United States Patent
Miele

(10) Patent No.: US 12,003,253 B2
(45) Date of Patent: *Jun. 4, 2024

(54) PERFORMING CYCLIC REDUNDANCY CHECKS USING PARALLEL COMPUTING ARCHITECTURES

(71) Applicant: NVIDIA Corporation, Santa Clara, CA (US)

(72) Inventor: Andrea Miele, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/402,341

(22) Filed: Aug. 13, 2021

(65) Prior Publication Data
US 2022/0173752 A1 Jun. 2, 2022

Related U.S. Application Data

(63) Continuation of application No. 16/559,424, filed on Sep. 3, 2019, now Pat. No. 11,095,307.

(51) Int. Cl.
| | | |
|---|---|---|
| *H03M 13/09* | (2006.01) | |
| *G06F 9/50* | (2006.01) | |
| *G06T 1/20* | (2006.01) | |
| *H04L 1/00* | (2006.01) | |

(52) U.S. Cl.
CPC .......... *H03M 13/09* (2013.01); *G06F 9/5005* (2013.01); *G06T 1/20* (2013.01); *H04L 1/0061* (2013.01)

(58) Field of Classification Search
CPC ........ H03M 13/09; G06F 9/5005; G06T 1/20; H04L 1/0061
See application file for complete search history.

(56) References Cited

U.S. PATENT DOCUMENTS

| | | | |
|---|---|---|---|
| 4,865,423 A | 9/1989 | Doi | |
| 5,923,680 A * | 7/1999 | Brueckheimer | ...... H04L 1/0057 714/776 |
| 6,560,742 B1 | 5/2003 | Dubey et al. | |
| 8,587,609 B1 | 11/2013 | Wang et al. | |
| 9,141,469 B2 | 9/2015 | Radhakrishnan et al. | |
| 11,095,307 B2 * | 8/2021 | Miele | .................. H03M 13/091 |

(Continued)

FOREIGN PATENT DOCUMENTS

| | | |
|---|---|---|
| CN | 201153259 Y | 11/2008 |
| CN | 101847999 A | 9/2010 |
| CN | 107451008 A | 12/2017 |

OTHER PUBLICATIONS

Blem et al., "Instruction Set Extensions for Cyclic Redundancy Check on a Multithreaded Processor," 7th Workshop on Media and Stream Processors, Dec. 12, 2005, 8 pages.

(Continued)

*Primary Examiner* — Guy J Lamarre
(74) *Attorney, Agent, or Firm* — Davis Wright Tremaine LLP

(57) ABSTRACT

Apparatuses, systems, and techniques to compute cyclic redundancy checks use a graphics processing unit (GPU) to compute cyclic redundancy checks. For example, in at least one embodiment, an input data sequence is distributed among GPU threads for parallel calculation of an overall CRC value for the input data sequence according to various novel techniques described herein.

25 Claims, 46 Drawing Sheets

(56) References Cited

U.S. PATENT DOCUMENTS

| | | | |
|---|---|---|---|
| 11,791,871 B2* | 10/2023 | Banuli Nanje Gowda | ................... G06F 9/466 375/267 |
| 2005/0066256 A1 | 3/2005 | Hooper et al. | |
| 2008/0002854 A1 | 1/2008 | Tehranchi et al. | |
| 2008/0074433 A1* | 3/2008 | Jiao | ....................... G06T 15/005 345/522 |
| 2010/0125777 A1 | 5/2010 | Wang et al. | |
| 2011/0231636 A1 | 9/2011 | Olson et al. | |
| 2013/0007573 A1 | 1/2013 | Radhakrishnan et al. | |
| 2013/0104012 A1 | 4/2013 | Barner | |
| 2013/0135315 A1 | 5/2013 | Bares et al. | |
| 2014/0207370 A1 | 7/2014 | Severson | |
| 2017/0187389 A1 | 6/2017 | Radhakrishnan et al. | |
| 2018/0067810 A1 | 3/2018 | Li | |
| 2018/0307984 A1* | 10/2018 | Koker | .................... G06N 3/044 |
| 2018/0356235 A1 | 12/2018 | Jang | |
| 2019/0007495 A1 | 1/2019 | Zhao et al. | |

OTHER PUBLICATIONS

Chi et al., "Exploring Various Levels of Parallelism in High-Performance CRC Algorithms," IEEE Access 7(6):32315-32326, Mar. 6, 2019.

Chi et al., "VACA: A high-performance variable-length adaptive CRC algorithm," 2017 IEEE 28th Annual International Symposium on Personal, Indoor, and Mobile Radio Communications (PIMRC), Oct. 8, 2017, 6 pages.

Cho et al., "Block-interleaving based parallel CRC computation for multi-processor systems," 2010 IEEE Workshop on Signal Processing System (SIPS 2010), Oct. 6, 2010, 6 pages.

IEEE, "IEEE Standard 754-2008 (Revision of IEEE Standard 754-1985): IEEE Standard for Floating-Point Arithmetic," Aug. 29, 2008, 70 pages.

International Electrotechnical Commission, "Functional safety of electrical/electronic/programmable electronic safety-related systems," IEC Standard 61508-1, Apr. 2014, 23 pages.

International Organization for Standardization, "Road vehicles—Functional safety," ISO Standard 26262, https://www.iso.org/obp/ui/#iso:std:iso:26262:-1:ed-1:v1:en, Nov. 11, 2011, 35 pages.

International Search Report and Written Opinion dated Nov. 19, 2020, Patent Application No. PCT/US2020/048638, 21 pages.

Ji et al., "Fast Parallel CRC Algorithm and Implementation on a Configurable Processor," 2002 IEEE International Conference on Communications, Apr. 28, 2002, 5 pages.

Kim et al., "A fast and energy-efficient Hamming decoder for software-defined radio using graphics processing units," Journal of Supercomputing 71(7):2454-2472, Mar. 5, 2015.

Meng, "Analyzing General-Purpose Computing Performance on GPU," California Polytechnic State University Master's Thesis, Dec. 2015, 79 pages.

Society of Automotive Engineers On-Road Automated Vehicle Standards Committee, "Taxonomy and Definitions for Terms Related to Driving Automation Systems for On-Road Motor Vehicles," Standard No. J3016-201609, issued Jan. 2014, revised Sep. 2016, 30 pages.

Society of Automotive Engineers On-Road Automated Vehicle Standards Committee, "Taxonomy and Definitions for Terms Related to Driving Automation Systems for On-Road Motor Vehicles," Standard No. J3016-201806, issued Jan. 2014, revised Jun. 2018, 35 pages.

Sun et al., "A Table-Based Algorithm for Pipelined CRC Calculation," 2010 IEEE International Conference on Communications, May 23, 2010, 5 pages.

Office Action for Chinese Application No. 202080072279.8, mailed Dec. 11, 2023, 18 pages.

* cited by examiner

PERFORMING CYCLIC REDUNDANCY CHECKS USING PARALLEL COMPUTING ARCHITECTURES

CROSS-REFERENCE TO RELATED APPLICATIONS

This application is a continuation of U.S. patent application Ser. No. 16/559,424, filed Sep. 3, 2019, entitled "PERFORMING CYCLIC REDUNDANCY CHECKS USING PARALLEL COMPUTING ARCHITECTURES," the disclosure of which is hereby incorporated herein in its entirety.

TECHNICAL FIELD

This disclosure relates to at least one embodiment for computing cyclic redundancy checks, and more particularly, at least one embodiment relates to computing cyclic redundancy check values using parallel computing architectures for use in wireless communications and processing.

BACKGROUND

Cyclic redundancy checks are done to make bit errors detectable and to detect bit errors. In many communication applications, checking, detecting, and/or correcting errors takes a significant amount of time, especially for current and future applications that rely upon improved communications speeds.

DETAILED DESCRIPTION

Figure 1:
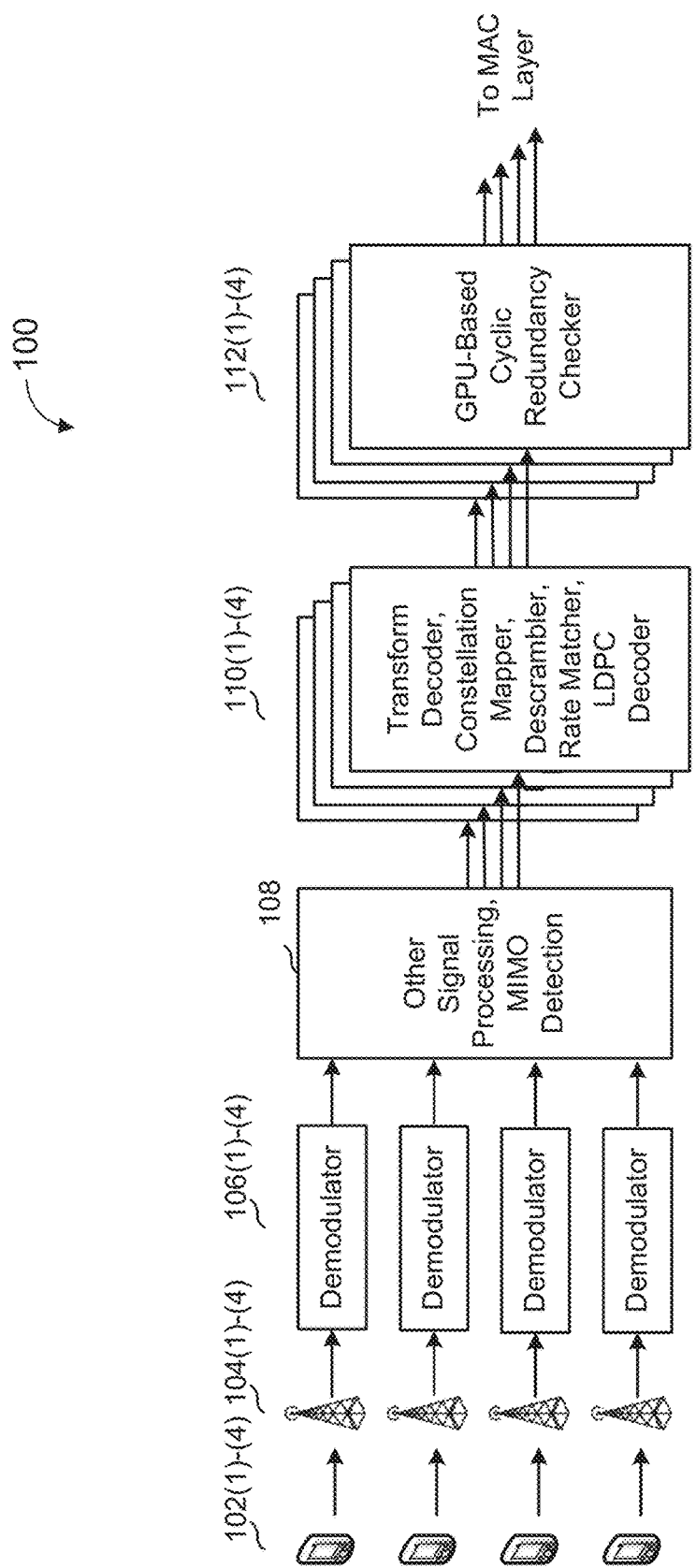
FIG. 1 illustrates data reception at a physical layer (PHY) of a mobile device network, according to one or more embodiments.

In at least one embodiment, error correction and detection is useful in communications where errors might occur in data being transmitted. In at least one embodiment, adding a cyclic redundancy check (CRC) value to data being transmitted can allow for a receiver to check whether that data was correctly received and, if not, in some situations to recover from such errors. In at least one embodiment, for instance, CRCs are used for Internet Protocol packets transmitted over the Internet and for Transport Blocks and Code Blocks in communications complying with various protocols, such as those referred to as "LTE" or "5G" used with mobile device networks. In at least one embodiment, in communications over mobile device networks that include voice and streaming, it is important to detect and correct errors very shortly after signals are received.

In at least one embodiment, a particular CRC has an associated generator polynomial, $P(x)$, and a CRC value for data being protected is a function of that data and that generator polynomial. In at least one embodiment, if input data is a binary sequence, it can represent a binary polynomial with coefficients in a Galois Field of characteristic 2 ("GF2") and a CRC value for that input data would be a remainder of that binary polynomial divided by its generator polynomial, $P(x)$. In at least one embodiment, a CRC value can be computed in a serial process, which can be slow. In at least one embodiment, an example representation of an input binary sequence is as shown in Equation 1 and an example representation of a CRC value for that input binary sequence is shown in Equation 2, where f is a degree of $P(x)$ and thus a size of a CRC value, sums are over bits of that input data sequence. In at least one embodiment, $f=24$, $f=16$, $f=8$, or some other value.

$$I(x) = \Sigma_i (x^i b_i) \tag{Eqn. 1}$$

$$CRC_f = (x^f \Sigma_i (x^i b_i)) \bmod P(x) \tag{Eqn. 2}$$

In at least one embodiment, a CRC value is computed for data on an uplink from a mobile device to cellular infrastructure servicing multiple mobile devices. In at least one embodiment, a CRC value is computed for data on a downlink. In at least one embodiment, a CRC value is computed from an input data sequence to compare it to a received CRC value received with that input data sequence, or to generate a CRC value for an input data sequence. In at least one embodiment, a generator polynomial as in Equation 3 is used and/or a generator polynomial as in Equation 4 is used.

$$P(X)_{CRC24A} = X^{24} + X^{23} + X^{18} + X^{17} + X^{14} + X^{11} + X^{10} + X^7 + X^6 + X^5 + X^4 + X^3 + X + 1 \tag{Eqn. 3}$$

$$P(x)_{CRC24B} = X^{24} + X^{23} + X^6 + X^5 + X + 1 \tag{Eqn. 4}$$

In at least one embodiment, an input data sequence has a size of K bytes (8*K bits), where K is a positive integer from one to a maximum size allowed by a protocol. In at least one embodiment, according to a particular protocol, K might be 1,056 bytes or 13,728 bytes, or some other value. In at least one embodiment, multiple levels of sequences with their own CRC values are provided for. In at least one embodiment, for example, a code block might have a size of 1,056 bytes (8,448 bits) and a transport block might be made up of 13 code blocks, or some other number of code blocks. In at least one embodiment, transport blocks might be made into larger blocks. In at least one embodiment, where a transport block is made up of multiple code blocks, there might be a CRC value for each code block and a CRC value for that transport block that represents a concatenation of those multiple code blocks. In at least one embodiment, a transport block has a size of $N=L*K$ bytes, where L is a number of code blocks in that transport block N and K is a number of bytes in each of those code blocks.

In at least one embodiment, an input data sequence can be treated as a binary polynomial and divided into smaller data segments, such as bytes, with data segments being processed in parallel using parallel capabilities of a graphics processing unit (GPU). In at least one embodiment, data segments are processed, using an XOR step or otherwise, in combination with a generator segment that is related to a generator polynomial for a CRC process being used. In at least one embodiment, a generator segment is precomputed based on a position of a corresponding data segment in a larger input data sequence. In at least one embodiment, outputs of data segment processing are combined in a reducing process, resulting in a residue of a modulo operation using that generator polynomial. In at least one embodiment, data segments and generator segments are processed in parallel, perhaps with each of a first plurality of threads of a GPU assigned a data segment and a generator segment and a second plurality of threads that perform a reducing process on outputs of that first plurality of threads.

In at least one embodiment, generator segments are precomputed as exemplified in Equation 5, where an i-th generator segment, $GS_i$, is one byte wide and as many generator segments as there are bytes in an input data segment, or could be an input data segment, are precomputed and stored as stored generator segments.

$$GS_i = x^{f+8i} \bmod P(x) \tag{Eqn. 5}$$

In at least one embodiment, stored generator segments can be stored in a global memory of a GPU. In at least one embodiment, an intermediate segment, $IS_i$, representing a result of an input data segment and a generator segment, whether precomputed or otherwise, might be represented as illustrated by Equation 6.

$$IS_i = x^{f+8i} b_i \bmod P(x) = GS_i (b_i \bmod P(x)) \bmod P(x) \tag{Eqn. 6}$$

In at least one embodiment, multiple bytes at once can be processed, such as four bytes. In at least one embodiment, modular polynomial multiplications and additions can be implemented by combinations of shifts and XORs operations. In at least one embodiment, multiple GPU threads each process a data segment and where a GPU thread processes four bytes, operations might be as shown in Equation 7 to arrive at a thread output, $TO_i$ for a thread i at a thread position i among a number of threads, given a thread input $TI_i$ that represents four bytes of a data segment.

$$TO_i = x^{8(4i)} b_{4i} \oplus x^{8(4i+1)} b_{4i+2} \oplus x^{8(4i+2)} b_{4i+2} \oplus x^{8(4i+3)} b_{4i+3} \bmod P(x) \tag{Eqn. 7}$$

In at least one embodiment, outputs TO; of a plurality of GPU threads can be XOR'ed using a XOR reduction tree implemented with atomic XORs in shared memory at a thread block level followed by atomic XORs in global memory. In at least one embodiment, in addition to generator segments being precomputed, a precomputed table, perhaps in global GPU memory, could be used to hold possible values of components of thread outputs given thread inputs. In at least one embodiment, a GPU thread receives an input byte of an input data sequence and outputs a byte corresponding to that input byte multiplied by some power of x, modulo $P(x)$. In at least one embodiment, where inputs are bytes, a 256-byte table that is precomputed from a generator segment is sufficient for handling all possible input byte values. In at least one embodiment, in using a lookup table, operations to output a thread output to be XORed with other thread outputs can be reduced to a lookup and some XORing.

In at least one embodiment, breaking an input data sequence, represented by a binary polynomial, into data segments of a byte or some other width, can reduce computing effort for cost of some precomputation and storage with a net result of a lower latency, which can be desirable in some protocols. In at least one embodiment, where generator polynomials do not change, or do not change frequently, costs of precomputation and storage can be allocated amount many operations. In at least one embodiment, a CRC process is done for CRC generator polynomials used in 5G software-defined Radio Access Network (RAN) devices and such CRC generator polynomials are few in number and are not expected to change frequently.

In at least one embodiment, another data width is used, such as 1, 2, 4, 16, or some other data width, which may vary and/or be tuned based on optimization factors, GPU architecture, or some constant. In at least one embodiment, processing four bits at a time might increase an overall CRC processing speed.

FIG. 1 illustrates data reception at a physical layer (PHY) of a mobile device network, according to one or more embodiments. In at least one embodiment, a network system 100 might provide for multiple mobile devices 102(1)-(4) to connect to base stations 104(1)-(4), where signals received are demodulated by demodulators 106(1)-(4) and processed by various other signal processing elements 108, such as channel estimation and multiple-input, multiple-output signal processing. In at least one embodiment, outputs of signal processing elements 108 might parse signals into multiple paths and provide those signals to other elements 110(1)-(4), as might contain transform decoders, constellation mappers, descramblers, rate matchers, low-density parity checking (LDPC) decoders, etc. In at least one embodiment, outputs of elements 110(1)-(4) might be to GPU-based cyclic redundancy checkers 112(1)-(4). In at least one embodiment, where network system 100 is providing real-time data transport or otherwise requires quick processing, performing CRC processing using a GPU and parallelization available with a GPU can provide for quick processing of CRCs.

Figure 2:
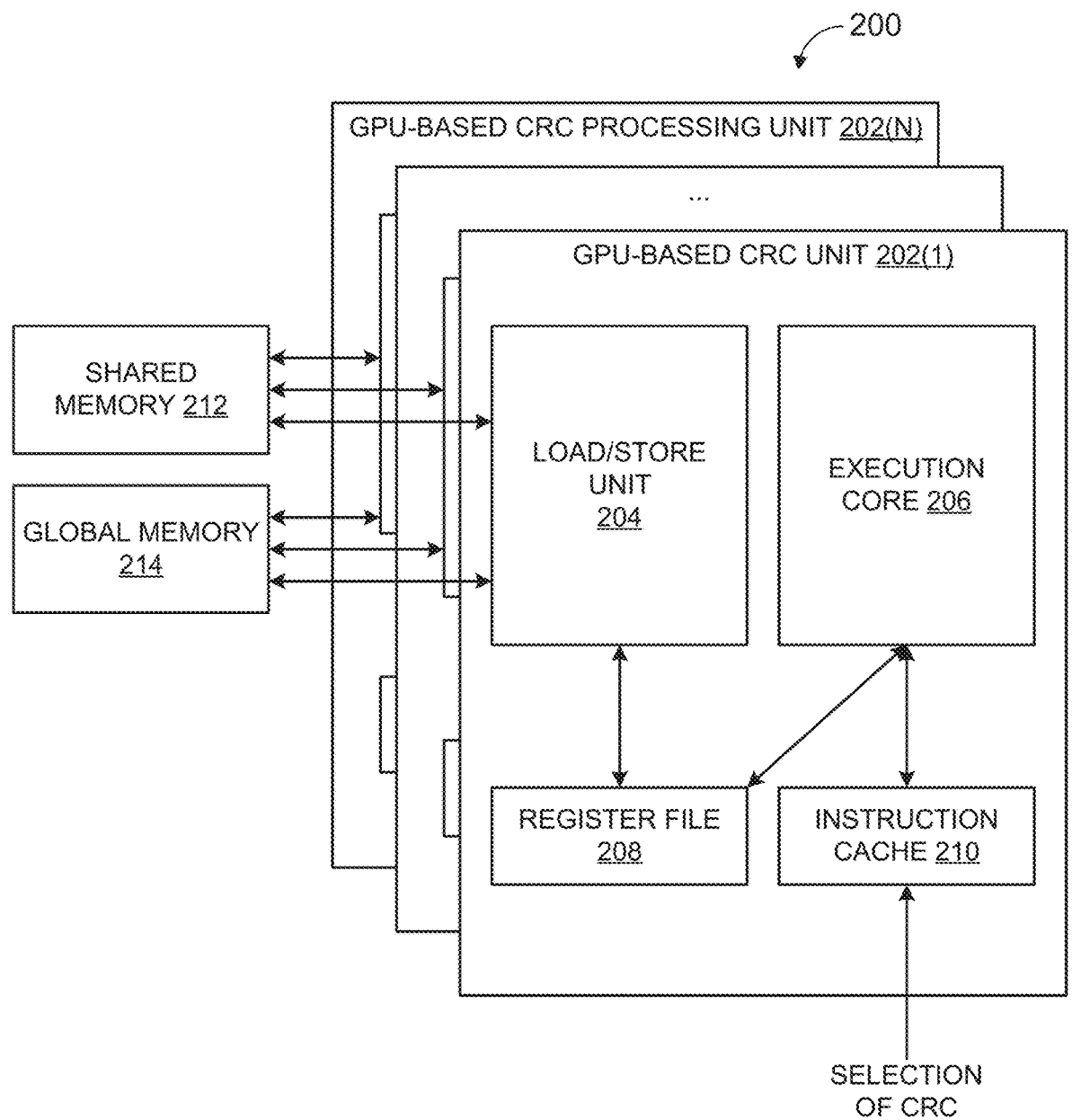
FIG. 2 illustrates elements of GPU-based CRC processing units as might be used for GPU-based cyclic redundancy checkers according to one or more embodiments.

FIG. 2 illustrates elements of GPU-based CRC processing units 202(1)-(N) as might be used for GPU-based cyclic redundancy checkers 112(1)-(4) in FIG. 1 according to one or more embodiments. In at least one embodiment, N is a number of threads used for CRC processing. In at least one embodiment, a GPU-based CRC processing unit 202(1), similar to other GPU-based CRC processing units shown, comprises a load/store unit 204, an execution core 206, a register file 208, an instruction cache 210, along with access to a shared memory 212 and a global memory 214. In at least one embodiment, GPU-based CRC processing unit 202(1) handles multiple different CRC processes and a selection of which generator polynomial to use is indicated at a selection input of GPU-based CRC processing unit 202(1). In at least one embodiment, in operations described herein, GPU-based CRC processing unit 202(1) can read in a number of bytes of a data segment, load data to register file 208, access those bytes using execute core 206 and return to register file 208 a thread output. In at least one embodiment, thread outputs are stored in shared memory 212 and processed by other threads in a parallel XOR reduction tree.

Figure 3:
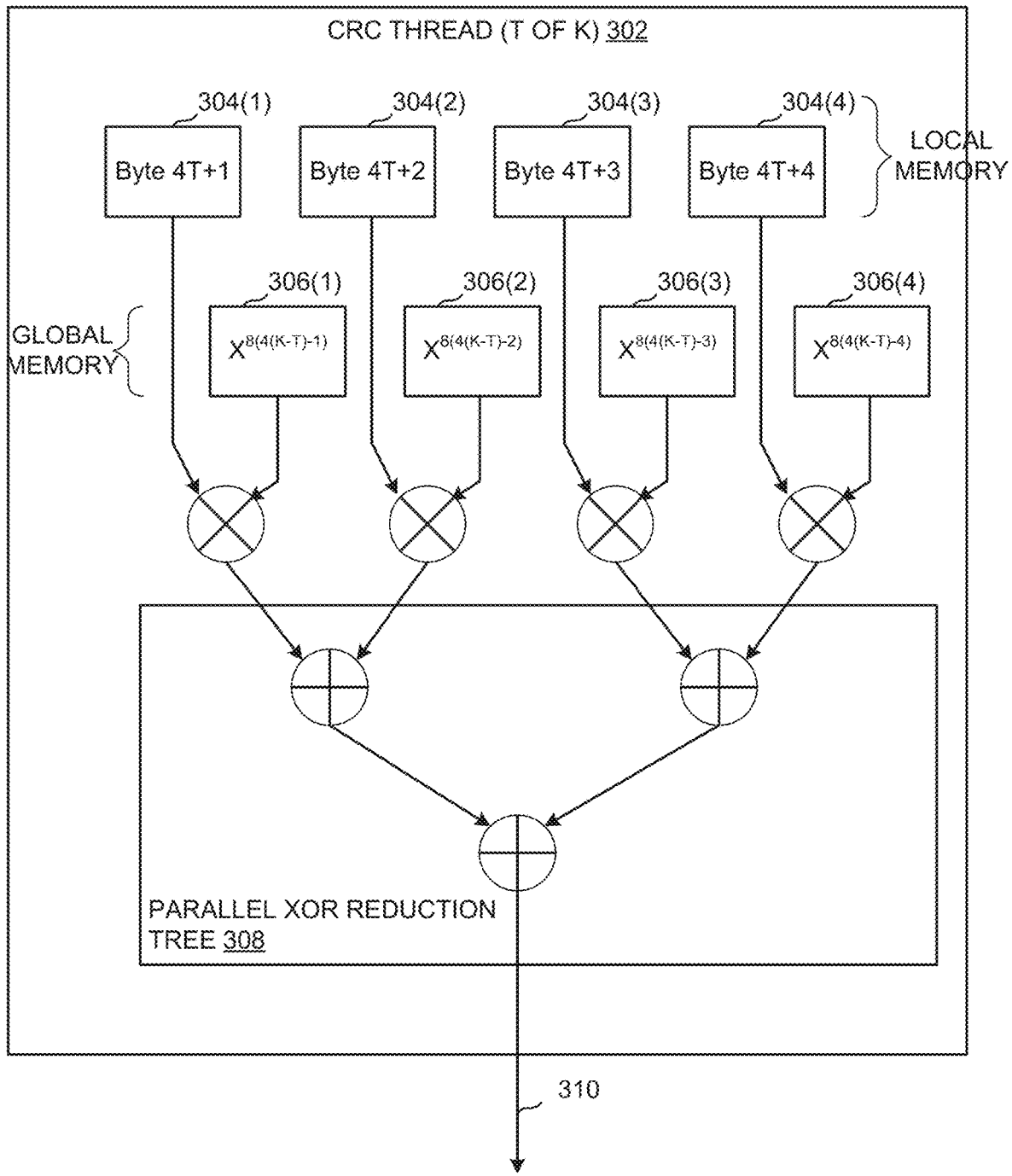
FIG. 3 illustrates an operation of a CRC thread according to one or more embodiments.

FIG. 3 illustrates an operation of a CRC thread 302 according to one or more embodiments. In at least one embodiment, a CRC thread is one of a plurality of threads and might be one of K threads processing a CRC for input data having 4*K bytes. In at least one embodiment, CRC thread 302 is for a thread T, where T=0, 1, . . . , K−1. In at least one embodiment, CRC thread 302 has storage 304 in local memory, such as thread registers, for four bytes of a data segment. In at least one embodiment, CRC thread 302 accesses storage 306 for polynomial factors modulo a generator polynomial, and multiplies byte values by polynomial factors or performs an equivalent lookup. In at least one embodiment, a parallel XOR reduction tree can reduce four values to one value to form a thread output 310 that represents a portion of a CRC over a 4*K byte input data sequence.

In at least one embodiment, a GPU-based CRC processing unit can be configured to execute many threads in parallel, where term "thread" refers to an instance of a particular program executing on a particular set of input data. In at least one embodiment, single-instruction, multiple-data (SIMD) instruction issue techniques are used to support parallel execution of a large number of threads without necessarily providing multiple independent instruction units. In at least one embodiment, single-instruction, multiple-thread (SIMT) techniques are used to support parallel execution of a large number of generally synchronized threads, using a common instruction unit configured to issue instructions to a set of processing engines within each processing cluster.

In at least one embodiment, a first plurality of threads of a GPU-based CRC processing unit operate on different segments of an input data sequence to process segments with corresponding generator polynomial segments performing an operation in common among threads of that plurality of threads, albeit with different data per thread. In at least one embodiment, a GPU-based CRC processing unit allocates an input data sequence among threads of a plurality of threads by parsing that input data sequence into a plurality of input data segments sized to fit a data width of a local memory of a thread. In at least one embodiment, threads in a first plurality of threads perform operations such as those illustrated in FIG. 3, while threads in a second plurality of threads perform operations such as XOR operations on outputs of threads and reduction operations by reducing an output modulo a generator polynomial.

In at least one embodiment, a thread of a GPU-based CRC processing unit may compute a multiplication of a data segment of an input data sequence with a polynomial factor over a Galois field GF2. In at least one embodiment, a thread of a GPU-based CRC processing unit may compute a multiplication of a data segment of an input data sequence with a precomputed multiplication of a polynomial factor with a generator polynomial segment over a Galois field GF2. In at least one embodiment, a thread of a GPU-based CRC processing unit may perform a lookup in a precomputed table for a value of a multiplication of a data segment of an input data sequence with a polynomial factor and a generator polynomial segment over a Galois field GF2. In at least one embodiment, that polynomial factor is a monomial with a single nonzero coefficient and a degree equal to a degree of a corresponding generator polynomial.

Figure 4:
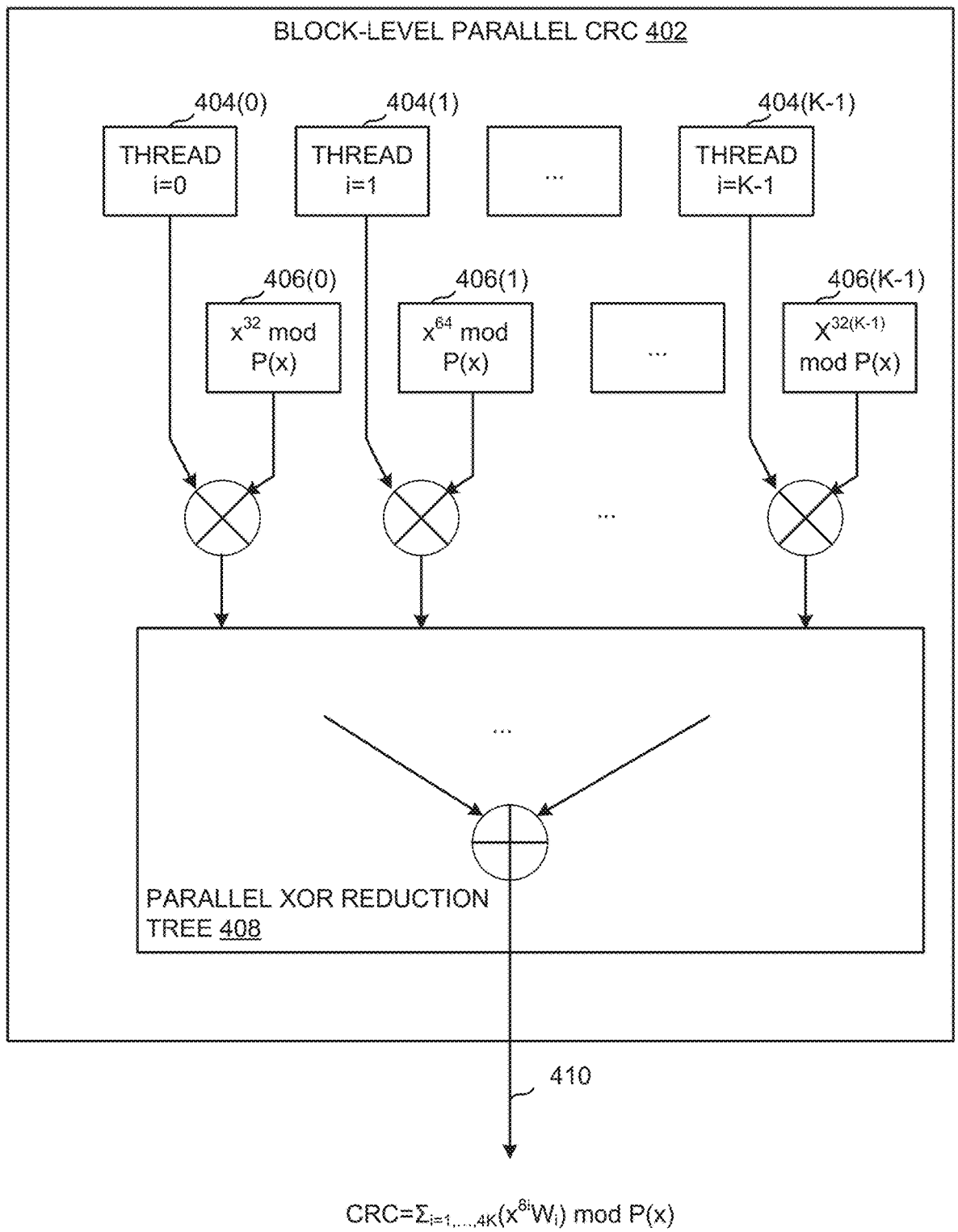
FIG. 4 illustrates an operation at a block-level for combining and reducing thread outputs in parallel according to one or more embodiments.

FIG. 4 illustrates an operation at a block-level for combining and reducing thread outputs in parallel according to one or more embodiments. In at least one embodiment, a block-level parallel CRC module 402 processes outputs of threads 404(0)-(K−1) multiplied by respective polynomial factors 406(0)-(K−1). In at least one embodiment, results of multiplication are provided to a parallel XOR reduction tree 408 to form an output 410 of a CRC value for an input data sequence having 4*K bytes, having reduced it to an f-bit value, where f is a size of a corresponding CRC. In at least one embodiment, a thread operates on 32 bits at a time and so powers of x in respective polynomial factors 406(0)-(K−

1) increment by 32, but other sizes could be used instead, with corresponding adjustments.

In at least one embodiment, a more generalized lookup table scheme could be used, such as where a lookup table is provided where powers of polynomial factors are precomputed and stored in a first lookup table for an index, i, e.g., $x^{8i}, x^{16i}, \ldots, x^{1016i}$ and some larger powers, $x^{1024i}, x^{2048i}$, are stored second lookup table. In at least one embodiment, this allows for precomputed combinations using a smaller total number of lookup table entries. In at least one embodiment, for example, a value for $x^{(2048+64)*5}$ could be determined using an index value of i=5 into a first table that provides a precomputed value for $x^{64*5}$ and a second table that provides a precomputed value for $x^{2048*5}$, which can then be multiplied modulo a generator polynomial. In at least one embodiment, powers of polynomial factors to be precomputed might increment by another value, such as 4, in a lookup table for an index i holding precomputed values $x^{4i}, x^{8i}, x^{12i}, x^{16i}$, etc.

Figure 5:
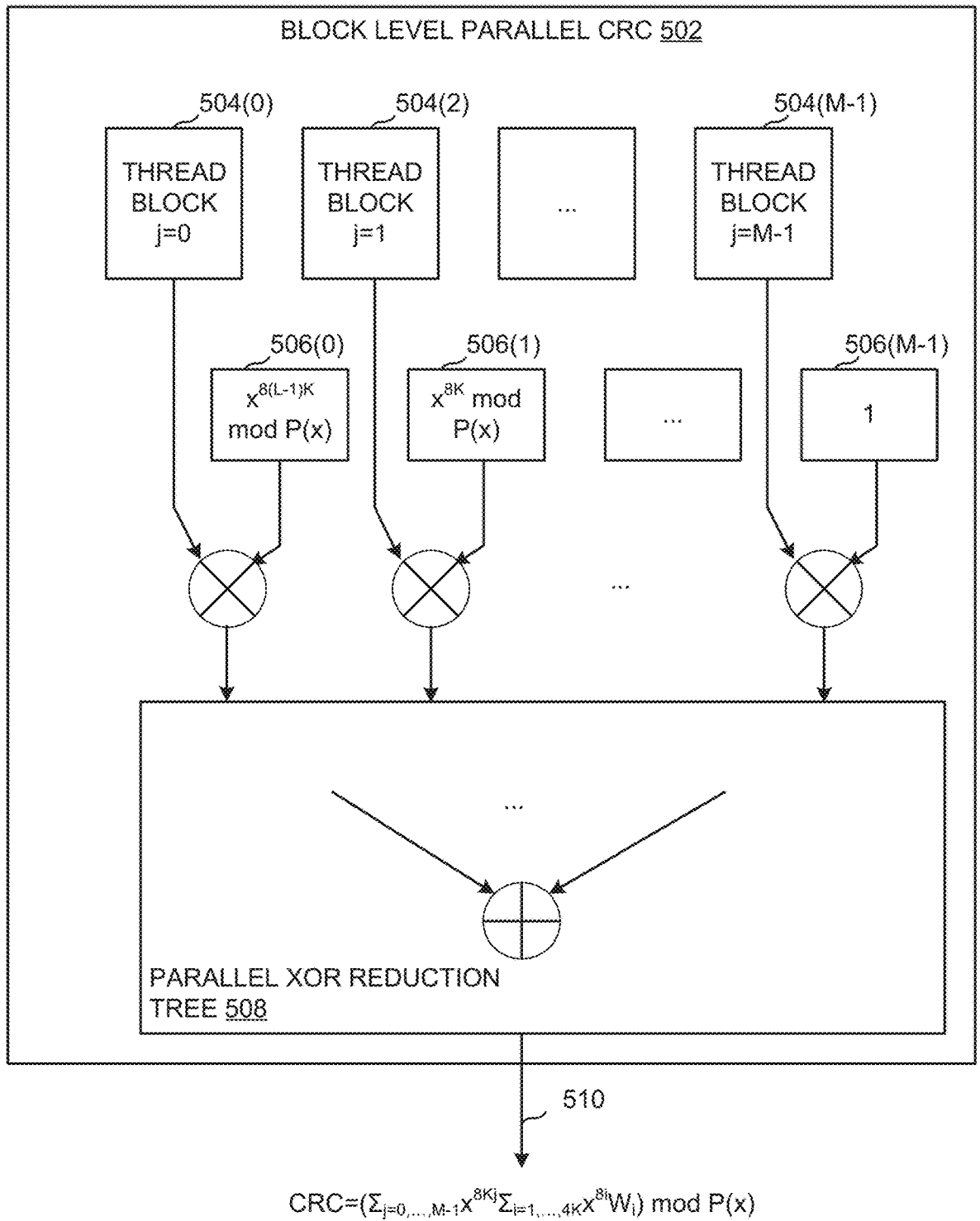
FIG. 5 illustrates an operation at a block-level for combining and reducing thread block outputs in parallel according to one or more embodiments.

FIG. 5 illustrates an operation at a block-level for combining and reducing thread block outputs in parallel according to one or more embodiments. In at least one embodiment, a thread block-level parallel CRC module 502 processes outputs of thread blocks 504(0)-(M−1) multiplied by respective polynomial factors 506(0)-(M−1). In at least one embodiment, results of multiplication are provided to a parallel XOR reduction tree 508 to form an output 510 of a CRC value for an input data sequence. In at least one embodiment, thread block-level parallel CRC module 502 processes larger sets of input data than a block-level parallel CRC module.

Figure 6:
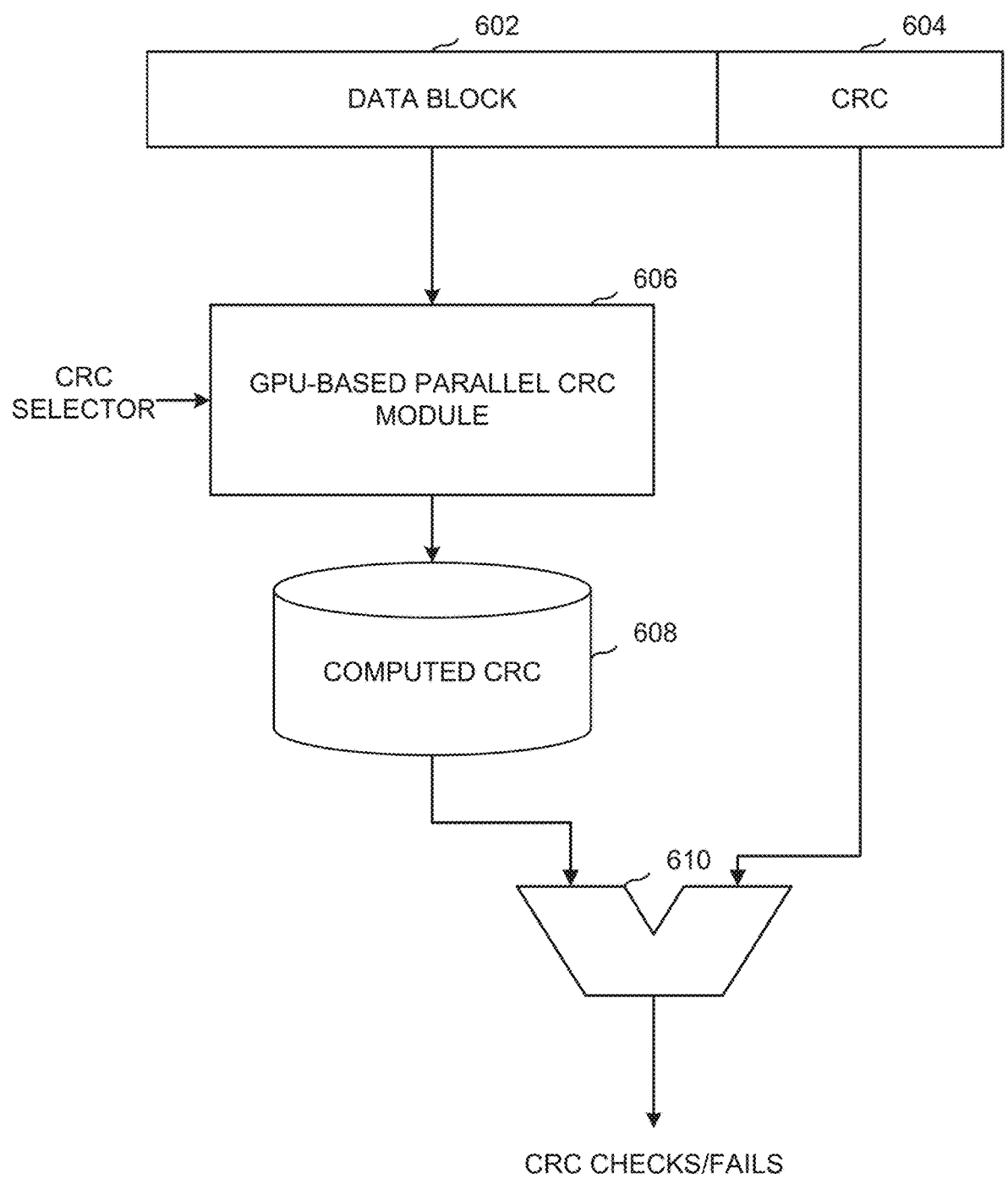
FIG. 6 illustrates a process of checking a CRC value according to one or more embodiments.

FIG. 6 illustrates a process of checking a CRC value according to one or more embodiments. In at least one embodiment, an input data block 602 is provided to a GPU-based parallel CRC module 606, which might be implemented as described herein, and outputs a CRC value using a selected CRC. In at least one embodiment, an output CRC value is stored in storage 608. In at least one embodiment, an output CRC value stored in storage 608 can be compared to a CRC value 604 received with input data block 602, by comparing using a comparator 610, which outputs a check or fail depending on whether CRCs match. In at least one embodiment, contents of storage 608 can be used as a CRC value to create a CRC value for a known good data block. In at least one embodiment, differences between an output CRC value stored in storage 608 and CRC value 604 can be used to detect and/or correct errors in input data block 602.

Figure 7A:
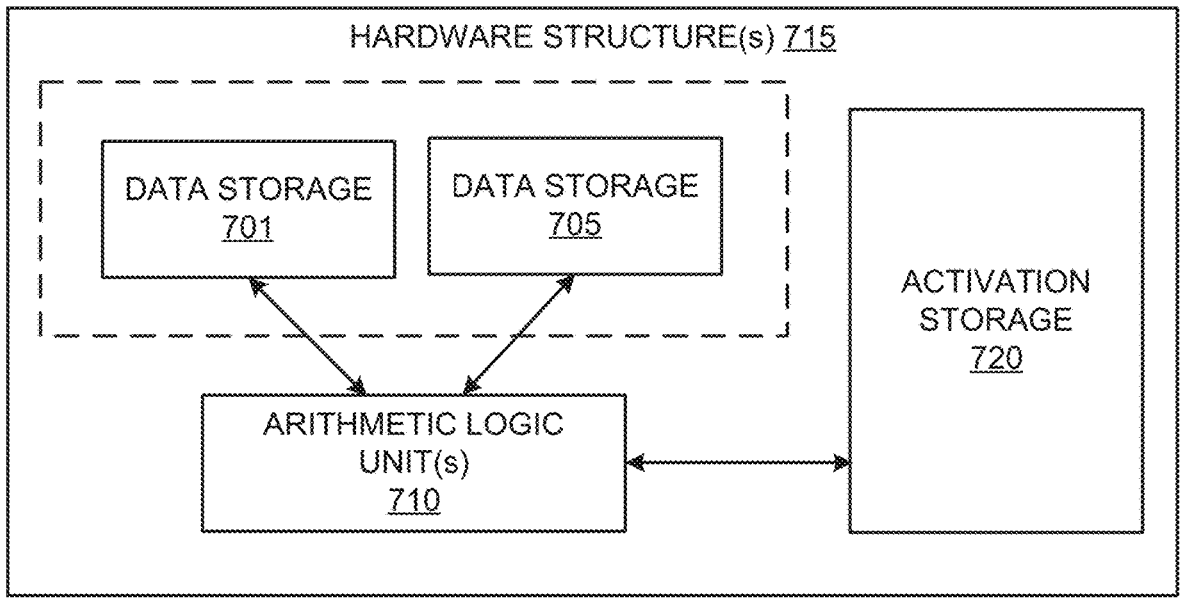
FIG. 7A illustrates inference and/or training logic, according to at least one embodiment.

FIG. 7A illustrates inference and/or training logic 715 used to perform inferencing and/or training operations associated with one or more embodiments. Details regarding inference and/or training logic 715 are provided herein in conjunction with FIGS. 7A and/or 7B.

In at least one embodiment, inference and/or training logic 715 may include, without limitation, code and/or data storage 701 to store forward and/or output weight and/or input/output data, and/or other parameters to configure neurons or layers of a neural network trained and/or used for inferencing in aspects of one or more embodiments. In at least one embodiment, training logic 715 may include, or be coupled to code and/or data storage 701 to store graph code or other software to control timing and/or order, in which weight and/or other parameter information is to be loaded to configure, logic, including integer and/or floating point units (collectively, arithmetic logic units (ALUs). In at least one embodiment, code, such as graph code, loads weight or other parameter information into processor ALUs based on an architecture of a neural network to which that code corresponds. In at least one embodiment, code and/or data storage 701 stores weight parameters and/or input/output data of each layer of a neural network trained or used in conjunction with one or more embodiments during forward propagation of input/output data and/or weight parameters during training and/or inferencing using aspects of one or more embodiments. In at least one embodiment, any portion of code and/or data storage 701 may be included with other on-chip or off-chip data storage, including a processor's L1, L2, or L3 cache or system memory.

In at least one embodiment, any portion of data storage 701 may be internal or external to one or more processors or other hardware logic devices or circuits. In at least one embodiment, data storage 701 may be cache memory, dynamic randomly addressable memory ("DRAM"), static randomly addressable memory ("SRAM"), non-volatile memory (e.g., Flash memory), or other storage. In at least one embodiment, choice of whether data storage 701 is internal or external to a processor, for example, or comprised of DRAM, SRAM, Flash or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 715 may include, without limitation, a code and/or data storage 705 to store backward and/or output weight and/or input/output data corresponding to neurons or layers of a neural network trained and/or used for inferencing in aspects of one or more embodiments. In at least one embodiment, code and/or data storage 705 stores weight parameters and/or input/output data of each layer of a neural network trained or used in conjunction with one or more embodiments during backward propagation of input/output data and/or weight parameters during training and/or inferencing using aspects of one or more embodiments. In at least one embodiment, training logic 715 may include, or be coupled to code and/or data storage 705 to store graph code or other software to control timing and/or order, in which weight and/or other parameter information is to be loaded to configure, logic, including integer and/or floating point units (collectively, arithmetic logic units (ALUs). In at least one embodiment, code, such as graph code, loads weight or other parameter information into processor ALUs based on an architecture of a neural network to which that code corresponds. In at least one embodiment, any portion of code and/or data storage 705 may be included with other on-chip or off-chip data storage, including a processor's L1, L2, or L3 cache or system memory. In at least one embodiment, any portion of code and/or data storage 705 may be internal or external to on one or more processors or other hardware logic devices or circuits. In at least one embodiment, code and/or data storage 705 may be cache memory, DRAM, SRAM, non-volatile memory (e.g., Flash memory), or other storage. In at least one embodiment, choice of whether code and/or data storage 705 is internal or external to a processor, for example, or comprised of DRAM, SRAM, Flash or some other storage type may depend on available storage on-chip versus off-chip, latency requirements of training and/or inferencing functions being performed, batch size of data used in inferencing and/or training of a neural network, or some combination of these factors.

In at least one embodiment, data storage 701 and data storage 705 may be separate storage structures. In at least one embodiment, data storage 701 and data storage 705 may be same storage structure. In at least one embodiment, data storage 701 and data storage 705 may be partially same storage structure and partially separate storage structures. In at least one embodiment, any portion of data storage 701 and data storage 705 may be included with other on-chip or off-chip data storage, including a processor's L1, L2, or L3 cache or system memory.

In at least one embodiment, inference and/or training logic 715 may include, without limitation, one or more arithmetic logic unit(s) ("ALU(s)") 710, including integer and/or floating point units, to perform logical and/or mathematical operations based, at least in part on, or indicated by, training and/or inference code (e.g., graph code), a result of which may produce activations (e.g., output values from layers or neurons within a neural network) stored in an activation storage 720 that are functions of input/output and/or weight parameter data stored in code and/or data storage 701 and/or code and/or data storage 705. In at least one embodiment, activations stored in activation storage 720 are generated according to linear algebraic and or matrix-based mathematics performed by ALU(s) 710 in response to performing instructions or other code, wherein weight values stored in code and/or data storage 705 and/or data 701 are used as operands along with other values, such as bias values, gradient information, momentum values, or other parameters or hyperparameters, any or all of which may be stored in code and/or data storage 705 or code and/or data storage 701 or another storage on or off-chip.

In at least one embodiment, ALU(s) 710 are included within one or more processors or other hardware logic devices or circuits, or ALU(s) 710 may be external to a processor or other hardware logic device or circuit that uses them (e.g., a co-processor). In at least one embodiment, ALUs 710 may be included within a processor's execution units or otherwise within a bank of ALUs accessible by a processor's execution units either within same processor or distributed between different processors of different types (e.g., central processing units, graphics processing units, fixed function units, etc.). In at least one embodiment, data storage 701, data storage 705, and activation storage 720 may be on same processor or other hardware logic device or circuit, or they may be in different processors or other hardware logic devices or circuits, or some combination of same and different processors or other hardware logic devices or circuits. In at least one embodiment, any portion of activation storage 720 may be included with other on-chip or off-chip data storage, including a processor's L1, L2, or L3 cache or system memory. Furthermore, inferencing and/or training code may be stored with other code accessible to a processor or other hardware logic or circuit and fetched and/or processed using a processor's fetch, decode, scheduling, execution, retirement and/or other logical circuits.

In at least one embodiment, activation storage 720 may be cache memory, DRAM, SRAM, non-volatile memory (e.g., Flash memory), or other storage. In at least one embodiment, activation storage 720 may be completely or partially within or external to one or more processors or other logical circuits. In at least one embodiment, choice of whether activation storage 720 is internal or external to a processor, for example, or comprised of DRAM, SRAM, Flash or some other storage type may depend on available storage on-chip versus off-chip, latency requirements of training and/or inferencing functions being performed, batch size of data used in inferencing and/or training of a neural network, or some combination of these factors. In at least one embodiment, inference and/or training logic 715 illustrated in FIG. 7A may be used in conjunction with an application-specific integrated circuit ("ASIC"), such as TensorFlow® Processing Unit from Google, an inference processing unit (IPU) from Graphcore™, or a Nervana® (e.g., "Lake Crest") processor from Intel Corp. In at least one embodiment, inference and/or training logic 715 illustrated in FIG. 7A may be used in conjunction with central processing unit ("CPU") hardware, graphics processing unit ("GPU") hardware or other hardware, such as field programmable gate arrays ("FPGAs").

Figure 7B:
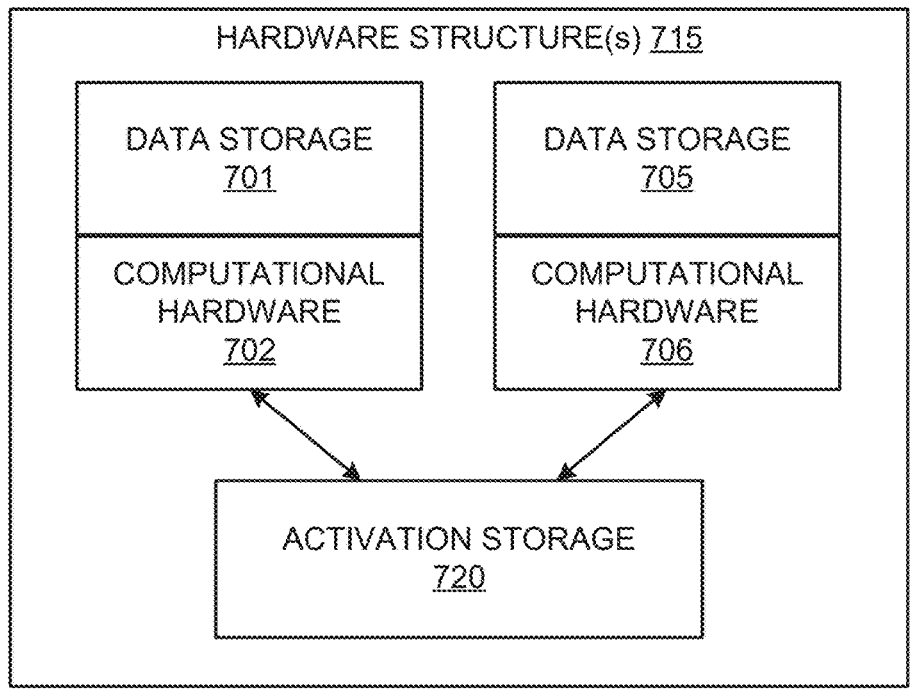
FIG. 7B illustrates inference and/or training logic, according to at least one embodiment.

FIG. 7B illustrates inference and/or training logic 715, according to at least one embodiment various. In at least one embodiment, inference and/or training logic 715 may include, without limitation, hardware logic in which computational resources are dedicated or otherwise exclusively used in conjunction with weight values or other information corresponding to one or more layers of neurons within a neural network. In at least one embodiment, inference and/or training logic 715 illustrated in FIG. 7B may be used in conjunction with an application-specific integrated circuit (ASIC), such as TensorFlow® Processing Unit from Google, an inference processing unit (IPU) from Graphcore™, or a Nervana® (e.g., "Lake Crest") processor from Intel Corp. In at least one embodiment, inference and/or training logic 715 illustrated in FIG. 7B may be used in conjunction with central processing unit (CPU) hardware, graphics processing unit (GPU) hardware or other hardware, such as field programmable gate arrays (FPGAs). In at least one embodiment, inference and/or training logic 715 includes, without limitation, code and/or data storage 701 and code and/or data storage 705, which may be used to store code (e.g., graph code), weight values and/or other information, including bias values, gradient information, momentum values, and/or other parameter or hyperparameter information. In at least one embodiment illustrated in FIG. 7B, each of code and/or data storage 701 and code and/or data storage 705 is associated with a dedicated computational resource, such as computational hardware 702 and computational hardware 706, respectively. In at least one embodiment, each of computational hardware 702 and computational hardware 706 comprises one or more ALUs that perform mathematical functions, such as linear algebraic functions, only on information stored in code and/or data storage 701 and code and/or data storage 705, respectively, result of which is stored in activation storage 720.

In at least one embodiment, each of data storage 701 and 705 and corresponding computational hardware 702 and 706, respectively, correspond to different layers of a neural network, such that resulting activation from one "storage/computational pair 701/702" of data storage 701 and computational hardware 702 is provided as an input to next "storage/computational pair 705/706" of data storage 705 and computational hardware 706, in order to mirror conceptual organization of a neural network. In at least one embodiment, each of storage/computational pairs 701/702 and 705/706 may correspond to more than one neural network layer. In at least one embodiment, additional storage/computation pairs (not shown) subsequent to or in parallel with storage computation pairs 701/702 and 705/706 may be included in inference and/or training logic 715.

Data Center

Figure 8:
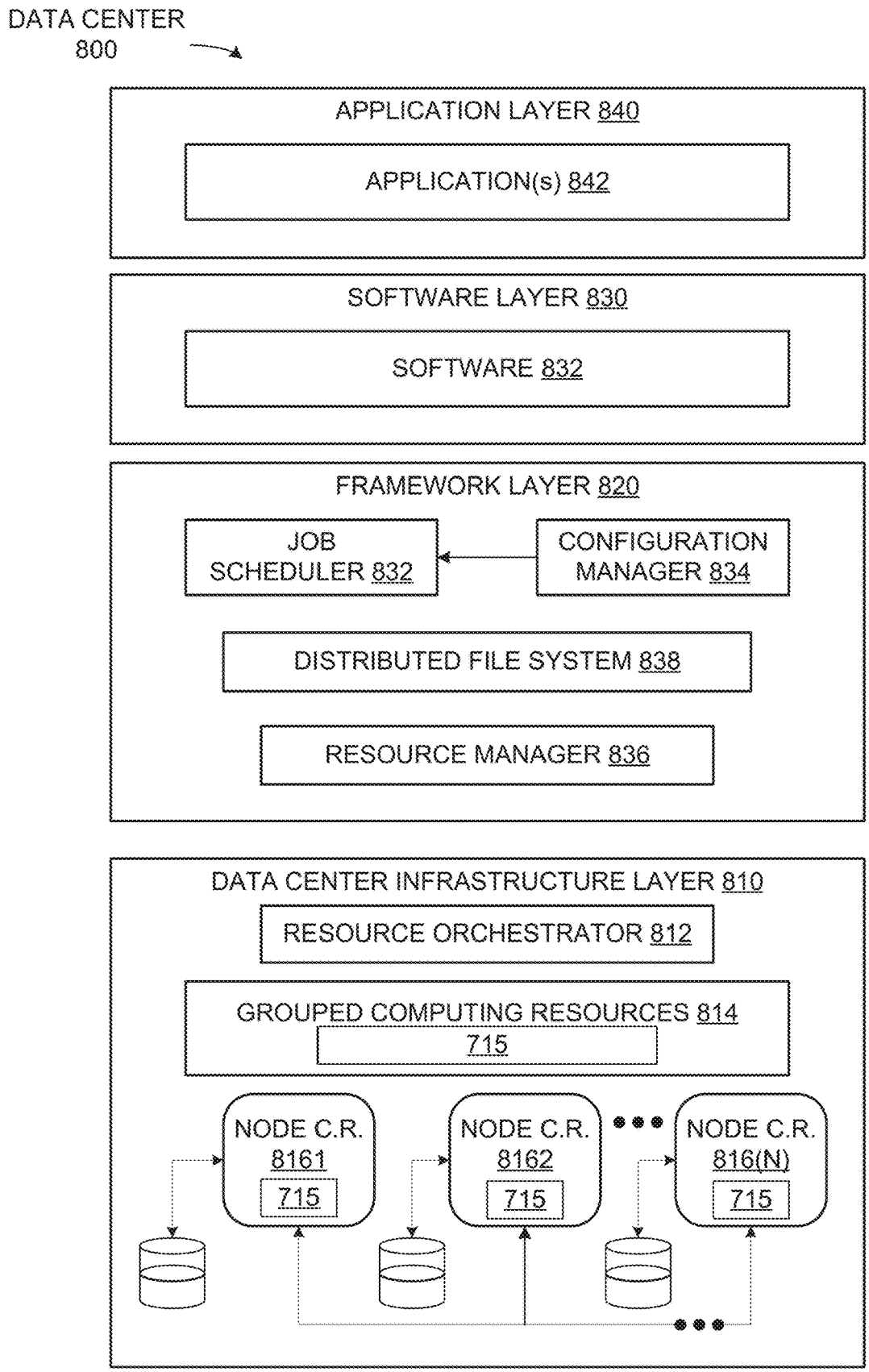
FIG. 8 illustrates an example data center system, according to at least one embodiment.

FIG. 8 illustrates an example data center 800, in which at least one embodiment may be used. In at least one embodiment, a data center 800 includes a data center infrastructure layer 810, a framework layer 820, a software layer 830 and an application layer 840.

In at least one embodiment, as shown in FIG. 8, a data center infrastructure layer 810 may include a resource orchestrator 812, grouped computing resources 814, and node computing resources ("node C.R.s") 816(1)-816(N), where "N" represents any whole, positive integer. In at least one embodiment, node C.R.s 816(1)-816(N) may include, but are not limited to, any number of central processing units ("CPUs") or other processors (including accelerators, field programmable gate arrays (FPGAs), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 816(1)-816(N) may be a server having one or more of above-mentioned computing resources.

In at least one embodiment, grouped computing resources 814 may include separate groupings of node C.R.s housed within one or more racks (not shown), or many racks housed in data centers at various geographical locations (also not shown). Separate groupings of node C.R.s within grouped computing resources 814 may include grouped compute, network, memory or storage resources that may be configured or allocated to support one or more workloads. In at least one embodiment, several node C.R.s including CPUs or processors may be grouped within one or more racks to provide compute resources to support one or more workloads. In at least one embodiment, one or more racks may also include any number of power modules, cooling modules, and network switches, in any combination.

In at least one embodiment, resource orchestrator 822 may configure or otherwise control one or more node C.R.s 816(1)-816(N) and/or grouped computing resources 814. In at least one embodiment, resource orchestrator 822 may include a software design infrastructure ("SDI") management entity for data center 800. In at least one embodiment, a resource orchestrator may include hardware, software or some combination thereof.

In at least one embodiment, as shown in FIG. 8, framework layer 820 includes a job scheduler 832, a configuration manager 834, a resource manager 836 and a distributed file system 838. In at least one embodiment, framework layer 820 may include a framework to support software 832 of software layer 830 and/or one or more application(s) 842 of application layer 840. In at least one embodiment, software 832 or application(s) 842 may respectively include web-based service software or applications, such as those provided by Amazon Web Services, Google Cloud and Microsoft Azure. In at least one embodiment, framework layer 820 may be, but is not limited to, a type of free and open-source software web application framework such as Apache Spark™ (hereinafter "Spark") that may utilize distributed file system 838 for large-scale data processing (e.g., "big data"). In at least one embodiment, job scheduler 832 may include a Spark driver to facilitate scheduling of workloads supported by various layers of data center 800. In at least one embodiment, configuration manager 834 may be capable of configuring different layers such as software layer 830 and framework layer 820 including Spark and distributed file system 838 for supporting large-scale data processing. In at least one embodiment, resource manager 836 may be capable of managing clustered or grouped computing resources mapped to or allocated for support of distributed file system 838 and job scheduler 832. In at least one embodiment, clustered or grouped computing resources may include grouped computing resource 814 at data center infrastructure layer 810. In at least one embodiment, resource manager 836 may coordinate with resource orchestrator 812 to manage these mapped or allocated computing resources.

In at least one embodiment, software 832 included in software layer 830 may include software used by at least portions of node C.R.s 816(1)-816(N), grouped computing resources 814, and/or distributed file system 838 of framework layer 820. One or more types of software may include but are not limited to Internet web page search software, e-mail virus scan software, database software, and streaming video content software.

In at least one embodiment, application(s) 842 included in application layer 840 may include one or more types of applications used by at least portions of node C.R.s 816(1)-816(N), grouped computing resources 814, and/or distributed file system 838 of framework layer 820. One or more types of applications may include but are not limited to any number of a genomics application, a cognitive compute, and a machine learning application, including training or inferencing software, machine learning framework software (e.g., PyTorch, TensorFlow®, Caffe, etc.) or other machine learning applications used in conjunction with one or more embodiments.

In at least one embodiment, any of configuration manager 834, resource manager 836, and resource orchestrator 812 may implement any number and type of self-modifying actions based on any amount and type of data acquired in any technically feasible fashion. In at least one embodiment, self-modifying actions may relieve a data center operator of data center 800 from making possibly bad configuration decisions and possibly avoiding underutilized and/or poor performing portions of a data center.

In at least one embodiment, data center 800, may include tools, services, software or other resources to train one or more machine learning models or predict or infer information using one or more machine learning models according to one or more embodiments described herein. For example, in at least one embodiment, a machine learning model may be trained by calculating weight parameters according to a neural network architecture using software and computing resources described above with respect to data center 800. In at least one embodiment, trained machine learning models corresponding to one or more neural networks may be used to infer or predict information using resources described above with respect to data center 800 by using weight parameters calculated through one or more training techniques described herein.

In at least one embodiment, a data center may use CPUs, application-specific integrated circuits (ASICs), GPUs, FPGAs, or other hardware to perform training and/or inferencing using above-described resources. In at least one embodiment, one or more software and/or hardware resources described above may be configured as a service to allow users to train or perform inferencing of information, such as image recognition, speech recognition, or other artificial intelligence services.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in system FIG. 8 for inferencing or predicting operations based, at least in part, on weight parameters calculated using neural network training operations, neural network functions and/or architectures, or neural network use cases described herein.

Autonomous Vehicle

Figure 9A:
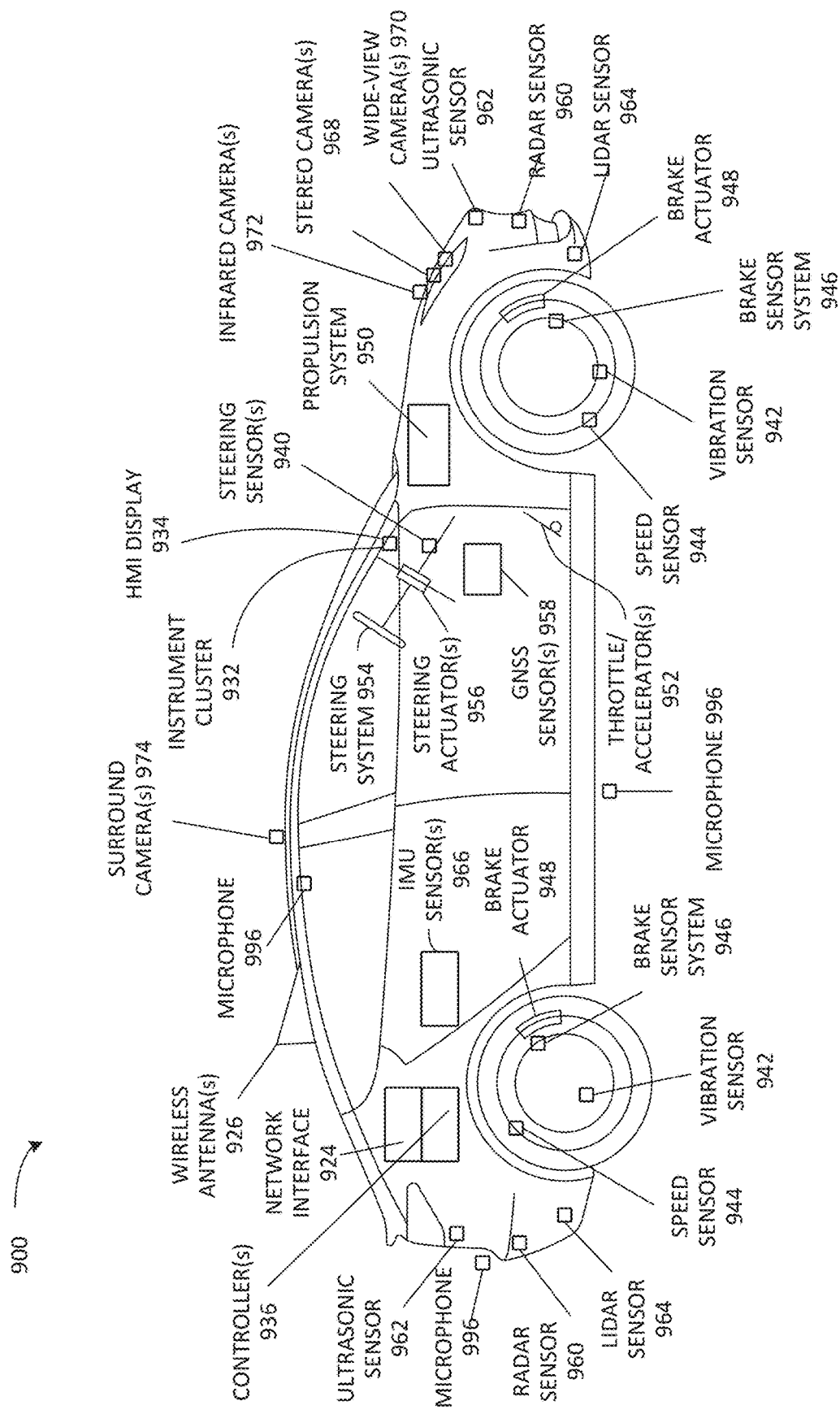
FIG. 9A illustrates an example of an autonomous vehicle, according to at least one embodiment.

FIG. 9A illustrates an example of an autonomous vehicle 900, according to at least one embodiment. In at least one embodiment, autonomous vehicle 900 (alternatively referred to herein as "vehicle 900") may be, without limitation, a passenger vehicle, such as a car, a truck, a bus, and/or another type of vehicle that accommodates one or more passengers. In at least one embodiment, vehicle 900 may be a semi-tractor-trailer truck used for hauling cargo. In at least one embodiment, vehicle 900 may be an airplane, robotic vehicle, or other kind of vehicle.

Autonomous vehicles may be described in terms of automation levels, defined by the National Highway Traffic Safety Administration ("NHTSA"), a division of the US Department of Transportation, and the Society of Automotive Engineers ("SAE") "Taxonomy and Definitions for Terms Related to Driving Automation Systems for On-Road Motor Vehicles" (e.g., Standard No. J3016-201806, published on Jun. 15, 2018, Standard No. J3016-201609, published on Sep. 30, 2016, and previous and future versions of this standard). In at least one embodiment, a vehicle 900 may be capable of functionality in accordance with one or more of level 1-level 5 of autonomous driving levels. For example, in at least one embodiment, a vehicle 900 may be capable of conditional automation (Level 3), high automation (Level 4), and/or full automation (Level 5), depending on an embodiment.

In at least one embodiment, a vehicle 900 may include, without limitation, components such as a chassis, a vehicle body, wheels (e.g., 2, 4, 6, 8, 18, etc.), tires, axles, and other components of a vehicle. In at least one embodiment, a vehicle 900 may include, without limitation, a propulsion system 950, such as an internal combustion engine, a hybrid electric power plant, an all-electric engine, and/or another propulsion system type. In at least one embodiment, a propulsion system 950 may be connected to a drive train of a vehicle 900, which may include, without limitation, a transmission, to enable propulsion of a vehicle 900. In at least one embodiment, a propulsion system 950 may be controlled in response to receiving signals from one or more throttle/accelerator(s) 952.

In at least one embodiment, a steering system 954, which may include, without limitation, a steering wheel, is used to steer a vehicle 900 (e.g., along a desired path or route) when a propulsion system 950 is operating (e.g., when a vehicle is in motion). In at least one embodiment, a steering system 954 may receive signals from steering actuator(s) 956. In at least one embodiment, a steering wheel is not required with full automation (Level 5) functionality. In at least one embodiment, a brake sensor system 946 may be used to operate vehicle brakes in response to receiving signals from brake actuator(s) 948 and/or brake sensors.

In at least one embodiment, controller(s) 936, which may include, without limitation, one or more system on chips ("SoCs") (not shown in FIG. 9A) and/or graphics processing unit(s) ("GPU(s)"), provide signals (e.g., representative of commands) to one or more components and/or systems of vehicle 900. For instance, in at least one embodiment, controller(s) 936 may send signals to operate vehicle brakes via brake actuators 948, to operate a steering system 954 via steering actuator(s) 956, to operate a propulsion system 950 via throttle/accelerator(s) 952. In at least one embodiment, controller(s) 936 may include one or more onboard (e.g., integrated) computing devices (e.g., supercomputers) that process sensor signals, and output operation commands (e.g., signals representing commands) to enable autonomous driving and/or to assist a human driver in driving a vehicle 900. In at least one embodiment, controller(s) 936 may include a first controller 936 for autonomous driving functions, a second controller 936 for functional safety functions, a third controller 936 for artificial intelligence functionality (e.g., computer vision), a fourth controller 936 for infotainment functionality, a fifth controller 936 for redundancy in emergency conditions, and/or other controllers. In at least one embodiment, a single controller 936 may handle two or more functionalities described above, two or more controllers 936 may handle a single functionality, and/or any combination thereof.

In at least one embodiment, controller(s) 936 provide signals for controlling one or more components and/or systems of a vehicle 900 in response to sensor data received from one or more sensors (e.g., sensor inputs). In at least one embodiment, sensor data may be received from, for example and without limitation, global navigation satellite systems ("GNSS") sensor(s) 958 (e.g., Global Positioning System sensor(s)), RADAR sensor(s) 960, ultrasonic sensor(s) 962, LIDAR sensor(s) 964, inertial measurement unit ("IMU") sensor(s) 966 (e.g., accelerometer(s), gyroscope(s), magnetic compass(es), magnetometer(s), etc.), microphone(s) 996, stereo camera(s) 968, wide-view camera(s) 970 (e.g., fisheye cameras), infrared camera(s) 972, surround camera(s) 974 (e.g., 360 degree cameras), long-range cameras (not shown in FIG. 9A), mid-range camera(s) (not shown in FIG. 9A), speed sensor(s) 944 (e.g., for measuring speed of vehicle 900), vibration sensor(s) 942, steering sensor(s) 940, brake sensor(s) (e.g., as part of a brake sensor system 946), and/or other sensor types.

In at least one embodiment, one or more controller(s) 936 may receive inputs (e.g., represented by input data) from an instrument cluster 932 of a vehicle 900 and provide outputs (e.g., represented by output data, display data, etc.) via a human-machine interface ("HMI") display 934, an audible annunciator, a loudspeaker, and/or via other components of a vehicle 900. In at least one embodiment, outputs may include information such as vehicle velocity, speed, time, map data (e.g., a High Definition map (not shown in FIG. 9A), location data (e.g., vehicle's 900 location, such as on a map), direction, location of other vehicles (e.g., an occupancy grid), information about objects and status of objects as perceived by controller(s) 936, etc. For example, in at least one embodiment, HMI display 934 may display information about presence of one or more objects (e.g., a street sign, caution sign, traffic light changing, etc.), and/or information about driving maneuvers a vehicle has made, is making, or will make (e.g., changing lanes now, taking exit 34B in two miles, etc.).

In at least one embodiment, a vehicle 900 further includes a network interface 924 which may use wireless antenna(s) 926 and/or modem(s) to communicate over one or more networks. For example, in at least one embodiment, network interface 924 may be capable of communication over Long-Term Evolution ("LTE"), Wideband Code Division Multiple Access ("WCDMA"), Universal Mobile Telecommunications System ("UMTS"), Global System for Mobile communication ("GSM"), IMT-CDMA Multi-Carrier ("CDMA2000"), etc. In at least one embodiment, wireless antenna(s) 926 may also enable communication between objects in an environment (e.g., vehicles, mobile devices, etc.), using local area network(s), such as Bluetooth, Bluetooth Low Energy ("LE"), Z-Wave, ZigBee, etc., and/or low power wide-area network(s) ("LPWANs"), such as LoRaWAN, SigFox, etc.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in a system FIG. 9A for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 9A to perform CRC generation and/or checking.

Figure 9B:
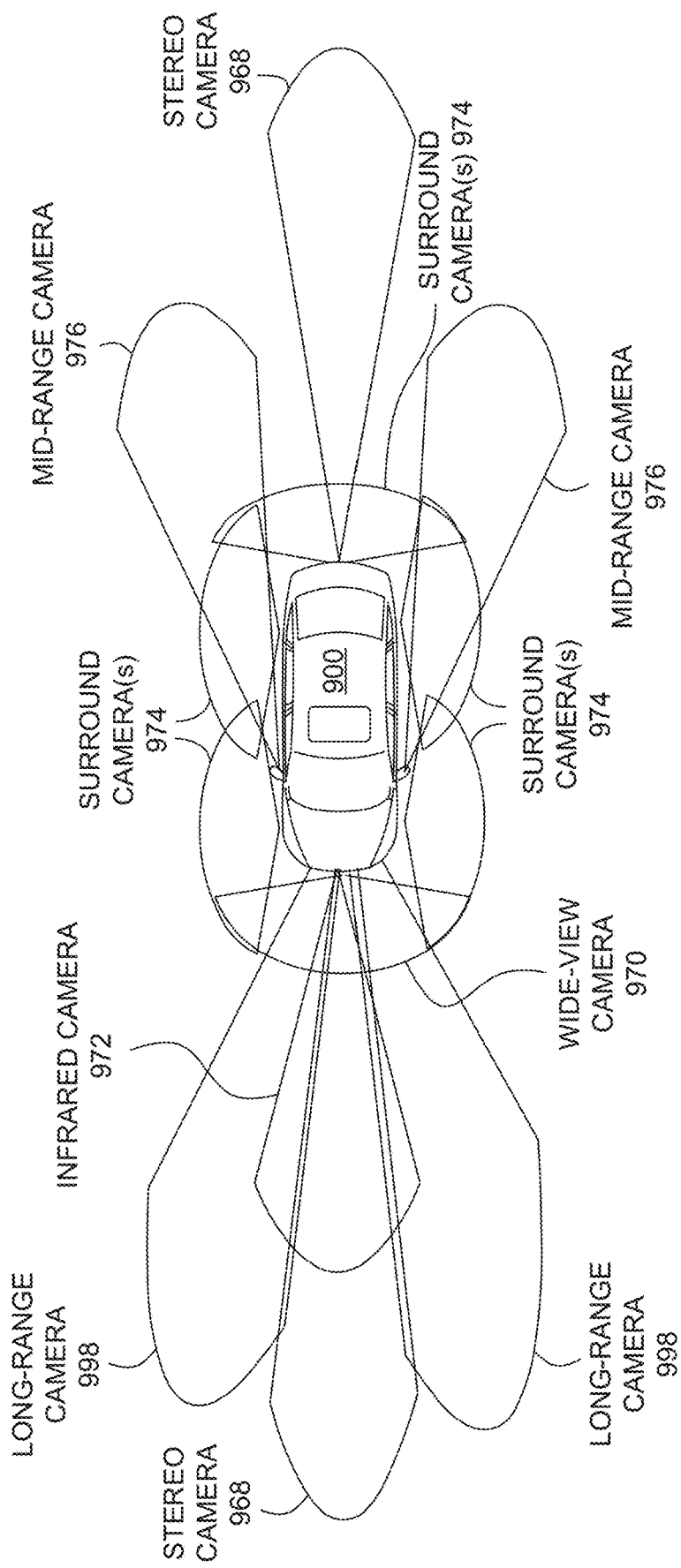
FIG. 9B illustrates an example of camera locations and fields of view for an autonomous vehicle of FIG. 9A, according to at least one embodiment.

FIG. 9B illustrates an example of camera locations and fields of view for an autonomous vehicle 900 of FIG. 9A, according to at least one embodiment. In at least one embodiment, cameras and respective fields of view are one example embodiment and are not intended to be limiting. For instance, in at least one embodiment, additional and/or alternative cameras may be included and/or cameras may be located at different locations on a vehicle 900.

In at least one embodiment, camera types for cameras may include, but are not limited to, digital cameras that may be adapted for use with components and/or systems of a vehicle 900. Camera(s) may operate at automotive safety integrity level ("ASIL") B and/or at another ASIL. In at least one embodiment, camera types may be capable of any image capture rate, such as 60 frames per second (fps), 1220 fps, 240 fps, etc., depending on embodiment. In at least one embodiment, cameras may be capable of using rolling shutters, global shutters, another type of shutter, or a combination thereof. In at least one embodiment, a color filter array may include a red clear clear clear ("RCCC") color filter array, a red clear clear blue ("RCCB") color filter array, a red blue green clear ("RBGC") color filter array, a Foveon X3 color filter array, a Bayer sensors ("RGGB") color filter array, a monochrome sensor color filter array, and/or another type of color filter array. In at least one embodiment, clear pixel cameras, such as cameras with an RCCC, an RCCB, and/or an RBGC color filter array, may be used in an effort to increase light sensitivity.

In at least one embodiment, one or more camera(s) may be used to perform advanced driver assistance systems ("ADAS") functions (e.g., as part of a redundant or fail-safe design). For example, in at least one embodiment, a Multi-Function Mono Camera may be installed to provide functions including lane departure warning, traffic sign assist and intelligent headlamp control. In at least one embodiment, one or more camera(s) (e.g., all cameras) may record and provide image data (e.g., video) simultaneously.

In at least one embodiment, one or more cameras may be mounted in a mounting assembly, such as a custom designed (three-dimensional ("3D") printed) assembly, in order to cut out stray light and reflections from within a car (e.g., reflections from a dashboard reflected in windshield mirrors) which may interfere with a camera's image data capture abilities. With reference to wing-mirror mounting assemblies, in at least one embodiment, wing-mirror assemblies may be custom 3D printed so that a camera mounting plate matches shape of a wing-mirror. In at least one embodiment, camera(s) may be integrated into a wing-mirror. In at least one embodiment, for side-view cameras, camera(s) may also be integrated within four pillars at each corner of a cab.

In at least one embodiment, cameras with a field of view that includes portions of an environment in front of a vehicle 900 (e.g., front-facing cameras) may be used for surround view, to help identify forward facing paths and obstacles, as well as aid in, with help of one or more of controllers 936 and/or control SoCs, providing information critical to generating an occupancy grid and/or determining preferred vehicle paths. In at least one embodiment, front-facing cameras may be used to perform many of same ADAS functions as LIDAR, including, without limitation, emergency braking, pedestrian detection, and collision avoidance. In at least one embodiment, front-facing cameras may also be used for ADAS functions and systems including, without limitation, Lane Departure Warnings ("LDW"), Autonomous Cruise Control ("ACC"), and/or other functions such as traffic sign recognition.

In at least one embodiment, a variety of cameras may be used in a front-facing configuration, including, for example, a monocular camera platform that includes a CMOS ("complementary metal oxide semiconductor") color imager. In at least one embodiment, a wide-view camera 970 may be used to perceive objects coming into view from a periphery (e.g., pedestrians, crossing traffic or bicycles). Although only one wide-view camera 970 is illustrated in FIG. 9B, in at least one embodiment, there may be any number (including zero) of wide-view camera(s) 970 on a vehicle 900. In at least one embodiment, any number of long-range camera(s) 998 (e.g., a long-view stereo camera pair) may be used for depth-based object detection, especially for objects for which a neural network has not yet been trained. In at least one embodiment, long-range camera(s) 998 may also be used for object detection and classification, as well as basic object tracking.

In at least one embodiment, any number of stereo camera(s) 968 may also be included in a front-facing configuration. In at least one embodiment, one or more stereo camera(s) 968 may include an integrated control unit comprising a scalable processing unit, which may provide a programmable logic ("FPGA") and a multi-core microprocessor with an integrated Controller Area Network ("CAN") or Ethernet interface on a single chip. In at least one embodiment, such a unit may be used to generate a 3D map of an environment of a vehicle 900, including a distance estimate for all points in an image. In at least one embodiment, one or more of stereo camera(s) 968 may include, without limitation, compact stereo vision sensor(s) that may include, without limitation, two camera lenses (one each on left and right) and an image processing chip that may measure distance from a vehicle 900 to a target object and use generated information (e.g., metadata) to activate autonomous emergency braking and lane departure warning functions. In at least one embodiment, other types of stereo camera(s) 968 may be used in addition to, or alternatively from, those described herein.

In at least one embodiment, cameras with a field of view that includes portions of an environment to a side of a vehicle 900 (e.g., side-view cameras) may be used for a surround view, providing information used to create and update an occupancy grid, as well as to generate side impact collision warnings. For example, in at least one embodiment, surround camera(s) 974 (e.g., four surround cameras 974 as illustrated in FIG. 9B) could be positioned on vehicle 900. Surround camera(s) 974 may include, without limitation, any number and combination of wide-view camera(s) 970, fisheye camera(s), 360 degree camera(s), and/or like. For instance, in at least one embodiment, four fisheye cameras may be positioned on front, rear, and sides of a vehicle 900. In at least one embodiment, a vehicle 900 may use three surround camera(s) 974 (e.g., left, right, and rear), and may leverage one or more other camera(s) (e.g., a forward-facing camera) as a fourth surround-view camera.

In at least one embodiment, cameras with a field of view that includes portions of an environment to rear of a vehicle 900 (e.g., rear-view cameras) may be used for park assistance, surround view, rear collision warnings, and creating and updating an occupancy grid. In at least one embodiment, a wide variety of cameras may be used including, but not limited to, cameras that are also suitable as front-facing camera(s) (e.g., long-range cameras 998 and/or mid-range camera(s) 976, stereo camera(s) 968), infrared camera(s) 972, etc.), as described herein.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in a system FIG. 9B for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 9B to perform CRC generation and/or checking.

Figure 9C:
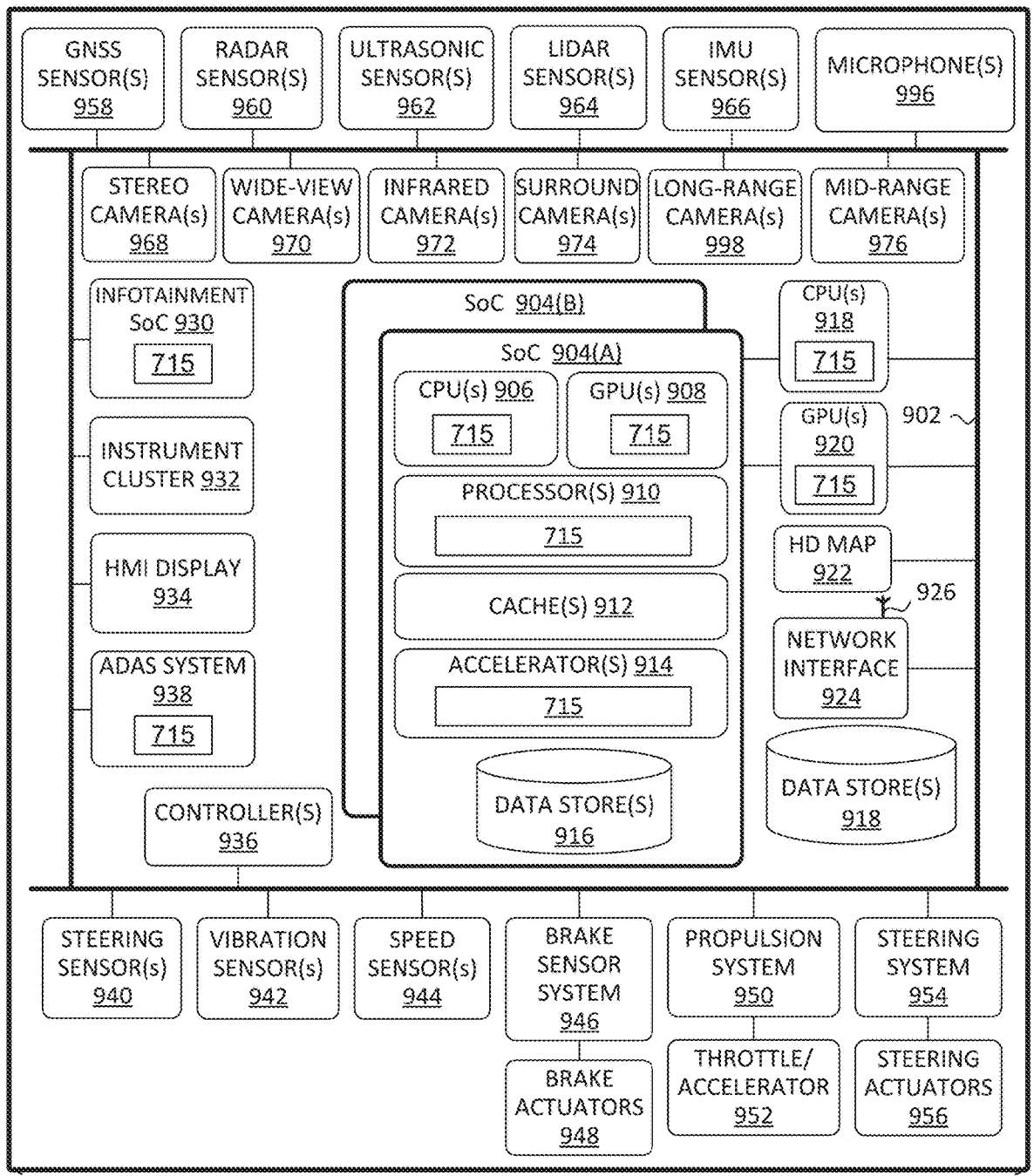
FIG. 9C is a block diagram illustrating an example system architecture for an autonomous vehicle of FIG. 9A, according to at least one embodiment.

FIG. 9C is a block diagram illustrating an example system architecture for an autonomous vehicle 900 of FIG. 9A, according to at least one embodiment. In at least one embodiment, each of components, features, and systems of a vehicle 900 in FIG. 9C are illustrated as being connected via a bus 902. In at least one embodiment, a bus 902 may include, without limitation, a CAN data interface (alternatively referred to herein as a "CAN bus"). In at least one embodiment, a CAN may be a network inside vehicle 900 used to aid in control of various features and functionality of a vehicle 900, such as actuation of brakes, acceleration, braking, steering, windshield wipers, etc. In at least one embodiment, a bus 902 may be configured to have dozens or even hundreds of nodes, each with its own unique identifier (e.g., a CAN ID). In at least one embodiment, a bus 902 may be read to find steering wheel angle, ground speed, engine revolutions per minute ("RPMs"), button positions, and/or other vehicle status indicators. In at least one embodiment, a bus 902 may be a CAN bus that is ASIL B compliant.

In at least one embodiment, in addition to, or alternatively from CAN, FlexRay and/or Ethernet may be used. In at least one embodiment, there may be any number of busses 902, which may include, without limitation, zero or more CAN busses, zero or more FlexRay busses, zero or more Ethernet busses, and/or zero or more other types of busses using a different protocol. In at least one embodiment, two or more busses 902 may be used to perform different functions, and/or may be used for redundancy. For example, in at least one embodiment, a first bus 902 may be used for collision avoidance functionality and a second bus 902 may be used for actuation control. In at least one embodiment, each bus 902 may communicate with any of components of vehicle 900, and two or more busses 902 may communicate with same components. In at least one embodiment, each of any number of system(s) on chip(s) ("SoC(s)") 904, each of controller(s) 936, and/or each computer within a vehicle may have access to same input data (e.g., inputs from sensors of a vehicle 900), and may be connected to a common bus, such as a CAN bus.

In at least one embodiment, a vehicle 900 may include one or more controller(s) 936, such as those described herein with respect to FIG. 9A. In at least one embodiment, controller(s) 936 may be used for a variety of functions. In at least one embodiment, controller(s) 936 may be coupled to any of various other components and systems of a vehicle 900, and may be used for control of a vehicle 900, artificial intelligence of a vehicle 900, infotainment for a vehicle 900, and/or like.

In at least one embodiment, a vehicle 900 may include any number of SoCs 904. In at least one embodiment, each of SoCs 904 may include, without limitation, central processing units ("CPU(s)") 906, graphics processing units ("GPU(s)") 908, processor(s) 910, cache(s) 912, accelerator(s) 914, data store(s) 916, and/or other components and features not illustrated. In at least one embodiment, SoC(s) 904 may be used to control a vehicle 900 in a variety of platforms and systems. For example, in at least one embodiment, SoC(s) 904 may be combined in a system (e.g., system of vehicle 900) with a High Definition ("HD") map 922 which may obtain map refreshes and/or updates via a network interface 924 from one or more servers (not shown in FIG. 9C).

In at least one embodiment, CPU(s) 906 may include a CPU cluster or CPU complex (alternatively referred to herein as a "CCPLEX"). In at least one embodiment, CPU(s) 906 may include multiple cores and/or level two ("L2") caches. For instance, in at least one embodiment, CPU(s) 906 may include eight cores in a coherent multi-processor configuration. In at least one embodiment, CPU(s) 906 may include four dual-core clusters where each cluster has a dedicated L2 cache (e.g., a 2 MB L2 cache). In at least one embodiment, CPU(s) 906 (e.g., CCPLEX) may be configured to support simultaneous cluster operation enabling any combination of clusters of CPU(s) 906 to be active at any given time.

In at least one embodiment, one or more of CPU(s) 906 may implement power management capabilities that include, without limitation, one or more of following features: individual hardware blocks may be clock-gated automatically when idle to save dynamic power; each core clock may be gated when a core is not actively executing instructions due to execution of Wait for Interrupt ("WFI")/Wait for Event ("WFE") instructions; each core may be independently power-gated; each core cluster may be independently clock-gated when all cores are clock-gated or power-gated; and/or each core cluster may be independently power-gated when all cores are power-gated. In at least one embodiment, CPU(s) 906 may further implement an enhanced algorithm for managing power states, where allowed power states and expected wakeup times are specified, and hardware/microcode determines best power state to enter for core, cluster, and CCPLEX. In at least one embodiment, processing cores may support simplified power state entry sequences in software with work offloaded to microcode.

In at least one embodiment, GPU(s) 908 may include an integrated GPU (alternatively referred to herein as an "iGPU"). In at least one embodiment, GPU(s) 908 may be programmable and may be efficient for parallel workloads. In at least one embodiment, GPU(s) 908 may use an enhanced tensor instruction set. In at least one embodiment, GPU(s) 908 may include one or more streaming microprocessors, where each streaming microprocessor may include a level one ("L1") cache (e.g., an L1 cache with at least 96 KB storage capacity), and two or more of streaming microprocessors may share an L2 cache (e.g., an L2 cache with a 512 KB storage capacity). In at least one embodiment, GPU(s) 908 may include at least eight streaming microprocessors. In at least one embodiment, GPU(s) 908 may use compute application programming interface(s) (API(s)). In at least one embodiment, GPU(s) 908 may use one or more parallel computing platforms and/or programming models (e.g., NVIDIA's CUDA).

In at least one embodiment, one or more of GPU(s) 908 may be power-optimized for best performance in automotive and embedded use cases. For example, in at least one embodiment, GPU(s) 908 could be fabricated on a Fin field-effect transistor ("FinFET"). In at least one embodiment, each streaming microprocessor may incorporate a number of mixed-precision processing cores partitioned into multiple blocks. For example, and without limitation, 64 PF32 cores and 32 PF64 cores could be partitioned into four processing blocks. In at least one embodiment, each processing block could be allocated 16 FP32 cores, 8 FP64 cores, 16 INT32 cores, two mixed-precision NVIDIA TENSOR COREs for deep learning matrix arithmetic, a level zero ("L0") instruction cache, a warp scheduler, a dispatch unit, and/or a 64 KB register file. In at least one embodiment, streaming microprocessors may include independent parallel integer and floating-point data paths to provide for efficient execution of workloads with a mix of computation and addressing calculations. In at least one embodiment, streaming microprocessors may include independent thread scheduling capability to enable finer-grain synchronization and cooperation between parallel threads. In at least one embodiment, streaming microprocessors may include a combined L1 data cache and shared memory unit in order to improve performance while simplifying programming.

In at least one embodiment, one or more of GPU(s) 908 may include a high bandwidth memory ("HBM") and/or a 16 GB HBM2 memory subsystem to provide, in some examples, about 900 GB/second peak memory bandwidth. In at least one embodiment, in addition to, or alternatively from, HBM memory, a synchronous graphics random-access memory ("SGRAM") may be used, such as a graphics double data rate type five synchronous random-access memory ("GDDR5").

In at least one embodiment, GPU(s) 908 may include unified memory technology. In at least one embodiment, address translation services ("ATS") support may be used to allow GPU(s) 908 to access CPU(s) 906 page tables directly. In at least one embodiment, when GPU(s) 908 memory management unit ("MMU") experiences a miss, an address translation request may be transmitted to CPU(s) 906. In response, CPU(s) 906 may look in its page tables for virtual-to-physical mapping for address and transmit translation back to GPU(s) 908, in at least one embodiment. In at least one embodiment, unified memory technology may allow a single unified virtual address space for memory of both CPU(s) 906 and GPU(s) 908, thereby simplifying GPU(s) 908 programming and porting of applications to GPU(s) 908.

In at least one embodiment, GPU(s) 908 may include any number of access counters that may keep track of frequency of access of GPU(s) 908 to memory of other processors. In at least one embodiment, access counter(s) may help ensure that memory pages are moved to physical memory of a processor that is accessing pages most frequently, thereby improving efficiency for memory ranges shared between processors.

In at least one embodiment, one or more of SoC(s) 904 may include any number of cache(s) 912, including those described herein. For example, in at least one embodiment, cache(s) 912 could include a level three ("L3") cache that is available to both CPU(s) 906 and GPU(s) 908 (e.g., that is connected to both CPU(s) 906 and GPU(s) 908). In at least one embodiment, cache(s) 912 may include a write-back cache that may keep track of states of lines, such as by using a cache coherence protocol (e.g., MEI, MESI, MSI, etc.). In at least one embodiment, an L3 cache may include 4 MB or more, depending on an embodiment, although smaller cache sizes may be used.

In at least one embodiment, one or more of SoC(s) 904 may include one or more accelerator(s) 914 (e.g., hardware accelerators, software accelerators, or a combination thereof). In at least one embodiment, SoC(s) 904 may include a hardware acceleration cluster that may include optimized hardware accelerators and/or large on-chip memory. In at least one embodiment, large on-chip memory (e.g., 4 MB of SRAM), may enable hardware acceleration cluster to accelerate neural networks and other calculations. In at least one embodiment, a hardware acceleration cluster may be used to complement GPU(s) 908 and to off-load some tasks of GPU(s) 908 (e.g., to free up more cycles of GPU(s) 908 for performing other tasks). In at least one embodiment, accelerator(s) 914 could be used for targeted workloads (e.g., perception, convolutional neural networks ("CNNs"), recurrent neural networks ("RNNs"), etc.) that are stable enough to be amenable to acceleration. In at least one embodiment, a CNN may include a region-based or regional convolutional neural networks ("RCNNs") and Fast RCNNs (e.g., as used for object detection) or other type of CNN.

In at least one embodiment, accelerator(s) 914 (e.g., hardware acceleration cluster) may include deep learning accelerator(s) ("DLA"). In at least one embodiment, DLA(s) may include, without limitation, one or more Tensor processing units ("TPUs") that may be configured to provide an additional ten trillion operations per second for deep learning applications and inferencing. In at least one embodiment, TPUs may be accelerators configured to, and optimized for, performing image processing functions (e.g., for CNNs, RCNNs, etc.). In at least one embodiment, DLA(s) may further be optimized for a specific set of neural network types and floating point operations, as well as inferencing. In at least one embodiment, design of DLA(s) may provide more performance per millimeter than a typical general-purpose GPU, and typically vastly exceeds performance of a CPU. In at least one embodiment, TPU(s) may perform several functions, including a single-instance convolution function, supporting, for example, INT8, INT16, and FP16 data types for both features and weights, as well as post-processor functions. In at least one embodiment, DLA(s) may quickly and efficiently execute neural networks, especially CNNs, on processed or unprocessed data for any of a variety of functions, including, for example and without limitation: a CNN for object identification and detection using data from camera sensors; a CNN for distance estimation using data from camera sensors; a CNN for emergency vehicle detection and identification and detection using data from microphones 996; a CNN for facial recognition and vehicle owner identification using data from camera sensors; and/or a CNN for security and/or safety related events.

In at least one embodiment, DLA(s) may perform any function of GPU(s) 908, and by using an inference accelerator, for example, a designer may target either DLA(s) or GPU(s) 908 for any function. For example, in at least one embodiment, a designer may focus processing of CNNs and floating point operations on DLA(s) and leave other functions to GPU(s) 908 and/or other accelerator(s) 914.

In at least one embodiment, accelerator(s) 914 (e.g., hardware acceleration cluster) may include a programmable vision accelerator(s) ("PVA"), which may alternatively be referred to herein as a computer vision accelerator. In at least one embodiment, PVA(s) may be designed and configured to accelerate computer vision algorithms for an advanced driver assistance system ("ADAS") 938, autonomous driving, augmented reality ("AR") applications, and/or virtual reality ("VR") applications. In at least one embodiment, PVA(s) may provide a balance between performance and flexibility. For example, in at least one embodiment, each PVA(s) may include, for example and without limitation, any number of reduced instruction set computer ("RISC") cores, direct memory access ("DMA"), and/or any number of vector processors.

In at least one embodiment, RISC cores may interact with image sensors (e.g., image sensors of any of cameras described herein), image signal processor(s), and/or like. In at least one embodiment, each RISC core may include any amount of memory. In at least one embodiment, RISC cores may use any of a number of protocols, depending on an embodiment. In at least one embodiment, RISC cores may execute a real-time operating system ("RTOS"). In at least one embodiment, RISC cores may be implemented using one or more integrated circuit devices, application specific integrated circuits ("ASICs"), and/or memory devices. For example, in at least one embodiment, RISC cores could include an instruction cache and/or a tightly coupled RAM.

In at least one embodiment, DMA may enable components of PVA(s) to access system memory independently of CPU(s) 906. In at least one embodiment, DMA may support any number of features used to provide optimization to a PVA including, but not limited to, supporting multi-dimensional addressing and/or circular addressing. In at least one embodiment, DMA may support up to six or more dimensions of addressing, which may include, without limitation, block width, block height, block depth, horizontal block stepping, vertical block stepping, and/or depth stepping.

In at least one embodiment, vector processors may be programmable processors that may be designed to efficiently and flexibly execute programming for computer vision algorithms and provide signal processing capabilities. In at least one embodiment, a PVA may include a PVA core and two vector processing subsystem partitions. In at least one embodiment, a PVA core may include a processor subsystem, DMA engine(s) (e.g., two DMA engines), and/or other peripherals. In at least one embodiment, a vector processing subsystem may operate as a primary processing engine of a PVA, and may include a vector processing unit ("VPU"), an instruction cache, and/or vector memory (e.g., "VMEM"). In at least one embodiment, a VPU core may include a digital signal processor such as, for example, a single instruction, multiple data ("SIMD"), a very long instruction word ("VLIW") digital signal processor. In at least one embodiment, a combination of SIMD and VLIW may enhance throughput and speed.

In at least one embodiment, each vector processor may include an instruction cache and may be coupled to a dedicated memory. As a result, in at least one embodiment, each vector processor may be configured to execute independently of other vector processors. In at least one embodiment, vector processors that are included in a particular PVA may be configured to employ data parallelism. For instance, in at least one embodiment, a plurality of vector processors included in a single PVA may execute same computer vision algorithm, but on different regions of an image. In at least one embodiment, vector processors included in a particular PVA may simultaneously execute different computer vision algorithms, on same image, or even execute different algorithms on sequential images or portions of an image. In at least one embodiment, among other things, any number of PVAs may be included in a hardware acceleration cluster and any number of vector processors may be included in each PVA. In at least one embodiment, PVA(s) may include additional error correcting code ("ECC") memory, to enhance overall system safety.

In at least one embodiment, accelerator(s) 914 (e.g., hardware acceleration cluster) may include a computer vision network on-chip and static random-access memory ("SRAM"), for providing high-bandwidth, low latency SRAM for accelerator(s) 914. In at least one embodiment, on-chip memory may include at least 4 MB SRAM, consisting of, for example and without limitation, eight field-configurable memory blocks, that may be accessible by both a PVA and DLA. In at least one embodiment, each pair of memory blocks may include an advanced peripheral bus ("APB") interface, configuration circuitry, a controller, and a multiplexer. In at least one embodiment, any type of memory may be used. In at least one embodiment, a PVA and DLA may access memory via a backbone that provides a PVA and DLA with high-speed access to memory. In at least one embodiment, a backbone may include a computer vision network on-chip that interconnects a PVA and DLA to memory (e.g., using APB).

In at least one embodiment, a computer vision network on-chip may include an interface that determines, before transmission of any control signal/address/data, that both PVA and DLA provide ready and valid signals. In at least one embodiment, an interface may provide for separate phases and separate channels for transmitting control signals/addresses/data, as well as burst-type communications for continuous data transfer. In at least one embodiment, an interface may comply with International Organization for Standardization ("ISO") 26262 or International Electrotechnical Commission ("IEC") 61508 standards, although other standards and protocols may be used.

In at least one embodiment, one or more of SoC(s) 904 may include a real-time ray-tracing hardware accelerator. In at least one embodiment, a real-time ray-tracing hardware accelerator may be used to quickly and efficiently determine positions and extents of objects (e.g., within a world model), to generate real-time visualization simulations, for RADAR signal interpretation, for sound propagation synthesis and/or analysis, for simulation of SONAR systems, for general wave propagation simulation, for comparison to LIDAR data for purposes of localization and/or other functions, and/or for other uses.

In at least one embodiment, accelerator(s) 914 (e.g., hardware accelerator cluster(s)) have a wide array of uses for autonomous driving. In at least one embodiment, a PVA may be a programmable vision accelerator that may be used for key processing stages in ADAS and autonomous vehicles. In at least one embodiment, a PVA's capabilities are a good match for algorithmic domains needing predictable processing, at low power and low latency. In other words, a PVA performs well on semi-dense or dense regular computation, even on small data sets, which need predictable run-times with low latency and low power. In at least one embodiment, autonomous vehicles, such as a vehicle 900, PVAs are designed to run classic computer vision algorithms, as they are efficient at object detection and operating on integer math.

For example, in at least one embodiment, a PVA is used to perform computer stereo vision. In at least one embodiment, a semi-global matching-based algorithm may be used in some examples, although this is not intended to be limiting. In at least one embodiment, applications for Levels 3-5 autonomous driving use motion estimation/stereo matching on-the-fly (e.g., structure from motion, pedestrian recognition, lane detection, etc.). In at least one embodiment, a PVA may perform computer stereo vision function on inputs from two monocular cameras.

In at least one embodiment, a PVA may be used to perform dense optical flow. For example, in at least one embodiment, a PVA could process raw RADAR data (e.g., using a 4D Fast Fourier Transform) to provide processed RADAR data. In at least one embodiment, a PVA is used for time of flight depth processing, by processing raw time of flight data to provide processed time of flight data, for example.

In at least one embodiment, a DLA may be used to run any type of network to enhance control and driving safety, including for example and without limitation, a neural network that outputs a measure of confidence for each object detection. In at least one embodiment, confidence may be represented or interpreted as a probability, or as providing a relative "weight" of each detection compared to other detections. In at least one embodiment, confidence enables a system to make further decisions regarding which detections should be considered as true positive detections rather than false positive detections. For example, in at least one embodiment, a system may set a threshold value for confidence and consider only detections exceeding a threshold value as true positive detections. In at least one embodiment in which an automatic emergency braking ("AEB") system is used, false positive detections would cause a vehicle to automatically perform emergency braking, which is obviously undesirable. In at least one embodiment, highly confident detections may be considered as triggers for AEB. In at least one embodiment, a DLA may run a neural network for regressing confidence value. In at least one embodiment, a neural network may take as its input at least some subset of parameters, such as bounding box dimensions, a ground plane estimate obtained (e.g., from another subsystem), output from IMU sensor(s) 966 that correlates with vehicle 900 orientation, distance, 3D location estimates of object obtained from a neural network and/or other sensors (e.g., LIDAR sensor(s) 964 or RADAR sensor(s) 960), among others.

In at least one embodiment, one or more of SoC(s) 904 may include data store(s) 916 (e.g., memory). In at least one embodiment, data store(s) 916 may be on-chip memory of SoC(s) 904, which may store neural networks to be executed on GPU(s) 908 and/or DLA. In at least one embodiment, data store(s) 916 may be large enough in capacity to store multiple instances of neural networks for redundancy and safety. In at least one embodiment, data store(s) 912 may comprise L2 or L3 cache(s).

In at least one embodiment, one or more of SoC(s) 904 may include any number of processor(s) 910 (e.g., embedded processors). In at least one embodiment, processor(s) 910 may include a boot and power management processor that may be a dedicated processor and subsystem to handle boot power and management functions and related security enforcement. In at least one embodiment, boot and a power management processor may be a part of SoC(s) 904 boot sequence and may provide runtime power management services. In at least one embodiment, a boot power and management processor may provide clock and voltage programming, assistance in system low power state transitions, management of SoC(s) 904 thermals and temperature sensors, and/or management of SoC(s) 904 power states. In at least one embodiment, each temperature sensor may be implemented as a ring-oscillator whose output frequency is proportional to temperature, and SoC(s) 904 may use ring-oscillators to detect temperatures of CPU(s) 906, GPU(s) 908, and/or accelerator(s) 914. In at least one embodiment, if temperatures are determined to exceed a threshold, then a boot and power management processor may enter a temperature fault routine and put SoC(s) 904 into a lower power state and/or put vehicle 900 into a chauffeur to safe stop mode (e.g., bring a vehicle 900 to a safe stop).

In at least one embodiment, processor(s) 910 may further include a set of embedded processors that may serve as an audio processing engine. In at least one embodiment, an audio processing engine may be an audio subsystem that enables full hardware support for multi-channel audio over multiple interfaces, and a broad and flexible range of audio I/O interfaces. In at least one embodiment, an audio processing engine is a dedicated processor core with a digital signal processor with dedicated RAM.

In at least one embodiment, processor(s) 910 may further include an always-on processor engine that may provide necessary hardware features to support low power sensor management and wake use cases. In at least one embodiment, an always-on processor engine may include, without limitation, a processor core, a tightly coupled RAM, supporting peripherals (e.g., timers and interrupt controllers), various I/O controller peripherals, and routing logic.

In at least one embodiment, processor(s) 910 may further include a safety cluster engine that includes, without limitation, a dedicated processor subsystem to handle safety management for automotive applications. In at least one embodiment, a safety cluster engine may include, without limitation, two or more processor cores, a tightly coupled RAM, support peripherals (e.g., timers, an interrupt controller, etc.), and/or routing logic. In a safety mode, two or more cores may operate, in at least one embodiment, in a lockstep mode and function as a single core with comparison logic to detect any differences between their operations. In at least one embodiment, processor(s) 910 may further include a real-time camera engine that may include, without limitation, a dedicated processor subsystem for handling real-time camera management. In at least one embodiment, processor(s) 910 may further include a high-dynamic range signal processor that may include, without limitation, an image signal processor that is a hardware engine that is part of a camera processing pipeline.

In at least one embodiment, processor(s) 910 may include a video image compositor that may be a processing block (e.g., implemented on a microprocessor) that implements video post-processing functions needed by a video playback application to produce final image for a player window. In at least one embodiment, a video image compositor may perform lens distortion correction on wide-view camera(s) 970, surround camera(s) 974, and/or on in-cabin monitoring camera sensor(s). In at least one embodiment, in-cabin monitoring camera sensor(s) are preferably monitored by a neural network running on another instance of SoC 904, configured to identify in-cabin events and respond accordingly. In at least one embodiment, an in-cabin system may perform, without limitation, lip reading to activate cellular service and place a phone call, dictate emails, change a vehicle's destination, activate or change a vehicle's infotainment system and settings, or provide voice-activated web surfing. In at least one embodiment, certain functions are available to a driver when a vehicle is operating in an autonomous mode and are disabled otherwise.

In at least one embodiment, a video image compositor may include enhanced temporal noise reduction for both spatial and temporal noise reduction. For example, in at least one embodiment, where motion occurs in a video, noise reduction weights spatial information appropriately, decreasing weight of information provided by adjacent frames. In at least one embodiment, where an image or portion of an image does not include motion, temporal noise reduction performed by video image compositor may use information from previous image to reduce noise in current image.

In at least one embodiment, a video image compositor may also be configured to perform stereo rectification on input stereo lens frames. In at least one embodiment, a video image compositor may further be used for user interface composition when an operating system desktop is in use, and GPU(s) 908 are not required to continuously render new surfaces. In at least one embodiment, when GPU(s) 908 are powered on and active doing 3D rendering, a video image compositor may be used to offload GPU(s) 908 to improve performance and responsiveness.

In at least one embodiment, one or more of SoC(s) 904 may further include a mobile industry processor interface ("MIPI") camera serial interface for receiving video and input from cameras, a high-speed interface, and/or a video input block that may be used for camera and related pixel input functions. In at least one embodiment, one or more of SoC(s) 904 may further include input/output controller(s) that may be controlled by software and may be used for receiving I/O signals that are uncommitted to a specific role.

In at least one embodiment, one or more of SoC(s) 904 may further include a broad range of peripheral interfaces to enable communication with peripherals, audio encoders/decoders ("codecs"), power management, and/or other devices. SoC(s) 904 may be used to process data from cameras (e.g., connected over Gigabit Multimedia Serial Link and Ethernet), sensors (e.g., LIDAR sensor(s) 964, RADAR sensor(s) 960, etc. that may be connected over Ethernet), data from a bus 902 (e.g., speed of vehicle 900, steering wheel position, etc.), data from GNSS sensor(s) 958 (e.g., connected over Ethernet or CAN bus), etc. In at least one embodiment, one or more of SoC(s) 904 may further include dedicated high-performance mass storage controllers that may include their own DMA engines, and that may be used to free CPU(s) 906 from routine data management tasks.

In at least one embodiment, SoC(s) 904 may be an end-to-end platform with a flexible architecture that spans automation levels 3-5, thereby providing a comprehensive functional safety architecture that leverages and makes efficient use of computer vision and ADAS techniques for diversity and redundancy, provides a platform for a flexible, reliable driving software stack, along with deep learning tools. In at least one embodiment, SoC(s) 904 may be faster, more reliable, and even more energy-efficient and space-efficient than other systems. For example, in at least one embodiment, accelerator(s) 914, when combined with CPU(s) 906, GPU(s) 908, and data store(s) 916, may provide for a fast, efficient platform for levels 3-5 autonomous vehicles.

In at least one embodiment, computer vision algorithms may be executed on CPUs, which may be configured using high-level programming language, such as C programming language, to execute a wide variety of processing algorithms across a wide variety of visual data. However, in at least one embodiment, CPUs are oftentimes unable to meet performance requirements of many computer vision applications, such as those related to execution time and power consumption, for example. In at least one embodiment, many CPUs are unable to execute complex object detection algorithms in real-time, which is used in in-vehicle ADAS applications and in practical Levels 3-5 autonomous vehicles.

In at least one embodiment, multiple neural networks can be performed simultaneously and/or sequentially, and results to be combined together to enable Level 3-5 autonomous driving functionality. For example, in at least one embodiment, a CNN executing on DLA or discrete GPU (e.g., GPU(s) 920) may include text and word recognition, allowing a supercomputer to read and understand traffic signs, including signs for which a neural network has not been specifically trained. In at least one embodiment, a DLA may further include a neural network that is able to identify, interpret, and provide semantic understanding of a sign, and to pass that semantic understanding to path planning modules running on a CPU Complex.

In at least one embodiment, multiple neural networks may be run simultaneously, as for Level 3, 4, or 5 driving. For example, in at least one embodiment, a warning sign consisting of "Caution: flashing lights indicate icy conditions," along with an electric light, may be independently or collectively interpreted by several neural networks. In at least one embodiment, a sign itself may be identified as a traffic sign by a first deployed neural network (e.g., a neural network that has been trained), text "flashing lights indicate icy conditions" may be interpreted by a second deployed neural network, which informs a vehicle's path planning software (preferably executing on CPU Complex) that when flashing lights are detected, icy conditions exist. In at least one embodiment, flashing light may be identified by operating a third deployed neural network over multiple frames, informing a vehicle's path-planning software of presence (or absence) of flashing lights. In at least one embodiment, all three neural networks may run simultaneously, such as within DLA and/or on GPU(s) 908.

In at least one embodiment, a CNN for facial recognition and vehicle owner identification may use data from camera sensors to identify presence of an authorized driver and/or owner of vehicle 900. In at least one embodiment, an always-on sensor processing engine may be used to unlock a vehicle when an owner approaches a driver door and turns on lights, and, in security mode, to disable a vehicle when an owner leaves a vehicle. In this way, SoC(s) 904 provide for security against theft and/or carjacking.

In at least one embodiment, a CNN for emergency vehicle detection and identification may use data from microphones 996 to detect and identify emergency vehicle sirens. In at least one embodiment, SoC(s) 904 use a CNN for classifying environmental and urban sounds, as well as classifying visual data. In at least one embodiment, a CNN running on a DLA is trained to identify relative closing speed of emergency vehicle (e.g., by using Doppler effect). In at least one embodiment, a CNN may also be trained to identify emergency vehicles specific to local area in which a vehicle is operating, as identified by GNSS sensor(s) 958. In at least one embodiment, when operating in Europe, a CNN will seek to detect European sirens, and when in United States CNN will seek to identify only North American sirens. In at least one embodiment, once an emergency vehicle is detected, a control program may be used to execute an emergency vehicle safety routine, a slowing vehicle, pulling over to side of a road, parking a vehicle, and/or idling a vehicle, with assistance of ultrasonic sensor(s) 962, until an emergency vehicle(s) pass.

In at least one embodiment, vehicle 900 may include CPU(s) 918 (e.g., discrete CPU(s), or dCPU(s)), that may be coupled to SoC(s) 904 via a high-speed interconnect (e.g., PCIe). In at least one embodiment, CPU(s) 918 may include an X86 processor, for example. In at least one embodiment, CPU(s) 918 may be used to perform any of a variety of functions, including arbitrating potentially inconsistent results between ADAS sensors and SoC(s) 904, and/or monitoring status and health of controller(s) 936 and/or an infotainment system on a chip ("infotainment SoC") 930, for example.

In at least one embodiment, vehicle 900 may include GPU(s) 920 (e.g., discrete GPU(s), or dGPU(s)), that may be coupled to SoC(s) 904 via a high-speed interconnect (e.g., NVIDIA's NVLINK). In at least one embodiment, GPU(s) 920 may provide additional artificial intelligence functionality, such as by executing redundant and/or different neural networks, and may be used to train and/or update neural networks based at least in part on input (e.g., sensor data) from sensors of vehicle 900.

In at least one embodiment, vehicle 900 may further include network interface 924 which may include, without limitation, wireless antenna(s) 926 (e.g., one or more wireless antennas 926 for different communication protocols, such as a cellular antenna, a Bluetooth antenna, etc.). In at least one embodiment, network interface 924 may be used to enable wireless connectivity over Internet with cloud (e.g., with server(s) and/or other network devices), with other vehicles, and/or with computing devices (e.g., client devices of passengers). In at least one embodiment, to communicate with other vehicles, a direct link may be established between vehicle 90 and another vehicle and/or an indirect link may be established (e.g., across networks and over Internet). In at least one embodiment, direct links may be provided using a vehicle-to-vehicle communication link. In at least one embodiment, a vehicle-to-vehicle communication link provides vehicle 900 information about vehicles in proximity to vehicle 900 (e.g., vehicles in front of, on side of, and/or behind vehicle 900). In at least one embodiment, aforementioned functionality may be part of a cooperative adaptive cruise control functionality of vehicle 900.

In at least one embodiment, network interface 924 may include an SoC that provides modulation and demodulation functionality and enables controller(s) 936 to communicate over wireless networks. In at least one embodiment, network interface 924 may include a radio frequency front-end for up-conversion from baseband to radio frequency, and down-conversion from radio frequency to baseband. In at least one embodiment, frequency conversions may be performed in any technically feasible fashion. In at least one embodiment, for example, frequency conversions could be performed through well-known processes, and/or using super-heterodyne processes. In at least one embodiment, radio frequency front end functionality may be provided by a separate chip. In at least one embodiment, a network interface may include wireless functionality for communicating over LTE, WCDMA, UMTS, GSM, CDMA2000, Bluetooth, Bluetooth LE, Wi-Fi, Z-Wave, ZigBee, LoRaWAN, and/or other wireless protocols.

In at least one embodiment, vehicle 900 may further include data store(s) 928 which may include, without limitation, off-chip (e.g., off SoC(s) 904) storage. In at least one embodiment, data store(s) 928 may include, without limitation, one or more storage elements including RAM, SRAM, dynamic random-access memory ("DRAM"), video random-access memory ("VRAM"), Flash, hard disks, and/or other components and/or devices that may store at least one bit of data.

In at least one embodiment, vehicle 900 may further include GNSS sensor(s) 958 (e.g., GPS and/or assisted GPS sensors), to assist in mapping, perception, occupancy grid generation, and/or path planning functions. In at least one embodiment, any number of GNSS sensor(s) 958 may be used, including, for example and without limitation, a GPS using a USB connector with an Ethernet to Serial (e.g., RS-232) bridge.

In at least one embodiment, vehicle 900 may further include RADAR sensor(s) 960. In at least one embodiment, RADAR sensor(s) 960 may be used by vehicle 900 for long-range vehicle detection, even in darkness and/or severe weather conditions. In at least one embodiment, RADAR functional safety levels may be ASIL B. In at least one embodiment, RADAR sensor(s) 960 may use a CAN and/or a bus 902 (e.g., to transmit data generated by RADAR sensor(s) 960) for control and to access object tracking data, with access to Ethernet to access raw data in some examples. In at least one embodiment, wide variety of RADAR sensor types may be used. In at least one embodiment, for example, and without limitation, RADAR sensor(s) 960 may be suitable for front, rear, and side RADAR use. In at least one embodiment, one or more of RADAR sensors(s) 960 are Pulse Doppler RADAR sensor(s).

In at least one embodiment, RADAR sensor(s) 960 may include different configurations, such as long-range with narrow field of view, short-range with wide field of view, short-range side coverage, etc. In at least one embodiment, long-range RADAR may be used for adaptive cruise control functionality. In at least one embodiment, long-range RADAR systems may provide a broad field of view realized by two or more independent scans, such as within a 250 m range. In at least one embodiment, RADAR sensor(s) 960 may help in distinguishing between static and moving objects, and may be used by an ADAS system 938 for emergency brake assist and forward collision warning. In at least one embodiment, sensors 960($s$) included in a long-range RADAR system may include, without limitation, monostatic multimodal RADAR with multiple (e.g., six or more) fixed RADAR antennae and a high-speed CAN and FlexRay interface. In at least one embodiment, with six antennae, central four antennae may create a focused beam pattern, designed to record a vehicle's 900 surroundings at higher speeds with minimal interference from traffic in adjacent lanes. In at least one embodiment, other two antennae may expand a field of view, making it possible to quickly detect vehicles entering or leaving vehicle's 900 lane.

In at least one embodiment, mid-range RADAR systems may include, as an example, a range of up to 160 m (front) or 80 m (rear), and a field of view of up to 42 degrees (front) or 150 degrees (rear). In at least one embodiment, short-range RADAR systems may include, without limitation, any number of RADAR sensor(s) 960 designed to be installed at both ends of a rear bumper. In at least one embodiment, when installed at both ends of a rear bumper, in at least one embodiment, a RADAR sensor system may create two beams that constantly monitor blind spot in rear and next to vehicle. In at least one embodiment, short-range RADAR systems may be used in ADAS system 938 for blind spot detection and/or lane change assist.

In at least one embodiment, vehicle 900 may further include ultrasonic sensor(s) 962. In at least one embodiment, ultrasonic sensor(s) 962, which may be positioned at front, back, and/or sides of vehicle 900, may be used for park assist and/or to create and update an occupancy grid. In at least one embodiment, a wide variety of ultrasonic sensor(s) 962 may be used, and different ultrasonic sensor(s) 962 may be used for different ranges of detection (e.g., 2.5 m, 4 m). In at least one embodiment, ultrasonic sensor(s) 962 may operate at functional safety levels of ASIL B.

In at least one embodiment, vehicle 900 may include LIDAR sensor(s) 964. In at least one embodiment, LIDAR sensor(s) 964 may be used for object and pedestrian detection, emergency braking, collision avoidance, and/or other functions. In at least one embodiment, LIDAR sensor(s) 964 may be functional safety level ASIL B. In at least one embodiment, vehicle 900 may include multiple LIDAR sensors 964 (e.g., two, four, six, etc.) that may use Ethernet (e.g., to provide data to a Gigabit Ethernet switch).

In at least one embodiment, LIDAR sensor(s) 964 may be capable of providing a list of objects and their distances for a 360-degree field of view. In at least one embodiment, commercially available LIDAR sensor(s) 964 may have an advertised range of approximately 100 m, with an accuracy of 2 cm-3 cm, and with support for a 100 Mbps Ethernet connection, for example. In at least one embodiment, one or more non-protruding LIDAR sensors 964 may be used. In such an embodiment, LIDAR sensor(s) 964 may be implemented as a small device that may be embedded into front, rear, sides, and/or corners of vehicle 900. In at least one embodiment, LIDAR sensor(s) 964, in such an embodiment, may provide up to a 120-degree horizontal and 35-degree vertical field-of-view, with a 200 m range even for low-reflectivity objects. In at least one embodiment, front-mounted LIDAR sensor(s) 964 may be configured for a horizontal field of view between 45 degrees and 135 degrees.

In at least one embodiment, LIDAR technologies, such as 3D flash LIDAR, may also be used. In at least one embodiment, 3D Flash LIDAR uses a flash of a laser as a transmission source, to illuminate surroundings of vehicle 900 up to approximately 200 m. In at least one embodiment, a flash LIDAR unit includes, without limitation, a receptor, which records laser pulse transit time and reflected light on each pixel, which in turn corresponds to a range from vehicle 900 to objects. In at least one embodiment, flash LIDAR may allow for highly accurate and distortion-free images of surroundings to be generated with every laser flash. In at least one embodiment, four flash LIDAR sensors may be deployed, one at each side of vehicle 900. In at least one embodiment, 3D flash LIDAR systems include, without limitation, a solid-state 3D staring array LIDAR camera with no moving parts other than a fan (e.g., a non-scanning LIDAR device). In at least one embodiment, a flash LIDAR device may use a 5 nanosecond class I (eye-safe) laser pulse per frame and may capture reflected laser light in form of 3D range point clouds and co-registered intensity data.

In at least one embodiment, a vehicle may further include IMU sensor(s) 966. In at least one embodiment, IMU sensor(s) 966 may be located at a center of a rear axle of a vehicle 900, in at least one embodiment. In at least one embodiment, IMU sensor(s) 966 may include, for example and without limitation, accelerometer(s), magnetometer(s), gyroscope(s), magnetic compass(es), and/or other sensor types. In at least one embodiment, such as in six-axis applications, IMU sensor(s) 966 may include, without limitation, accelerometers and gyroscopes. In at least one embodiment, such as in nine-axis applications, IMU sensor(s) 966 may include, without limitation, accelerometers, gyroscopes, and magnetometers.

In at least one embodiment, IMU sensor(s) 966 may be implemented as a miniature, high performance GPS-Aided Inertial Navigation System ("GPS/INS") that combines micro-electro-mechanical systems ("MEMS") inertial sensors, a high-sensitivity GPS receiver, and advanced Kalman filtering algorithms to provide estimates of position, velocity, and attitude. In at least one embodiment, IMU sensor(s) 966 may enable vehicle 900 to estimate heading without requiring input from a magnetic sensor by directly observing and correlating changes in velocity from GPS to IMU sensor(s) 966. In at least one embodiment, IMU sensor(s) 966 and GNSS sensor(s) 958 may be combined in a single integrated unit.

In at least one embodiment, vehicle 900 may include microphone(s) 996 placed in and/or around vehicle 900. In at least one embodiment, microphone(s) 996 may be used for emergency vehicle detection and identification, among other things.

In at least one embodiment, vehicle 900 may further include any number of camera types, including stereo camera(s) 968, wide-view camera(s) 970, infrared camera(s) 972, surround camera(s) 974, long-range camera(s) 998, mid-range camera(s) 976, and/or other camera types. In at least one embodiment, cameras may be used to capture image data around an entire periphery of vehicle 900. In at least one embodiment, types of cameras used depends vehicle 900. In at least one embodiment, any combination of camera types may be used to provide necessary coverage around vehicle 900. In at least one embodiment, number of cameras may differ depending on embodiment. In at least one embodiment, for example, vehicle 900 could include six cameras, seven cameras, ten cameras, twelve cameras, or another number of cameras. In at least one embodiment, cameras may support, as an example and without limitation, Gigabit Multimedia Serial Link ("GMSL") and/or Gigabit Ethernet. In at least one embodiment, each of camera(s) is described with more detail previously herein with respect to FIG. 9A and FIG. 9B.

In at least one embodiment, vehicle 900 may further include vibration sensor(s) 942. In at least one embodiment, vibration sensor(s) 942 may measure vibrations of components of vehicle 900, such as axle(s). In at least one embodiment, for example, changes in vibrations may indicate a change in road surfaces. In at least one embodiment, when two or more vibration sensors 942 are used, differences between vibrations may be used to determine friction or slippage of road surface (e.g., when difference in vibration is between a power-driven axle and a freely rotating axle).

In at least one embodiment, vehicle 900 may include ADAS system 938. In at least one embodiment, ADAS system 938 may include, without limitation, an SoC. In at least one embodiment, ADAS system 938 may include, without limitation, any number and combination of an autonomous/adaptive/automatic cruise control ("ACC") system, a cooperative adaptive cruise control ("CACC") system, a forward crash warning ("FCW") system, an automatic emergency braking ("AEB") system, a lane departure warning ("LDW)" system, a lane keep assist ("LKA") system, a blind spot warning ("BSW") system, a rear cross-traffic warning ("RCTW") system, a collision warning ("CW") system, a lane centering ("LC") system, and/or other systems, features, and/or functionality.

In at least one embodiment, ACC system may use RADAR sensor(s) 960, LIDAR sensor(s) 964, and/or any number of camera(s). In at least one embodiment, an ACC system may include a longitudinal ACC system and/or a lateral ACC system. In at least one embodiment, a longitudinal ACC system monitors and controls distance to vehicle immediately ahead of vehicle 900 and automatically adjusts speed of vehicle 900 to maintain a safe distance from vehicles ahead. In at least one embodiment, lateral ACC system performs distance keeping, and advises vehicle 900 to change lanes when necessary. In at least one embodiment, a lateral ACC is related to other ADAS applications such as LC and CW.

In at least one embodiment, a CACC system uses information from other vehicles that may be received via network interface 924 and/or wireless antenna(s) 926 from other vehicles via a wireless link, or indirectly, over a network connection (e.g., over Internet). In at least one embodiment, direct links may be provided by a vehicle-to-vehicle ("V2V") communication link, while indirect links may be provided by an infrastructure-to-vehicle ("I2V") communication link. In general, V2V communication concept provides information about immediately preceding vehicles (e.g., vehicles immediately ahead of and in same lane as vehicle 900), while I2V communication concept provides information about traffic further ahead. In at least one embodiment, a CACC system may include either or both I2V and V2V information sources. In at least one embodiment, given information of vehicles ahead of vehicle 900, a CACC system may be more reliable and it has potential to improve traffic flow smoothness and reduce congestion on a road.

In at least one embodiment, FCW system is designed to alert a driver to a hazard, so that a driver may take corrective action. In at least one embodiment, a FCW system uses a front-facing camera and/or RADAR sensor(s) 960, coupled to a dedicated processor, DSP, FPGA, and/or ASIC, that is electrically coupled to driver feedback, such as a display, speaker, and/or vibrating component. In at least one embodiment, an FCW system may provide a warning, such as in form of a sound, visual warning, vibration and/or a quick brake pulse.

In at least one embodiment, an AEB system detects an impending forward collision with another vehicle or other object, and may automatically apply brakes if a driver does not take corrective action within a specified time or distance parameter. In at least one embodiment, an AEB system may use front-facing camera(s) and/or RADAR sensor(s) 960, coupled to a dedicated processor, DSP, FPGA, and/or ASIC. In at least one embodiment, when an AEB system detects a hazard, an AEB system typically first alerts a driver to take corrective action to avoid collision and, if a driver does not take corrective action, an AEB system may automatically apply brakes in an effort to prevent, or at least mitigate, impact of a predicted collision. In at least one embodiment, an AEB system, may include techniques such as dynamic brake support and/or crash imminent braking.

In at least one embodiment, an LDW system provides visual, audible, and/or tactile warnings, such as steering wheel or seat vibrations, to alert a driver when vehicle 900 crosses lane markings. In at least one embodiment, an LDW system does not activate when a driver indicates an intentional lane departure, by activating a turn signal. In at least one embodiment, an LDW system may use front-side facing cameras, coupled to a dedicated processor, DSP, FPGA, and/or ASIC, that is electrically coupled to driver feedback, such as a display, speaker, and/or vibrating component. In at least one embodiment, an LKA system is a variation of an LDW system. In at least one embodiment, an LKA system provides steering input or braking to correct a vehicle 900 if vehicle 900 starts to exit a lane.

In at least one embodiment, a BSW system detects and warns a driver of vehicles in an automobile's blind spot. In at least one embodiment, a BSW system may provide a visual, audible, and/or tactile alert to indicate that merging or changing lanes is unsafe. In at least one embodiment, a BSW system may provide an additional warning when a driver uses a turn signal. In at least one embodiment, a BSW system may use rear-side facing camera(s) and/or RADAR sensor(s) 960, coupled to a dedicated processor, DSP, FPGA, and/or ASIC, that is electrically coupled to driver feedback, such as a display, speaker, and/or vibrating component.

In at least one embodiment, an RCTW system may provide visual, audible, and/or tactile notification when an object is detected outside rear-camera range when vehicle 900 is backing up. In at least one embodiment, an RCTW system includes an AEB system to ensure that vehicle brakes are applied to avoid a crash. In at least one embodiment, an RCTW system may use one or more rear-facing RADAR sensor(s) 960, coupled to a dedicated processor, DSP, FPGA, and/or ASIC, that is electrically coupled to driver feedback, such as a display, speaker, and/or vibrating component.

In at least one embodiment, conventional ADAS systems may be prone to false positive results which may be annoying and distracting to a driver, but typically are not catastrophic, because conventional ADAS systems alert a driver and allow a driver to decide whether a safety condition truly exists and act accordingly. In at least one embodiment, vehicle 900 itself decides, in case of conflicting results, whether to heed a result from a primary computer or a secondary computer (e.g., first controller 936 or second controller 936). In at least one embodiment, for example, ADAS system 938 may be a backup and/or secondary computer for providing perception information to a backup computer rationality module. In at least one embodiment, a backup computer rationality monitor may run a redundant diverse software on hardware components to detect faults in perception and dynamic driving tasks. In at least one embodiment, outputs from ADAS system 938 may be provided to a supervisory MCU. In at least one embodiment, if outputs from a primary computer and secondary computer conflict, supervisory MCU determines how to reconcile a conflict to ensure safe operation.

In at least one embodiment, a primary computer may be configured to provide supervisory MCU with a confidence score, indicating a primary computer's confidence in a chosen result. In at least one embodiment, if a confidence score exceeds a threshold, a supervisory MCU may follow a primary computer's direction, regardless of whether a secondary computer provides a conflicting or inconsistent result. In at least one embodiment, where a confidence score does not meet a threshold, and where primary and secondary computers indicate different results (e.g., a conflict), a supervisory MCU may arbitrate between computers to determine appropriate outcome.

In at least one embodiment, a supervisory MCU may be configured to run neural network(s) that are trained and configured to determine, based at least in part on outputs from a primary computer and secondary computer, conditions under which a secondary computer provides false alarms. In at least one embodiment, neural network(s) in a supervisory MCU may learn when a secondary computer's output may be trusted, and when it cannot. In at least one embodiment, for example, when a secondary computer is a RADAR-based FCW system, a neural network(s) in a supervisory MCU may learn when an FCW system is identifying metallic objects that are not, in fact, hazards, such as a drainage grate or manhole cover that triggers an alarm. In at least one embodiment, when a secondary computer is a camera-based LDW system, a neural network in supervisory MCU may learn to override LDW when bicyclists or pedestrians are present and a lane departure is, in fact, safest maneuver. In at least one embodiment, a supervisory MCU may include at least one of a DLA or GPU suitable for running neural network(s) with associated memory. In at least one embodiment, a supervisory MCU may comprise and/or be included as a component of SoC(s) 904.

In at least one embodiment, an ADAS system 938 may include a secondary computer that performs ADAS functionality using traditional rules of computer vision. In at least one embodiment, a secondary computer may use classic computer vision rules (if-then), and presence of a neural network(s) in a supervisory MCU may improve reliability, safety and performance. For example, in at least one embodiment, diverse implementation and intentional non-identity makes overall system more fault-tolerant, especially to faults caused by software (or software-hardware interface) functionality. For example, in at least one embodiment, if there is a software bug or error in software running on a primary computer, and non-identical software code running on a secondary computer provides same overall result, then a supervisory MCU may have greater confidence that overall result is correct, and a bug in software or hardware on a primary computer is not causing a material error.

In at least one embodiment, an output of ADAS system 938 may be fed into a primary computer's perception block and/or a primary computer's dynamic driving task block. For example, in at least one embodiment, if ADAS system 938 indicates a forward crash warning due to an object immediately ahead, a perception block may use this information when identifying objects. In at least one embodiment, a secondary computer may have its own neural network which is trained and thus reduces risk of false positives, as described herein.

In at least one embodiment, vehicle 900 may further include infotainment SoC 930 (e.g., an in-vehicle infotainment system (IVI)). Although illustrated and described as an SoC, infotainment system 930, in at least one embodiment, may not be an SoC, and may include, without limitation, two or more discrete components. In at least one embodiment, infotainment SoC 930 may include, without limitation, a combination of hardware and software that may be used to provide audio (e.g., music, a personal digital assistant, navigational instructions, news, radio, etc.), video (e.g., TV, movies, streaming, etc.), phone (e.g., hands-free calling), network connectivity (e.g., LTE, WiFi, etc.), and/or information services (e.g., navigation systems, rear-parking assistance, a radio data system, vehicle related information such as fuel level, total distance covered, brake fuel level, oil level, door open/close, air filter information, etc.) to vehicle 900. For example, an infotainment SoC 930 could include radios, disk players, navigation systems, video players, USB and Bluetooth connectivity, carputers, in-car entertainment, WiFi, steering wheel audio controls, hands free voice control, a heads-up display ("HUD"), HMI display 934, a telematics device, a control panel (e.g., for controlling and/or interacting with various components, features, and/or systems), and/or other components. In at least one embodiment, an infotainment SoC 930 may further be used to provide information (e.g., visual and/or audible) to user(s) of a vehicle, such as information from an ADAS system 938, autonomous driving information such as planned vehicle maneuvers, trajectories, surrounding environment information (e.g., intersection information, vehicle information, road information, etc.), and/or other information.

In at least one embodiment, an infotainment SoC 930 may include any amount and type of GPU functionality. In at least one embodiment, an infotainment SoC 930 may communicate over a bus 902 (e.g., a CAN bus, Ethernet, etc.) with other devices, systems, and/or components of a vehicle 900. In at least one embodiment, an infotainment SoC 930 may be coupled to a supervisory MCU such that a GPU of infotainment system may perform some self-driving functions in event that primary controller(s) 936 (e.g., primary and/or backup computers of vehicle 900) fail. In at least one embodiment, an infotainment SoC 930 may put a vehicle 900 into a chauffeur to safe stop mode, as described herein.

In at least one embodiment, a vehicle 900 may further include an instrument cluster 932 (e.g., a digital dash, an electronic instrument cluster, a digital instrument panel, etc.). In at least one embodiment, an instrument cluster 932 may include, without limitation, a controller and/or supercomputer (e.g., a discrete controller or supercomputer). In at least one embodiment, an instrument cluster 932 may include, without limitation, any number and combination of a set of instrumentation such as a speedometer, fuel level, oil pressure, tachometer, odometer, turn indicators, gearshift position indicator, seat belt warning light(s), parking-brake warning light(s), engine-malfunction light(s), supplemental restraint system (e.g., airbag) information, lighting controls, safety system controls, navigation information, etc. In some examples, information may be displayed and/or shared among an infotainment SoC 930 and instrument cluster 932. In at least one embodiment, an instrument cluster 932 may be included as part of an infotainment SoC 930, or vice versa.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in system FIG. 9C for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 9C to perform CRC generation and/or checking.

Figure 9D:
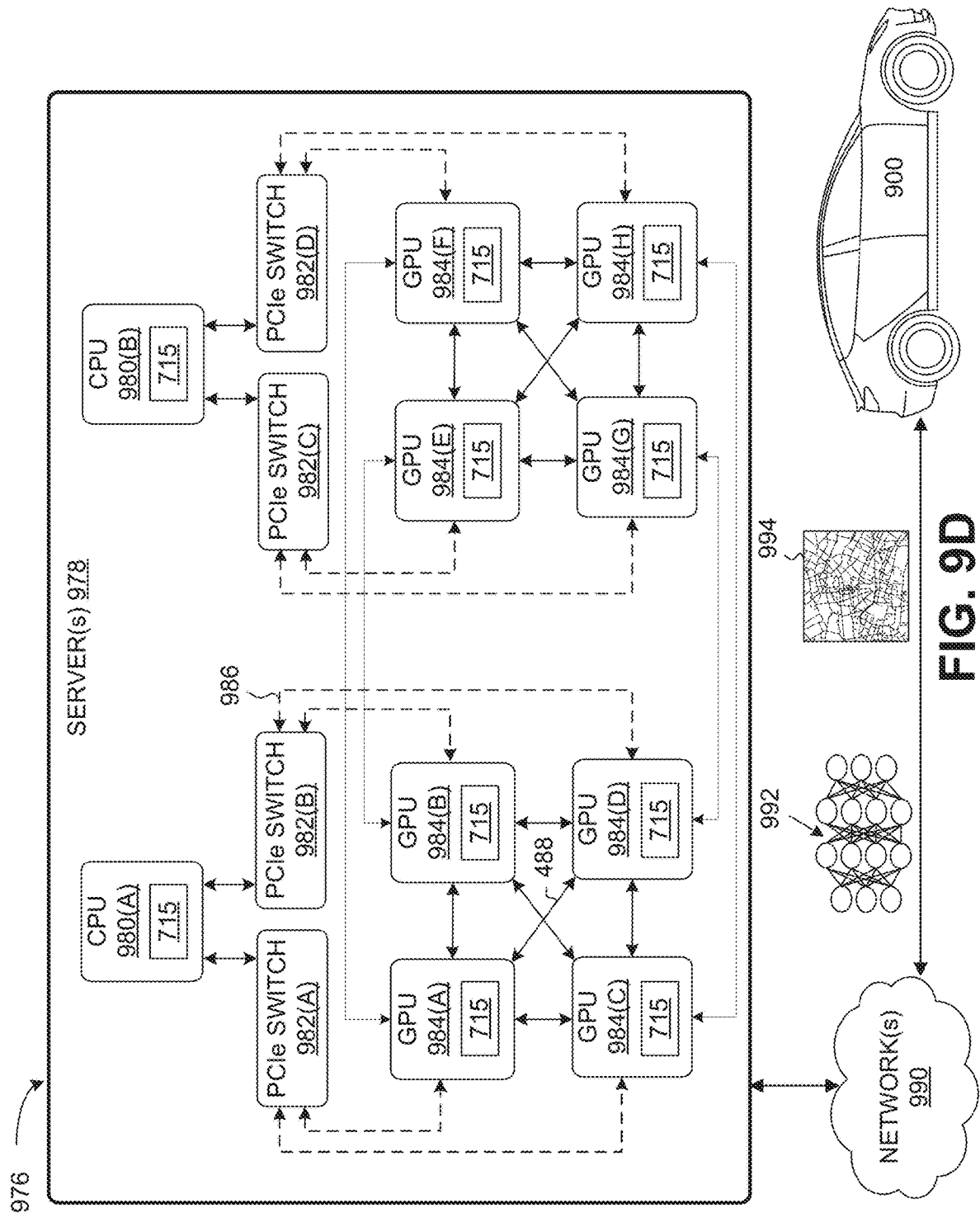
FIG. 9D is a diagram illustrating a system for communication between cloud-based server(s) and an autonomous vehicle of FIG. 9A, according to at least one embodiment.

FIG. 9D is a diagram of a system 976 for communication between cloud-based server(s) and an autonomous vehicle 900 of FIG. 9A, according to at least one embodiment. In at least one embodiment, a system 976 may include, without limitation, server(s) 978, network(s) 990, and any number and type of vehicles, including a vehicle 900. In at least one embodiment, server(s) 978 may include, without limitation, a plurality of GPUs 984(A)-984(H) (collectively referred to herein as GPUs 984), PCIe switches 982(A)-982(H) (collectively referred to herein as PCIe switches 982), and/or CPUs 980(A)-980(B) (collectively referred to herein as CPUs 980). In at least one embodiment, GPUs 984, CPUs 980, and PCIe switches 982 may be interconnected with high-speed interconnects such as, for example and without limitation, NVLink interfaces 988 developed by NVIDIA and/or PCIe connections 986. In at least one embodiment, GPUs 984 are connected via an NVLink and/or NVSwitch SoC and GPUs 984 and PCIe switches 982 are connected via PCIe interconnects. In at least one embodiment, although eight GPUs 984, two CPUs 980, and four PCIe switches 982 are illustrated, this is not intended to be limiting. In at least one embodiment, each of server(s) 978 may include, without limitation, any number of GPUs 984, CPUs 980, and/or PCIe switches 982, in any combination. For example, in at least one embodiment, server(s) 978 could each include eight, sixteen, thirty-two, and/or more GPUs 984.

In at least one embodiment, server(s) 978 may receive, over network(s) 990 and from vehicles, image data representative of images showing unexpected or changed road conditions, such as recently commenced road-work. In at least one embodiment, server(s) 978 may transmit, over network(s) 990 and to vehicles, neural networks 992, updated neural networks 992, and/or map information 994, including, without limitation, information regarding traffic and road conditions. In at least one embodiment, updates to map information 994 may include, without limitation, updates for HD map 922, such as information regarding construction sites, potholes, detours, flooding, and/or other obstructions. In at least one embodiment, neural networks 992, updated neural networks 992, and/or map information 994 may have resulted from new training and/or experiences represented in data received from any number of vehicles in an environment, and/or based at least in part on training performed at a data center (e.g., using server(s) 978 and/or other servers).

In at least one embodiment, server(s) 978 may be used to train machine learning models (e.g., neural networks) based at least in part on training data. In at least one embodiment, training data may be generated by vehicles, and/or may be generated in a simulation (e.g., using a game engine). In at least one embodiment, any amount of training data is tagged (e.g., where an associated neural network benefits from supervised learning) and/or undergoes other pre-processing. In at least one embodiment, any amount of training data is not tagged and/or pre-processed (e.g., where an associated neural network does not require supervised learning). In at least one embodiment, once machine learning models are trained, machine learning models may be used by vehicles (e.g., transmitted to vehicles over network(s) 990, and/or machine learning models may be used by server(s) 978 to remotely monitor vehicles.

In at least one embodiment, server(s) 978 may receive data from vehicles and apply data to up-to-date real-time neural networks for real-time intelligent inferencing. In at least one embodiment, server(s) 978 may include deep-learning supercomputers and/or dedicated AI computers powered by GPU(s) 984, such as a DGX and DGX Station machines developed by NVIDIA. However, in at least one embodiment, server(s) 978 may include deep learning infrastructure that use CPU-powered data centers.

In at least one embodiment, a deep-learning infrastructure of server(s) 978 may be capable of fast, real-time inferencing, and may use that capability to evaluate and verify health of processors, software, and/or associated hardware in a vehicle 900. For example, in at least one embodiment, deep-learning infrastructure may receive periodic updates from a vehicle 900, such as a sequence of images and/or objects that a vehicle 900 has located in that sequence of images (e.g., via computer vision and/or other machine learning object classification techniques). In at least one embodiment, deep-learning infrastructure may run its own neural network to identify objects and compare them with objects identified by a vehicle 900 and, if results do not match and deep-learning infrastructure concludes that AI in a vehicle 900 is malfunctioning, then server(s) 978 may transmit a signal to a vehicle 900 instructing a fail-safe computer of a vehicle 900 to assume control, notify passengers, and complete a safe parking maneuver.

In at least one embodiment, server(s) 978 may include GPU(s) 984 and one or more programmable inference accelerators (e.g., NVIDIA's TensorRT 3). In at least one embodiment, a combination of GPU-powered servers and inference acceleration may make real-time responsiveness possible. In at least one embodiment, such as where performance is less critical, servers powered by CPUs, FPGAs, and other processors may be used for inferencing. In at least one embodiment, hardware structure(s) 715 are used to perform one or more embodiments. Details regarding hardware structure(s) 715 are provided herein in conjunction with FIGS. 7A and/or 7B.

Computer Systems

Figure 10:
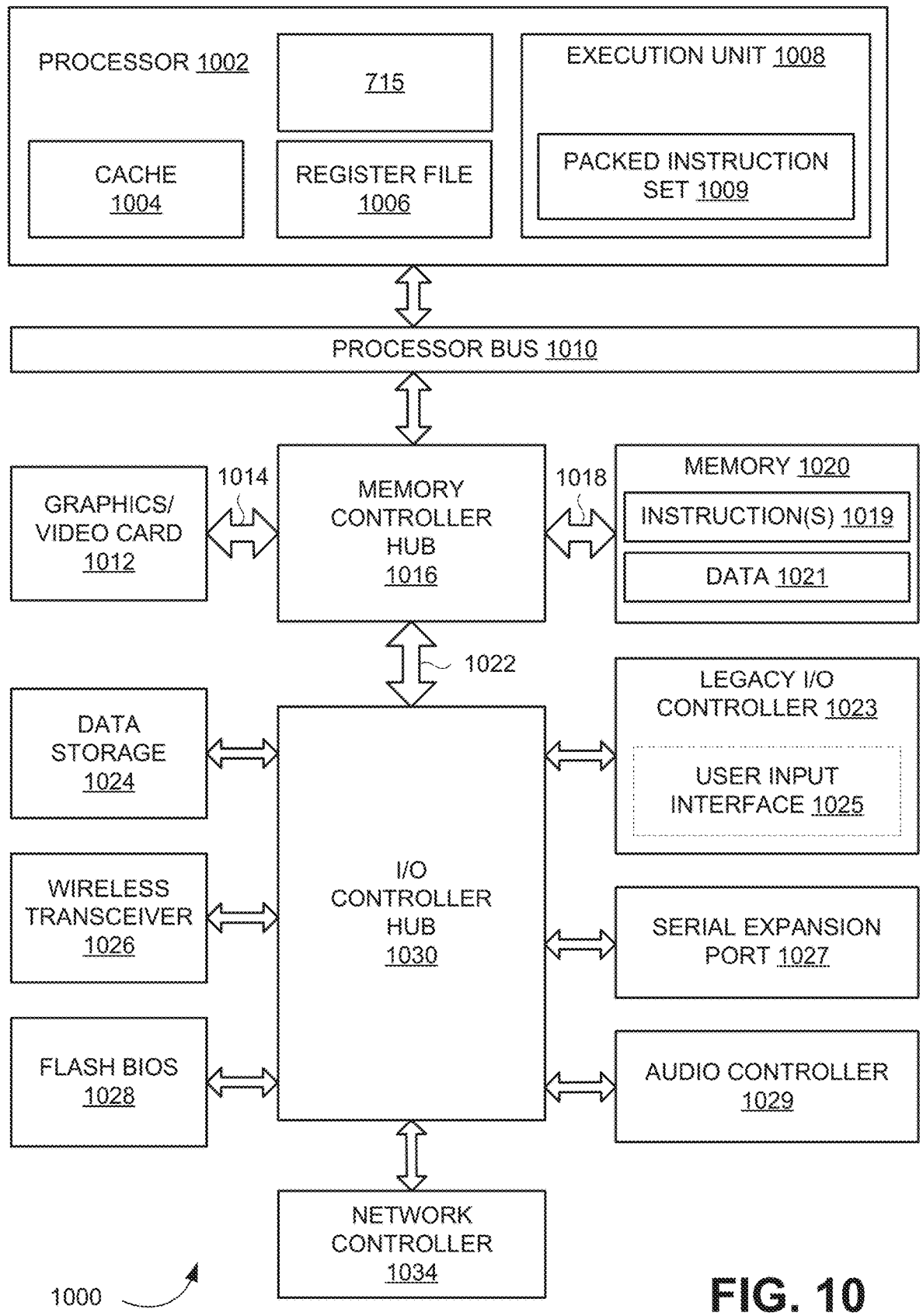
FIG. 10 is a block diagram illustrating a computer system, according to at least one embodiment.

FIG. 10 is a block diagram illustrating an exemplary computer system, which may be a system with interconnected devices and components, a system-on-a-chip (SOC) or some combination thereof 1000 formed with a processor that may include execution units to execute an instruction, according to at least one embodiment. In at least one embodiment, a computer system 1000 may include, without limitation, a component, such as a processor 1002 to employ execution units including logic to perform algorithms for process data, in accordance with present disclosure, such as in embodiment described herein. In at least one embodiment, computer system 1000 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, a computer system 1000 may execute a version of WINDOWS' operating system available from Microsoft Corporation of Redmond, Wash., although other operating systems (UNIX and Linux for example), embedded software, and/or graphical user interfaces, may also be used.

In at least one embodiment, features may be used in other devices such as handheld devices and embedded applications. In at least one embodiment, a handheld device might be a cellular phone, an Internet Protocol device, a digital camera, a personal digital assistant ("PDAs"), and/or a handheld PC. In at least one embodiment, embedded applications may include a microcontroller, a digital signal processor ("DSP"), system on a chip, network computers ("NetPCs"), set-top boxes, network hubs, wide area network ("WAN") switches, or any other system that may perform one or more instructions in accordance with at least one embodiment.

In at least one embodiment, a computer system 1000 may include, without limitation, a processor 1002 that may include, without limitation, one or more execution units 1008 to perform machine learning model training and/or inferencing according to techniques described herein. In at least one embodiment, a system 10 is a single processor desktop or server system, or system 10 may be a multiprocessor system. In at least one embodiment, a processor 1002 may include, without limitation, a complex instruction set computer ("CISC") microprocessor, a reduced instruction set computing ("RISC") microprocessor, a very long instruction word ("VLIW") microprocessor, a processor implementing a combination of instruction sets, or any other processor device, such as a digital signal processor, for example. In at least one embodiment, a processor 1002 may be coupled to a processor bus 1010 that may transmit data signals between a processor 1002 and other components in a computer system 1000.

In at least one embodiment, a processor 1002 may include, without limitation, a Level 1 ("L1") internal cache memory ("cache") 1004. In at least one embodiment, a processor 1002 may have a single internal cache or multiple levels of internal cache. In at least one embodiment, a cache memory may reside external to a processor 1002 and/or may include a combination of both internal and external caches depending on particular implementation and needs. In at least one embodiment, a register file 1006 may store different types of data in various registers including, without limitation, integer registers, floating point registers, status registers, and an instruction pointer register.

In at least one embodiment, an execution unit 1008, including, without limitation, logic to perform integer and floating point operations, also resides in processor 1002. In at least one embodiment, a processor 1002 may also include a microcode ("ucode") read only memory ("ROM") that stores microcode for certain macro instructions. In at least one embodiment, an execution unit 1008 may include logic to handle a packed instruction set 1009. In at least one embodiment, by including a packed instruction set 1009 in an instruction set of a general-purpose processor 1002, along with associated circuitry to execute instructions, operations used by many multimedia applications may be performed using packed data in a general-purpose processor 1002. In at least one embodiment, many multimedia applications may be accelerated and executed more efficiently by using full width of a processor's data bus for performing operations on packed data, which may eliminate need to transfer smaller units of data across a processor's data bus to perform one or more operations one data element at a time.

In at least one embodiment, an execution unit 1008 may also be used in microcontrollers, embedded processors, graphics devices, DSPs, and other types of logic circuits.

In at least one embodiment, a computer system 1000 may include, without limitation, a memory 1020. In at least one embodiment, a memory 1020 may be implemented as a Dynamic Random Access Memory ("DRAM") device, a Static Random Access Memory ("SRAM") device, a flash memory device, or other memory device. In at least one embodiment, a memory 1020 may store instruction(s) 1019 and/or data 1021 represented by data signals that may be executed by processor 1002.

In at least one embodiment, a system logic chip may be coupled to a processor bus 1010 and a memory 1020. In at least one embodiment, a system logic chip may include, without limitation, a memory controller hub ("MCH") 1016, and a processor 1002 may communicate with a MCH 1016 via processor bus 1010. In at least one embodiment, a MCH 1016 may provide a high bandwidth memory path 1018 to a memory 1020 for instruction and data storage and for storage of graphics commands, data and textures. In at least one embodiment, a MCH 1016 may direct data signals between a processor 1002, a memory 1020, and other components in a computer system 1000 and to bridge data signals between a processor bus 1010, a memory 1020, and a system I/O 1022. In at least one embodiment, a system logic chip may provide a graphics port for coupling to a graphics controller. In at least one embodiment, an MCH 1016 may be coupled to memory 1020 through a high bandwidth memory path 1018 and a graphics/video card 1012 may be coupled to an MCH 1016 through an Accelerated Graphics Port ("AGP") interconnect 1014.

In at least one embodiment, a computer system 1000 may use a system I/O 1022 that is a proprietary hub interface bus to couple an MCH 1016 to I/O controller hub ("ICH") 1030. In at least one embodiment, an ICH 1030 may provide direct connections to some I/O devices via a local I/O bus. In at least one embodiment, a local I/O bus may include, without limitation, a high-speed I/O bus for connecting peripherals to memory 1020, a chipset, and a processor 1002. In at least one embodiment, examples may include, without limitation, an audio controller 1029, a firmware hub ("flash BIOS") 1028, a wireless transceiver 1026, a data storage 1024, a legacy I/O controller 1023 containing user input 1023 and keyboard interfaces, a serial expansion port 1027, such as a Universal Serial Bus ("USB"), and a network controller 1034. In at least one embodiment, data storage 1024 may comprise a hard disk drive, a floppy disk drive, a CD-ROM device, a flash memory device, or other mass storage device.

FIG. 10 illustrates a system, which includes interconnected hardware devices or "chips," or may illustrate an exemplary System on a Chip ("SoC"). In at least one embodiment, devices illustrated in FIG. 10 may be interconnected with proprietary interconnects, standardized interconnects (e.g., PCIe) or some combination thereof. In at least one embodiment, one or more components of system 1000 are interconnected using compute express link (CXL) interconnects.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in system FIG. 10 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 10 to perform CRC generation and/or checking.

Figure 11:
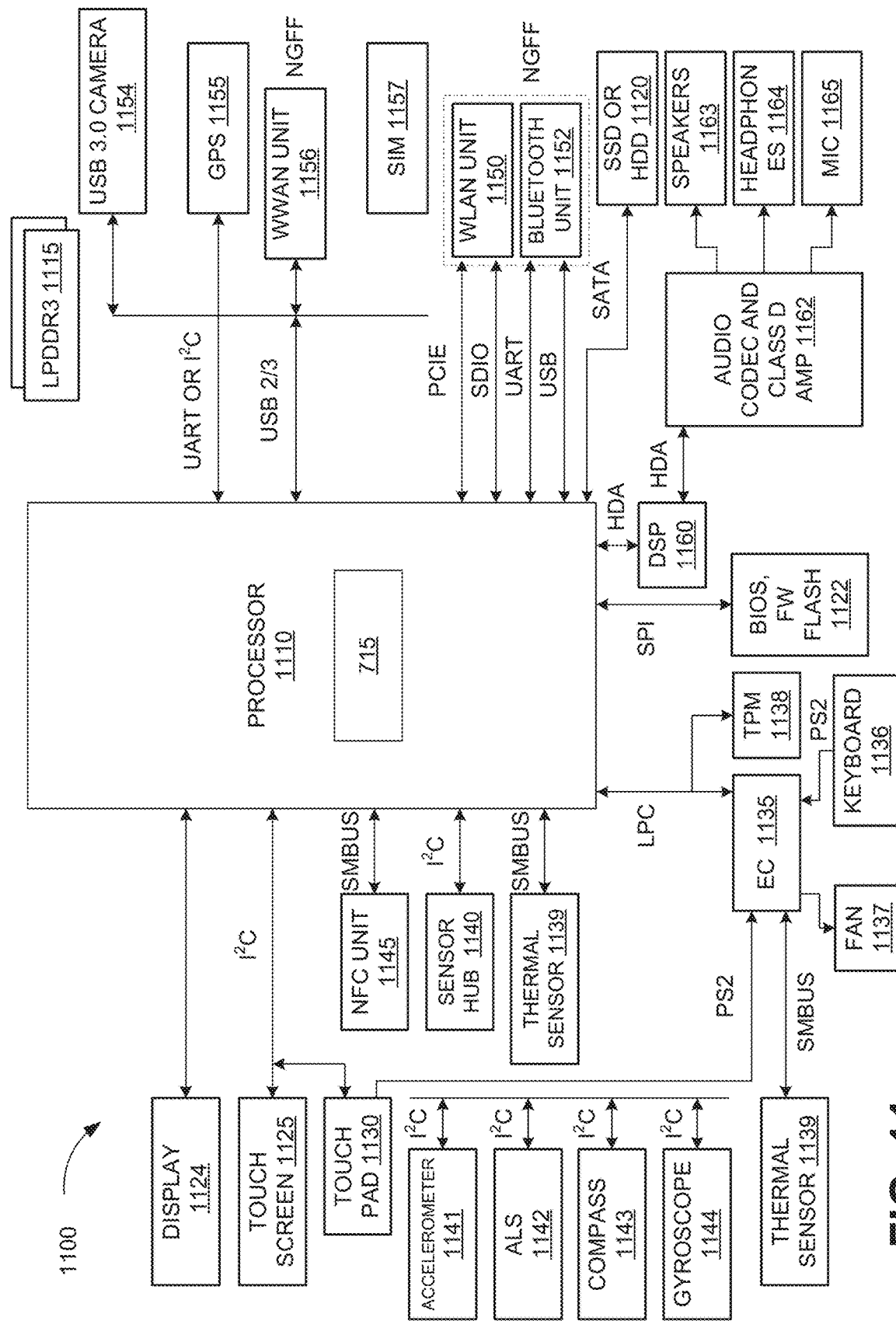
FIG. 11 is a block diagram illustrating computer system, according to at least one embodiment.

FIG. 11 is a block diagram illustrating an electronic device 1100 for utilizing a processor 1110, according to at least one embodiment. In at least one embodiment, an electronic device 1100 may be, for example and without limitation, a notebook, a tower server, a rack server, a blade server, a laptop, a desktop, a tablet, a mobile device, a phone, an embedded computer, or any other suitable electronic device.

In at least one embodiment, a system 1100 may include, without limitation, a processor 1110 communicatively coupled to any suitable number or kind of components, peripherals, modules, or devices. In at least one embodiment, a processor 1110 coupled using a bus or interface, such as a $I^2C$ bus, a System Management Bus ("SMBus"), a Low Pin Count (LPC) bus, a Serial Peripheral Interface ("SPI"), a High Definition Audio ("HDA") bus, a Serial Advance Technology Attachment ("SATA") bus, a Universal Serial Bus ("USB") (versions 1, 2, 3), or a Universal Asynchronous Receiver/Transmitter ("UART") bus.

FIG. 11 illustrates a system, which includes interconnected hardware devices or "chips", or may illustrate an exemplary System on a Chip ("SoC"). In at least one embodiment, devices illustrated in FIG. 11 may be interconnected with proprietary interconnects, standardized interconnects (e.g., PCIe) or some combination thereof. In at least one embodiment, one or more components of FIG. 11 are interconnected using compute express link (CXL) interconnects.

In at least one embodiment, FIG. 11 may include a display 1124, a touch screen 1125, a touch pad 1130, a Near Field Communications unit ("NFC") 1145, a sensor hub 1140, a thermal sensor 1146, an Express Chipset ("EC") 1135, a Trusted Platform Module ("TPM") 1138, BIOS/firmware/flash memory ("BIOS, FW Flash") 1122, a DSP 1160, a drive "SSD or HDD") 1120 such as a Solid State Disk ("SSD") or a Hard Disk Drive ("HDD"), a wireless local area network unit ("WLAN") 1150, a Bluetooth unit 1152, a Wireless Wide Area Network unit ("WWAN") 1156, a Global Positioning System (GPS) 1155, a camera ("USB 3.0 camera") 1154 such as a USB 3.0 camera, or a Low Power Double Data Rate ("LPDDR") memory unit ("LPDDR3") 1115 implemented in, for example, a LPDDR3 standard. These components may each be implemented in any suitable manner.

In at least one embodiment, other components may be communicatively coupled to a processor 1110 through components discussed above. In at least one embodiment, an accelerometer 1141, Ambient Light Sensor ("ALS") 1142, compass 1143, and a gyroscope 1144 may be communicatively coupled to a sensor hub 1140. In at least one embodiment, a thermal sensor 1139, a fan 1137, a keyboard 1146, and a touch pad 1130 may be communicatively coupled to an EC 1135. In at least one embodiment, a speaker 1163, headphones 1164, and a microphone ("mic") 1165 may be communicatively coupled to an audio unit ("audio codec and class d amp") 1164, which may in turn be communicatively coupled to a DSP 1160. In at least one embodiment, audio unit 1164 may include, for example and without limitation, an audio coder/decoder ("codec") and a class D amplifier. In at least one embodiment, a SIM card ("SIM") 1157 may be communicatively coupled to a WWAN unit 1156. In at least one embodiment, components such as a WLAN unit 1150 and a Bluetooth unit 1152, as well as a WWAN unit 1156 may be implemented in a Next Generation Form Factor ("NGFF").

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in a system FIG. 11 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 11 to perform CRC generation and/or checking.

Figure 12:
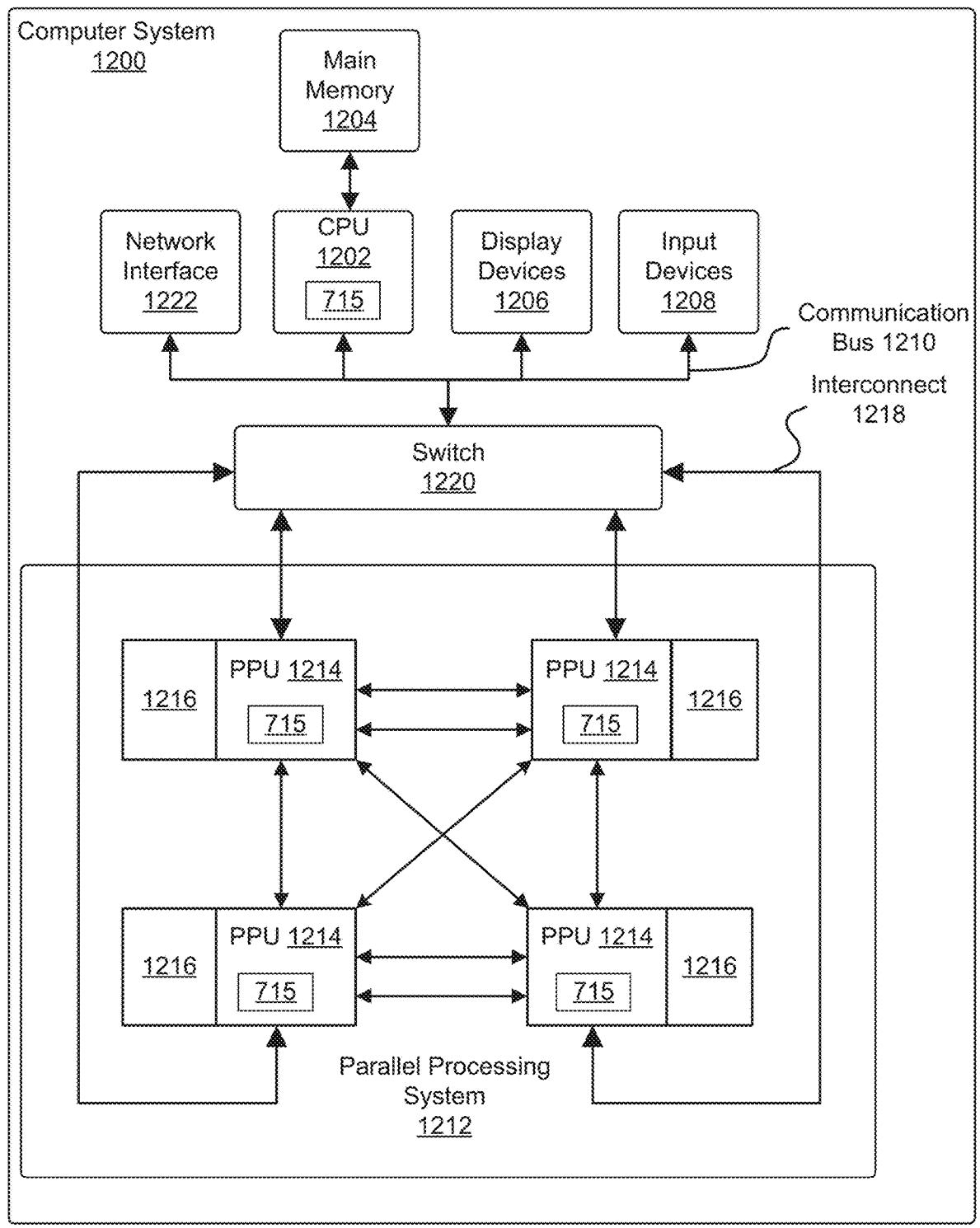
FIG. 12 illustrates a computer system, according to at least one embodiment.

FIG. 12 illustrates a computer system 1200, according to at least one embodiment. In at least one embodiment, a computer system 1200 is configured to implement various processes and methods described throughout this disclosure.

In at least one embodiment, a computer system 1200 comprises, without limitation, at least one central processing unit ("CPU") 1202 that is connected to a communication bus 1210 implemented using any suitable protocol, such as PCI ("Peripheral Component Interconnect"), peripheral component interconnect express ("PCI-Express"), AGP ("Accelerated Graphics Port"), HyperTransport, or any other bus or point-to-point communication protocol(s). In at least one embodiment, a computer system 1200 includes, without limitation, a main memory 1204 and control logic (e.g., implemented as hardware, software, or a combination thereof) and data are stored in a main memory 1204 which may take form of random access memory ("RAM"). In at least one embodiment, a network interface subsystem ("network interface") 1222 provides an interface to other computing devices and networks for receiving data from and transmitting data to other systems from a computer system 1200.

In at least one embodiment, a computer system 1200 includes, without limitation, input devices 1208, a parallel processing system 1212, and display devices 1206 which can be implemented using a cathode ray tube ("CRT"), liquid crystal display ("LCD"), light emitting diode ("LED"), plasma display, or other suitable display technologies. In at least one embodiment, user input is received from input devices 1208 such as a keyboard, mouse, touchpad, microphone, and more. In at least one embodiment, each of foregoing modules can be situated on a single semiconductor platform to form a processing system.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in a system FIG. 12 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 12 to perform CRC generation and/or checking.

Figure 13:
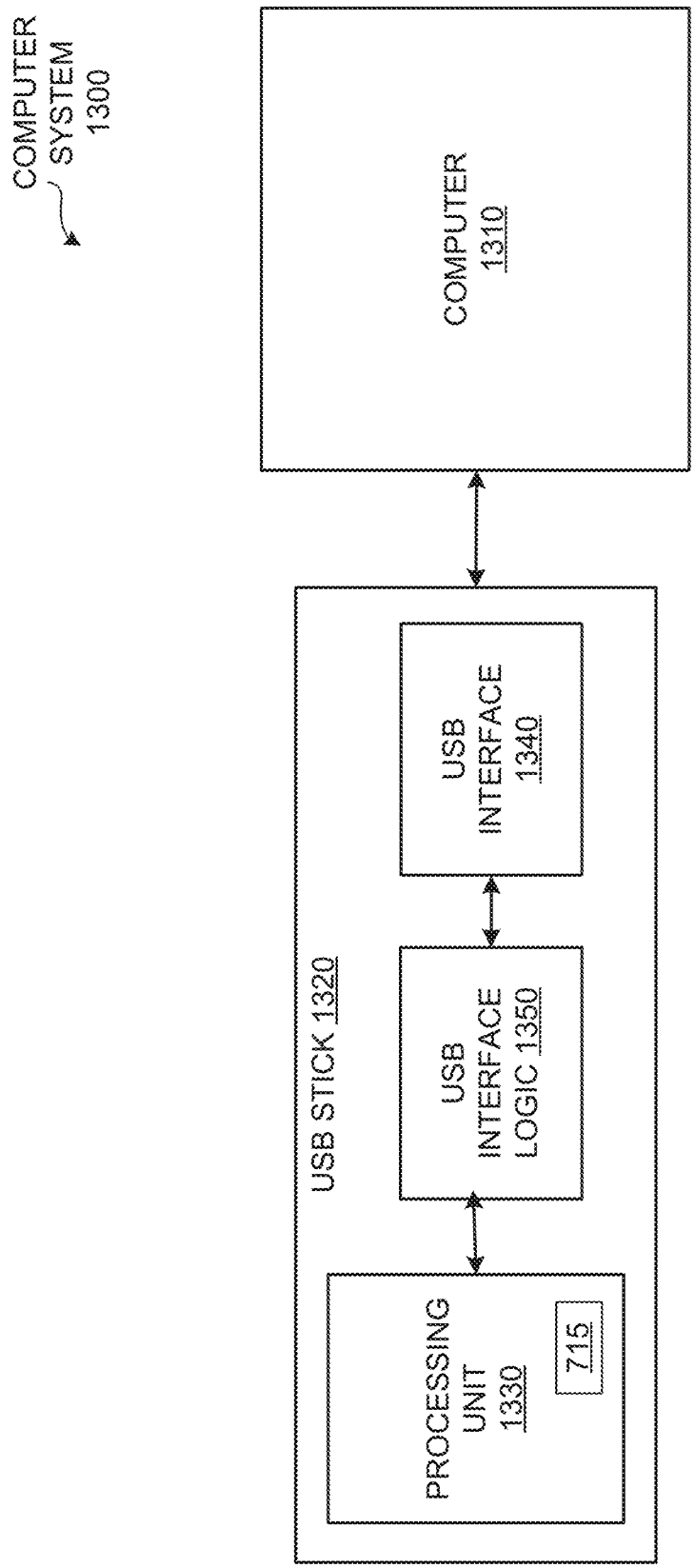
FIG. 13 illustrates a computer system, according to at least one embodiment.

FIG. 13 illustrates a computer system 1300, according to at least one embodiment. In at least one embodiment, a computer system 1300 includes, without limitation, a computer 1310 and a USB stick 1320. In at least one embodiment, a computer 1310 may include, without limitation, any number and type of processor(s) (not shown) and a memory (not shown). In at least one embodiment, a computer 1310 includes, without limitation, a server, a cloud instance, a laptop, and a desktop computer.

In at least one embodiment, a USB stick 1320 includes, without limitation, a processing unit 1330, a USB interface 1340, and USB interface logic 1350. In at least one embodiment, a processing unit 1330 may be any instruction execution system, apparatus, or device capable of executing instructions. In at least one embodiment, a processing unit 1330 may include, without limitation, any number and type of processing cores (not shown). In at least one embodiment, a processing core 1330 comprises an application specific integrated circuit ("ASIC") that is optimized to perform any amount and type of operations associated with machine learning. For instance, in at least one embodiment, a processing core 1330 is a tensor processing unit ("TPC") that is optimized to perform machine learning inference operations. In at least one embodiment, a processing core 1330 is a vision processing unit ("VPU") that is optimized to perform machine vision and machine learning inference operations.

In at least one embodiment, a USB interface 1340 may be any type of USB connector or USB socket. For instance, in at least one embodiment, a USB interface 1340 is a USB 3.0 Type-C socket for data and power. In at least one embodiment, a USB interface 1340 is a USB 3.0 Type-A connector. In at least one embodiment, a USB interface logic 1350 may include any amount and type of logic that enables a processing unit 1330 to interface with or devices (e.g., computer 1310) via USB connector 1340.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in system FIG. 13 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 13 to perform CRC generation and/or checking.

Figure 14:
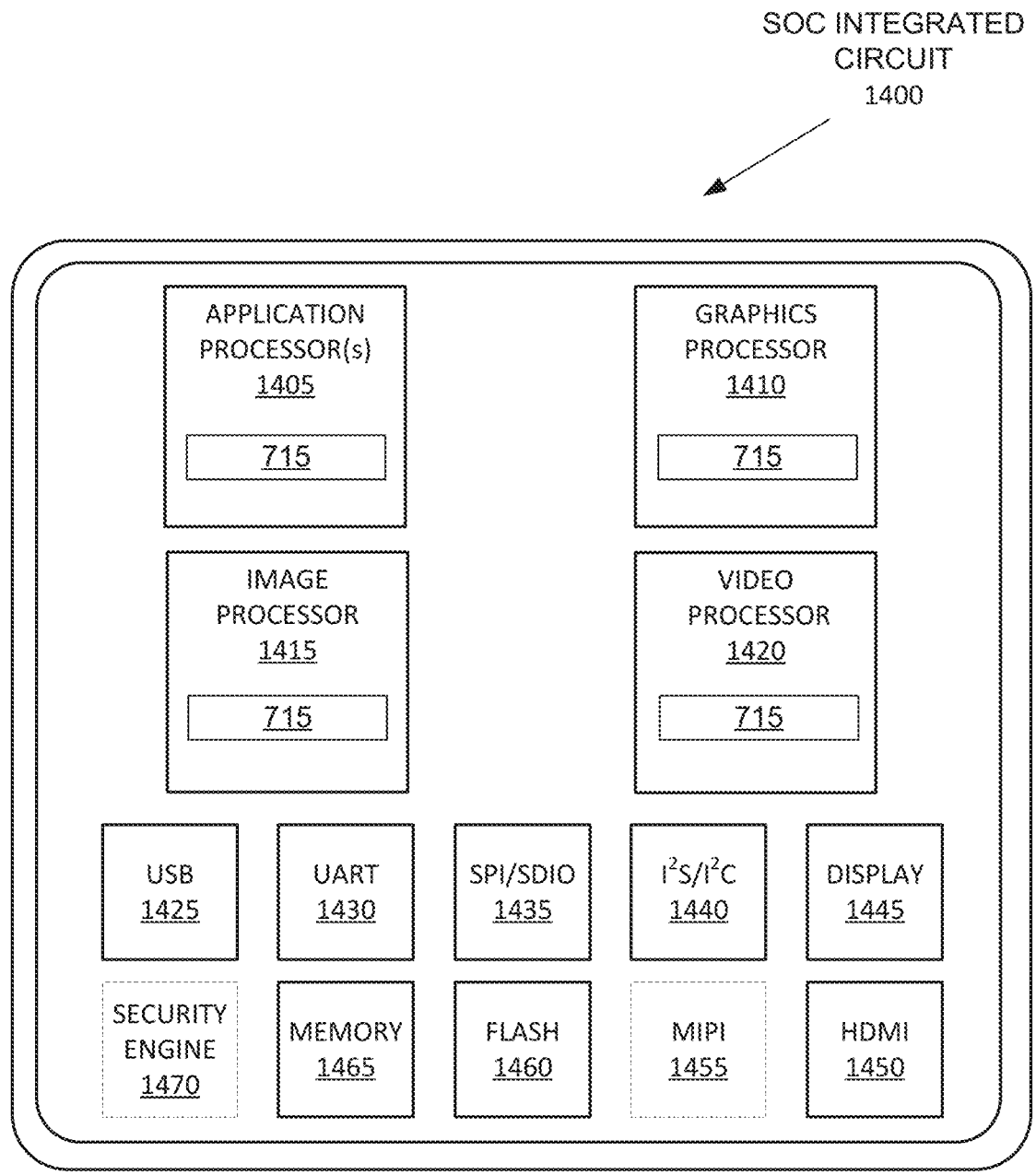
FIG. 14 illustrates exemplary integrated circuits and associated graphics processors that may be fabricated using one or more IP cores, according to at least one embodiment.

FIG. 14 illustrates exemplary integrated circuits and associated graphics processors that may be fabricated using one or more IP cores, according to various embodiments described herein. In at least one embodiment, in addition to what is illustrated, other logic and circuits may be included, such as additional graphics processors/cores, peripheral interface controllers, or general-purpose processor cores.

FIG. 14 is a block diagram illustrating an exemplary system on a chip (SOC) integrated circuit 1400 that may be fabricated using one or more IP cores, according to at least one embodiment. In at least one embodiment, an integrated circuit 1400 includes one or more application processor(s) 1405 (e.g., CPUs), at least one graphics processor 1410, and may additionally include an image processor 1415 and/or a video processor 1420, any of which may be a modular IP core. In at least one embodiment, an integrated circuit 1400 includes peripheral or bus logic including a USB controller 1425, an UART controller 1430, an SPI/SDIO controller 1435, and an I2S/I2C controller 1440. In at least one embodiment, an integrated circuit 1400 can include a display device 1445 coupled to one or more of a high-definition multimedia interface (HDMI) controller 1450 and a mobile industry processor interface (MIPI) display interface 1455. In at least one embodiment, storage may be provided by a flash memory subsystem 1460 including flash memory and a flash memory controller. In at least one embodiment, a memory interface may be provided via a memory controller 1465 for access to SDRAM or SRAM memory devices. In at least one embodiment, some integrated circuits additionally include an embedded security engine 1470.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in an integrated circuit 1400 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 14 to perform CRC generation and/or checking.

Figure 15A:
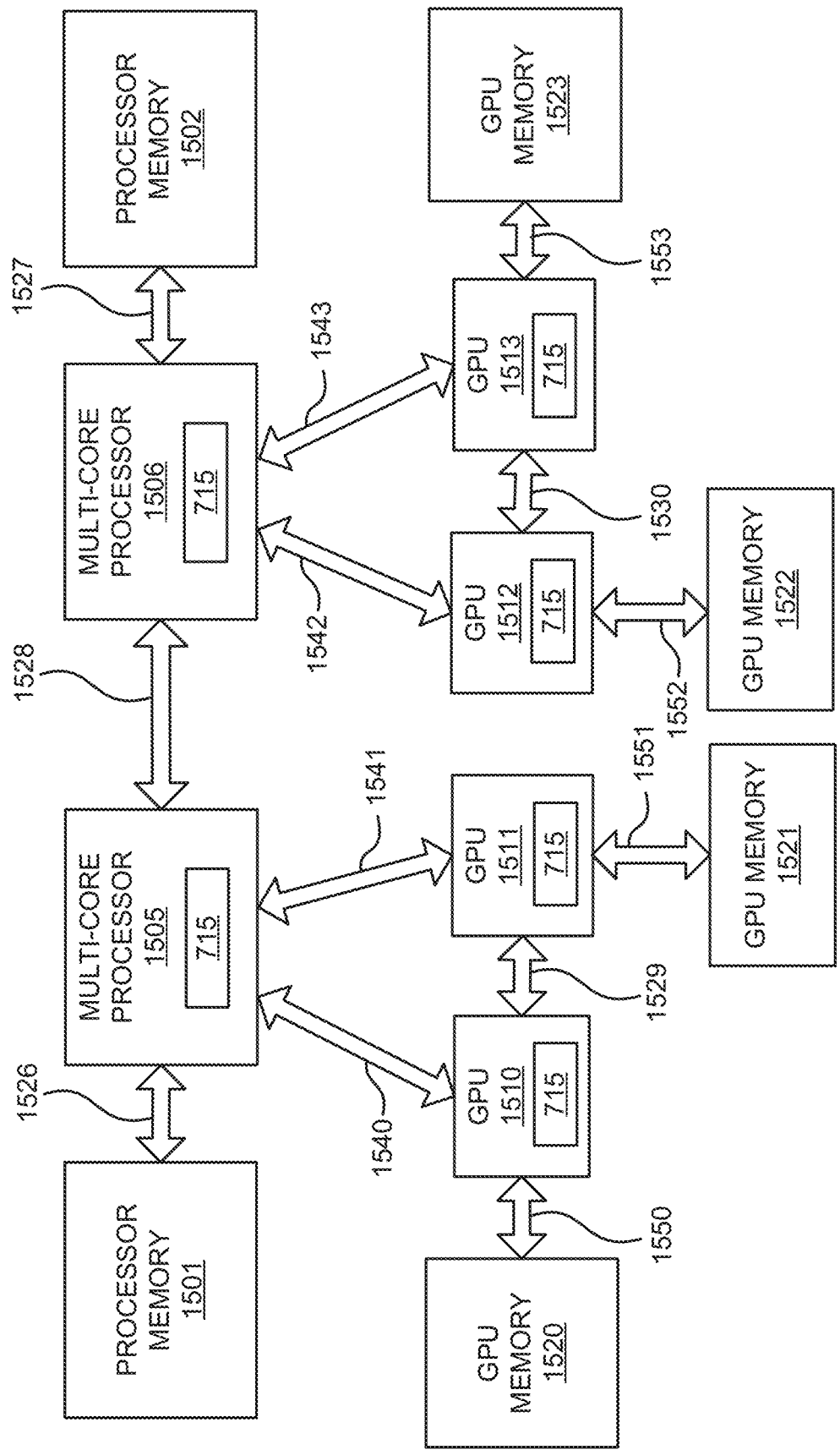
FIG. 15A illustrates a computer system, according to at least one embodiment.

FIG. 15A illustrates an exemplary architecture in which a plurality of GPUs 1510-1513 is communicatively coupled to a plurality of multi-core processors 1505-1506 over high-speed links 1540-1543 (e.g., buses, point-to-point interconnects, etc.). In at least one embodiment, high-speed links 1540-1543 support a communication throughput of 4 GB/s, 30 GB/s, 80 GB/s or higher. In at least one embodiment, various interconnect protocols may be used including, but not limited to, PCIe 4.0 or 5.0 and NVLink 2.0.

In addition, and in at least one embodiment, two or more of GPUs 1510-1513 are interconnected over high-speed links 1529-1530, which may be implemented using same or different protocols/links than those used for high-speed links 1540-1543. In at least one embodiment, similarly, two or more of multi-core processors 1505-1506 may be connected over high speed link 1528 which may be symmetric multiprocessor (SMP) buses operating at 20 GB/s, 30 GB/s, 120 GB/s or higher. In at least one embodiment, alternatively, all communication between various system components shown in FIG. 15A may be accomplished using same protocols/links (e.g., over a common interconnection fabric).

In at least one embodiment, each multi-core processor 1505-1506 is communicatively coupled to a processor memory 1501-1502, via memory interconnects 1526-1527, respectively, and each GPU 1510-1513 is communicatively coupled to GPU memory 1520-1523 over GPU memory interconnects 1550-1553, respectively. In at least one embodiment, memory interconnects 1526-1527 and 1550-1553 may utilize same or different memory access technologies. In at least one embodiment, by way of example, and not limitation, processor memories 1501-1502 and GPU memories 1520-1523 may be volatile memories such as dynamic random access memories (DRAMs) (including stacked DRAMs), Graphics DDR SDRAM (GDDR) (e.g., GDDR5, GDDR6), or High Bandwidth Memory (HBM) and/or may be non-volatile memories such as 3D XPoint or Nano-Ram. In at least one embodiment, some portion of processor memories 1501-1502 may be volatile memory and another portion may be non-volatile memory (e.g., using a two-level memory (2LM) hierarchy).

As described herein, although various processors 1505-1506 and GPUs 1510-1513 may be physically coupled to a particular memory 1501-1502, 1520-1523, respectively, in at least one embodiment, a unified memory architecture may be implemented in which a same virtual system address space (also referred to as "effective address" space) is distributed among various physical memories. In at least one embodiment, for example, processor memories 1501-1502 may each comprise 64 GB of system memory address space and GPU memories 1520-1523 may each comprise 32 GB of system memory address space (resulting in a total of 256 GB addressable memory in this example).

Figure 15B:
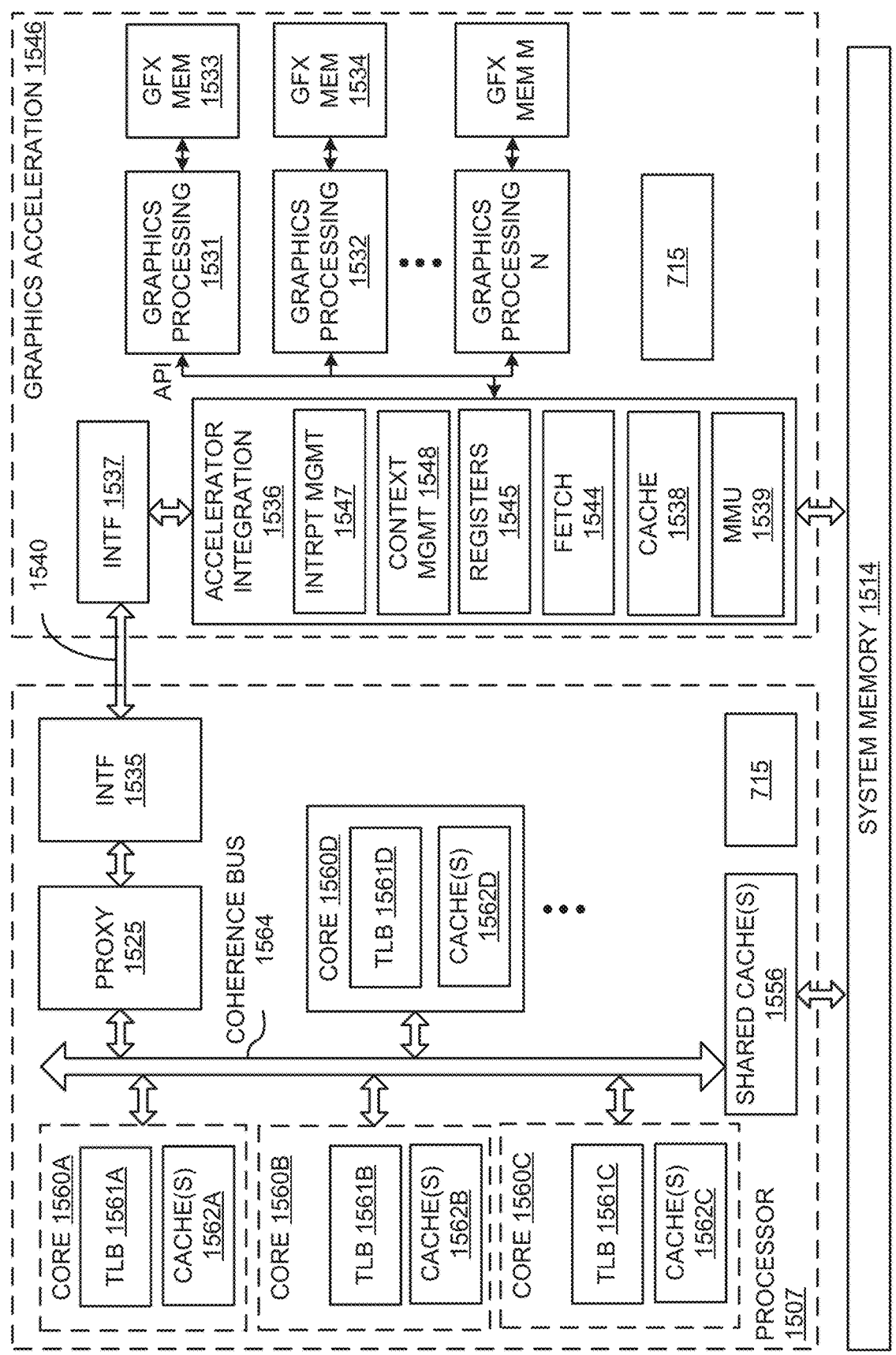
FIG. 15B illustrates a computer system, according to at least one embodiment.

FIG. 15B illustrates additional details for an interconnection between a multi-core processor 1507 and a graphics acceleration module 1546 in accordance with at least one embodiment. In at least one embodiment, graphics acceleration module 1546 may include one or more GPU chips integrated on a line card which is coupled to processor 1507 via high-speed link 1540. In at least one embodiment, alternatively, graphics acceleration module 1546 may be integrated on a same package or chip as processor 1507.

In at least one embodiment, illustrated processor 1507 includes a plurality of cores 1560A-1560D, each with a translation lookaside buffer 1561A-1561D and one or more caches 1562A-1562D. In at least one embodiment, cores 1560A-1560D may include various other components for executing instructions and processing data which are not illustrated. In at least one embodiment, caches 1562A-1562D may comprise level 1 (L1) and level 2 (L2) caches. In at least one embodiment, in addition, one or more shared caches 1556 may be included in caches 1562A-1562D and shared by sets of cores 1560A-1560D. For example, at least one embodiment of processor 1507 includes 24 cores, each with its own L1 cache, twelve shared L2 caches, and twelve shared L3 caches, wherein one or more L2 and L3 caches are shared by two adjacent cores. In at least one embodiment, processor 1507 and graphics acceleration module 1546 connect with system memory 1514, which may include processor memories 1501-1502 of FIG. 15A.

In at least one embodiment, coherency is maintained for data and instructions stored in various caches 1562A-1562D, 1556 and system memory 1514 via inter-core communication over a coherence bus 1564. In at least one embodiment, for example, each cache may have cache coherency logic/circuitry associated therewith to communicate to over coherence bus 1564 in response to detected reads or writes to particular cache lines. In at least one embodiment, a cache snooping protocol is implemented over coherence bus 1564 to snoop cache accesses.

In at least one embodiment, a proxy circuit 1525 communicatively couples graphics acceleration module 1546 to coherence bus 1564, allowing graphics acceleration module 1546 to participate in a cache coherence protocol as a peer of cores 1560A-1560D. In at least one embodiment, an interface 1535 provides connectivity to proxy circuit 1525 over high-speed link 1540 (e.g., a PCIe bus, NVLink, etc.) and an interface 1537 connects graphics acceleration module 1546 to link 1540.

In at least one embodiment, an accelerator integration circuit 1536 provides cache management, memory access, context management, and interrupt management services on behalf of a plurality of graphics processing engines 1531, 1532, N of graphics acceleration module 1546. In at least one embodiment, graphics processing engines 1531, 1532, N may each comprise a separate graphics processing unit (GPU). In at least one embodiment, alternatively, graphics processing engines 1531, 1532, N may comprise different types of graphics processing engines within a GPU such as graphics execution units, media processing engines (e.g., video encoders/decoders), samplers, and blit engines. In at least one embodiment, graphics acceleration module 1546 may be a GPU with a plurality of graphics processing engines 1531-1532, N or graphics processing engines 1531-1532, N may be individual GPUs integrated on a common package, line card, or chip.

In at least one embodiment, accelerator integration circuit 1536 includes a fetch unit 1544, and a memory management unit (MMU) 1539 for performing various memory management functions such as virtual-to-physical memory translations (also referred to as effective-to-real memory translations) and memory access protocols for accessing system memory 1514. In at least one embodiment, MMU 1539 may also include a translation lookaside buffer (TLB) (not shown) for caching virtual/effective to physical/real address translations. In at least one embodiment, a cache 1538 stores commands and data for efficient access by graphics processing engines 1531-1532, N. In at least one embodiment, data stored in cache 1538 and graphics memories 1533-1534, M is kept coherent with core caches 1562A-1562D, 1556 and system memory 1514. In at least one embodiment, as mentioned, this may be accomplished via proxy circuit 1525 on behalf of cache 1538 and memories 1533-1534, M (e.g., sending updates to cache 1538 related to modifications/accesses of cache lines on processor caches 1562A-1562D, 1556 and receiving updates from cache 1538).

In at least one embodiment, a set of registers 1545 store context data for threads executed by graphics processing engines 1531-1532, N and a context management circuit 1548 manages thread contexts. In at least one embodiment, for example, context management circuit 1548 may perform save and restore operations to save and restore contexts of various threads during contexts switches (e.g., where a first thread is saved and a second thread is stored so that a second thread can be execute by a graphics processing engine). In at least one embodiment, for example, on a context switch, context management circuit 1548 may store current register values to a designated region in memory (e.g., identified by a context pointer). In at least one embodiment, it may then restore register values when returning to a context. In at least one embodiment, an interrupt management circuit 1547 receives and processes interrupts received from system devices.

In at least one embodiment, virtual/effective addresses from a graphics processing engine 1531 are translated to real/physical addresses in system memory 1514 by MMU 1539. In at least one embodiment, accelerator integration circuit 1536 supports multiple (e.g., 4, 8, 16) graphics accelerator modules 1546 and/or other accelerator devices.

In at least one embodiment, graphics accelerator module 1546 may be dedicated to a single application executed on processor 1507 or may be shared between multiple applications. In at least one embodiment, a virtualized graphics execution environment is presented in which resources of graphics processing engines 1531-1532, N are shared with multiple applications or virtual machines (VMs). In at least one embodiment, resources may be subdivided into "slices" which are allocated to different VMs and/or applications based on processing requirements and priorities associated with VMs and/or applications.

In at least one embodiment, accelerator integration circuit 1536 performs as a bridge to a system for graphics acceleration module 1546 and provides address translation and system memory cache services. In addition, in at least one embodiment, accelerator integration circuit 1536 may provide virtualization facilities for a host processor to manage virtualization of graphics processing engines 1531-1532, interrupts, and memory management.

In at least one embodiment, because hardware resources of graphics processing engines 1531-1532, N are mapped explicitly to a real address space seen by host processor 1507, any host processor can address these resources directly using an effective address value. In at least one embodiment, one function of accelerator integration circuit 1536 is physical separation of graphics processing engines 1531-1532, N so that they appear to a system as independent units.

In at least one embodiment, one or more graphics memories 1533-1534, Mare coupled to each of graphics processing engines 1531-1532, N, respectively. In at least one embodiment, graphics memories 1533-1534, M store instructions and data being processed by each of graphics processing engines 1531-1532, N. In at least one embodiment, graphics memories 1533-1534, M may be volatile memories such as DRAMs (including stacked DRAMs), GDDR memory (e.g., GDDR5, GDDR6), or HBM, and/or may be non-volatile memories such as 3D XPoint or Nano-Ram.

In at least one embodiment, to reduce data traffic over link 1540, biasing techniques are used to ensure that data stored in graphics memories 1533-1534, M is data which will be used most frequently by graphics processing engines 1531-1532, N and preferably not used by cores 1560A-1560D (at least not frequently). In at least one embodiment, similarly, a biasing mechanism attempts to keep data needed by cores (and preferably not graphics processing engines 1531-1532, N) within caches 1562A-1562D, 1556 of cores and system memory 1514.

Figure 15C:
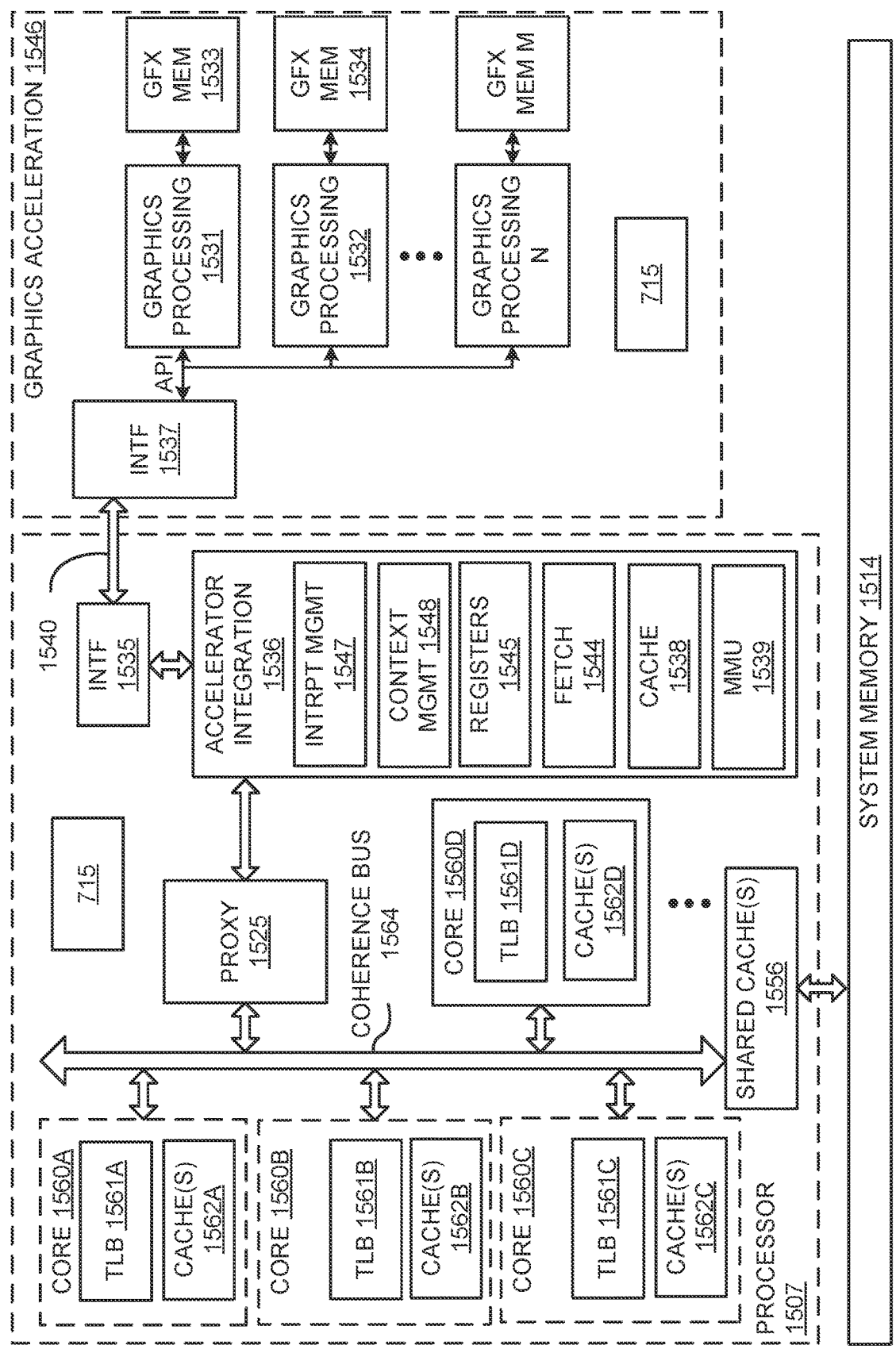
FIG. 15C illustrates a computer system, according to at least one embodiment.

FIG. 15C illustrates another exemplary embodiment in which accelerator integration circuit 1536 is integrated within processor 1507, wherein graphics processing engines 1531-1532, N communicate directly over high-speed link 1540 to accelerator integration circuit 1536 via interface 1537 and interface 1535 (which, again, may be utilize any form of bus or interface protocol). In at least one embodiment, accelerator integration circuit 1536 may perform same operations as those described with respect to FIG. 15B, but potentially at a higher throughput given its close proximity to coherence bus 1564 and caches 1562A-1562D, 1556. In at least one embodiment, different programming models are supported, including a dedicated-process programming model (no graphics acceleration module virtualization) and shared programming models (with virtualization), which may include programming models which are controlled by accelerator integration circuit 1536 and programming models which are controlled by graphics acceleration module 1546.

In at least one embodiment, graphics processing engines 1531-1532, N are dedicated to a single application or process under a single operating system. In at least one embodiment, a single application can funnel other application requests to graphics processing engines 1531-1532, N, providing virtualization within a VM/partition.

In at least one embodiment, graphics processing engines 1531-1532, N, may be shared by multiple VM/application partitions. In at least one embodiment, shared models may use a system hypervisor to virtualize graphics processing engines 1531-1532, N to allow access by each operating system. In at least one embodiment, for single-partition systems without a hypervisor, graphics processing engines 1531-1532, N are owned by an operating system. In at least one embodiment, an operating system can virtualize graphics processing engines 1531-1532, N to provide access to each process or application.

In at least one embodiment, graphics acceleration module 1546 or an individual graphics processing engine 1531-1532, N selects a process element using a process handle. In at least one embodiment, process elements are stored in system memory 1514 and are addressable using an effective address to real address translation techniques described herein. In at least one embodiment, a process handle may be an implementation-specific value provided to a host process when registering its context with graphics processing engine 1531-1532, N (that is, calling system software to add a process element to a process element linked list). In at least one embodiment, a lower 16-bits of a process handle may be an offset of a process element within a process element linked list.

Figure 15D:
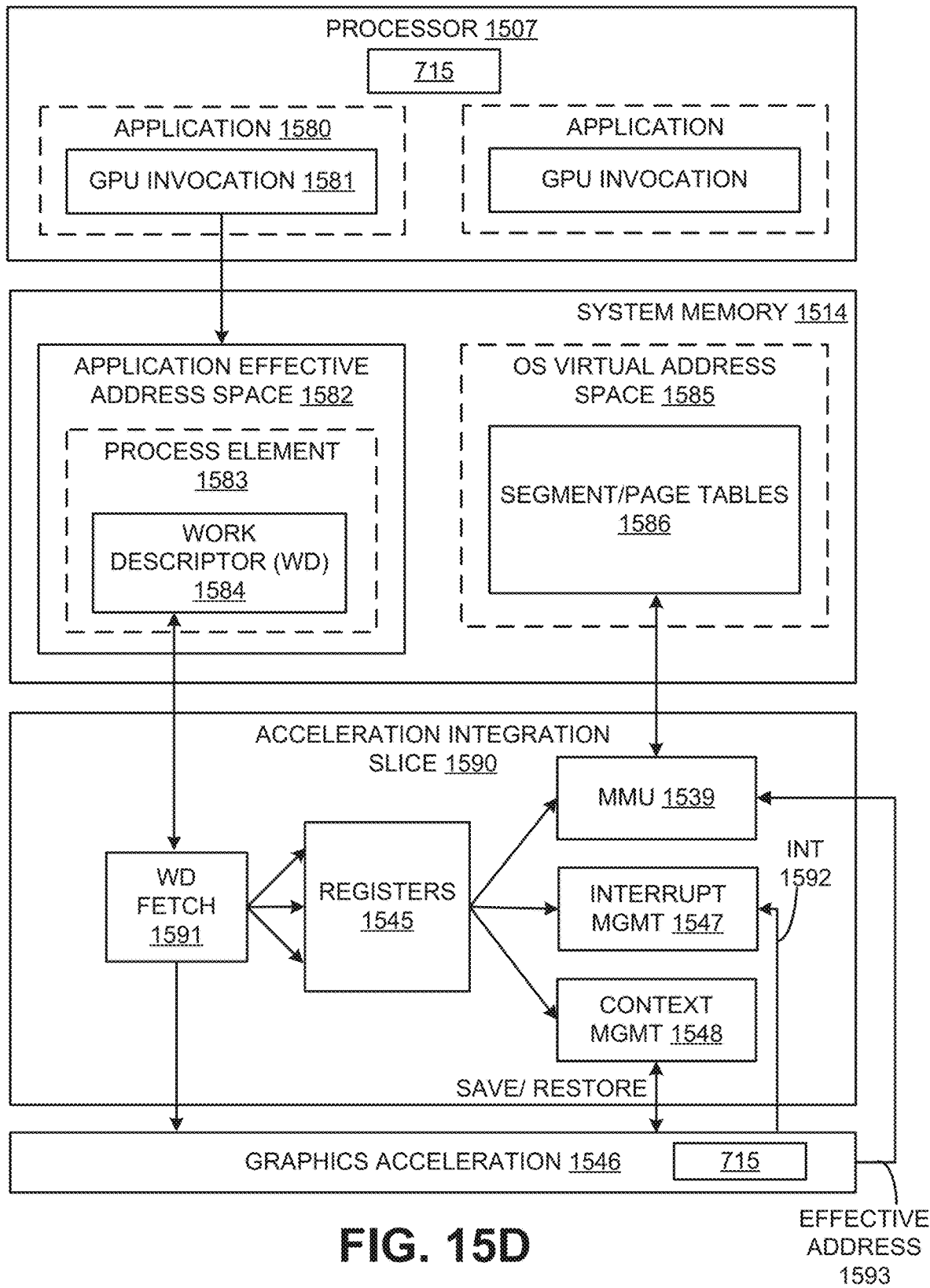
FIG. 15D illustrates a computer system, according to at least one embodiment.

FIG. 15D illustrates an exemplary accelerator integration slice 1590. As used herein, a "slice" comprises a specified portion of processing resources of accelerator integration circuit 1536. In at least one embodiment, application effective address space 1582 within system memory 1514 stores process elements 1583. In at least one embodiment, process elements 1583 are stored in response to GPU invocations 1581 from applications 1580 executed on processor 1507. In at least one embodiment, a process element 1583 contains process state for corresponding application 1580. In at least one embodiment, a work descriptor (WD) 1584 contained in process element 1583 can be a single job requested by an application or may contain a pointer to a queue of jobs. In at least one embodiment, WD 1584 is a pointer to a job request queue in an application's address space 1582.

In at least one embodiment, graphics acceleration module 1546 and/or individual graphics processing engines 1531-1532, N can be shared by all or a subset of processes in a system. In at least one embodiment, an infrastructure for setting up process state and sending a WD 1584 to a graphics acceleration module 1546 to start a job in a virtualized environment may be included.

In at least one embodiment, a dedicated-process programming model is implementation-specific. In at least one embodiment, in this model, a single process owns graphics acceleration module 1546 or an individual graphics processing engine 1531. In at least one embodiment, because graphics acceleration module 1546 is owned by a single process, a hypervisor initializes accelerator integration circuit 1536 for an owning partition and an operating system initializes accelerator integration circuit 1536 for an owning process when graphics acceleration module 1546 is assigned.

In operation, a WD fetch unit 1591 in accelerator integration slice 1590 fetches next WD 1584 which includes an indication of work to be done by one or more graphics processing engines of graphics acceleration module 1546. In at least one embodiment, Data from WD 1584 may be stored in registers 1545 and used by MMU 1539, interrupt management circuit 1547 and/or context management circuit 1548 as illustrated. In at least one embodiment, for example, MMU 1539 includes segment/page walk circuitry for accessing segment/page tables 1586 within OS virtual address space 1585. In at least one embodiment, interrupt management circuit 1547 may process interrupt events 1592 received from graphics acceleration module 1546. In at least one embodiment, when performing graphics operations, an effective address 1593 generated by a graphics processing engine 1531-1532, N is translated to a real address by MMU 1539.

In at least one embodiment, a same set of registers 1545 are duplicated for each graphics processing engine 1531-1532, N and/or graphics acceleration module 1546 and may be initialized by a hypervisor or operating system. In at least one embodiment, each of these duplicated registers may be included in an accelerator integration slice 1590. In at least one embodiment, exemplary registers that may be initialized by a hypervisor are shown in Table 1.

TABLE 1

| Hypervisor Initialized Registers |
|---|
| 1 Slice Control Register |
| 2 Real Address (RA) Scheduled Processes Area Pointer |
| 3 Authority Mask Override Register |
| 4 Interrupt Vector Table Entry Offset |
| 5 Interrupt Vector Table Entry Limit |
| 6 State Register |
| 7 Logical Partition ID |
| 8 Real address (RA) Hypervisor Accelerator Utilization Record Pointer |
| 9 Storage Description Register |

In at least one embodiment, exemplary registers that may be initialized by an operating system are shown in Table 2.

TABLE 2

| Operating System Initialized Registers |
|---|
| 1 Process and Thread Identification |
| 2 Effective Address (EA) Context Save/Restore Pointer |
| 3 Virtual Address (VA) Accelerator Utilization Record Pointer |
| 4 Virtual Address (VA) Storage Segment Table Pointer |
| 5 Authority Mask |
| 6 Work descriptor |

In at least one embodiment, each WD 1584 is specific to a particular graphics acceleration module 1546 and/or graphics processing engines 1531-1532, N. In at least one embodiment, it contains all information required by a graphics processing engine 1531-1532, N to do work or it can be a pointer to a memory location where an application has set up a command queue of work to be completed.

Figure 15E:
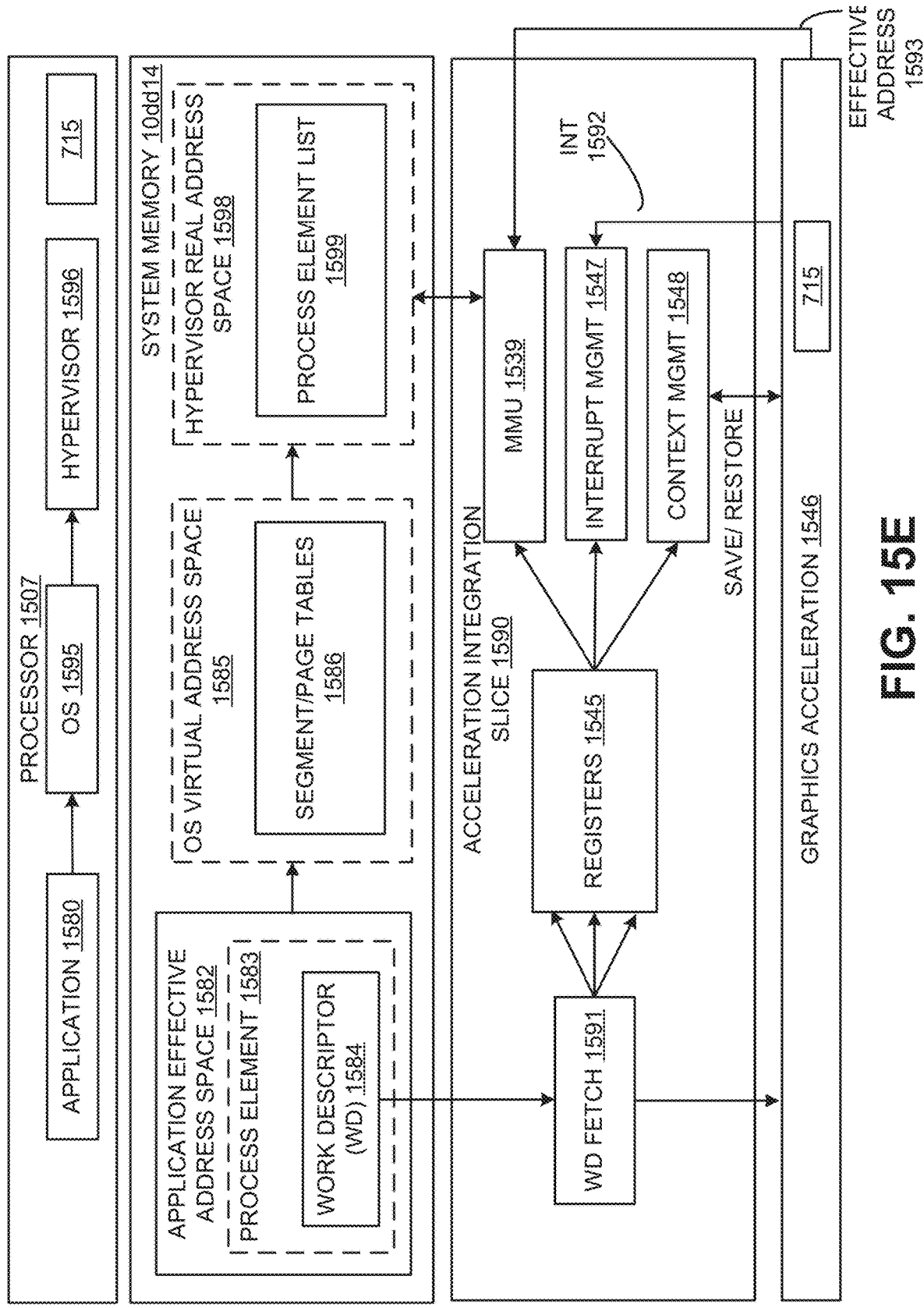
FIG. 15E illustrates a computer system, according to at least one embodiment.

FIG. 15E illustrates additional details for at least one embodiment of a shared model. In at least one embodiment, a hypervisor real address space 1598 is included in which a process element list 1599 is stored. In at least one embodiment, hypervisor real address space 1598 is accessible via a hypervisor 1596 that virtualizes graphics acceleration module engines for operating system 1595.

In at least one embodiment, shared programming models allow for all or a subset of processes from all or a subset of partitions in a system to use a graphics acceleration module 1546. In at least one embodiment, there are two programming models where graphics acceleration module 1546 is shared by multiple processes and partitions: time-sliced shared and graphics directed shared.

In at least one embodiment, in this model, system hypervisor 1596 owns graphics acceleration module 1546 and makes its function available to all operating systems 1595. In at least one embodiment, for a graphics acceleration module 1546 to support virtualization by system hypervisor 1596, graphics acceleration module 1546 may adhere to the following: 1) An application's job request must be autonomous (that is, state does not need to be maintained between jobs), or graphics acceleration module 1546 must provide a context save and restore mechanism; 2) An application's job request is guaranteed by graphics acceleration module 1546 to complete in a specified amount of time, including any translation faults, or graphics acceleration module 1546 provides an ability to preempt processing of a job; and 3) Graphics acceleration module 1546 must be guaranteed fairness between processes when operating in a directed shared programming model.

In at least one embodiment, application 1580 is required to make an operating system 1595 system call with a graphics acceleration module 1546 type, a work descriptor (WD), an authority mask register (AMR) value, and a context save/restore area pointer (CSRP). In at least one embodiment, graphics acceleration module 1546 type describes a targeted acceleration function for a system call. In at least one embodiment, graphics acceleration module 1546 type may be a system-specific value. In at least one embodiment, WD is formatted specifically for graphics acceleration module 1546 and can be in a form of a graphics acceleration module 1546 command, an effective address pointer to a user-defined structure, an effective address pointer to a queue of commands, or any other data structure to describe work to be done by graphics acceleration module 1546. In at least one embodiment, an AMR value is an AMR state to use for a current process. In at least one embodiment, a value passed to an operating system is similar to an application setting an AMR. In at least one embodiment, if accelerator integration circuit 1536 and graphics acceleration module 1546 implementations do not support a User Authority Mask Override Register (UAMOR), an operating system may apply a current UAMOR value to an AMR value before passing an AMR in a hypervisor call. In at least one embodiment, hypervisor 1596 may apply a current Authority Mask Override Register (AMOR) value before placing an AMR into process element 1583. In at least one embodiment, CSRP is one of registers 1545 containing an effective address of an area in an application's address space 1582 for graphics acceleration module 1546 to save and restore context state. In at least one embodiment, this pointer is not required if no state is required to be saved between jobs or when a job is preempted. In at least one embodiment, context save/restore area may be pinned system memory.

In at least one embodiment, upon receiving a system call, operating system 1595 may verify that application 1580 has registered and been given authority to use graphics acceleration module 1546. In at least one embodiment, operating system 1595 then calls hypervisor 1596 with information shown in Table 3.

TABLE 3

OS to Hypervisor Call Parameters

| | |
|---|---|
| 1 | A work descriptor (WD) |
| 2 | An Authority Mask Register (AMR) value (potentially masked) |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | Virtual address of storage segment table pointer (SSTP) |
| 7 | A logical interrupt service number (LISN) |

In at least one embodiment, upon receiving a hypervisor call, hypervisor 1596 verifies that operating system 1595 has registered and been given authority to use graphics acceleration module 1546. In at least one embodiment, hypervisor 1596 then puts process element 1583 into a process element linked list for a corresponding graphics acceleration module 1546 type. In at least one embodiment, a process element may include information shown in Table 4.

TABLE 4

Process Element Information

| | |
|---|---|
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | Virtual address of storage segment table pointer (SSTP) |
| 7 | A logical interrupt service number (LISN) |
| 8 | Interrupt vector table, derived from hypervisor call parameters |
| 9 | A state register (SR) value |
| 10 | A logical partition ID (LPID) |
| 11 | A real address (RA) hypervisor accelerator utilization record pointer |
| 12 | Storage Descriptor Register (SDR) |

In at least one embodiment, hypervisor initializes a plurality of accelerator integration slice 1590 registers 1545.

Figure 15F:
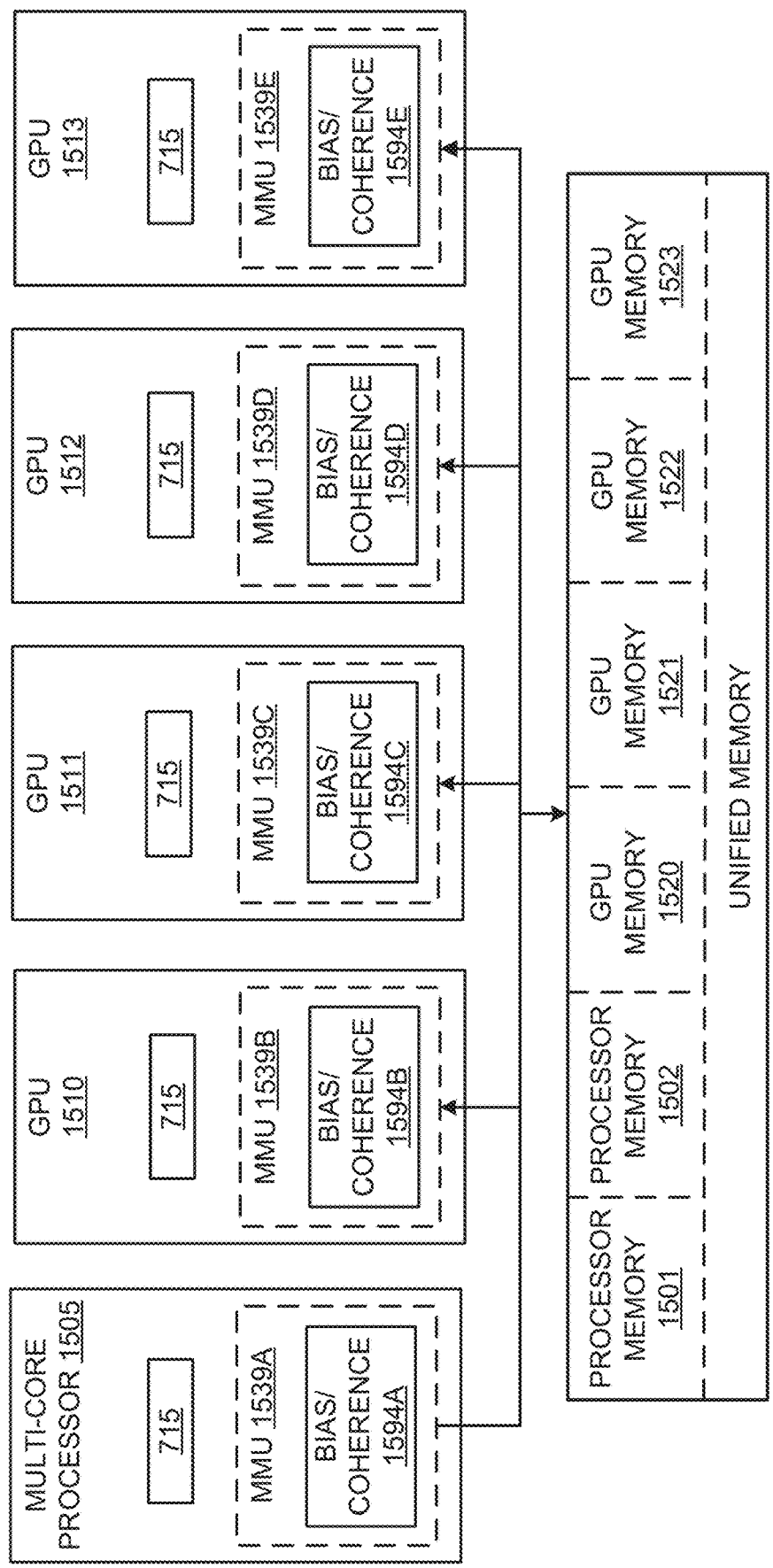
FIG. 15F illustrates a computer system, according to at least one embodiment.

In at least one embodiment, as illustrated in FIG. 15F, a unified memory is used, addressable via a common virtual memory address space used to access physical processor memories 1501-1502 and GPU memories 1520-1523. In at least one embodiment, in this implementation, operations executed on GPUs 1510-1513 utilize a same virtual/effective memory address space to access processor memories 1501-1502 and vice versa, thereby simplifying programmability. In at least one embodiment, a first portion of a virtual/effective address space is allocated to processor memory 1501, a second portion to second processor memory 1502, a third portion to GPU memory 1520, and so on. In at least one embodiment, an entire virtual/effective memory space (sometimes referred to as an effective address space) is thereby distributed across each of processor memories 1501-1502 and GPU memories 1520-1523, allowing any processor or GPU to access any physical memory with a virtual address mapped to that memory.

In at least one embodiment, bias/coherence management circuitry 1594A-1594E within one or more of MMUs 1539A-1539E ensures cache coherence between caches of one or more host processors (e.g., 1505) and GPUs 1510-1513 and implements biasing techniques indicating physical memories in which certain types of data should be stored. While multiple instances of bias/coherence management circuitry 1594A-1594E are illustrated in FIG. 15F, bias/coherence circuitry may be implemented within an MMU of one or more host processors 1505 and/or within accelerator integration circuit 1536.

One embodiment allows GPU-attached memory 1520-1523 to be mapped as part of system memory, and accessed using shared virtual memory (SVM) technology, but without suffering performance drawbacks associated with full system cache coherence. In at least one embodiment, an ability for GPU-attached memory 1520-1523 to be accessed as system memory without onerous cache coherence overhead provides a beneficial operating environment for GPU offload. In at least one embodiment, this arrangement allows host processor 1505 software to setup operands and access computation results, without overhead of tradition I/O DMA data copies. In at least one embodiment, such traditional copies involve driver calls, interrupts and memory mapped I/O (MMIO) accesses that are all inefficient relative to simple memory accesses. In at least one embodiment, an ability to access GPU attached memory 1520-1523 without cache coherence overheads can be critical to execution time of an offloaded computation. In at least one embodiment, in cases with substantial streaming write memory traffic, for example, cache coherence overhead can significantly reduce an effective write bandwidth seen by a GPU 1510-1513. In at least one embodiment, efficiency of operand setup, efficiency of results access, and efficiency of GPU computation may play a role in determining effectiveness of a GPU offload.

In at least one embodiment, selection of GPU bias and host processor bias is driven by a bias tracker data structure. In at least one embodiment, a bias table may be used, for example, which may be a page-granular structure (e.g., controlled at a granularity of a memory page) that includes 1 or 2 bits per GPU-attached memory page. In at least one embodiment, a bias table may be implemented in a stolen memory range of one or more GPU-attached memories 1520-1523, with or without a bias cache in GPU 1510-1513 (e.g., to cache frequently/recently used entries of a bias table). In at least one embodiment, alternatively, an entire bias table may be maintained within a GPU.

In at least one embodiment, a bias table entry associated with each access to GPU-attached memory 1520-1523 is accessed prior to actual access to a GPU memory, causing the following operations. In at least one embodiment, first, local requests from GPU 1510-1513 that find their page in GPU bias are forwarded directly to a corresponding GPU memory 1520-1523. In at least one embodiment, local requests from a GPU that find their page in host bias are forwarded to processor 1505 (e.g., over a high-speed link as discussed above). In at least one embodiment, requests from processor 1505 that find a requested page in host processor bias complete a request like a normal memory read. In at least one embodiment, alternatively, requests directed to a GPU-biased page may be forwarded to GPU 1510-1513. In at least one embodiment, a GPU may then transition a page to a host processor bias if it is not currently using a page. In at least one embodiment, bias state of a page can be changed either by a software-based mechanism, a hardware-assisted software-based mechanism, or, for a limited set of cases, a purely hardware-based mechanism.

In at least one embodiment, one mechanism for changing bias state employs an API call (e.g., OpenCL), which, in turn, calls a GPU's device driver which, in turn, sends a message (or enqueues a command descriptor) to a GPU directing it to change a bias state and, for some transitions, perform a cache flushing operation in a host. In at least one embodiment, cache flushing operation is used for a transition from host processor 1505 bias to GPU bias, but is not for an opposite transition.

In at least one embodiment, cache coherency is maintained by temporarily rendering GPU-biased pages uncacheable by host processor 1505. In at least one embodiment, to access these pages, processor 1505 may request access from GPU 1510 which may or may not grant access right away. In at least one embodiment, thus, to reduce communication between processor 1505 and GPU 1510 it is beneficial to ensure that GPU-biased pages are those which are required by a GPU but not host processor 1505 and vice versa.

In at least one embodiment, hardware structure(s) 715 are used to perform one or more embodiments. Details regarding the hardware structure(x) 715 are provided herein in conjunction with FIGS. 7A and/or 7B.

In at least one embodiment, a GPU-based CRC processing unit might be used in a system of FIG. 15 to perform CRC generation and/or checking.

Figure 16A:
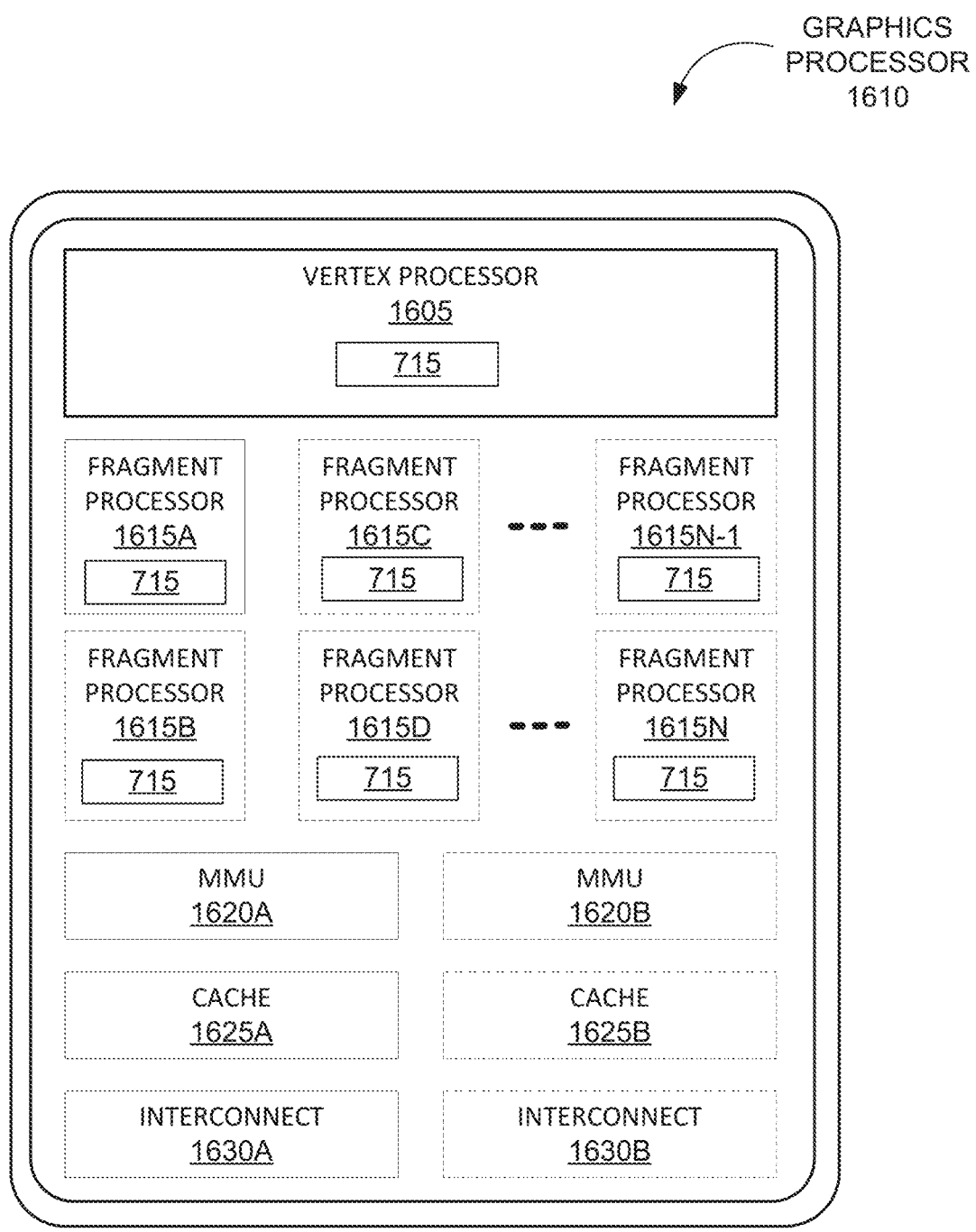
FIGS. 16A and 16B illustrate exemplary integrated circuits and associated graphics processors that may be fabricated using one or more IP cores, according to at least one embodiment.
Figure 16B:
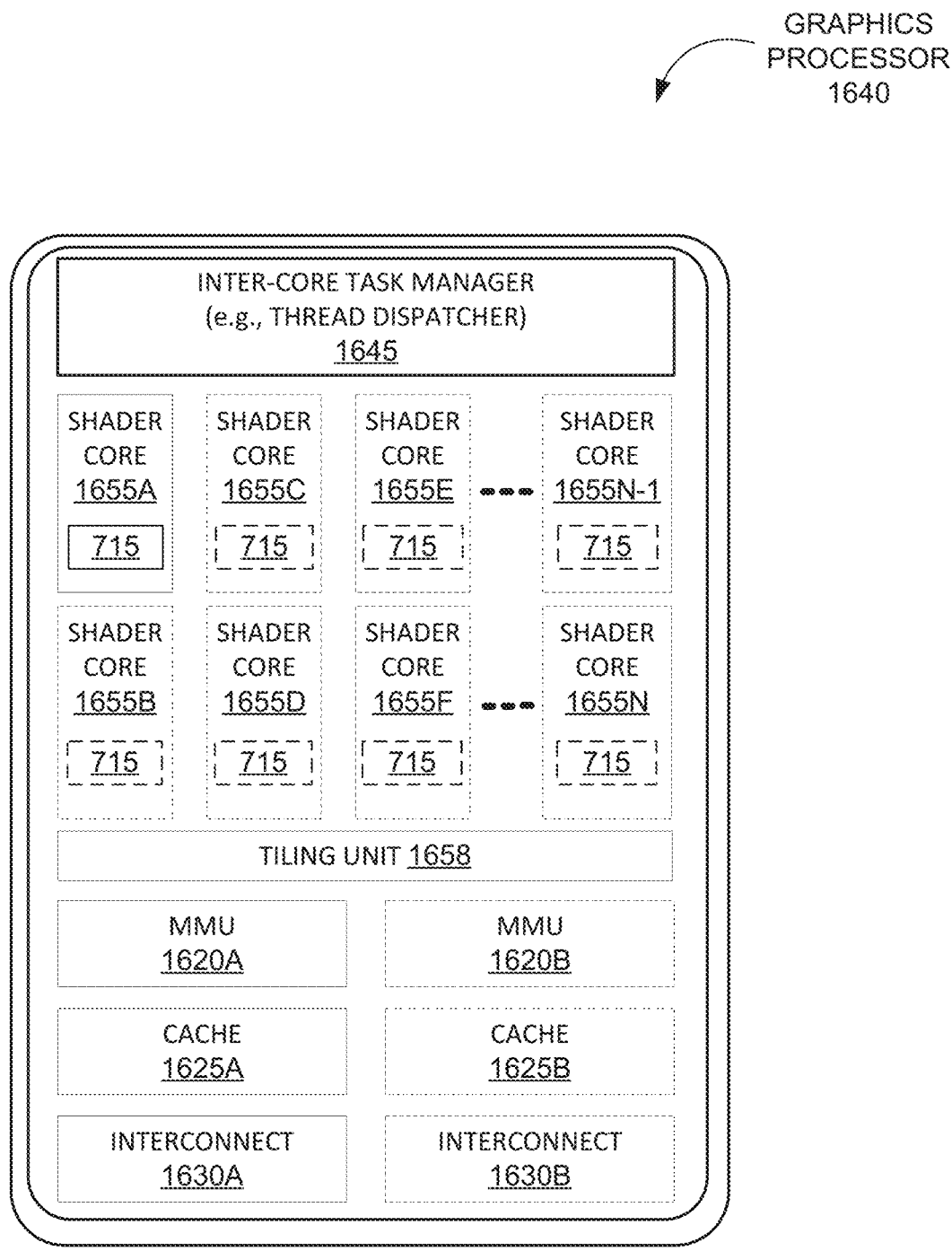

FIGS. 16A and 16B illustrate exemplary integrated circuits and associated graphics processors that may be fabricated using one or more IP cores, according to various embodiments described herein. In addition to what is illustrated, other logic and circuits may be included in at least one embodiment, including additional graphics processors/cores, peripheral interface controllers, or general-purpose processor cores.

FIGS. 16A and 16B are block diagrams illustrating exemplary graphics processors for use within an SoC, according to embodiments described herein. FIG. 16A illustrates an exemplary graphics processor 1610 of a system on a chip integrated circuit that may be fabricated using one or more IP cores, according to at least one embodiment. FIG. 16B illustrates an additional exemplary graphics processor 1640 of a system on a chip integrated circuit that may be fabricated using one or more IP cores, according to at least one embodiment. In at least one embodiment, graphics processor 1610 of FIG. 16A is a low power graphics processor core. In at least one embodiment, graphics processor 1640 of FIG. 16B is a higher performance graphics processor core. In at least one embodiment, each of graphics processors 1610, 1640 can be variants of graphics processor 1410 of FIG. 14.

In at least one embodiment, a graphics processor 1610 includes a vertex processor 1605 and one or more fragment processor(s) 1615A-1615N (e.g., 1615A, 1615B, 1615C, 1615D, through 1615N-1, and 1615N). In at least one embodiment, a graphics processor 1610 can execute different shader programs via separate logic, such that a vertex processor 1605 is optimized to execute operations for vertex shader programs, while one or more fragment processor(s) 1615A-1615N execute fragment (e.g., pixel) shading operations for fragment or pixel shader programs. In at least one embodiment, a vertex processor 1605 performs a vertex processing stage of a 3D graphics pipeline and generates primitives and vertex data. In at least one embodiment, fragment processor(s) 1615A-1615N use primitive and vertex data generated by vertex processor 1605 to produce a framebuffer that is displayed on a display device. In at least one embodiment, fragment processor(s) 1615A-1615N are optimized to execute fragment shader programs as provided for in an OpenGL API, which may be used to perform similar operations as a pixel shader program as provided for in a Direct 3D API.

In at least one embodiment, a graphics processor 1610 additionally includes one or more memory management units (MMUs) 1620A-1620B, cache(s) 1625A-1625B, and circuit interconnect(s) 1630A-1630B. In at least one embodiment, one or more MMU(s) 1620A-1620B provide for virtual to physical address mapping for a graphics processor 1610, including for a vertex processor 1605 and/or fragment processor(s) 1615A-1615N, which may reference vertex or image/texture data stored in memory, in addition to vertex or image/texture data stored in one or more cache(s) 1625A-1625B. In at least one embodiment, one or more MMU(s) 1620A-1620B may be synchronized with other MMUs within a system, including one or more MMUs associated with one or more application processor(s) 1405, image processors 1415, and/or video processors 1420 of FIG. 14, such that each processor 1405-1420 can participate in a shared or unified virtual memory system. In at least one embodiment, one or more circuit interconnect(s) 1630A-1630B enable a graphics processor 1610 to interface with other IP cores within SoC, either via an internal bus of an SoC or via a direct connection.

In at least one embodiment, a graphics processor 1640 includes one or more MMU(s) 1620A-1620B, caches 1625A-1625B, and circuit interconnects 1630A-1630B of graphics processor 1610 of FIG. 16A. In at least one embodiment, a graphics processor 1640 includes one or more shader core(s) 1655A-1655N (e.g., 1655A, 1655B, 1655C, 1655D, 1655E, 1655F, through 1655N-1, and 1655N), which provides for a unified shader core architecture in which a single core or type of core can execute all types of programmable shader code, including shader program code to implement vertex shaders, fragment shaders, and/or compute shaders. In at least one embodiment, a number of shader cores can vary. In at least one embodiment, a graphics processor 1640 includes an inter-core task manager 1645, which acts as a thread dispatcher to dispatch execution threads to one or more shader cores 1655A-1655N and a tiling unit 1658 to accelerate tiling operations for tile-based rendering, in which rendering operations for a scene are subdivided in image space, for example to exploit local spatial coherence within a scene or to optimize use of internal caches.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in integrated circuit 16A and/or 16B for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 16A or 16B to perform CRC generation and/or checking.

Figure 17A:
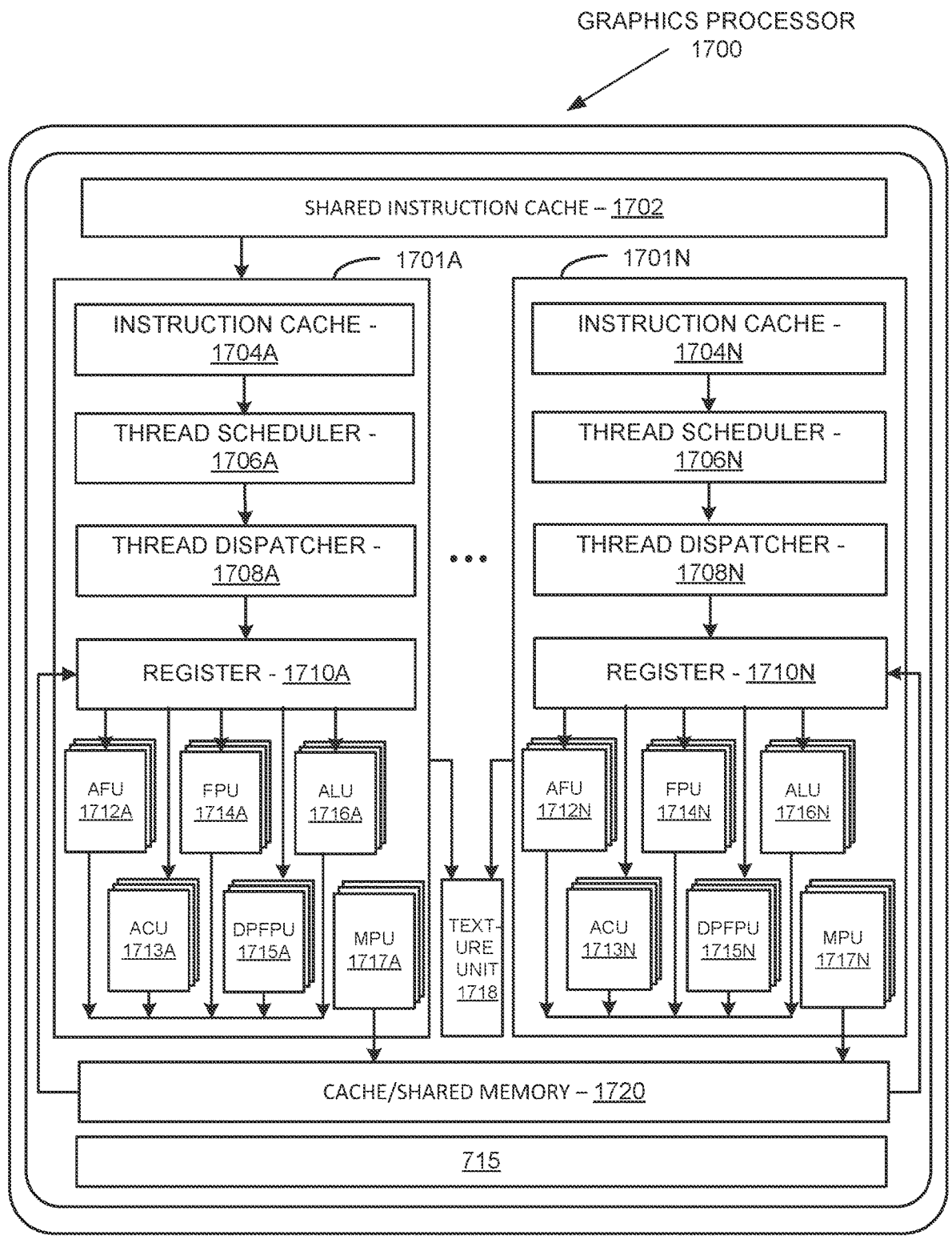
FIGS. 17A and 17B illustrate additional exemplary graphics processor logic, according to at least one embodiment.
Figure 17B:
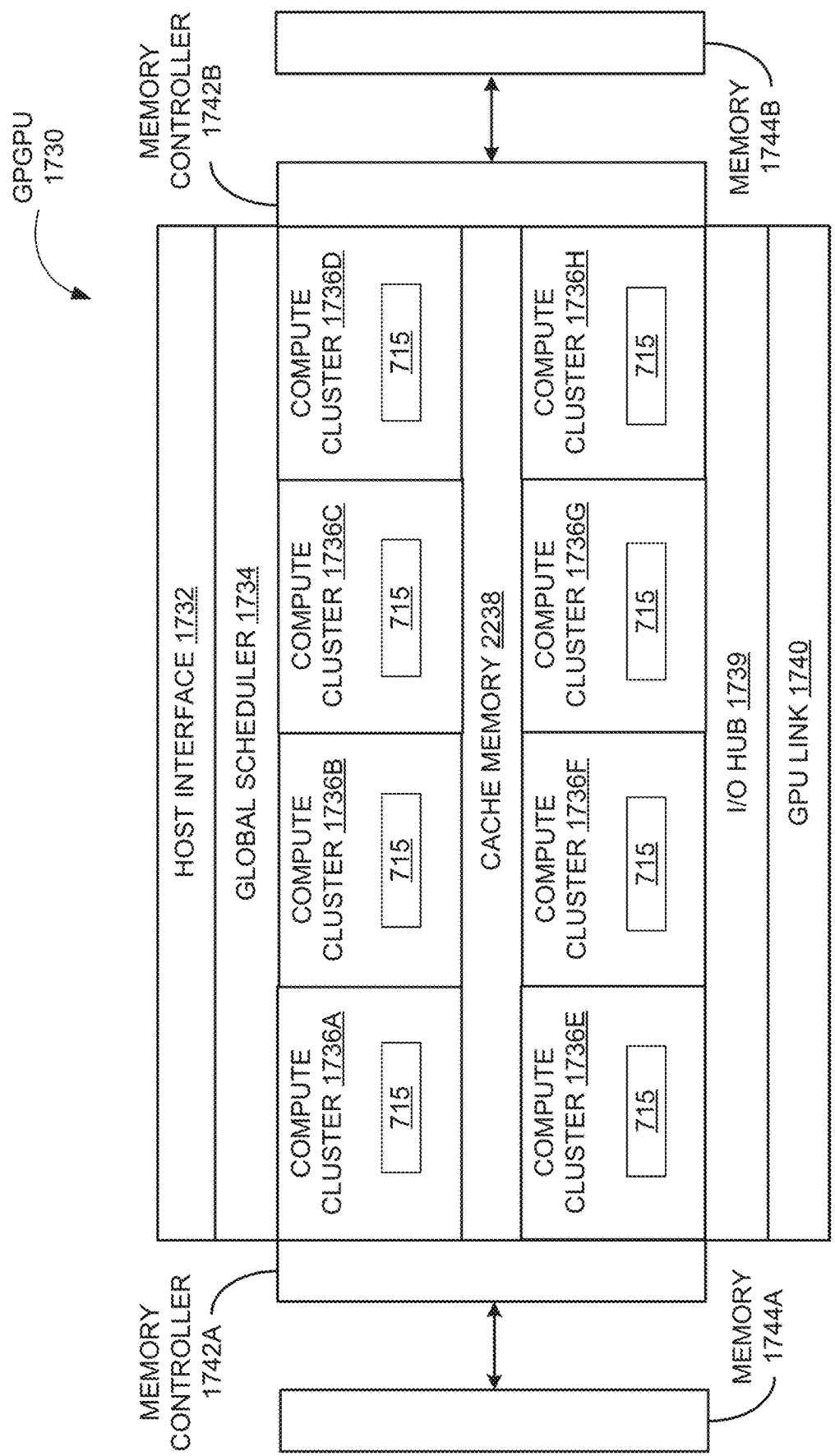

FIGS. 17A and 17B illustrate additional exemplary graphics processor logic according to embodiments described herein. FIG. 17A illustrates a graphics core 1700 that may be included within a graphics processor 1410 of FIG. 14, in at least one embodiment, and may be a unified shader core 1655A-1655N as in FIG. 16B in at least one embodiment. FIG. 17B illustrates a highly parallel general-purpose graphics processing unit 1730 suitable for deployment on a multi-chip module in at least one embodiment.

In at least one embodiment, a graphics core 1700 includes a shared instruction cache 1702, a texture unit 1718, and a cache/shared memory 1720 that are common to execution resources within a graphics core 1700. In at least one embodiment, a graphics core 1700 can include multiple slices 1701A-1701N or partitions for each core, and a graphics processor can include multiple instances of a graphics core 1700. In at least one embodiment, slices 1701A-1701N can include support logic including a local instruction cache 1704A-1704N, a thread scheduler 1706A-1706N, a thread dispatcher 1708A-1708N, and a set of registers 1710A-1710N. In at least one embodiment, slices 1701A-1701N can include a set of additional function units (AFUs 1712A-1712N), floating-point units (FPU 1714A-1714N), integer arithmetic logic units (ALUs 1716-1716N), address computational units (ACU 1713A-1713N), double-precision floating-point units (DPFPU 1715A-1715N), and matrix processing units (MPU 1717A-1717N).

In at least one embodiment, FPUs 1714A-1714N can perform single-precision (32-bit) and half-precision (16-bit) floating point operations, while DPFPUs 1715A-1715N perform double precision (64-bit) floating point operations. In at least one embodiment, ALUs 1716A-1716N can perform variable precision integer operations at 8-bit, 16-bit, and 32-bit precision, and can be configured for mixed precision operations. In at least one embodiment, MPUs 1717A-1717N can also be configured for mixed precision matrix operations, including half-precision floating point and 8-bit integer operations. In at least one embodiment, MPUs 1717-1717N can perform a variety of matrix operations to accelerate machine learning application frameworks, including enabling support for accelerated general matrix to matrix multiplication (GEMM). In at least one embodiment, AFUs 1712A-1712N can perform additional logic operations not supported by floating-point or integer units, including trigonometric operations (e.g., sine, cosine, etc.).

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in graphics core 1700 for inferencing or predicting operations based, at least in part, on weight parameters calculated using neural network training operations, neural network functions and/or architectures, or neural network use cases described herein.

FIG. 17B illustrates a general-purpose processing unit (GPGPU) 1730 that can be configured to enable highly parallel compute operations to be performed by an array of graphics processing units, in at least one embodiment. In at least one embodiment, a GPGPU 1730 can be linked directly to other instances of a GPGPU 1730 to create a multi-GPU cluster to improve training speed for deep neural networks. In at least one embodiment, a GPGPU 1730 includes a host interface 1732 to enable a connection with a host processor. In at least one embodiment, a host interface 1732 is a PCI Express interface. In at least one embodiment, host interface 1732 can be a vendor specific communications interface or communications fabric. In at least one embodiment, a GPGPU 1730 receives commands from a host processor and uses a global scheduler 1734 to distribute execution threads associated with those commands to a set of compute clusters 1736A-1736H. In at least one embodiment, compute clusters 1736A-1736H share a cache memory 1738. In at least one embodiment, cache memory 1738 can serve as a higher-level cache for cache memories within compute clusters 1736A-1736H.

In at least one embodiment, GPGPU 1730 includes memory 1744A-1744B coupled with compute clusters 1736A-1736H via a set of memory controllers 1742A-1742B. In at least one embodiment, memory 1744A-1744B can include various types of memory devices including dynamic random access memory (DRAM) or graphics random access memory, such as synchronous graphics random access memory (SGRAM), including graphics double data rate (GDDR) memory.

In at least one embodiment, compute clusters 1736A-1736H each include a set of graphics cores, such as a graphics core 1700 of FIG. 17A, which can include multiple types of integer and floating point logic units that can perform computational operations at a range of precisions including suited for machine learning computations. For example, in at least one embodiment, at least a subset of floating point units in each of compute clusters 1736A-1736H can be configured to perform 16-bit or 32-bit floating point operations, while a different subset of those floating point units can be configured to perform 64-bit floating point operations.

In at least one embodiment, multiple instances of a GPGPU 1730 can be configured to operate as a compute cluster. In at least one embodiment, communication used by compute clusters 1736A-1736H for synchronization and data exchange varies across embodiments. In at least one embodiment, multiple instances of a GPGPU 1730 communicate over a host interface 1732. In at least one embodiment, a GPGPU 1730 includes an I/O hub 1739 that couples a GPGPU 1730 with a GPU link 1740 that enables a direct connection to other instances of a GPGPU 1730. In at least one embodiment, a GPU link 1740 is coupled to a dedicated GPU-to-GPU bridge that enables communication and synchronization between multiple instances of a GPGPU 1730. In at least one embodiment, a GPU link 1740 couples with a high speed interconnect to transmit and receive data to other GPGPUs or parallel processors. In at least one embodiment, multiple instances of a GPGPU 1730 are located in separate data processing systems and communicate via a network device that is accessible via host interface 1732. In at least one embodiment, a GPU link 1740 can be configured to enable a connection to a host processor in addition to or as an alternative to host interface 1732.

In at least one embodiment, a GPGPU 1730 can be configured to train neural networks. In at least one embodiment, a GPGPU 1730 can be used within an inferencing platform. In at least one embodiment, in which a GPGPU 1730 is used for inferencing, a GPGPU may include fewer compute clusters 1736A-1736H relative to when a GPGPU is used for training a neural network. In at least one embodiment, memory technology associated with memory 1744A-1744B may differ between inferencing and training configurations, with higher bandwidth memory technologies devoted to training configurations. In at least one embodiment, inferencing configuration of a GPGPU 1730 can support inferencing specific instructions. For example, in at least one embodiment, an inferencing configuration can provide support for one or more 8-bit integer dot product instructions, which may be used during inferencing operations for deployed neural networks.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in a GPGPU 1730 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 17A or FIG. 17B to perform CRC generation and/or checking.

Figure 18:
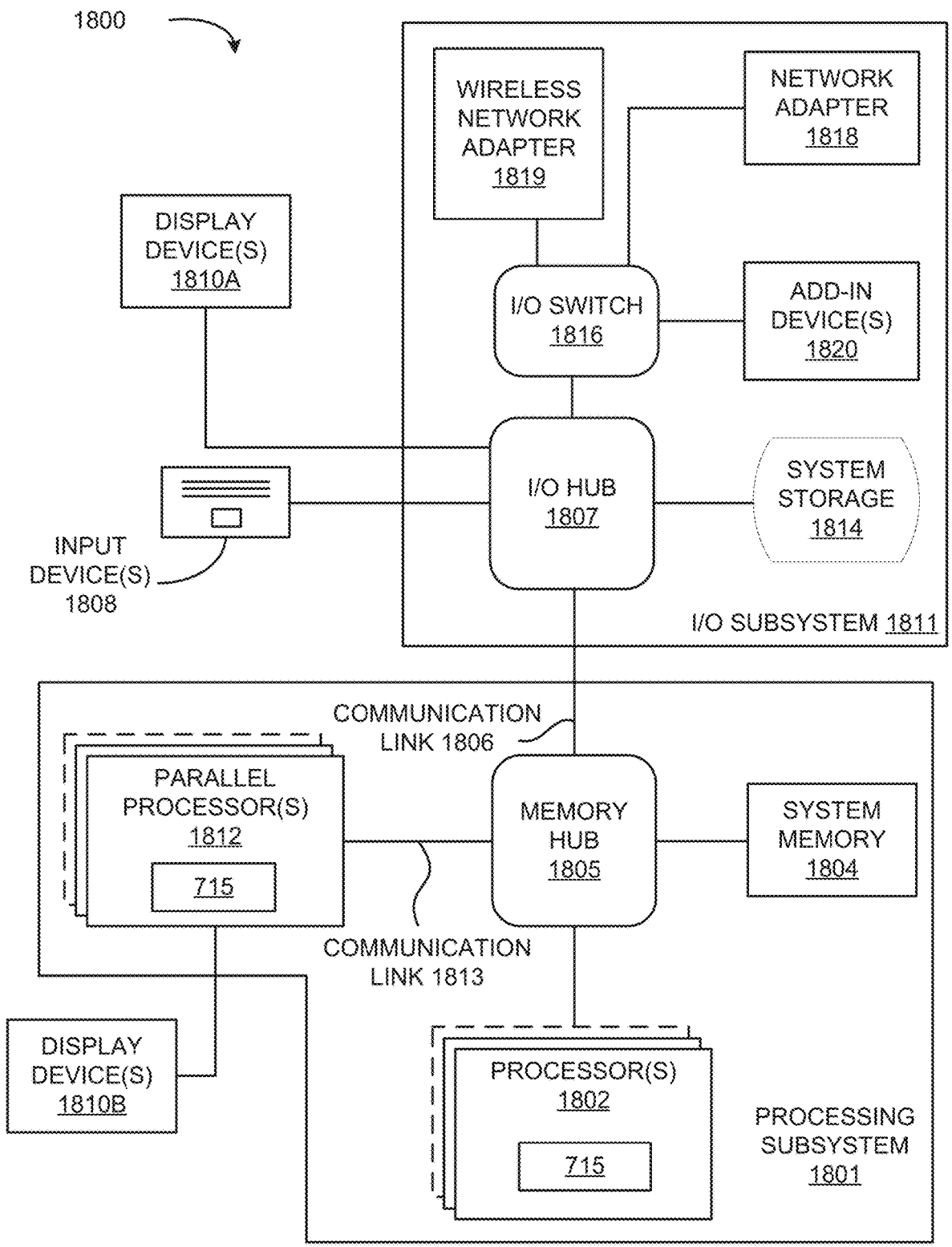
FIG. 18 illustrates a computer system, according to at least one embodiment.

FIG. 18 is a block diagram illustrating a computing system 1800 according to at least one embodiment. In at least one embodiment, a computing system 1800 includes a processing subsystem 1801 having one or more processor(s) 1802 and a system memory 1804 communicating via an interconnection path that may include a memory hub 1805. In at least one embodiment, a memory hub 1805 may be a separate component within a chipset component or may be integrated within one or more processor(s) 1802. In at least one embodiment, a memory hub 1805 couples with an I/O subsystem 1811 via a communication link 1806. In at least one embodiment, an I/O subsystem 1811 includes an I/O hub 1807 that can enable a computing system 1800 to receive input from one or more input device(s) 1808. In at least one embodiment, an I/O hub 1807 can enable a display controller, which may be included in one or more processor(s) 1802, to provide outputs to one or more display device(s) 1810A. In at least one embodiment, one or more display device(s) 1810A coupled with I/O hub 1807 can include a local, internal, or embedded display device.

In at least one embodiment, a processing subsystem 1801 includes one or more parallel processor(s) 1812 coupled to a memory hub 1805 via a bus or other communication link 1813 as shown in FIG. 18. In at least one embodiment, a communication link 1813 may be one of any number of standards based communication link technologies or protocols, such as, but not limited to PCI Express, or may be a vendor specific communications interface or communications fabric. In at least one embodiment, one or more parallel processor(s) 1812 form a computationally focused parallel or vector processing system that can include a large number of processing cores and/or processing clusters, such as a many integrated core (MIC) processor. In at least one embodiment, one or more parallel processor(s) 1812 form a graphics processing subsystem that can output pixels to one of one or more display device(s) 1810A coupled via I/O Hub 1807. In at least one embodiment, one or more parallel processor(s) 1812 can also include a display controller and display interface (not shown) to enable a direct connection to one or more display device(s) 1810B.

In at least one embodiment, a system storage unit 1814 can connect to an I/O hub 1807 to provide a storage mechanism for computing system 1800. In at least one embodiment, an I/O switch 1816 can be used to provide an interface mechanism to enable connections between an I/O hub 1807 and other components, such as a network adapter 1818 and/or wireless network adapter 1819 that may be integrated into a platform, and various other devices that can be added via one or more add-in device(s) 1820. In at least one embodiment, a network adapter 1818 can be an Ethernet adapter or another wired network adapter. In at least one embodiment, a wireless network adapter 1819 can include one or more of a Wi-Fi, Bluetooth, near field communication (NFC), or other network device that includes one or more wireless radios.

In at least one embodiment, a computing system 1800 can include other components not explicitly shown, including USB or other port connections, optical storage drives, video capture devices, and the like, may also be connected to an I/O hub 1807. In at least one embodiment, communication paths interconnecting various components in FIG. 18 may be implemented using any suitable protocols, such as PCI (Peripheral Component Interconnect) based protocols (e.g., PCI-Express), or other bus or point-to-point communication interfaces and/or protocol(s), such as an NVLink high-speed interconnect, or interconnect protocols.

In at least one embodiment, one or more parallel processor(s) 1812 incorporate circuitry optimized for graphics and video processing, including, for example, video output circuitry, and constitute a graphics processing unit (GPU). In at least one embodiment, one or more parallel processor(s) 1812 incorporate circuitry optimized for general purpose processing. In at least one embodiment, components of a computing system 1800 may be integrated with one or more other system elements on a single integrated circuit. For example, in at least one embodiment, one or more parallel processor(s) 1812, a memory hub 1805, processor(s) 1802, and an I/O hub 1807 can be integrated into a system on chip (SoC) integrated circuit. In at least one embodiment, components of a computing system 1800 can be integrated into a single package to form a system in package (SIP) configuration. In at least one embodiment, at least a portion of components of computing system 1800 can be integrated into a multi-chip module (MCM), which can be interconnected with other multi-chip modules into a modular computing system.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in system FIG. 18 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 18 to perform CRC generation and/or checking.

Processors

Figure 19A:
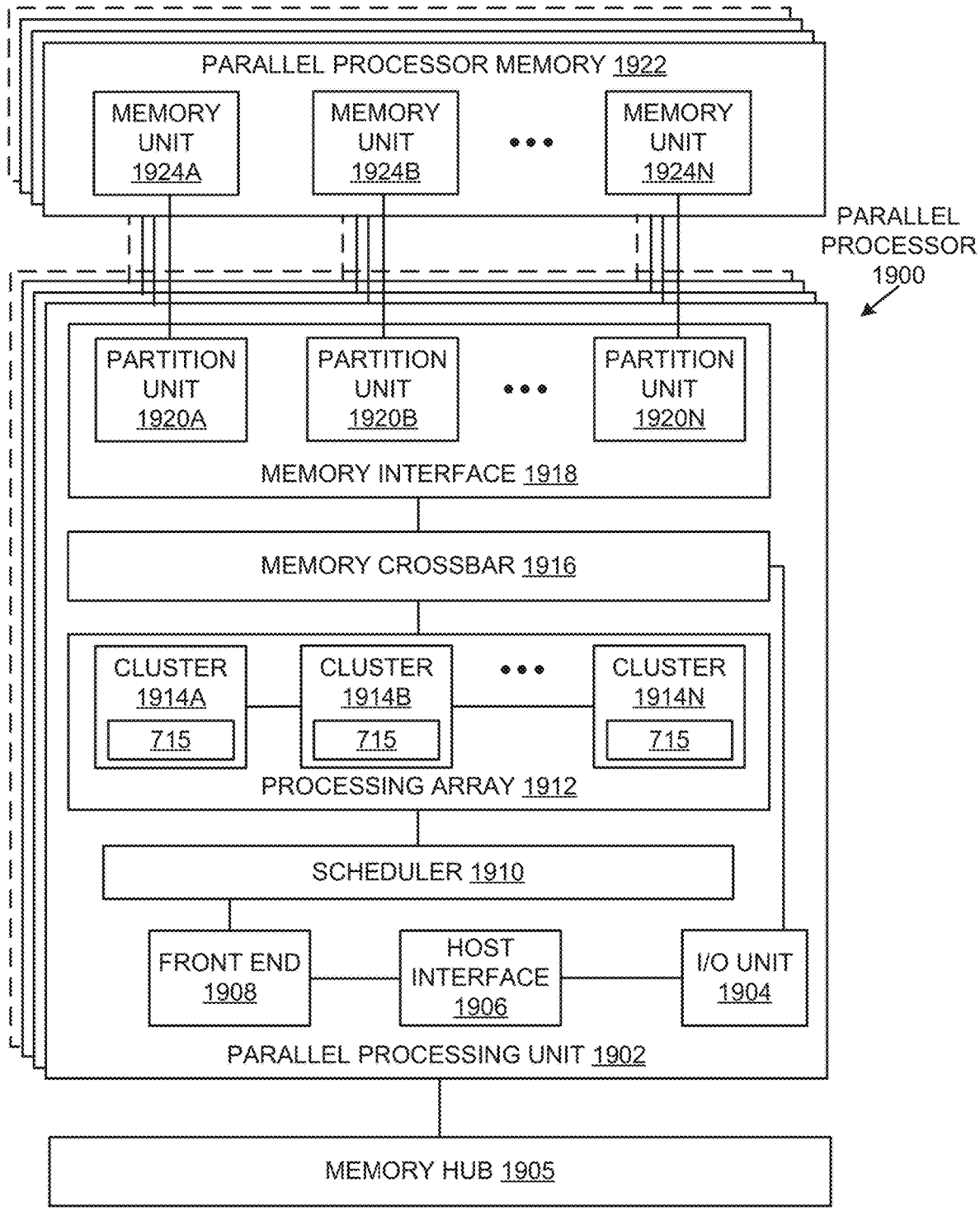
FIG. 19A illustrates a parallel processor, according to at least one embodiment.

FIG. 19A illustrates a parallel processor 1900 according to at least one embodiment. In at least one embodiment, various components of a parallel processor 1900 may be implemented using one or more integrated circuit devices, such as programmable processors, application specific integrated circuits (ASICs), or field programmable gate arrays (FPGA). In at least one embodiment, an illustrated parallel processor 1900 is a variant of one or more parallel processor(s) 1812 shown in FIG. 18 according to at least one embodiment.

In at least one embodiment, a parallel processor 1900 includes a parallel processing unit 1902. In at least one embodiment, a parallel processing unit 1902 includes an I/O unit 1904 that enables communication with other devices, including other instances of a parallel processing unit 1902. In at least one embodiment, I/O unit 1904 may be directly connected to other devices. In at least one embodiment, I/O unit 1904 connects with other devices via use of a hub or switch interface, such as memory hub 1905. In at least one embodiment, connections between a memory hub 1905 and an I/O unit 1904 form a communication link 1813 as shown in FIG. 18. In at least one embodiment, an I/O unit 1904 connects with a host interface 1906 and a memory crossbar 1916, where host interface 1906 receives commands directed to performing processing operations and a memory crossbar 1916 receives commands directed to performing memory operations.

In at least one embodiment, when a host interface 1906 receives a command buffer via an I/O unit 1904, a host interface 1906 can direct work operations to perform those commands to a front end 1908. In at least one embodiment, a front end 1908 couples with a scheduler 1910, which is configured to distribute commands or other work items to a processing cluster array 1912. In at least one embodiment, a scheduler 1910 ensures that processing cluster array 1912 is properly configured and in a valid state before tasks are distributed to a processing cluster array 1912. In at least one embodiment, a scheduler 1910 is implemented via firmware logic executing on a microcontroller. In at least one embodiment, a microcontroller implemented scheduler 1910 is configurable to perform complex scheduling and work distribution operations at coarse and fine granularity, enabling rapid preemption and context switching of threads executing on a processing array 1912. In at least one embodiment, host software can prove workloads for scheduling on a processing array 1912 via one of multiple graphics processing doorbells. In at least one embodiment, workloads can then be automatically distributed across a processing array 1912 by a scheduler 1910 logic within a microcontroller including a scheduler 1910.

In at least one embodiment, a processing cluster array 1912 can include up to "N" processing clusters (e.g., cluster 1914A, cluster 1914B, through cluster 1914N). In at least one embodiment, each cluster 1914A-1914N of a processing cluster array 1912 can execute a large number of concurrent threads. In at least one embodiment, a scheduler 1910 can allocate work to clusters 1914A-1914N of a processing cluster array 1912 using various scheduling and/or work distribution algorithms, which may vary depending on workload arising for each type of program or computation. In at least one embodiment, scheduling can be handled dynamically by a scheduler 1910, or can be assisted in part by compiler logic during compilation of program logic configured for execution by processing cluster array 1912. In at least one embodiment, different clusters 1914A-1914N of processing cluster array 1912 can be allocated for processing different types of programs or for performing different types of computations.

In at least one embodiment, a processing cluster array 1912 can be configured to perform various types of parallel processing operations. In at least one embodiment, a processing cluster array 1912 is configured to perform general-purpose parallel compute operations. For example, in at least one embodiment, a processing cluster array 1912 can include logic to execute processing tasks including filtering of video and/or audio data, performing modeling operations, including physics operations, and performing data transformations.

In at least one embodiment, a processing cluster array 1912 is configured to perform parallel graphics processing operations. In at least one embodiment, a processing cluster array 1912 can include additional logic to support execution of such graphics processing operations, including, but not limited to texture sampling logic to perform texture operations, as well as tessellation logic and other vertex processing logic. In at least one embodiment, a processing cluster array 1912 can be configured to execute graphics processing related shader programs such as, but not limited to vertex shaders, tessellation shaders, geometry shaders, and pixel shaders. In at least one embodiment, a parallel processing unit 1902 can transfer data from a system memory via an I/O unit 1904 for processing. In at least one embodiment, during processing, transferred data can be stored to on-chip memory (e.g., parallel processor memory 1922) during processing, then written back to system memory.

In at least one embodiment, when a parallel processing unit 1902 is used to perform graphics processing, a scheduler 1910 can be configured to divide a processing workload into approximately equal sized tasks, to better enable distribution of graphics processing operations to multiple clusters 1914A-1914N of a processing cluster array 1912. In at least one embodiment, portions of a processing cluster array 1912 can be configured to perform different types of processing. For example, in at least one embodiment, a first portion may be configured to perform vertex shading and topology generation, a second portion may be configured to perform tessellation and geometry shading, and a third portion may be configured to perform pixel shading or other screen space operations, to produce a rendered image for display. In at least one embodiment, intermediate data produced by one or more of clusters 1914A-1914N may be stored in buffers to allow intermediate data to be transmitted between clusters 1914A-1914N for further processing.

In at least one embodiment, a processing cluster array 1912 can receive processing tasks to be executed via a scheduler 1910, which receives commands defining processing tasks from a front end 1908. In at least one embodiment, processing tasks can include indices of data to be processed, e.g., surface (patch) data, primitive data, vertex data, and/or pixel data, as well as state parameters and commands defining how data is to be processed (e.g., what program is to be executed). In at least one embodiment, a scheduler 1910 may be configured to fetch indices corresponding to tasks or may receive indices from a front end 1908. In at least one embodiment, a front end 1908 can be configured to ensure a processing cluster array 1912 is configured to a valid state before a workload specified by incoming command buffers (e.g., batch-buffers, push buffers, etc.) is initiated.

In at least one embodiment, each of one or more instances of a parallel processing unit 1902 can couple with parallel processor memory 1922. In at least one embodiment, parallel processor memory 1922 can be accessed via a memory crossbar 1916, which can receive memory requests from a processing cluster array 1912 as well as an I/O unit 1904. In at least one embodiment, a memory crossbar 1916 can access parallel processor memory 1922 via a memory interface 1918. In at least one embodiment, memory interface 1918 can include multiple partition units (e.g., partition unit 1920A, partition unit 1920B, through partition unit 1920N) that can each couple to a portion (e.g., memory unit) of parallel processor memory 1922. In at least one embodiment, a number of partition units 1920A-1920N is configured to be equal to a number of memory units, such that a first partition unit 1920A has a corresponding first memory unit 1924A, a second partition unit 1920B has a corresponding memory unit 1924B, and an Nth partition unit 1920N has a corresponding Nth memory unit 1924N. In at least one embodiment, a number of partition units 1920A-1920N may not be equal to a number of memory devices.

In at least one embodiment, memory units 1924A-1924N can include various types of memory devices, including dynamic random access memory (DRAM) or graphics random access memory, such as synchronous graphics random access memory (SGRAM), including graphics double data rate (GDDR) memory. In at least one embodiment, memory units 1924A-1924N may also include 3D stacked memory, including but not limited to high bandwidth memory (HBM). In at least one embodiment, render targets, such as frame buffers or texture maps may be stored across memory units 1924A-1924N, allowing partition units 1920A-1920N to write portions of each render target in parallel to efficiently use available bandwidth of parallel processor memory 1922. In at least one embodiment, a local instance of parallel processor memory 1922 may be excluded in favor of a unified memory design that utilizes system memory in conjunction with local cache memory.

In at least one embodiment, any one of clusters 1914A-1914N of a processing cluster array 1912 can process data that will be written to any of memory units 1924A-1924N within a parallel processor memory 1922. In at least one embodiment, a memory crossbar 1916 can be configured to transfer an output of each cluster 1914A-1914N to any partition unit 1920A-1920N or to another cluster 1914A-1914N, which can perform additional processing operations on an output. In at least one embodiment, each cluster 1914A-1914N can communicate with a memory interface 1918 through a memory crossbar 1916 to read from or write to various external memory devices. In at least one embodiment, a memory crossbar 1916 has a connection to a memory interface 1918 to communicate with an I/O unit 1904, as well as a connection to a local instance of a parallel processor memory 1922, enabling processing units within different processing clusters 1914A-1914N to communicate with system memory or other memory that is not local to a parallel processing unit 1902. In at least one embodiment, a memory crossbar 1916 can use virtual channels to separate traffic streams between clusters 1914A-1914N and partition units 1920A-1920N.

In at least one embodiment, multiple instances of a parallel processing unit 1902 can be provided on a single add-in card, or multiple add-in cards can be interconnected. In at least one embodiment, different instances of a parallel processing unit 1902 can be configured to inter-operate even if different instances have different numbers of processing cores, different amounts of local parallel processor memory, and/or other configuration differences. For example, in at least one embodiment, some instances of a parallel processing unit 1902 can include higher precision floating point units relative to other instances. In at least one embodiment, systems incorporating one or more instances of a parallel processing unit 1902 or parallel processor 1900 can be implemented in a variety of configurations and form factors, including but not limited to desktop, laptop, or handheld personal computers, servers, workstations, game consoles, and/or embedded systems.

Figure 19B:
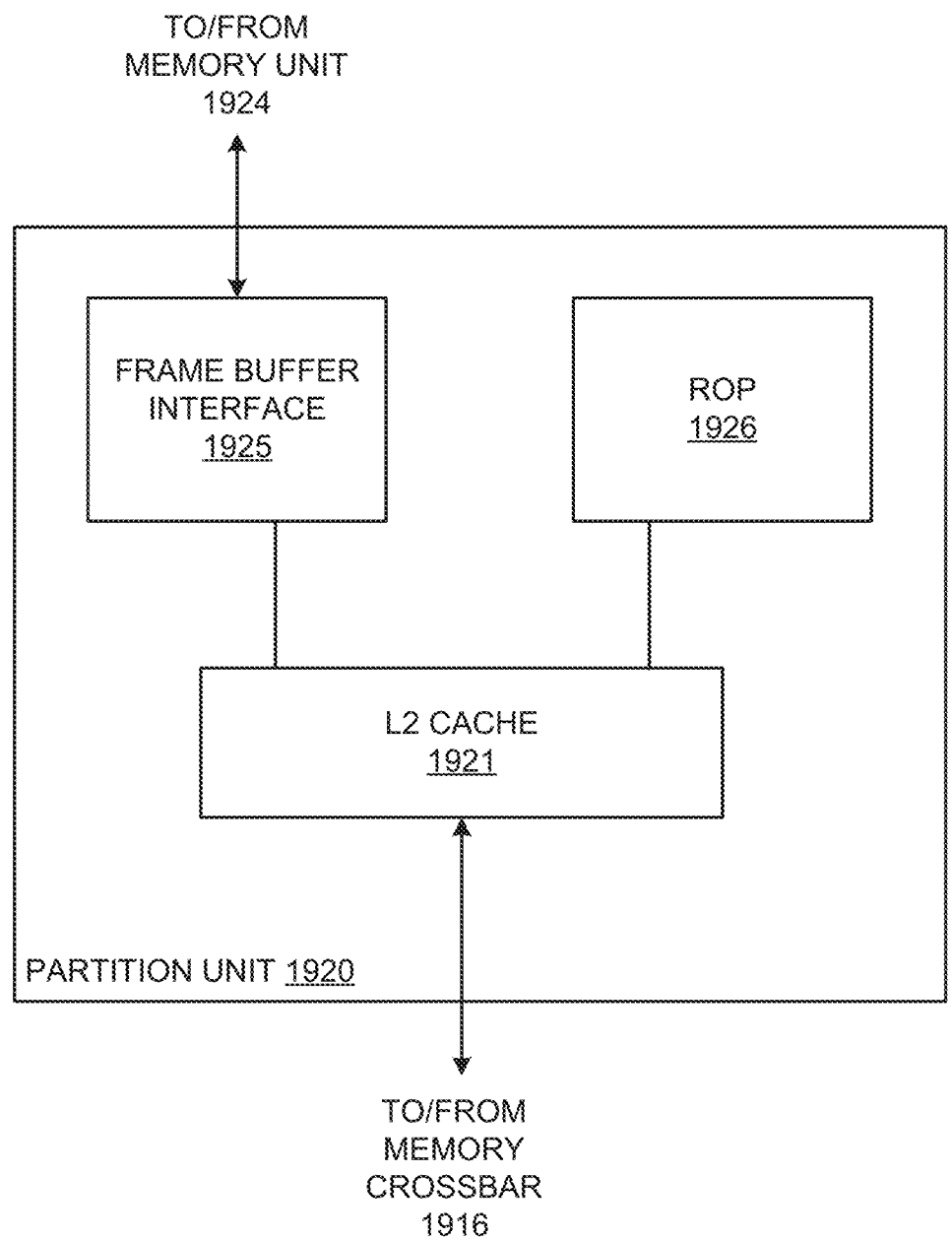
FIG. 19B illustrates a partition unit, according to at least one embodiment.

FIG. 19B is a block diagram of a partition unit 1920 according to at least one embodiment. In at least one embodiment, a partition unit 1920 is an instance of one of partition units 1920A-1920N of FIG. 19A. In at least one embodiment, partition unit 1920 includes an L2 cache 1921, a frame buffer interface 1925, and an ROP 1926 (raster operations unit). In at least one embodiment, an L2 cache 1921 is a read/write cache that is configured to perform load and store operations received from a memory crossbar 1916 and ROP 1926. In at least one embodiment, read misses and urgent write-back requests are output by an L2 cache 1921 to frame buffer interface 1925 for processing. In at least one embodiment, updates can also be sent to a frame buffer via a frame buffer interface 1925 for processing. In at least one embodiment, a frame buffer interface 1925 interfaces with one of memory units in parallel processor memory, such as memory units 1924A-1924N of FIG. 19A (e.g., within parallel processor memory 1922).

In at least one embodiment, an ROP 1926 is a processing unit that performs raster operations such as stencil, z test, blending, and a like. In at least one embodiment, an ROP 1926 then outputs processed graphics data that is stored in graphics memory. In at least one embodiment, an ROP 1926 includes compression logic to compress depth or color data that is written to memory and decompress depth or color data that is read from memory. In at least one embodiment, compression logic can be lossless compression logic that makes use of one or more of multiple compression algorithms. In at least one embodiment, types of compression that are performed by ROP 1926 can vary based on statistical characteristics of data to be compressed. For example, in at least one embodiment, delta color compression is performed on depth and color data on a per-tile basis.

In at least one embodiment, ROP 1926 is included within each processing cluster (e.g., cluster 1914A-1914N of FIG. 19) instead of within a partition unit 1920. In at least one embodiment, read and write requests for pixel data are transmitted over a memory crossbar 1916 instead of pixel fragment data. In at least one embodiment, processed graphics data may be displayed on a display device, such as one of one or more display device(s) 1810 of FIG. 18, routed for further processing by processor(s) 1802, or routed for further processing by processing entities within a parallel processor 1900 of FIG. 19A.

Figure 19C:
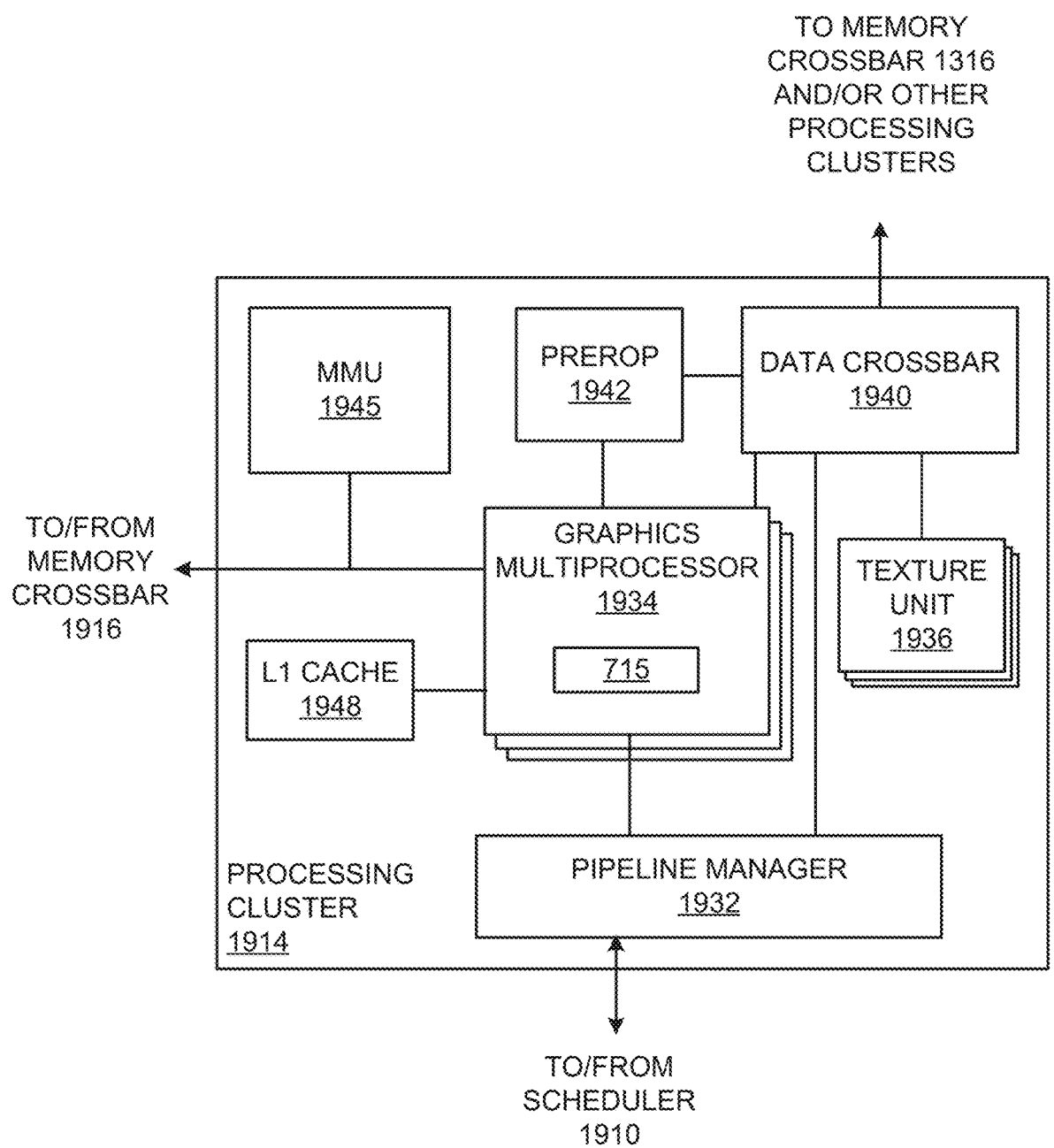
FIG. 19C illustrates a processing cluster, according to at least one embodiment.

FIG. 19C is a block diagram of a processing cluster 1914 within a parallel processing unit according to at least one embodiment. In at least one embodiment, a processing cluster is an instance of one of processing clusters 1914A-1914N of FIG. 19A. In at least one embodiment, a processing cluster 1914 can be configured to execute many threads in parallel, where term "thread" refers to an instance of a particular program executing on a particular set of input data. In at least one embodiment, single-instruction, multiple-data (SIMD) instruction issue techniques are used to support parallel execution of a large number of threads without providing multiple independent instruction units. In at least one embodiment, single-instruction, multiple-thread (SIMT) techniques are used to support parallel execution of a large number of generally synchronized threads, using a common instruction unit configured to issue instructions to a set of processing engines within each processing cluster.

In at least one embodiment, operation of a processing cluster 1914 can be controlled via a pipeline manager 1932 that distributes processing tasks to SIMT parallel processors. In at least one embodiment, a pipeline manager 1932 receives instructions from a scheduler 1910 of FIG. 19A and manages execution of those instructions via a graphics multiprocessor 1934 and/or a texture unit 1936. In at least one embodiment, a graphics multiprocessor 1934 is an exemplary instance of an SIMT parallel processor. However, in at least one embodiment, various types of SIMT parallel processors of differing architectures may be included within a processing cluster 1914. In at least one embodiment, one or more instances of a graphics multiprocessor 1934 can be included within a processing cluster 1914. In at least one embodiment, a graphics multiprocessor 1934 can process data and a data crossbar 1940 can be used to distribute processed data to one of multiple possible destinations, including other shader units. In at least one embodiment, a pipeline manager 1932 can facilitate distribution of processed data by specifying destinations for processed data to be distributed via a data crossbar 1940.

In at least one embodiment, each graphics multiprocessor 1934 within processing cluster 1914 can include an identical set of functional execution logic (e.g., arithmetic logic units, load-store units, etc.). In at least one embodiment, functional execution logic can be configured in a pipelined manner in which new instructions can be issued before previous instructions are complete. In at least one embodiment, functional execution logic supports a variety of operations including integer and floating point arithmetic, comparison operations, Boolean operations, bit-shifting, and computation of various algebraic functions. In at least one embodiment, those same functional-unit hardware can be leveraged to perform different operations and any combination of functional units may be present.

In at least one embodiment, instructions transmitted to a processing cluster 1914 constitute a thread. In at least one embodiment, a set of threads executing across a set of parallel processing engines is a thread group. In at least one embodiment, a thread group executes a program on different input data. In at least one embodiment, each thread within a thread group can be assigned to a different processing engine within a graphics multiprocessor 1934. In at least one embodiment, a thread group may include fewer threads than a number of processing engines within a graphics multiprocessor 1934. In at least one embodiment, when a thread group includes fewer threads than a number of processing engines, one or more of said processing engines may be idle during cycles in which that thread group is being processed. In at least one embodiment, a thread group may also include more threads than a number of processing engines within a graphics multiprocessor 1934. In at least one embodiment, when a thread group includes more threads than number of processing engines within a graphics multiprocessor 1934, processing can be performed over consecutive clock cycles. In at least one embodiment, multiple thread groups can be executed concurrently on a graphics multiprocessor 1934.

In at least one embodiment, a graphics multiprocessor 1934 includes an internal cache memory to perform load and store operations. In at least one embodiment, a graphics multiprocessor 1934 can forego an internal cache and use a cache memory (e.g., an L1 cache 1948) within a processing cluster 1914. In at least one embodiment, each graphics multiprocessor 1934 also has access to L2 caches within partition units (e.g., partition units 1920A-1920N of FIG. 19A) that are shared among all processing clusters 1914 and may be used to transfer data between threads. In at least one embodiment, a graphics multiprocessor 1934 may also access off-chip global memory, which can include one or more of local parallel processor memory and/or system memory. In at least one embodiment, any memory external to a parallel processing unit 1902 may be used as global memory. In at least one embodiment, a processing cluster 1914 includes multiple instances of graphics multiprocessor 1934 that can share common instructions and data, which may be stored in L1 cache 1948.

In at least one embodiment, each processing cluster 1914 may include an MMU 1945 (memory management unit) that is configured to map virtual addresses into physical addresses. In at least one embodiment, one or more instances of an MMU 1945 may reside within a memory interface 1918 of FIG. 19A. In at least one embodiment, an MMU 1945 includes a set of page table entries (PTEs) used to map a virtual address to a physical address of a tile (talk more about tiling) and a cache line index, if used. In at least one embodiment, an MMU 1945 may include address translation lookaside buffers (TLB) or caches that may reside within graphics multiprocessor 1934 or an L1 cache or processing cluster 1914. In at least one embodiment, a physical address is processed to distribute a surface data access locality to allow efficient request interleaving among partition units. In at least one embodiment, a cache line index may be used to determine whether a request for a cache line is a hit or miss.

In at least one embodiment, a processing cluster 1914 may be configured such that each graphics multiprocessor 1934 is coupled to a texture unit 1936 for performing texture mapping operations, e.g., determining texture sample positions, reading texture data, and filtering texture data. In at least one embodiment, texture data is read from an internal texture L1 cache (not shown) or from an L1 cache within a graphics multiprocessor 1934 and is fetched from an L2 cache, a local parallel processor memory, or system memory, as needed. In at least one embodiment, each graphics multiprocessor 1934 outputs processed tasks to a data crossbar 1940 to provide a processed task to another processing cluster 1914 for further processing or to store a processed task in an L2 cache, local parallel processor memory, or system memory via a memory crossbar 1916. In at least one embodiment, a preROP 1942 (pre-raster operations unit) is configured to receive data from a graphics multiprocessor 1934, direct data to ROP units, which may be located with partition units as described herein (e.g., partition units 1920A-1920N of FIG. 19A). In at least one embodiment, a PreROP 1942 unit can perform optimizations for color blending, organize pixel color data, and perform address translations.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in a graphics processing cluster 1914 for inferencing or predicting operations based, at least in part, on weight parameters calculated using neural network training operations, neural network functions and/or architectures, or neural network use cases described herein.

Figure 19D:
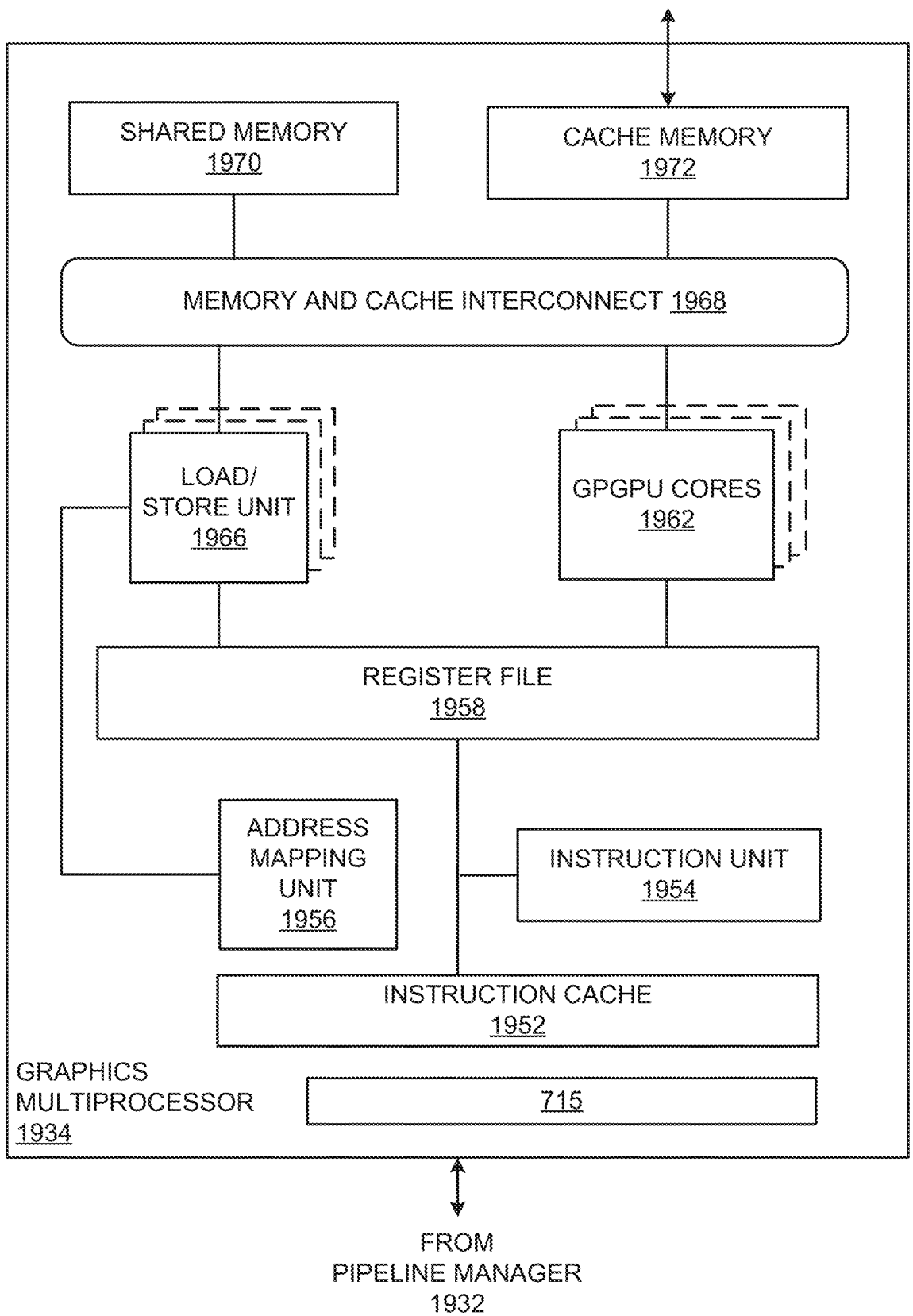
FIG. 19D illustrates a graphics multiprocessor, according to at least one embodiment.

FIG. 19D shows a graphics multiprocessor 1934 according to at least one embodiment. In at least one embodiment, a graphics multiprocessor 1934 couples with a pipeline manager 1932 of a processing cluster 1914. In at least one embodiment, a graphics multiprocessor 1934 has an execution pipeline including but not limited to an instruction cache 1952, an instruction unit 1954, an address mapping unit 1956, a register file 1958, one or more general purpose graphics processing unit (GPGPU) cores 1962, and one or more load/store units 1966. In at least one embodiment, GPGPU cores 1962 and load/store units 1966 are coupled with a cache memory 1972 and a shared memory 1970 via a memory and a cache interconnect 1968.

In at least one embodiment, an instruction cache 1952 receives a stream of instructions to execute from a pipeline manager 1932. In at least one embodiment, instructions are cached in an instruction cache 1952 and dispatched for execution by an instruction unit 1954. In at least one embodiment, an instruction unit 1954 can dispatch instructions as thread groups (e.g., warps), with each thread of a thread group assigned to a different execution unit within a GPGPU core 1962. In at least one embodiment, an instruction can access any of a local, shared, or global address space by specifying an address within a unified address space. In at least one embodiment, an address mapping unit 1956 can be used to translate addresses in a unified address space into a distinct memory address that can be accessed by load/store units 1966.

In at least one embodiment, a register file 1958 provides a set of registers for functional units of a graphics multiprocessor 1934. In at least one embodiment, a register file 1958 provides temporary storage for operands connected to data paths of functional units (e.g., GPGPU cores 1962, load/store units 1966) of a graphics multiprocessor 1934. In at least one embodiment, a register file 1958 is divided between each of those functional units such that each functional unit is allocated a dedicated portion of a register file 1958. In at least one embodiment, a register file 1958 is divided between different warps being executed by a graphics multiprocessor 1934.

In at least one embodiment, GPGPU cores 1962 can each include floating point units (FPUs) and/or integer arithmetic logic units (ALUs) that are used to execute instructions of a graphics multiprocessor 1934. In at least one embodiment, GPGPU cores 1962 can be similar in architecture or can differ in architecture. In at least one embodiment, a first portion of GPGPU cores 1962 includes a single precision FPU and an integer ALU while a second portion of GPGPU cores includes a double precision FPU. In at least one embodiment, FPUs can implement the IEEE 754-2008 standard for floating point arithmetic or enable variable precision floating point arithmetic. In at least one embodiment, a graphics multiprocessor 1934 can additionally include one or more fixed function or special function units to perform specific functions such as copy rectangle or pixel blending operations. In at least one embodiment, one or more of GPGPU cores can also include fixed or special function logic.

In at least one embodiment, GPGPU cores 1962 include SIMD logic capable of performing a single instruction on multiple sets of data. In at least one embodiment, GPGPU cores 1962 can physically execute SIMD4, SIMD8, and SIMD16 instructions and logically execute SIMD1, SIMD2, and SIMD32 instructions. In at least one embodiment, SIMD instructions for GPGPU cores can be generated at compile time by a shader compiler or automatically generated when executing programs written and compiled for single program multiple data (SPMD) or SIMT architectures. In at least one embodiment, multiple threads of a program configured for an SIMT execution model can executed via a single SIMD instruction. For example, in at least one embodiment, eight SIMT threads that perform same or similar operations can be executed in parallel via a single SIMD8 logic unit.

In at least one embodiment, a memory and cache interconnect 1968 is an interconnect network that connects each functional unit of a graphics multiprocessor 1934 to register file 1958 and to a shared memory 1970. In at least one embodiment, a memory and cache interconnect 1968 is a crossbar interconnect that allows a load/store unit 1966 to implement load and store operations between a shared memory 1970 and a register file 1958. In at least one embodiment, a register file 1958 can operate at a same frequency as GPGPU cores 1962, thus data transfer between GPGPU cores 1962 and a register file 1958 is very low latency. In at least one embodiment, a shared memory 1970 can be used to enable communication between threads that execute on functional units within a graphics multiprocessor 1934. In at least one embodiment, a cache memory 1972 can be used as a data cache for example, to cache texture data communicated between functional units and a texture unit 1936. In at least one embodiment, a shared memory 1970 can also be used as a program managed cache. In at least one embodiment, threads executing on GPGPU cores 1962 can programmatically store data within a shared memory in addition to automatically cached data that is stored within a cache memory 1972.

In at least one embodiment, a parallel processor or GPGPU as described herein is communicatively coupled to host/processor cores to accelerate graphics operations, machine-learning operations, pattern analysis operations, and various general purpose GPU (GPGPU) functions. In at least one embodiment, a GPU may be communicatively coupled to host processor/cores over a bus or other interconnect (e.g., a high speed interconnect such as PCIe or NVLink). In at least one embodiment, a GPU may be integrated on same package or chip as cores and communicatively coupled to cores over an internal processor bus/interconnect (e.g., internal to a package or chip). In at least one embodiment, regardless of manner in which a GPU is connected, processor cores may allocate work to a GPU in form of sequences of commands/instructions contained in a work descriptor. In at least one embodiment, a GPU then uses dedicated circuitry/logic for efficiently processing these commands/instructions.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in a graphics multiprocessor 1934 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 19A through 19D to perform CRC generation and/or checking.

Figure 20:
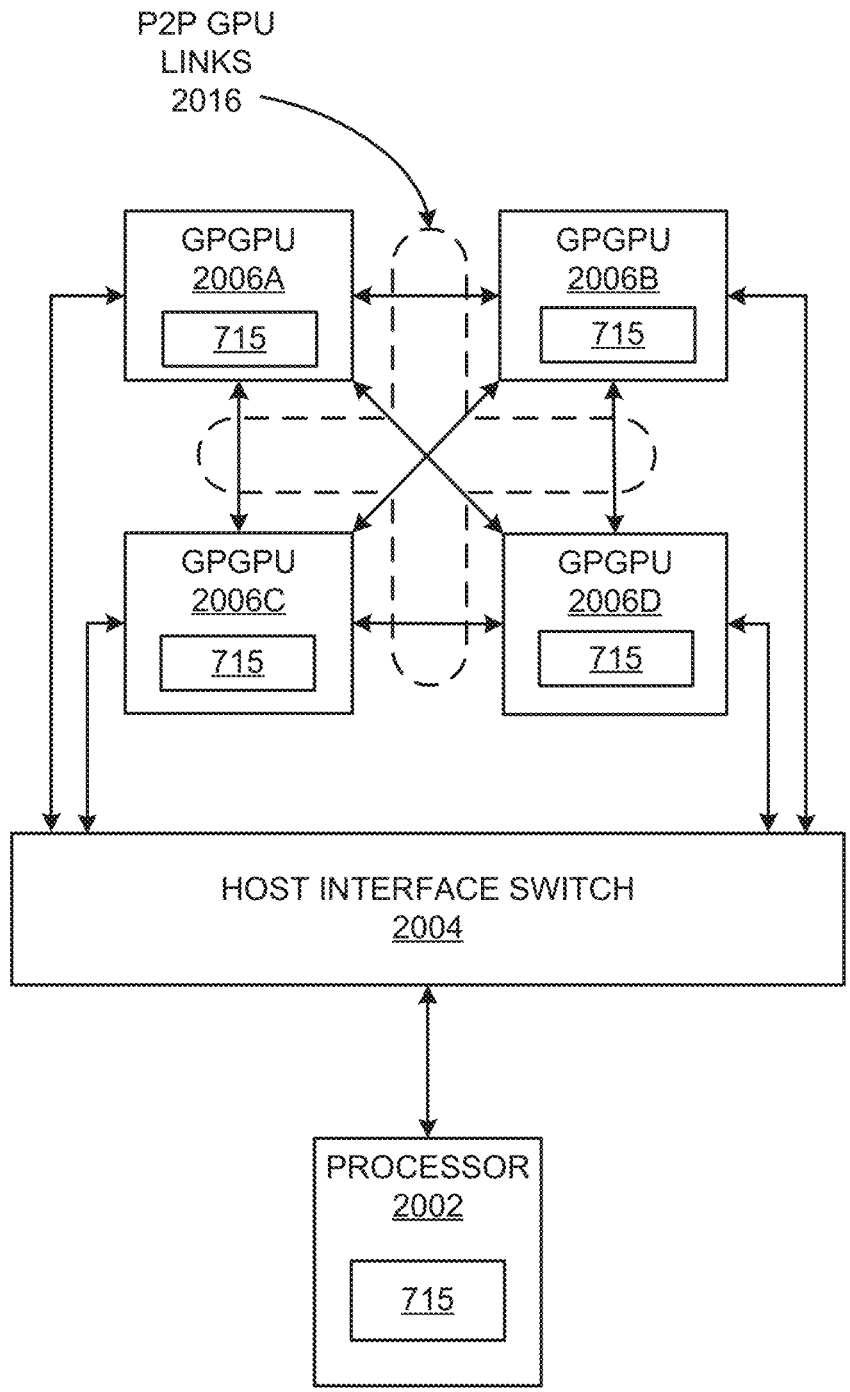
FIG. 20 illustrates a multi-graphics processing unit (GPU) system, according to at least one embodiment.

FIG. 20 illustrates a multi-GPU computing system 2000, according to at least one embodiment. In at least one embodiment, multi-GPU computing system 2000 can include a processor 2002 coupled to multiple general purpose graphics processing units (GPGPUs) 2006A-D via a host interface switch 2004. In at least one embodiment, host interface switch 2004 is a PCI express switch device that couples processor 2002 to a PCI express bus over which processor 2002 can communicate with GPGPUs 2006A-D. In at least one embodiment, GPGPUs 2006A-D can interconnect via a set of high-speed point to point GPU to GPU links 2016. In at least one embodiment, GPU to GPU links 2016 connect to each of GPGPUs 2006A-D via a dedicated GPU link. In at least one embodiment, P2P GPU links 2016 enable direct communication between each of GPGPUs 2006A-D without requiring communication over host interface bus 2004 to which processor 2002 is connected. In at least one embodiment, with GPU-to-GPU traffic directed to P2P GPU links 2016, host interface bus 2004 remains available for system memory access or to communicate with other instances of multi-GPU computing system 2000, for example, via one or more network devices. While in at least one embodiment GPGPUs 2006A-D connect to processor 2002 via host interface switch 2004, in at least one embodiment processor 2002 includes direct support for P2P GPU links 2016 and can connect directly to GPGPUs 2006A-D.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in multi-GPU computing system 2000 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 20 to perform CRC generation and/or checking.

Figure 21:
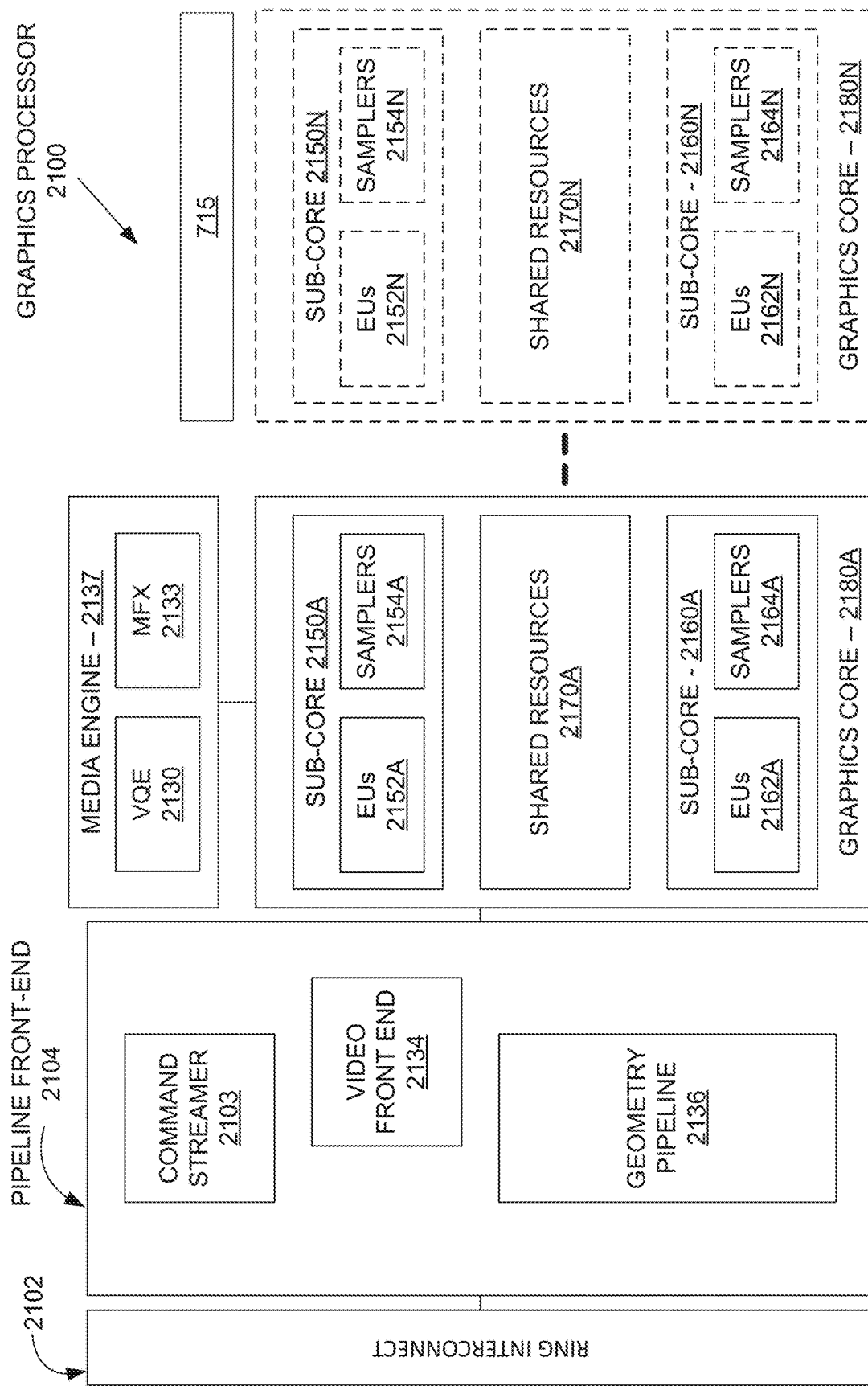
FIG. 21 illustrates a graphics processor, according to at least one embodiment.

FIG. 21 is a block diagram of a graphics processor 2100, according to at least one embodiment. In at least one embodiment, graphics processor 2100 includes a ring interconnect 2102, a pipeline front-end 2104, a media engine 2137, and graphics cores 2180A-2180N. In at least one embodiment, ring interconnect 2102 couples graphics processor 2100 to other processing units, including other graphics processors or one or more general-purpose processor cores. In at least one embodiment, graphics processor 2100 is one of many processors integrated within a multi-core processing system.

In at least one embodiment, graphics processor 2100 receives batches of commands via ring interconnect 2102. In at least one embodiment, incoming commands are interpreted by a command streamer 2103 in pipeline front-end 2104. In at least one embodiment, graphics processor 2100 includes scalable execution logic to perform 3D geometry processing and media processing via graphics core(s) 2180A-2180N. In at least one embodiment, for 3D geometry processing commands, command streamer 2103 supplies commands to geometry pipeline 2136. In at least one embodiment, for at least some media processing commands, command streamer 2103 supplies commands to a video front end 2134, which couples with a media engine 2137. In at least one embodiment, media engine 2137 includes a Video Quality Engine (VQE) 2130 for video and image post-processing and a multi-format encode/decode (MFX) 2133 engine to provide hardware-accelerated media data encode and decode. In at least one embodiment, geometry pipeline 2136 and media engine 2137 each generate execution threads for thread execution resources provided by at least one graphics core 2180A.

In at least one embodiment, graphics processor 2100 includes scalable thread execution resources featuring modular cores 2180A-2180N (sometimes referred to as core slices), each having multiple sub-cores 2150A-550N, 2160A-2160N (sometimes referred to as core sub-slices). In at least one embodiment, graphics processor 2100 can have any number of graphics cores 2180A through 2180N. In at least one embodiment, graphics processor 2100 includes a graphics core 2180A having at least a first sub-core 2150A and a second sub-core 2160A. In at least one embodiment, graphics processor 2100 is a low power processor with a single sub-core (e.g., 2150A). In at least one embodiment, graphics processor 2100 includes multiple graphics cores 2180A-2180N, each including a set of first sub-cores 2150A-2150N and a set of second sub-cores 2160A-2160N. In at least one embodiment, each sub-core in first sub-cores 2150A-2150N includes at least a first set of execution units 2152A-2152N and media/texture samplers 2154A-2154N. In at least one embodiment, each sub-core in second sub-cores 2160A-2160N includes at least a second set of execution units 2162A-2162N and samplers 2164A-2164N. In at least one embodiment, each sub-core 2150A-2150N, 2160A-2160N shares a set of shared resources 2170A-2170N. In at least one embodiment, shared resources include shared cache memory and pixel operation logic.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, inference and/or training logic 715 may be used in graphics processor 2100 for inferencing or predicting operations based, at least in part, on weight parameters calculated using neural network training operations, neural network functions and/or architectures, or neural network use cases described herein.

In at least one embodiment, a GPU-based CRC processing unit might be used in a system of FIG. 21 to perform CRC generation and/or checking.

Figure 22:
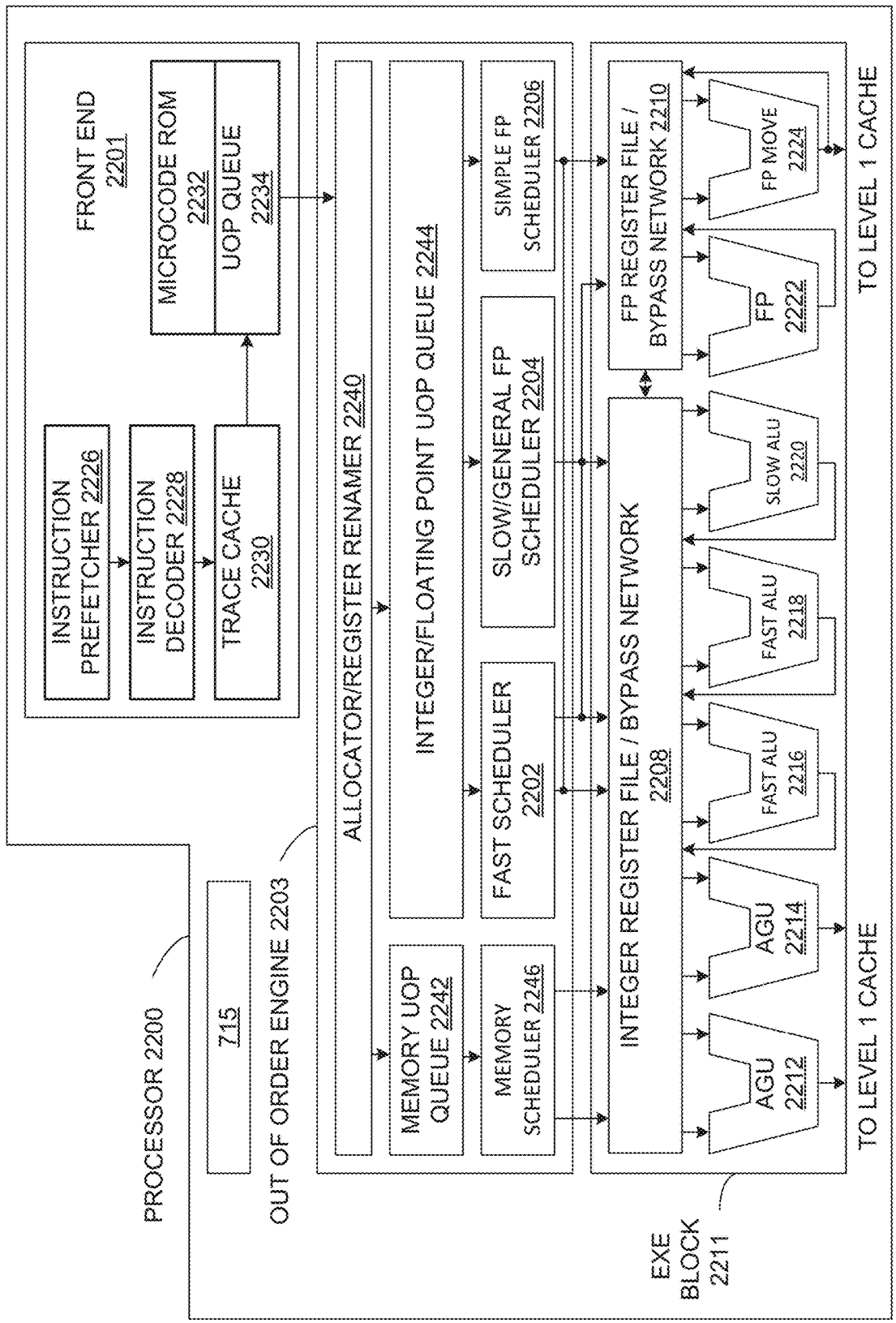
FIG. 22 is a block diagram illustrating a processor microarchitecture for a processor, according to at least one embodiment.

FIG. 22 is a block diagram illustrating micro-architecture for a processor 2200 that may include logic circuits to perform instructions, according to at least one embodiment.

In at least one embodiment, a processor 2200 may perform instructions, including x86 instructions, ARM instructions, specialized instructions for application-specific integrated circuits (ASICs), etc. In at least one embodiment, a processor 2210 may include registers to store packed data, such as 64-bit wide MMX™ registers in microprocessors enabled with MMX technology from Intel Corporation of Santa Clara, Calif. In at least one embodiment, MMX registers, available in both integer and floating point forms, may operate with packed data elements that accompany single instruction, multiple data ("SIMD") and streaming SIMD extensions ("SSE") instructions. In at least one embodiment, 128-bit wide XMM registers relating to SSE2, SSE3, SSE4, AVX, or beyond (referred to generically as "SSEx") technology may hold such packed data operands. In at least one embodiment, processors 2210 may perform instructions to accelerate machine learning or deep learning algorithms, training, or inferencing.

In at least one embodiment, a processor 2200 includes an in-order front end ("front end") 2201 to fetch instructions to be executed and prepare instructions to be used later in a processor pipeline. In at least one embodiment, a front end 2201 may include several units. In at least one embodiment, an instruction prefetcher 2226 fetches instructions from memory and feeds instructions to an instruction decoder 2228 which in turn decodes or interprets instructions. For example, in at least one embodiment, an instruction decoder 2228 decodes a received instruction into one or more operations called "micro-instructions" or "micro-operations" (also called "micro ops" or "uops") that a machine may execute. In at least one embodiment, an instruction decoder 2228 parses instruction into an opcode and corresponding data and control fields that may be used by micro-architecture to perform operations in accordance with at least one embodiment. In at least one embodiment, a trace cache 2230 may assemble decoded uops into program ordered sequences or traces in a uop queue 2234 for execution. In at least one embodiment, when a trace cache 2230 encounters a complex instruction, a microcode ROM 2232 provides uops needed to complete operation.

In at least one embodiment, some instructions may be converted into a single micro-op, whereas others need several micro-ops to complete full operation. In at least one embodiment, if more than four micro-ops are needed to complete an instruction, an instruction decoder 2228 may access microcode ROM 2232 to perform an instruction. In at least one embodiment, an instruction may be decoded into a small number of micro-ops for processing an instruction decoder 2228. In at least one embodiment, an instruction may be stored within microcode ROM 2232 should a number of micro-ops be needed to accomplish an operation. In at least one embodiment, a trace cache 2230 refers to an entry point programmable logic array ("PLA") to determine a correct micro-instruction pointer for reading microcode sequences to complete one or more instructions from microcode ROM 2232 in accordance with at least one embodiment. In at least one embodiment, after a microcode ROM 2232 finishes sequencing micro-ops for an instruction, a front end 2201 of a machine may resume fetching micro-ops from a trace cache 2230.

In at least one embodiment, an out-of-order execution engine ("out of order engine") 2203 may prepare instructions for an execution. In at least one embodiment, an out-of-order execution logic has a number of buffers to smooth out and re-order flow of instructions to optimize performance as they go down pipeline and get scheduled for execution. In at least one embodiment, an out-of-order execution engine 2203 includes, without limitation, an allocator/register renamer 2240, a memory uop queue 2242, an integer/floating point uop queue 2244, a memory scheduler 2246, a fast scheduler 2202, a slow/general floating point scheduler ("slow/general FP scheduler") 2204, and a simple floating point scheduler ("simple FP scheduler") 2206. In at least one embodiment, a fast schedule 2202, a slow/general floating point scheduler 2204, and a simple floating point scheduler 2206 are also collectively referred to herein as "uop schedulers 2202, 2204, 2206." An allocator/register renamer 2240 allocates machine buffers and resources that each uop needs in order to execute. In at least one embodiment, an allocator/register renamer 2240 renames logic registers onto entries in a register file. In at least one embodiment, an allocator/register renamer 2240 also allocates an entry for each uop in one of two uop queues, a memory uop queue 2242 for memory operations and an integer/floating point uop queue 2244 for non-memory operations, in front of a memory scheduler 2246 and uop schedulers 2202, 2204, 2206. In at least one embodiment, uop schedulers 2202, 2204, 2206, determine when a uop is ready to execute based on readiness of their dependent input register operand sources and availability of execution resources uops need to complete their operation. In at least one embodiment, a fast scheduler 2202 of at least one embodiment may schedule on each half of main clock cycle while a slow/general floating point scheduler 2204 and a simple floating point scheduler 2206 may schedule once per main processor clock cycle. In at least one embodiment, uop schedulers 2202, 2204, 2206 arbitrate for dispatch ports to schedule uops for execution.

In at least one embodiment, an execution block b11 includes, without limitation, an integer register file/bypass network 2208, a floating point register file/bypass network ("FP register file/bypass network") 2210, address generation units ("AGUs") 2212 and 2214, fast Arithmetic Logic Units (ALUs) ("fast ALUs") 2216 and 2218, a slow Arithmetic Logic Unit ("slow ALU") 2220, a floating point ALU ("FP") 2222, and a floating point move unit ("FP move") 2224. In at least one embodiment, an integer register file/bypass network 2208 and a floating point register file/bypass network 2210 are also referred to herein as "register files 2208, 2210." In at least one embodiment, AGUSs 2212 and 2214, fast ALUs 2216 and 2218, a slow ALU 2220, a floating point ALU 2222, and a floating point move unit 2224 are also referred to herein as "execution units 2212, 2214, 2216, 2218, 2220, 2222, and 2224." In at least one embodiment, an execution block b11 may include, without limitation, any number (including zero) and type of register files, bypass networks, address generation units, and execution units, in any combination.

In at least one embodiment, register files 2208, 2210 may be arranged between uop schedulers 2202, 2204, 2206, and execution units 2212, 2214, 2216, 2218, 2220, 2222, and 2224. In at least one embodiment, an integer register file/bypass network 2208 performs integer operations. In at least one embodiment, a floating point register file/bypass network 2210 performs floating point operations. In at least one embodiment, each of register files 2208, 2210 may include, without limitation, a bypass network that may bypass or forward just completed results that have not yet been written into register file to new dependent uops. In at least one embodiment, register files 2208, 2210 may communicate data with each other. In at least one embodiment, integer register file/bypass network 2208 may include, without limitation, two separate register files, one register file for low-order thirty-two bits of data and a second register file for high order thirty-two bits of data. In at least one embodiment, a floating point register file/bypass network 2210 may include, without limitation, 128-bit wide entries because floating point instructions typically have operands from 64 to 128 bits in width.

In at least one embodiment, execution units 2212, 2214, 2216, 2218, 2220, 2222, 2224 may execute instructions. In at least one embodiment, register files 2208, 2210 store integer and floating point data operand values that microinstructions need to execute. In at least one embodiment, a processor 2200 may include, without limitation, any number and combination of execution units 2212, 2214, 2216, 2218, 2220, 2222, 2224. In at least one embodiment, a floating point ALU 2222 and a floating point move unit 2224, may execute a floating point, MMX, SIMD, AVX and SSE, or other operations, including specialized machine learning instructions. In at least one embodiment, a floating point ALU 2222 may include, without limitation, a 64-bit by 64-bit floating point divider to execute divide, square root, and remainder micro ops. In at least one embodiment, instructions involving a floating point value may be handled with floating point hardware. In at least one embodiment, ALU operations may be passed to fast ALUs 2216, 2218. In at least one embodiment, fast ALUS 2216, 2218 may execute fast operations with an effective latency of half a clock cycle. In at least one embodiment, most complex integer operations go to a slow ALU 2220 as a slow ALU 2220 may include, without limitation, integer execution hardware for a long-latency type of operations, such as a multiplier, shifts, flag logic, and branch processing. In at least one embodiment, memory load/store operations may be executed by AGUS 2212, 2214. In at least one embodiment, a fast ALU 2216, a fast ALU 2218, and a slow ALU 2220 may perform integer operations on 64-bit data operands. In at least one embodiment, a fast ALU 2216, a fast ALU 2218, and a slow ALU 2220 may be implemented to support a variety of data bit sizes including sixteen, thirty-two, 128, 256, etc. In at least one embodiment, a floating point ALU 2222 and a floating point move unit 2224 may be implemented to support a range of operands having bits of various widths. In at least one embodiment, a floating point ALU 2222 and a floating point move unit 2224 may operate on 128-bit wide packed data operands in conjunction with SIMD and multimedia instructions.

In at least one embodiment, uop schedulers 2202, 2204, 2206, dispatch dependent operations before a parent load has finished executing. In at least one embodiment, as uops may be speculatively scheduled and executed in a processor 2200, a processor 2200 may also include logic to handle memory misses. In at least one embodiment, if a data load misses in data cache, there may be dependent operations in flight in pipeline that have left scheduler with temporarily incorrect data. In at least one embodiment, a replay mechanism tracks and re-executes instructions that use incorrect data. In at least one embodiment, dependent operations might need to be replayed and independent ones may be allowed to complete. In at least one embodiment, schedulers and a replay mechanism of at least one embodiment of a processor may also be designed to catch instruction sequences for text string comparison operations.

In at least one embodiment, "registers" may refer to on-board processor storage locations that may be used as part of instructions to identify operands. In at least one embodiment, registers may be those that may be usable from outside of a processor (from a programmer's perspective). In at least one embodiment, registers might not be limited to a particular type of circuit. Rather, in at least one embodiment, a register may store data, provide data, and perform functions described herein. In at least one embodiment, registers described herein may be implemented by circuitry within a processor using any number of different techniques, such as dedicated physical registers, dynamically allocated physical registers using register renaming, combinations of dedicated and dynamically allocated physical registers, etc. In at least one embodiment, integer registers store 32-bit integer data. A register file of at least one embodiment also contains eight multimedia SIMD registers for packed data.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, portions or all of inference and/or training logic 715 may be incorporated into an EXE Block 2211 and other memory or registers shown or not shown. For example, in at least one embodiment, training and/or inferencing techniques described herein may use one or more of ALUs illustrated in EXE Block 2211. Moreover, in at least one embodiment, weight parameters may be stored in an on-chip or off-chip memory and/or registers (shown or not shown) that configure ALUs of an EXE Block 2211 to perform one or more machine learning algorithms, neural network architectures, use cases, or training techniques described herein.

In at least one embodiment, a GPU-based CRC processing unit might be used in a system of FIG. 22 to perform CRC generation and/or checking.

Figure 23:
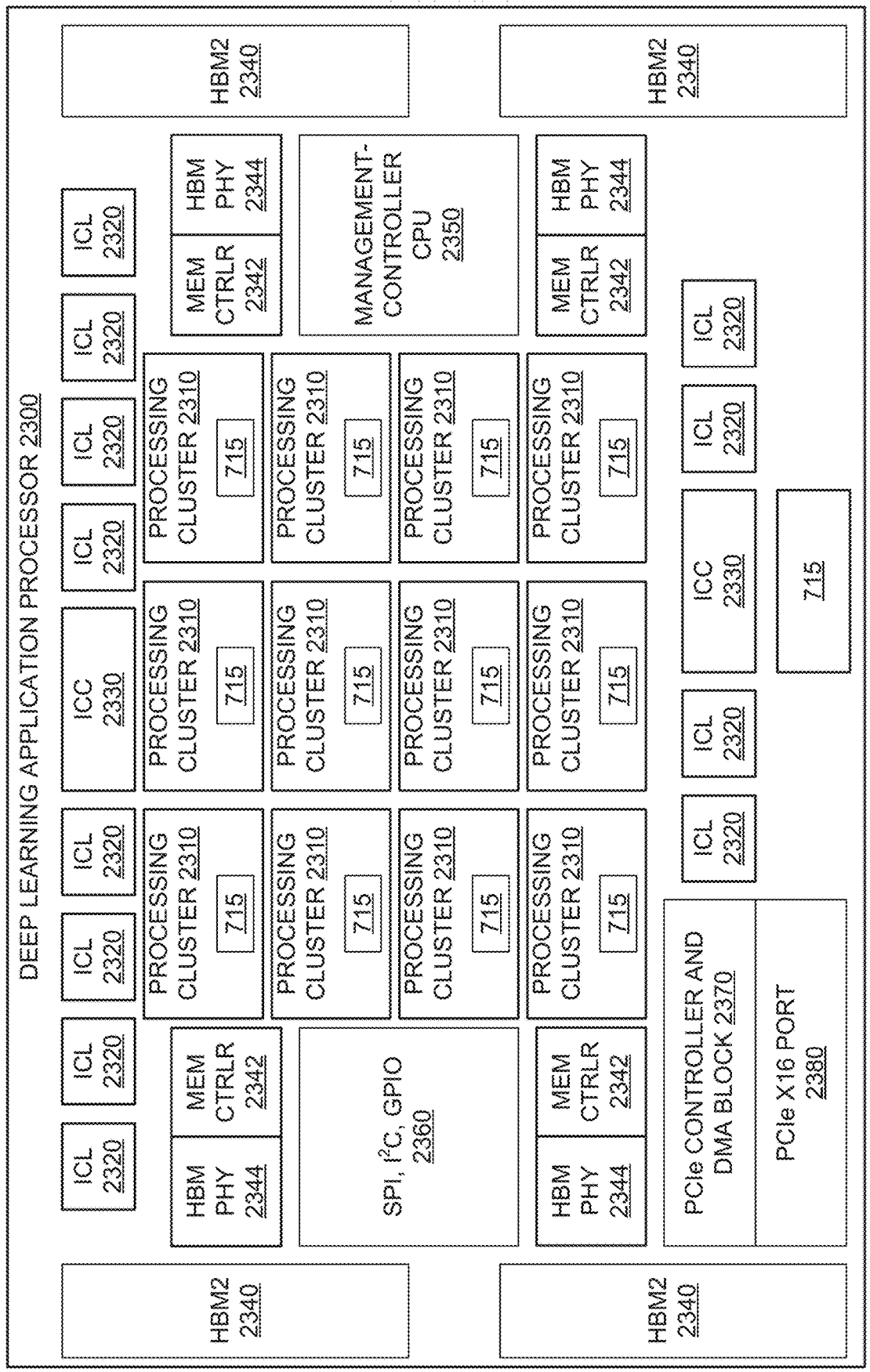
FIG. 23 illustrates a deep learning application processor, according to at least one embodiment.

FIG. 23 illustrates a deep learning application processor 2300, according to at least one embodiment. In at least one embodiment, a deep learning application processor 2300 uses instructions that, if executed by a deep learning application processor 2300, cause a deep learning application processor 2300 to perform some or all of processes and techniques described throughout this disclosure. In at least one embodiment, a deep learning application processor 2300 is an application-specific integrated circuit (ASIC). In at least one embodiment, an application processor 2300 performs matrix multiply operations either "hard-wired" into hardware as a result of performing one or more instructions or both. In at least one embodiment, a deep learning application processor 2300 includes, without limitation, processing clusters 2310(1)-2310(12), Inter-Chip Links ("ICLs") 2320(1)-2320(12), Inter-Chip Controllers ("ICCs") 2330(1)-2330(2), high bandwidth memory second generation ("HBM2") 2340(1)-2340(4), memory controllers ("Mem Ctrlrs") 2342(1)-2342(4), a high bandwidth memory physical layer ("HBM PHY") 2344(1)-2344(4), a management-controller central processing unit ("management-controller CPU") 2350, a Serial Peripheral Interface, Inter-Integrated Circuit, and General Purpose Input/Output block ("SPI, I2C, GPIO") 2360, a peripheral component interconnect express controller and direct memory access block ("PCIe Controller and DMA") 2370, and a sixteen-lane peripheral component interconnect express port ("PCI Express×16") 2380.

In at least one embodiment, processing clusters 2310 may perform deep learning operations, including inference or prediction operations based on weight parameters calculated based at least in part on one or more training techniques, including those described herein. In at least one embodiment, each processing cluster 2310 may include, without limitation, any number and type of processors. In at least one embodiment, a deep learning application processor 2300 may include any number and type of processing clusters 2300. In at least one embodiment, Inter-Chip Links 2320 are bi-directional. In at least one embodiment, Inter-Chip Links 2320 and Inter-Chip Controllers 2330 enable multiple deep learning application processors 2300 to exchange information, including activation information resulting from performing one or more machine learning algorithms embodied in one or more neural networks. In at least one embodiment, a deep learning application processor 2300 may include any number (including zero) and type of ICLs 2320 and ICCs 2330.

In at least one embodiment, HBM2s 2340 provide a total of 32 Gigabytes (GB) of memory. In at least one embodiment, an HBM2 2340(i) is associated with both a memory controller 2342(i) and an HBM PHY 2344(i). In at least one embodiment, any number of HBM2s 2340 may provide any type and total amount of high bandwidth memory and may be associated with any number (including zero) and type of memory controllers 2342 and HBM PHYs 2344. In at least one embodiment, an SPI, I2C, GPIO 2360, PCIe Controller and DMA 2370, and/or a PCIe 2380 may be replaced with any number and type of blocks that enable any number and type of communication standards in any technically feasible fashion.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, a deep learning application processor is used to train a machine learning model, such as a neural network, to predict or infer information provided to a deep learning application processor 2300. In at least one embodiment, a deep learning application processor 2300 is used to infer or predict information based on a trained machine learning model (e.g., neural network) that has been trained by another processor or system or by a deep learning application processor 2300. In at least one embodiment, a processor 2300 may be used to perform one or more neural network use cases described herein.

Figure 24:
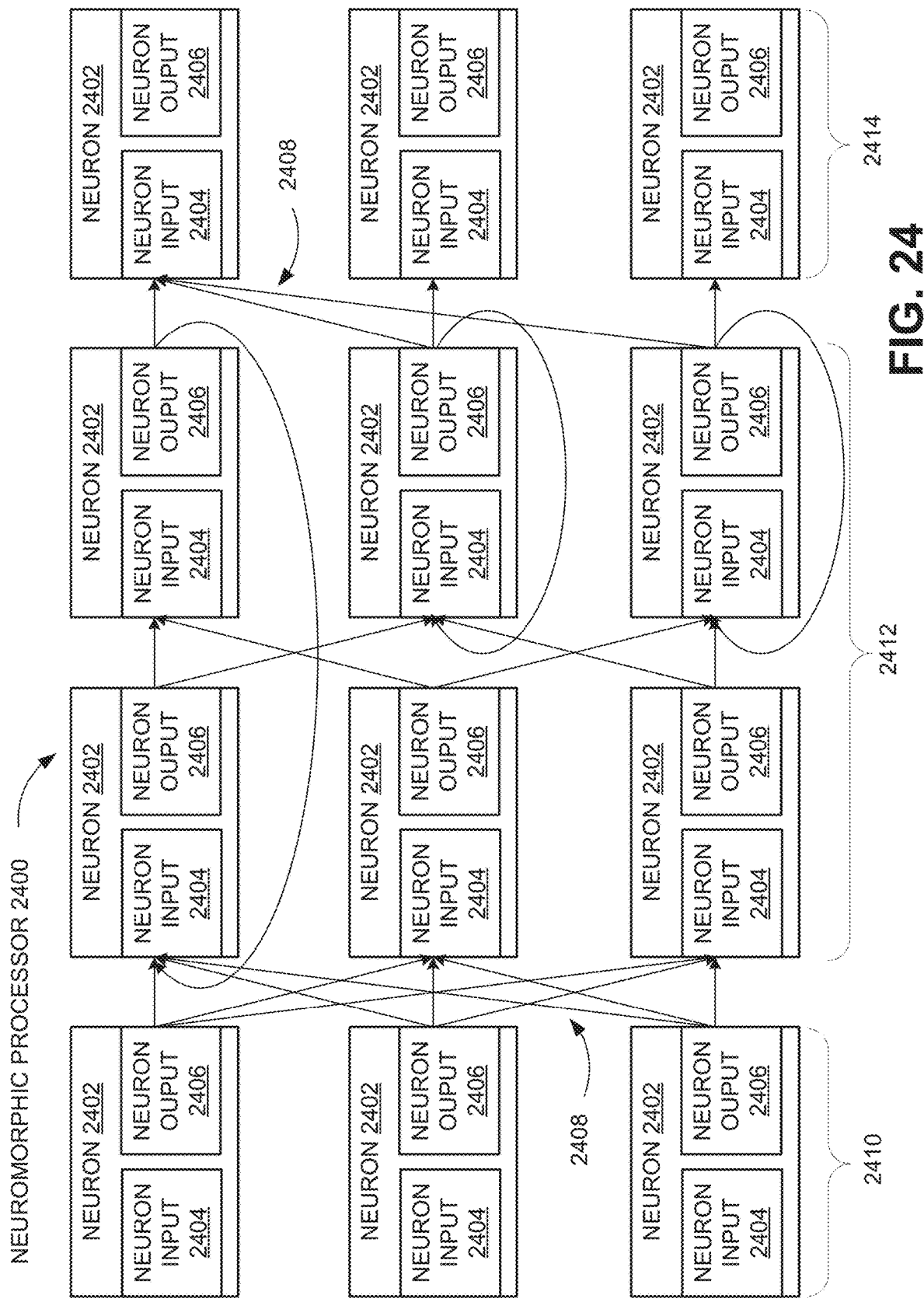
FIG. 24 is a block diagram illustrating an example neuromorphic processor, according to at least one embodiment.

FIG. 24 is a block diagram of a neuromorphic processor 2400, according to at least one embodiment. In at least one embodiment, a neuromorphic processor 2400 may receive one or more inputs from sources external to a neuromorphic processor 2400. In at least one embodiment, these inputs may be transmitted to one or more neurons 2402 within a neuromorphic processor 2400. In at least one embodiment, neurons 2402 and components thereof may be implemented using circuitry or logic, including one or more arithmetic logic units (ALUs). In at least one embodiment, a neuromorphic processor 2400 may include, without limitation, thousands or millions of instances of neurons 2402, but any suitable number of neurons 2402 may be used. In at least one embodiment, each instance of a neuron 2402 may include a neuron input 2404 and a neuron output 2406. In at least one embodiment, neurons 2402 may generate outputs that may be transmitted to inputs of other instances of neurons 2402. For example, in at least one embodiment, neuron inputs 2404 and neuron outputs 2406 may be interconnected via synapses 2408.

In at least one embodiment, neurons 2402 and synapses 2408 may be interconnected such that a neuromorphic processor 2400 operates to process or analyze information received by a neuromorphic processor 2400. In at least one embodiment, neurons 2402 may transmit an output pulse (or "fire" or "spike") when inputs received through a neuron input 2404 exceed a threshold. In at least one embodiment, neurons 2402 may sum or integrate signals received at neuron inputs 2404. For example, in at least one embodiment, neurons 2402 may be implemented as leaky integrate-and-fire neurons, wherein if a sum (referred to as a "membrane potential") exceeds a threshold value, a neuron 2402 may generate an output (or "fire") using a transfer function such as a sigmoid or threshold function. In at least one embodiment, a leaky integrate-and-fire neuron may sum signals received at neuron inputs 2404 into a membrane potential and may also apply a decay factor (or leak) to reduce a membrane potential. In at least one embodiment, a leaky integrate-and-fire neuron may fire if multiple input signals are received at neuron inputs 2404 rapidly enough to exceed a threshold value (e.g., before a membrane potential decays too low to fire). In at least one embodiment, neurons 2402 may be implemented using circuits or logic that receive inputs, integrate inputs into a membrane potential, and decay a membrane potential. In at least one embodiment, inputs may be averaged, or any other suitable transfer function may be used. Furthermore, in at least one embodiment, neurons 2402 may include, without limitation, comparator circuits or logic that generate an output spike at neuron output 2406 when result of applying a transfer function to neuron input 2404 exceeds a threshold. In at least one embodiment, once a neuron 2402 fires, it may disregard previously received input information by, for example, resetting a membrane potential to 0 or another suitable default value. In at least one embodiment, once a membrane potential is reset to 0, a neuron 2402 may resume normal operation after a suitable period of time (or a refractory period).

In at least one embodiment, neurons 2402 may be interconnected through synapses 2408. In at least one embodiment, synapses 2408 may operate to transmit signals from an output of a first neuron 2402 to an input of a second neuron 2402. In at least one embodiment, neurons 2402 may transmit information over more than one instance of a synapse 2408. In at least one embodiment, one or more instances of neuron output 2406 may be connected, via an instance of a synapse 2408, to an instance of neuron input 2404 in same neuron 2402. In at least one embodiment, an instance of neuron 2402 generating an output to be transmitted over an instance of a synapse 2408 may be referred to as a "pre-synaptic neuron" with respect to that instance of a synapse 2408. In at least one embodiment, an instance of a neuron 2402 receiving an input transmitted over an instance of a synapse 2408 may be referred to as a "post-synaptic neuron" with respect to that instance of a synapse 2408. Because an instance of a neuron 2402 may receive inputs from one or more instances of a synapse 2408, and may also transmit outputs over one or more instances of a synapse 2408, a single instance of a neuron 2402 may therefore be both a "pre-synaptic neuron" and "post-synaptic neuron," with respect to various instances of synapses 2408, in at least one embodiment.

In at least one embodiment, neurons 2402 may be organized into one or more layers. In at least one embodiment, each instance of a neuron 2402 may have one neuron output 2406 that may fan out through one or more synapses 2408 to one or more neuron inputs 2404. In at least one embodiment, neuron outputs 2406 of neurons 2402 in a first layer 2410 may be connected to neuron inputs 2404 of neurons 2402 in a second layer 2412. In at least one embodiment, a layer 2410 may be referred to as a "feed-forward layer." In at least one embodiment, each instance of a neuron 2402 in an instance of a first layer 2410 may fan out to each instance of a neuron 2402 in a second layer 2412. In at least one embodiment, a first layer 2410 may be referred to as a "fully connected feed-forward layer." In at least one embodiment, each instance of a neuron 2402 in an instance of a second layer 2412 may fan out to fewer than all instances of neuron 2402 in a third layer 2414. In at least one embodiment, a second layer 2412 may be referred to as a "sparsely connected feed-forward layer." In at least one embodiment, neurons 2402 in a second layer 2412 may fan out to neurons 2402 in multiple other layers, including to neurons 2402 in (same) second layer 2412. In at least one embodiment, a second layer 2412 may be referred to as a "recurrent layer." A neuromorphic processor 2400 may include, without limitation, any suitable combination of recurrent layers and feed-forward layers, including, without limitation, both sparsely connected feed-forward layers and fully connected feed-forward layers.

In at least one embodiment, a neuromorphic processor 2400 may include, without limitation, a reconfigurable interconnect architecture or dedicated hard wired interconnects to connect synapse 2408 to neurons 2402. In at least one embodiment, a neuromorphic processor 2400 may include, without limitation, circuitry or logic that allows synapses to be allocated to different neurons 2402 as needed based on neural network topology and neuron fan-in/out. For example, in at least one embodiment, synapses 2408 may be connected to neurons 2402 using an interconnect fabric, such as network-on-chip, or with dedicated connections. In at least one embodiment, synapse interconnections and components thereof may be implemented using circuitry or logic.

Figure 25:
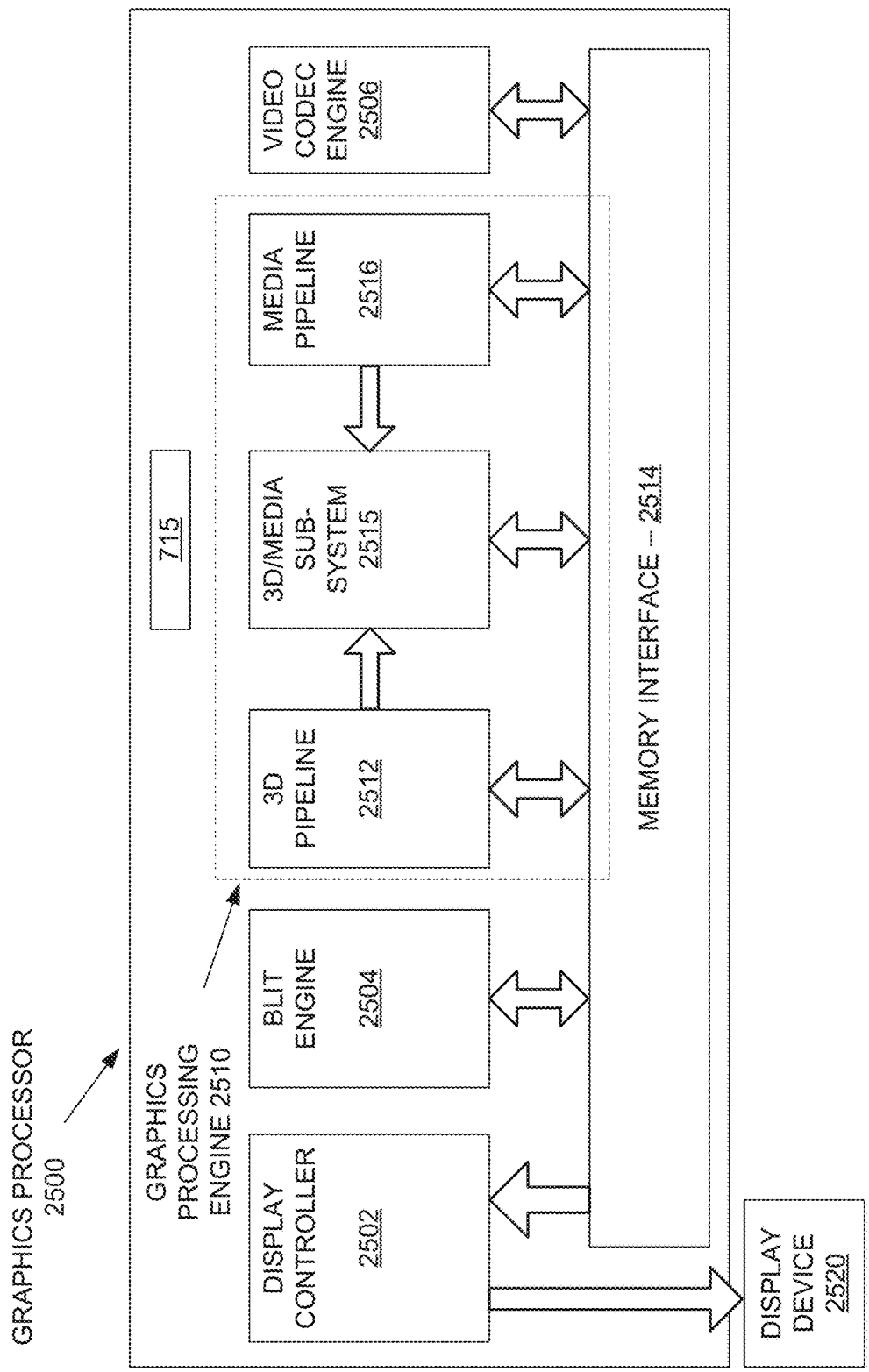
FIGS. 25 and 26 illustrates at least portions of a graphics processor, according to at least one embodiment.

FIG. 25 is a block diagram of a graphics processor 2500, which may be a discrete graphics processing unit, or may be a graphics processor integrated with a plurality of processing cores. In at least one embodiment, a graphics processor 2500 communicates via a memory mapped I/O interface to registers on a graphics processor 2500 and with commands placed into memory. In at least one embodiment, a graphics processor 2500 includes a memory interface 2514 to access memory. In at least one embodiment, a memory interface 2514 is an interface to local memory, one or more internal caches, one or more shared external caches, and/or to system memory.

In at least one embodiment, a graphics processor 2500 also includes a display controller 2502 to drive display output data to a display device 2520. In at least one embodiment, a display controller 2502 includes hardware for one or more overlay planes for a display device 2520 and a composition of multiple layers of video or user interface elements. In at least one embodiment, a display device 2520 can be an internal or external display device. In at least one embodiment, a display device 2520 is a head mounted display device, such as a virtual reality (VR) display device or an augmented reality (AR) display device. In at least one embodiment, a graphics processor 2500 includes a video codec engine 2506 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In at least one embodiment, a graphics processor 2500 includes a block image transfer (BLIT) engine 2504 to perform two-dimensional (2D) rasterizer operations including, for example, bit-boundary block transfers. However, in at least one embodiment, 2D graphics operations are performed using one or more components of a graphics processing engine (GPE) 2510. In at least one embodiment, GPE 2510 is a compute engine for performing graphics operations, including three-dimensional (3D) graphics operations and media operations.

In at least one embodiment, a GPE 2510 includes a 3D pipeline 2512 for performing 3D operations, such as rendering three-dimensional images and scenes using processing functions that act upon 3D primitive shapes (e.g., rectangle, triangle, etc.). In at least one embodiment, a 3D pipeline 2512 includes programmable and fixed function elements that perform various tasks and/or spawn execution threads to a 3D/Media sub-system 2515. While a 3D pipeline 2512 can be used to perform media operations, in at least one embodiment, a GPE 2510 also includes a media pipeline 2516 that is used to perform media operations, such as video post-processing and image enhancement.

In at least one embodiment, a media pipeline 2516 includes fixed function or programmable logic units to perform one or more specialized media operations, such as video decode acceleration, video de-interlacing, and video encode acceleration in place of, or on behalf of a video codec engine 2506. In at least one embodiment, a media pipeline 2516 additionally includes a thread spawning unit to spawn threads for execution on 3D/Media sub-system 2515. In at least one embodiment, spawned threads perform computations for media operations on one or more graphics execution units included in 3D/Media sub-system 2515.

In at least one embodiment, a 3D/Media subsystem 2515 includes logic for executing threads spawned by a 3D pipeline 2512 and a media pipeline 2516. In at least one embodiment, a 3D pipeline 2512 and a media pipeline 2516 send thread execution requests to a 3D/Media subsystem 2515, which includes thread dispatch logic for arbitrating and dispatching various requests to available thread execution resources. In at least one embodiment, execution resources include an array of graphics execution units to process 3D and media threads. In at least one embodiment, a 3D/Media subsystem 2515 includes one or more internal caches for thread instructions and data. In at least one embodiment, a subsystem 2515 also includes a shared memory, including registers and addressable memory, to share data between threads and to store output data.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, portions or all of inference and/or training logic 715 may be incorporated into graphics processor 2500. For example, in at least one embodiment, training and/or inferencing techniques described herein may use one or more of ALUs embodied in 3D pipeline 2512. Moreover, in at least one embodiment, inferencing and/or training operations described herein may be done using logic other than logic illustrated in FIG. 7A or 7B. In at least one embodiment, weight parameters may be stored in on-chip or off-chip memory and/or registers (shown or not shown) that configure ALUs of a graphics processor 2500 to perform one or more machine learning algorithms, neural network architectures, use cases, or training techniques described herein.

Figure 26:
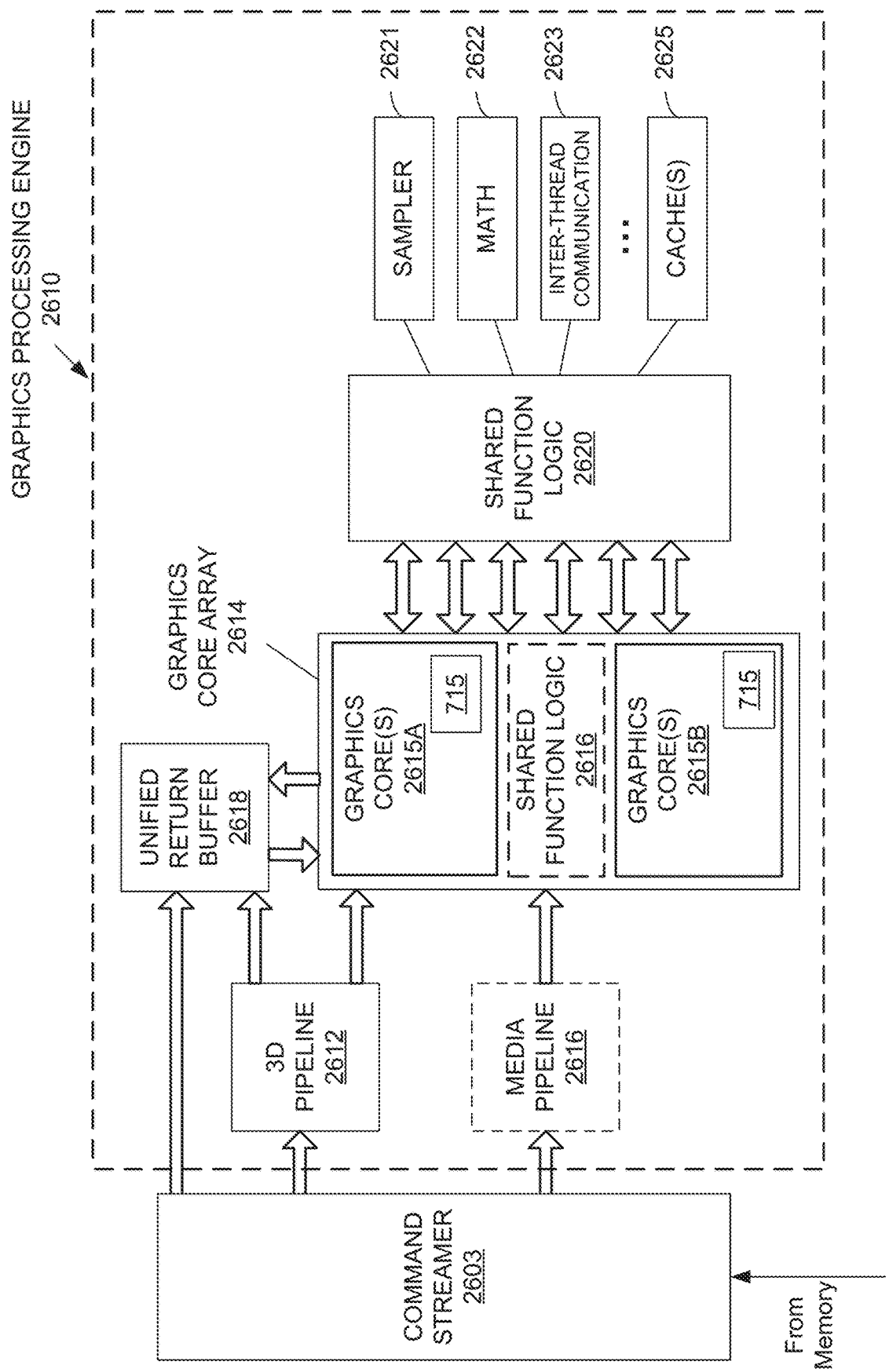

FIG. 26 is a block diagram of a graphics processing engine 2610 of a graphics processor in accordance with at least one embodiment. In at least one embodiment, a graphics processing engine (GPE) 2610 is a version of GPE 2510 shown in FIG. 25. In at least one embodiment, a media pipeline 2516 is not required and might not be explicitly included within GPE 2610. In at least one embodiment, a separate media and/or image processor is coupled to a GPE 2610.

In at least one embodiment, a GPE 2610 is coupled to or includes a command streamer 2603, which provides a command stream to a 3D pipeline 2512 and/or media pipelines 2516. In at least one embodiment, a command streamer 2603 is coupled to memory, which can be system memory, or one or more of internal cache memory and shared cache memory. In at least one embodiment, a command streamer 2603 receives commands from memory and sends commands to a 3D pipeline 2512 and/or media pipeline 2516. In at least one embodiment, commands are instructions, primitives, or micro-operations fetched from a ring buffer, which stores commands for a 3D pipeline 2512 and media pipeline 2516. In at least one embodiment, a ring buffer can additionally include batch command buffers storing batches of multiple commands. In at least one embodiment, commands for a 3D pipeline 2512 can also include references to data stored in memory, such as but not limited to vertex and geometry data for 3D pipeline 2512 and/or image data and memory objects for media pipeline 2516. In at least one embodiment, a 3D pipeline 2512 and media pipeline 2516 process commands and data by performing operations or by dispatching one or more execution threads to a graphics core array 2614. In at least one embodiment, a graphics core array 2614 includes one or more blocks of graphics cores (e.g., graphics core(s) 2615A, graphics core(s) 2615B), each block including one or more graphics cores. In at least one embodiment, each graphics core includes a set of graphics execution resources that includes general-purpose and graphics specific execution logic to perform graphics and compute operations, as well as fixed function texture processing and/or machine learning and artificial intelligence acceleration logic, including inference and/or training logic 715 in FIG. 7A and FIG. 7B.

In at least one embodiment, a 3D pipeline 2512 includes fixed function and programmable logic to process one or more shader programs, such as vertex shaders, geometry shaders, pixel shaders, fragment shaders, compute shaders, or other shader programs, by processing instructions and dispatching execution threads to a graphics core array 2614. In at least one embodiment, a graphics core array 2614 provides a unified block of execution resources for use in processing shader programs. In at least one embodiment, multi-purpose execution logic (e.g., execution units) within graphics core(s) 2615A-2615B of a graphic core array 2614 includes support for various 3D API shader languages and can execute multiple simultaneous execution threads associated with multiple shaders.

In at least one embodiment, a graphics core array 2614 also includes execution logic to perform media functions, such as video and/or image processing. In at least one embodiment, execution units additionally include general-purpose logic that is programmable to perform parallel general-purpose computational operations, in addition to graphics processing operations.

In at least one embodiment, output data generated by threads executing on a graphics core array 2614 can output data to a memory in a unified return buffer (URB) 2618. In at least one embodiment, a URB 2618 can store data for multiple threads. In at least one embodiment, a URB 2618 may be used to send data between different threads executing on a graphics core array 2614. In at least one embodiment, a URB 2618 may additionally be used for synchronization between threads on graphics core array 2614 and fixed function logic within shared function logic 2620.

In at least one embodiment, a graphics core array 2614 is scalable, such that a graphics core array 2614 includes a variable number of graphics cores, each having a variable number of execution units based on a target power and performance level of a GPE 2610. In at least one embodiment, execution resources are dynamically scalable, such that execution resources may be enabled or disabled as needed.

In at least one embodiment, a graphics core array 2614 is coupled to shared function logic 2620 that includes multiple resources that are shared between graphics cores in a graphics core array 2614. In at least one embodiment, shared functions performed by shared function logic 2620 are embodied in hardware logic units that provide specialized supplemental functionality to a graphics core array 2614. In at least one embodiment, shared function logic 2620 includes but is not limited to sampler 2621, math 2622, and inter-thread communication (ITC) 2623 logic. In at least one embodiment, one or more cache(s) 2625 are in included in, or couple to, shared function logic 2620.

In at least one embodiment, a shared function is used if demand for a specialized function is insufficient for inclusion within a graphics core array 2614. In at least one embodiment, a single instantiation of a specialized function is used in shared function logic 2620 and shared among other execution resources within graphics core array 2614. In at least one embodiment, specific shared functions within shared function logic 2620 that are used extensively by a graphics core array 2614 may be included within shared function logic 2616 within a graphics core array 2614. In at least one embodiment, shared function logic 2616 within a graphics core array 2614 can include some or all logic within shared function logic 2620. In at least one embodiment, all logic elements within shared function logic 2620 may be duplicated within shared function logic 2616 of a graphics core array 2614. In at least one embodiment, shared function logic 2620 is excluded in favor of shared function logic 2616 within a graphics core array 2614.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, portions or all of inference and/or training logic 715 may be incorporated into graphics processor 2610. For example, in at least one embodiment, training and/or inferencing techniques described herein may use one or more of ALUs embodied in a 3D pipeline 2512, graphics core(s) 2615A, shared function logic 2616, graphics core(s) 2615B, shared function logic 2620, or other logic in FIG. 26. Moreover, in at least one embodiment, inferencing and/or training operations described herein may be done using logic other than logic illustrated in FIG. 7A or 7B. In at least one embodiment, weight parameters may be stored in on-chip or off-chip memory and/or registers (shown or not shown) that configure ALUs of a graphics processor 2610 to perform one or more machine learning algorithms, neural network architectures, use cases, or training techniques described herein.

In at least one embodiment, a GPU-based CRC processing unit might be used in a system of FIG. 26 to perform CRC generation and/or checking.

Figure 27:
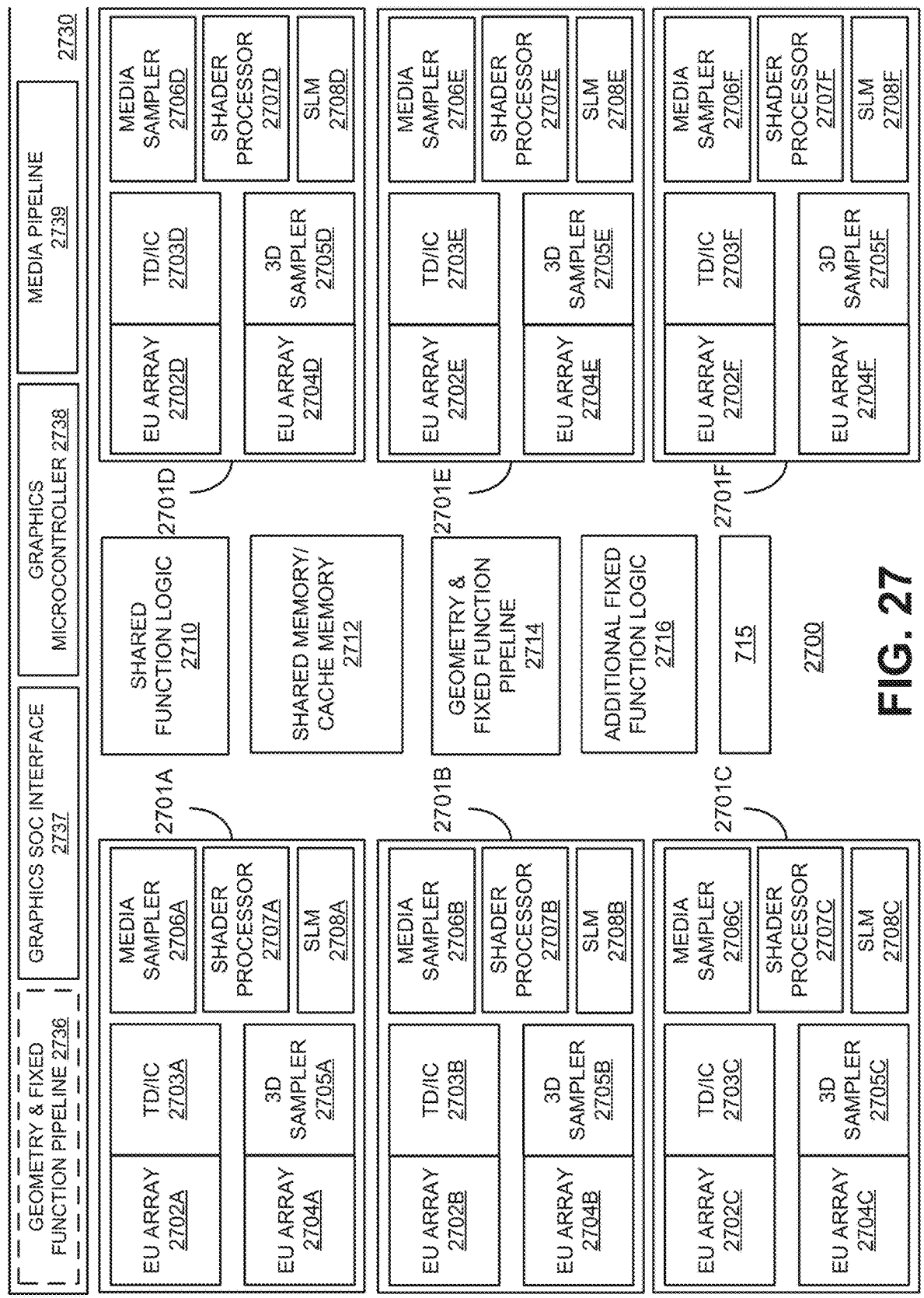
FIG. 27 is a block diagram of at least portions of a graphics processor core, according to at least one embodiment.

FIG. 27 is a block diagram of hardware logic of a graphics processor core 2700, according to at least one embodiment described herein. In at least one embodiment, a graphics processor core 2700 is included within a graphics core array. In at least one embodiment, a graphics processor core 2700, sometimes referred to as a core slice, can be one or multiple graphics cores within a modular graphics processor. In at least one embodiment, a graphics processor core 2700 is exemplary of one graphics core slice, and a graphics processor as described herein may include multiple graphics core slices based on target power and performance envelopes. In at least one embodiment, each graphics core 2700 can include a fixed function block 2730 coupled with multiple sub-cores 2701A-2701F, also referred to as sub-slices, that include modular blocks of general-purpose and fixed function logic.

In at least one embodiment, a fixed function block 2730 includes a geometry/fixed function pipeline 2736 that can be shared by all sub-cores in a graphics processor 2700, for example, in lower performance and/or lower power graphics processor implementations. In at least one embodiment, geometry/fixed function pipeline 2736 includes a 3D fixed function pipeline, a video front-end unit, a thread spawner and thread dispatcher, and a unified return buffer manager, which manages unified return buffers.

In at least one embodiment a fixed function block 2730 also includes a graphics SoC interface 2737, a graphics microcontroller 2738, and a media pipeline 2739. In at least one embodiment, a graphics SoC interface 2737 provides an interface between a graphics core 2700 and other processor cores within a system on a chip integrated circuit. In at least one embodiment, a graphics microcontroller 2738 is a programmable sub-processor that is configurable to manage various functions of graphics processor 2700, including thread dispatch, scheduling, and pre-emption. In at least one embodiment, media pipeline 2739 includes logic to facilitate decoding, encoding, pre-processing, and/or post-processing of multimedia data, including image and video data. In at least one embodiment, a media pipeline 2739 implements media operations via requests to compute or sampling logic within sub-cores 2701-2701F.

In at least one embodiment, SoC interface 2737 enables a graphics core 2700 to communicate with general-purpose application processor cores (e.g., CPUs) and/or other components within an SoC, including memory hierarchy elements such as a shared last level cache memory, a system RAM, and/or an embedded on-chip or on-package DRAM. In at least one embodiment, an SoC interface 2737 can also enable communication with fixed function devices within an SoC, such as camera imaging pipelines, and enables use of and/or implements global memory atomics that may be shared between a graphics core 2700 and CPUs within an SoC. In at least one embodiment, an SoC interface 2737 can also implement power management controls for a graphics core 2700 and enable an interface between a clock domain of a graphic core 2700 and other clock domains within an SoC. In at least one embodiment, SoC interface 2737 enables receipt of command buffers from a command streamer and global thread dispatcher that are configured to provide commands and instructions to each of one or more graphics cores within a graphics processor. In at least one embodiment, commands and instructions can be dispatched to a media pipeline 2739, when media operations are to be performed, or a geometry and fixed function pipeline (e.g., geometry and fixed function pipeline 2736, a geometry and fixed function pipeline 2714) when graphics processing operations are to be performed.

In at least one embodiment, a graphics microcontroller 2738 can be configured to perform various scheduling and management tasks for a graphics core 2700. In at least one embodiment, a graphics microcontroller 2738 can perform graphics and/or compute workload scheduling on various graphics parallel engines within execution unit (EU) arrays 2702A-2702F, 2704A-2704F within sub-cores 2701A-2701F. In at least one embodiment, host software executing on a CPU core of an SoC including a graphics core 2700 can submit workloads one of multiple graphics processor doorbells, which invokes a scheduling operation on an appropriate graphics engine. In at least one embodiment, scheduling operations include determining which workload to run next, submitting a workload to a command streamer, pre-empting existing workloads running on an engine, monitoring progress of a workload, and notifying host software when a workload is complete. In at least one embodiment, a graphics microcontroller 2738 can also facilitate low-power or idle states for a graphics core 2700, providing a graphics core 2700 with an ability to save and restore registers within a graphics core 2700 across low-power state transitions independently from an operating system and/or graphics driver software on a system.

In at least one embodiment, a graphics core 2700 may have greater than or fewer than illustrated sub-cores 2701A-2701F, up to N modular sub-cores. For each set of N sub-cores, in at least one embodiment, a graphics core 2700 can also include shared function logic 2710, a shared and/or cache memory 2712, a geometry/fixed function pipeline 2714, as well as additional fixed function logic 2716 to accelerate various graphics and compute processing operations. In at least one embodiment, shared function logic 2710 can include logic units (e.g., sampler, math, and/or inter-thread communication logic) that can be shared by each N sub-cores within a graphics core 2700. In at least one embodiment, shared and/or cache memory 2712 can be a last-level cache for N sub-cores 2701A-2701F within a graphics core 2700 and can also serve as a shared memory that is accessible by multiple sub-cores. In at least one embodiment, a geometry/fixed function pipeline 2714 can be included instead of a geometry/fixed function pipeline 2736 within a fixed function block 2730 and can include same or similar logic units.

In at least one embodiment, a graphics core 2700 includes additional fixed function logic 2716 that can include various fixed function acceleration logic for use by a graphics core 2700. In at least one embodiment, additional fixed function logic 2716 includes an additional geometry pipeline for use in position only shading. In position-only shading, at least two geometry pipelines exist, whereas in a full geometry pipeline within a geometry/fixed function pipeline 2716, 2736, and a cull pipeline, which is an additional geometry pipeline which may be included within additional fixed function logic 2716. In at least one embodiment, a cull pipeline is a trimmed down version of a full geometry pipeline. In at least one embodiment, a full pipeline and a cull pipeline can execute different instances of an application, each instance having a separate context. In at least one embodiment, position only shading can hide long cull runs of discarded triangles, enabling shading to be completed earlier in some instances. For example, in at least one embodiment, cull pipeline logic within additional fixed function logic 2716 can execute position shaders in parallel with a main application and generally generates critical results faster than a full pipeline, as a cull pipeline fetches and shades a position attribute of vertices, without performing rasterization and rendering of pixels to a frame buffer. In at least one embodiment, a cull pipeline can use generated critical results to compute visibility information for all triangles without regard to whether those triangles are culled. In at least one embodiment, a full pipeline (which in this instance may be referred to as a replay pipeline) can consume visibility information to skip culled triangles to shade only visible triangles that are finally passed to a rasterization phase.

In at least one embodiment, additional fixed function logic 2716 can also include machine-learning acceleration logic, such as fixed function matrix multiplication logic, for implementations including optimizations for machine learning training or inferencing.

In at least one embodiment, each graphics sub-core 2701A-2701F includes a set of execution resources that may be used to perform graphics, media, and compute operations in response to requests by graphics pipeline, media pipeline, or shader programs. In a least one embodiment, graphics sub-cores 2701A-2701F include multiple EU arrays 2702A-2702F, 2704A-2704F, thread dispatch and inter-thread communication (TD/IC) logic 2703A-2703F, a 3D (e.g., texture) sampler 2705A-2705F, a media sampler 2706A-2706F, a shader processor 2707A-2707F, and shared local memory (SLM) 2708A-2708F. In at least one embodiment, EU arrays 2702A-2702F, 2704A-2704F each include multiple execution units, which are general-purpose graphics processing units capable of performing floating-point and integer/fixed-point logic operations in service of a graphics, media, or compute operation, including graphics, media, or compute shader programs. In at least one embodiment, TD/IC logic 2703A-2703F performs local thread dispatch and thread control operations for execution units within a sub-core and facilitate communication between threads executing on execution units of a sub-core. In at least one embodiment, 3D sampler 2705A-2705F can read texture or other 3D graphics related data into memory. In at least one embodiment, a 3D sampler can read texture data differently based on a configured sample state and texture format associated with a given texture. In at least one embodiment, a media sampler 2706A-2706F can perform similar read operations based on a type and format associated with media data. In at least one embodiment, each graphics sub-core 2701A-2701F can alternately include a unified 3D and media sampler. In at least one embodiment, threads executing on execution units within each of sub-cores 2701A-2701F can make use of shared local memory 2708A-2708F within each sub-core, to enable threads executing within a thread group to execute using a common pool of on-chip memory.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, portions or all of inference and/or training logic 715 may be incorporated into graphics processor 2710. For example, in at least one embodiment, training and/or inferencing techniques described herein may use one or more of ALUs embodied in a 3D pipeline 2710, a graphics microcontroller 2738, a geometry & fixed function pipeline 2714 and 2736, or other logic in FIG. 26. Moreover, in at least one embodiment, inferencing and/or training operations described herein may be done using logic other than logic illustrated in FIG. 7A or 7B. In at least one embodiment, weight parameters may be stored in on-chip or off-chip memory and/or registers (shown or not shown) that configure ALUs of a graphics processor 2700 to perform one or more machine learning algorithms, neural network architectures, use cases, or training techniques described herein.

In at least one embodiment, a GPU-based CRC processing unit might be used in a system of FIG. 27 to perform CRC generation and/or checking.

Figure 28A:
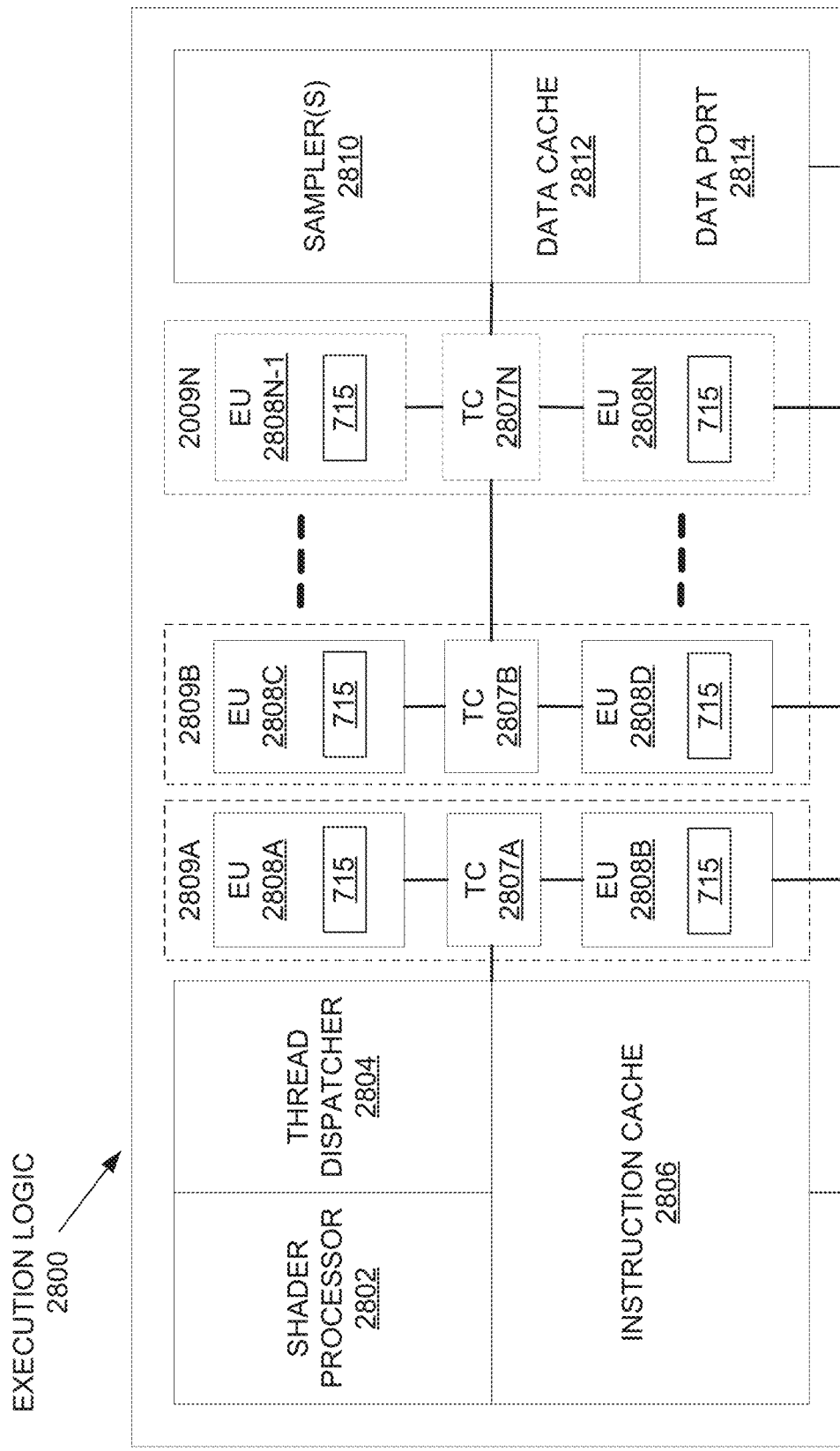
FIGS. 28A and 28B illustrates thread execution logic, according to at least one embodiment.
Figure 28B:
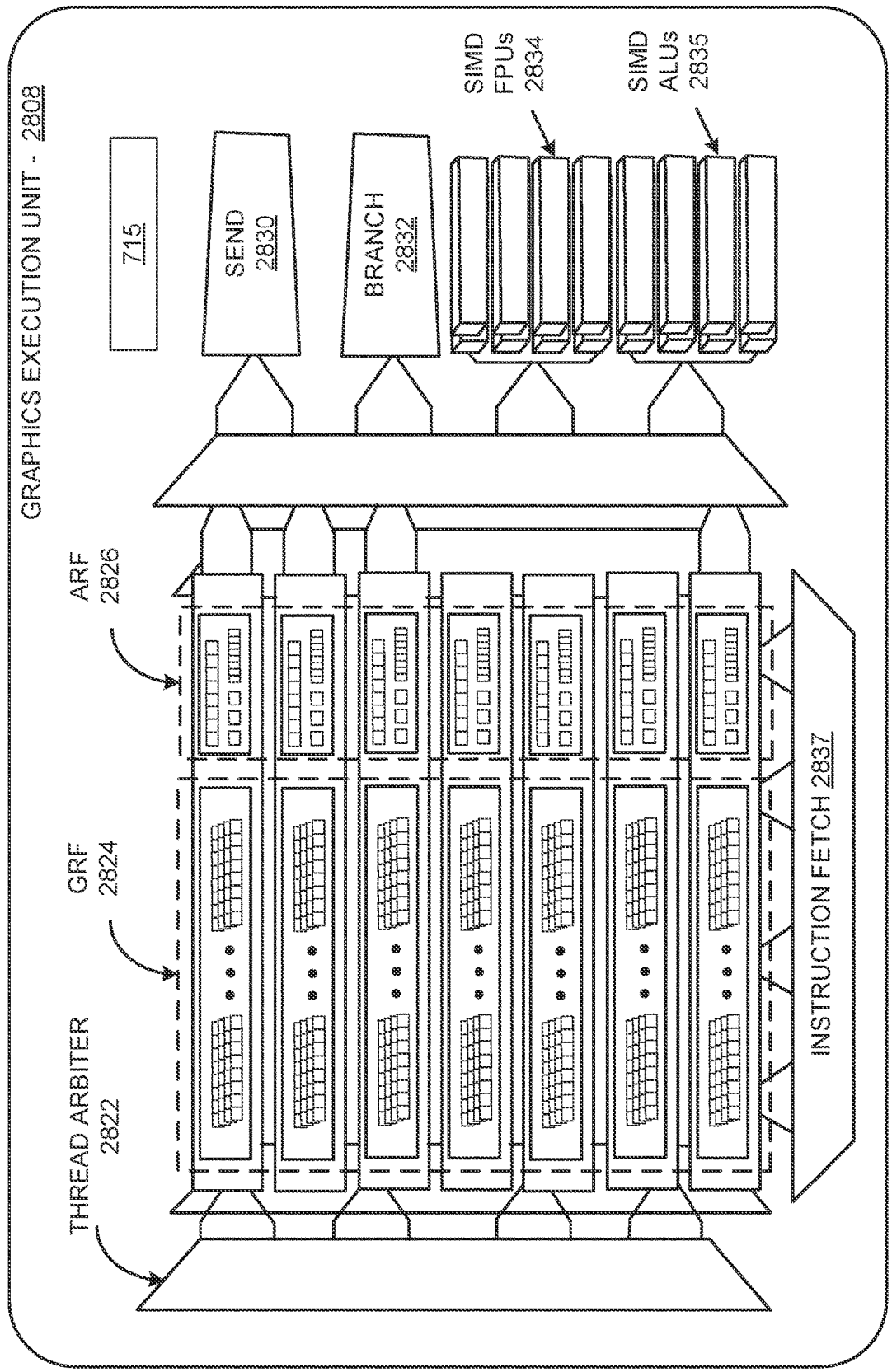

FIGS. 28A and 28B illustrate thread execution logic 2800 including an array of processing elements of a graphics processor core according to at least one embodiment. FIG. 28A illustrates at least one embodiment, in which thread execution logic 2800 is used. FIG. 28B illustrates exemplary internal details of an execution unit, according to at least one embodiment.

As illustrated in FIG. 28A, in at least one embodiment, thread execution logic 2800 includes a shader processor 2802, a thread dispatcher 2804, instruction cache 2806, a scalable execution unit array including a plurality of execution units 2808A-2808N, a sampler 2810, a data cache 2812, and a data port 2814. In at least one embodiment, a scalable execution unit array can dynamically scale by enabling or disabling one or more execution units (e.g., any of execution unit 2808A, 2808B, 2808C, 2808D, through 2808N-1 and 2808N) based on computational requirements of a workload, for example. In at least one embodiment, scalable execution units are interconnected via an interconnect fabric that links to each of said execution units. In at least one embodiment, thread execution logic 2800 includes one or more connections to memory, such as system memory or cache memory, through one or more of instruction a cache 2806, a data port 2814, a sampler 2810, and execution units 2808A-2808N. In at least one embodiment, each execution unit (e.g., 2808A) is a stand-alone programmable general-purpose computational unit that is capable of executing multiple simultaneous hardware threads while processing multiple data elements in parallel for each thread. In at least one embodiment, an array of execution units 2808A-2808N is scalable to include any number individual execution units.

In at least one embodiment, execution units 2808A-2808N are primarily used to execute shader programs. In at least one embodiment, a shader processor 2802 can process various shader programs and dispatch execution threads associated with shader programs via a thread dispatcher 2804. In at least one embodiment, a thread dispatcher 2804 includes logic to arbitrate thread initiation requests from graphics and media pipelines and instantiate requested threads on one or more execution units in execution units 2808A-2808N. For example, in at least one embodiment, a geometry pipeline can dispatch vertex, tessellation, or geometry shaders to thread execution logic for processing. In at least one embodiment, a thread dispatcher 2804 can also process runtime thread spawning requests from executing shader programs.

In at least one embodiment, execution units 2808A-2808N support an instruction set that includes native support for many standard 3D graphics shader instructions, such that shader programs from graphics libraries (e.g., Direct 3D and OpenGL) are executed with a minimal translation. In at least one embodiment, execution units support vertex and geometry processing (e.g., vertex programs, geometry programs, vertex shaders), pixel processing (e.g., pixel shaders, fragment shaders) and general-purpose processing (e.g., compute and media shaders). In at least one embodiment, each of execution units 2808A-2808N, which include one or more arithmetic logic units (ALUs), is capable of multi-issue single instruction multiple data (SIMD) execution and multi-threaded operation enables an efficient execution environment despite higher latency memory accesses. In at least one embodiment, each hardware thread within each execution unit has a dedicated high-bandwidth register file and associated independent thread-state. In at least one embodiment, execution is multi-issue per clock to pipelines capable of integer, single and double precision floating point operations, SIMD branch capability, logical operations, transcendental operations, and other miscellaneous operations. In at least one embodiment, while waiting for data from memory or one of shared functions, dependency logic within execution units 2808A-2808N causes a waiting thread to sleep until requested data has been returned. In at least one embodiment, while awaiting thread is sleeping, hardware resources may be devoted to processing other threads. For example, in at least one embodiment, during a delay associated with a vertex shader operation, an execution unit can perform operations for a pixel shader, fragment shader, or another type of shader program, including a different vertex shader.

In at least one embodiment, each execution unit in execution units 2808A-2808N operates on arrays of data elements. In at least one embodiment, number of data elements refers to "execution size," or number of channels for an instruction. In at least one embodiment, an execution channel is a logical unit of execution for data element access, masking, and flow control within instructions. In at least one embodiment, a number of channels may be independent of a number of physical Arithmetic Logic Units (ALUs) or Floating Point Units (FPUs) for a particular graphics processor. In at least one embodiment, execution units 2808A-2808N support integer and floating-point data types.

In at least one embodiment, an execution unit instruction set includes SIMD instructions. In at least one embodiment, various data elements can be stored as a packed data type in a register and an execution unit will process various elements based on data size of elements. For example, in at least one embodiment, when operating on a 256-bit wide vector, 256 bits of a vector are stored in a register, and an execution unit operates on vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, in at least one embodiment, different vector widths and register sizes are possible.

In at least one embodiment, one or more execution units can be combined into a fused execution unit 2809A-2809N having thread control logic (2807A-2807N) that is common to fused EUs. In at least one embodiment, multiple EUs can be fused into an EU group. In at least one embodiment, each EU in fused EU group can be configured to execute a separate SIMD hardware thread. Number of EUs in a fused EU group can vary according to various embodiments. In at least one embodiment, various SIMD widths can be performed per-EU, including but not limited to SIMD8, SIMD16, and SIMD32. In at least one embodiment, each fused graphics execution unit 2809A-2809N includes at least two execution units. For example, in at least one embodiment, a fused execution unit 2809A includes a first EU 2808A, a second EU 2808B, and thread control logic 2807A that is common to first EU 2808A and second EU 2808B. In at least one embodiment, thread control logic 2807A controls threads executed on a fused graphics execution unit 2809A, allowing each EU within fused execution units 2809A-2809N to execute using a common instruction pointer register.

In at least one embodiment, one or more internal instruction caches (e.g., 2806) are included in thread execution logic 2800 to cache thread instructions for execution units. In at least one embodiment, one or more data caches (e.g., 2812) are included to cache thread data during thread execution. In at least one embodiment, a sampler 2810 is included to provide texture sampling for 3D operations and media sampling for media operations. In at least one embodiment, sampler 2810 includes specialized texture or media sampling functionality to process texture or media data during sampling process before providing sampled data to an execution unit.

During execution, in at least one embodiment, graphics and media pipelines send thread initiation requests to thread execution logic 2800 via thread spawning and dispatch logic. In at least one embodiment, once a group of geometric objects has been processed and rasterized into pixel data, pixel processor logic (e.g., pixel shader logic, fragment shader logic, etc.) within shader processor 2802 is invoked to further compute output information and cause results to be written to output surfaces (e.g., color buffers, depth buffers, stencil buffers, etc.). In at least one embodiment, a pixel shader or fragment shader calculates values of various vertex attributes that are to be interpolated across a rasterized object. In at least one embodiment, pixel processor logic within a shader processor 2802 then executes an application programming interface (API)-supplied pixel or fragment shader program. In at least one embodiment, to execute a shader program, a shader processor 2802 dispatches threads to an execution unit (e.g., 2808A) via a thread dispatcher 2804. In at least one embodiment, a shader processor 2802 uses texture sampling logic in a sampler 2810 to access texture data in texture maps stored in memory. In at least one embodiment, arithmetic operations on texture data and input geometry data compute pixel color data for each geometric fragment, or discards one or more pixels from further processing.

In at least one embodiment, a data port 2814 provides a memory access mechanism for thread execution logic 2800 to output processed data to memory for further processing on a graphics processor output pipeline. In at least one embodiment, a data port 2814 includes or couples to one or more cache memories (e.g., data cache 2812) to cache data for memory access via a data port.

As illustrated in FIG. 28B, in at least one embodiment, a graphics execution unit 2808 can include an instruction fetch unit 2837, a general register file array (GRF) 2824, an architectural register file array (ARF) 2826, a thread arbiter 2822, a send unit 2830, a branch unit 2832, a set of SIMD floating point units (FPUs) 2834, and in at least one embodiment a set of dedicated integer SIMD ALUs 2835. In at least one embodiment, GRF 2824 and ARF 2826 includes a set of general register files and architecture register files associated with each simultaneous hardware thread that may be active in a graphics execution unit 2808. In at least one embodiment, a per thread architectural state is maintained in ARF 2826, while data used during a thread execution is stored in GRF 2824. In at least one embodiment, an execution state of each thread, including instruction pointers for each thread, can be held in thread-specific registers in ARF 2826.

In at least one embodiment, a graphics execution unit 2808 has an architecture that is a combination of Simultaneous Multi-Threading (SMT) and fine-grained Interleaved Multi-Threading (IMT). In at least one embodiment, architecture has a modular configuration that can be fine-tuned at design time based on a target number of simultaneous threads and number of registers per execution unit, where execution unit resources are divided across logic used to execute multiple simultaneous threads.

In at least one embodiment, a graphics execution unit 2808 can co-issue multiple instructions, which may each be different instructions. In at least one embodiment, a thread arbiter 2822 of a graphics execution unit thread 2808 can dispatch instructions to one of send unit 2830, branch unit 2842, or SIMD FPU(s) 2834 for execution. In at least one embodiment, each execution thread can access 128 general-purpose registers within GRF 2824, where each register can store 32 bytes, accessible as a SIMD 8-element vector of 32-bit data elements. In at least one embodiment, each execution unit thread has access to 4 Kbytes within a GRF 2824, although embodiments are not so limited, and greater or fewer register resources may be provided in other embodiments. In at least one embodiment, up to seven threads can execute simultaneously, although number of threads per execution unit can also vary according to embodiments. In at least one embodiment, in which seven threads may access 4 Kbytes, a GRF 2824 can store a total of 28 Kbytes. In at least one embodiment, flexible addressing modes can permit registers to be addressed together to build effectively wider registers or to represent strided rectangular block data structures.

In at least one embodiment, memory operations, sampler operations, and other longer-latency system communications are dispatched via "send" instructions that are executed by a message passing send unit 2830. In at least one embodiment, branch instructions are dispatched to a dedicated branch unit 2832 to facilitate SIMD divergence and eventual convergence.

In at least one embodiment a graphics execution unit 2808 includes one or more SIMD floating point units (FPU(s)) 2834 to perform floating-point operations. In at least one embodiment, FPU(s) 2834 also support integer computation. In at least one embodiment, FPU(s) 2834 can SIMD execute up to M number of 32-bit floating-point (or integer) operations, or SIMD execute up to 2M 16-bit integer or 16-bit floating-point operations. In at least one embodiment, at least one of FPU(s) provides extended math capability to support high-throughput transcendental math functions and a double precision 64-bit floating-point. In at least one embodiment, a set of 8-bit integer SIMD ALUs 2835 is also present, and may be specifically optimized to perform operations associated with machine learning computations.

In at least one embodiment, arrays of multiple instances of a graphics execution unit 2808 can be instantiated in a graphics sub-core grouping (e.g., a sub-slice). In at least one embodiment, an execution unit 2808 can execute instructions across a plurality of execution channels. In at least one embodiment, each thread executed on a graphics execution unit 2808 is executed on a different channel.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, portions or all of inference and/or training logic 715 may be incorporated into execution logic 2800. Moreover, in at least one embodiment, inferencing and/or training operations described herein may be done using logic other than logic illustrated in FIG. 7A or 7B. In at least one embodiment, weight parameters may be stored in on-chip or off-chip memory and/or registers (shown or not shown) that configure ALUs of execution logic 2800 to perform one or more machine learning algorithms, neural network architectures, use cases, or training techniques described herein.

In at least one embodiment, a GPU-based CRC processing unit might be used in a system of FIG. 28A or 28B to perform CRC generation and/or checking.

Figure 29:
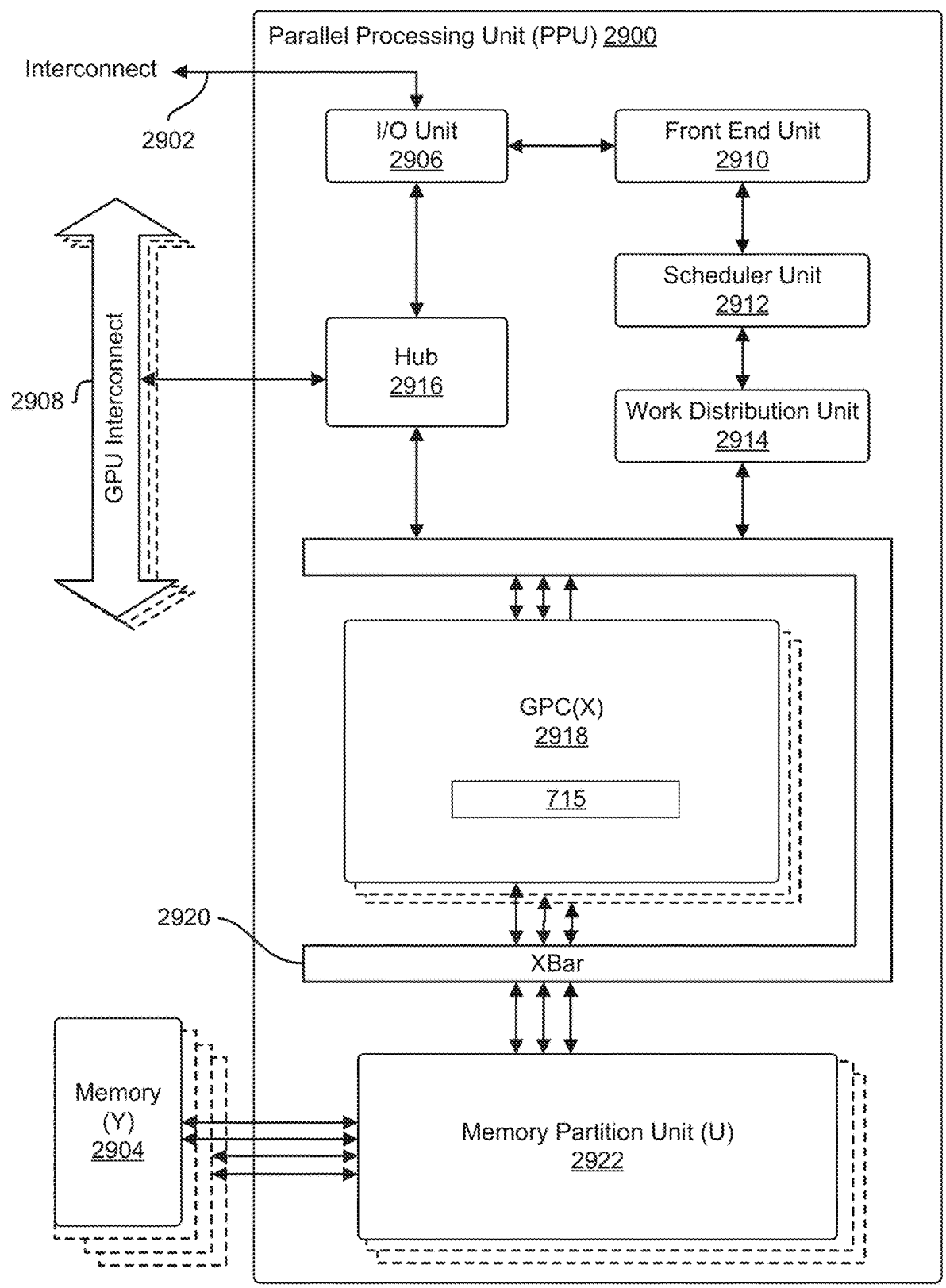
FIG. 29 illustrates a parallel processing unit ("PPU"), according to at least one embodiment.

FIG. 29 illustrates a parallel processing unit ("PPU") 2900, according to at least one embodiment. In at least one embodiment, PPU 2900 is configured with machine-readable code that, if executed by PPU 2900, causes PPU 2900 to perform some or all of processes and techniques described throughout this disclosure. In at least one embodiment, PPU 2900 is a multi-threaded processor that is implemented on one or more integrated circuit devices and that utilizes multithreading as a latency-hiding technique designed to process computer-readable instructions (also referred to as machine-readable instructions or simply instructions) on multiple threads in a parallel manner. In at least one embodiment, a thread refers to a thread of execution and is an instantiation of a set of instructions configured to be executed by PPU 2900. In at least one embodiment, PPU 2900 is a graphics processing unit ("GPU") configured to implement a graphics rendering pipeline for processing three-dimensional ("3D") graphics data in order to generate two-dimensional ("2D") image data for display on a display device such as a liquid crystal display ("LCD") device. In at least one embodiment, PPU 2900 is utilized to perform computations such as linear algebra operations and machine-learning operations. FIG. 29 illustrates an example of a parallel processor for illustrative purposes only and should be construed as a non-limiting example of processor architectures contemplated within scope of this disclosure and that any suitable processor may be employed to supplement and/or substitute for same.

In at least one embodiment, one or more PPUs 2900 are configured to accelerate any High Performance Computing ("HPC"), data center, and machine learning applications. In at least one embodiment, PPU 2900 is configured to accelerate all deep learning systems and applications including following non-limiting examples: autonomous vehicle platforms, deep learning, high-accuracy speech, image, text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, personalized user recommendations and more.

In at least one embodiment, PPU 2900 includes, without limitation, an Input/Output ("I/O") unit 2906, a front-end unit 2910, a scheduler unit 2912, a work distribution unit 2914, a hub 2916, a crossbar ("Xbar") 2920, one or more general processing clusters ("GPCs") 2918, and one or more partition units ("memory partition units") 2922. In at least one embodiment, PPU 2900 is connected to a host processor or other PPUs 2900 via one or more high-speed GPU interconnects ("GPU interconnects") 2908. In at least one embodiment, PPU 2900 is connected to a host processor or other peripheral devices via an interconnect 2902. In at least one embodiment, PPU 2900 is connected to a local memory comprising one or more memory devices ("memory") 2904. In at least one embodiment, memory devices 2904 include, without limitation, one or more dynamic random access memory ("DRAM") devices. In at least one embodiment, one or more DRAM devices are configured and/or configurable as high-bandwidth memory ("HBM") subsystems, with multiple DRAM dies stacked within each device.

In at least one embodiment, high-speed GPU interconnect 2908 may refer to a wire-based multi-lane communications link that is used by systems to scale and include one or more PPUs 2900 combined with one or more central processing units ("CPUs"), supports cache coherence between PPUs 2900 and CPUs, and CPU mastering. In at least one embodiment, data and/or commands are transmitted by a high-speed GPU interconnect 2908 through hub 2916 to/from other units of PPU 2900, such as one or more copy engines, video encoders, video decoders, power management units, and other components which may not be explicitly illustrated in FIG. 29.

In at least one embodiment, I/O unit 2906 is configured to transmit and receive communications (e.g., commands, data) from a host processor (not illustrated in FIG. 29) over system bus 2902. In at least one embodiment, I/O unit 2906 communicates with host processor directly via system bus 2902 or through one or more intermediate devices such as a memory bridge. In at least one embodiment, I/O unit 2906 may communicate with one or more other processors, such as one or more of PPUs 2900 via system bus 2902. In at least one embodiment, I/O unit 2906 implements a Peripheral Component Interconnect Express ("PCIe") interface for communications over a PCIe bus. In at least one embodiment, I/O unit 2906 implements interfaces for communicating with external devices.

In at least one embodiment, I/O unit 2906 decodes packets received via system bus 2902. In at least one embodiment, at least some packets represent commands configured to cause PPU 2900 to perform various operations. In at least one embodiment, I/O unit 2906 transmits decoded commands to various other units of PPU 2900 as specified by commands. In at least one embodiment, commands are transmitted to front-end unit 2910 and/or transmitted to hub 2916 or other units of PPU 2900 such as one or more copy engines, a video encoder, a video decoder, a power management unit, etc. (not explicitly illustrated in FIG. 29). In at least one embodiment, I/O unit 2906 is configured to route communications between and among various logical units of PPU 2900.

In at least one embodiment, a program executed by a host processor encodes a command stream in a buffer that provides workloads to PPU 2900 for processing. In at least one embodiment, a workload comprises instructions and data to be processed by those instructions. In at least one embodiment, buffer is a region in a memory that is accessible (e.g., read/write) by both host processor and PPU 2900 a host interface unit may be configured to access buffer in a system memory connected to system bus 2902 via memory requests transmitted over system bus 2902 by I/O unit 2906. In at least one embodiment, host processor writes command stream to buffer and then transmits a pointer to start of command stream to PPU 2900 such that front-end unit 2910 receives pointers to one or more command streams and manages one or more command streams, reading commands from command streams and forwarding commands to various units of PPU 2900.

In at least one embodiment, front-end unit 2910 is coupled to scheduler unit 2912 that configures various GPCs 2918 to process tasks defined by one or more command streams. In at least one embodiment, scheduler unit 2912 is configured to track state information related to various tasks managed by scheduler unit 2912 where state information may indicate which of GPCs 2918 a task is assigned to, whether task is active or inactive, a priority level associated with a task, and so forth. In at least one embodiment, scheduler unit 2912 manages execution of a plurality of tasks on one or more of GPCs 2918.

In at least one embodiment, scheduler unit 2912 is coupled to work distribution unit 2914 that is configured to dispatch tasks for execution on GPCs 2918. In at least one embodiment, work distribution unit 2914 tracks a number of scheduled tasks received from scheduler unit 2912 and work distribution unit 2914 manages a pending task pool and an active task pool for each of GPCs 2918. In at least one embodiment, pending task pool comprises a number of slots (e.g., 32 slots) that contain tasks assigned to be processed by a particular GPC 2918; an active task pool may comprise a number of slots (e.g., 4 slots) for tasks that are actively being processed by GPCs 2918, such that as one of GPCs 2918 completes execution of a task, that task is evicted from active task pool for GPC 2918 and one of other tasks from pending task pool is selected and scheduled for execution on GPC 2918. In at least one embodiment, if an active task is idle on GPC 2918, such as while waiting for a data dependency to be resolved, then active task is evicted from GPC 2918 and returned to pending task pool while another task in pending task pool is selected and scheduled for execution on GPC 2918.

In at least one embodiment, work distribution unit 2914 communicates with one or more GPCs 2918 via XBar 2920. In at least one embodiment, XBar 2920 is an interconnect network that couples many of units of PPU 2900 to other units of PPU 2900, and can be configured to couple work distribution unit 2914 to a particular GPC 2918. In at least one embodiment, one or more other units of PPU 2900 may also be connected to XBar 2920 via hub 2916.

In at least one embodiment, tasks are managed by scheduler unit 2912 and dispatched to one of GPCs 2918 by work distribution unit 2914. In at least one embodiment, GPC 2918 is configured to process task and generate results. In at least one embodiment, results may be consumed by other tasks within GPC 2918, routed to a different GPC 2918 via XBar 2920, or stored in memory 2904. In at least one embodiment, results can be written to memory 2904 via partition units 2922, which implement a memory interface for reading and writing data to/from memory 2904. In at least one embodiment, results can be transmitted to another PPU 2904 or CPU via high-speed GPU interconnect 2908. In at least one embodiment, PPU 2900 includes, without limitation, a number U of partition units 2922 that is equal to a number of separate and distinct memory devices 2904 coupled to PPU 2900. In at least one embodiment, partition unit 2922 will be described in more detail herein in conjunction with FIG. 31.

In at least one embodiment, a host processor executes a driver kernel that implements an application programming interface ("API") that enables one or more applications executing on host processor to schedule operations for execution on PPU 2900. In at least one embodiment, multiple compute applications are simultaneously executed by PPU 2900 and PPU 2900 provides isolation, quality of service ("QoS"), and independent address spaces for multiple compute applications. In at least one embodiment, an application generates instructions (e.g., in form of API calls) that cause driver kernel to generate one or more tasks for execution by PPU 2900 and driver kernel outputs tasks to one or more streams being processed by PPU 2900. In at least one embodiment, each task comprises one or more groups of related threads, which may be referred to as a warp. In at least one embodiment, a warp comprises a plurality of related threads (e.g., 32 threads) that can be executed in parallel. In at least one embodiment, cooperating threads can refer to a plurality of threads including instructions to perform a task and that exchange data through shared memory. In at least one embodiment, threads and cooperating threads are described in more detail, in accordance with at least one embodiment, in conjunction with FIG. 31.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, a deep learning application processor is used to train a machine learning model, such as a neural network, to predict or infer information provided to PPU 2900. In at least one embodiment, a deep learning application processor 2900 is used to infer or predict information based on a trained machine learning model (e.g., neural network) that has been trained by another processor or system or by PPU 2900. In at least one embodiment, PPU 2900 may be used to perform one or more neural network use cases described herein.

In at least one embodiment, a GPU-based CRC processing unit might be used in a system of FIG. 29 to perform CRC generation and/or checking.

Figure 30:
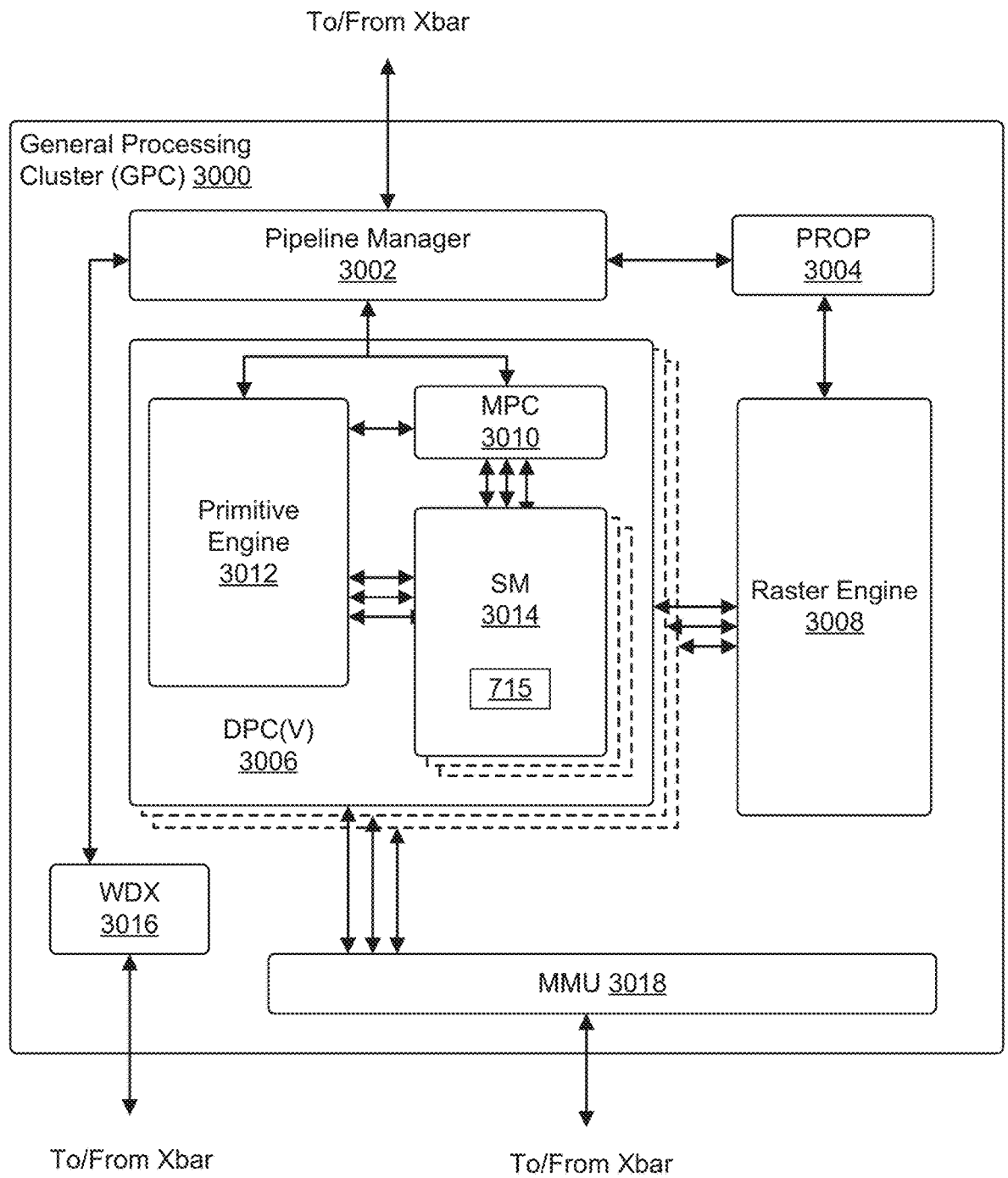
FIG. 30 illustrates a general processing cluster ("GPC"), according to at least one embodiment.

FIG. 30 illustrates a general processing cluster ("GPC") 3000, according to at least one embodiment. In at least one embodiment, GPC 3000 is GPC 2918 of FIG. 29. In at least one embodiment, each GPC 3000 includes, without limitation, a number of hardware units for processing tasks and each GPC 3000 includes, without limitation, a pipeline manager 3002, a pre-raster operations unit ("PROP") 3004, a raster engine 3008, a work distribution crossbar ("WDX") 3016, a memory management unit ("MMU") 3018, one or more Data Processing Clusters ("DPCs") 3006, and any suitable combination of parts.

In at least one embodiment, operation of GPC 3000 is controlled by a pipeline manager 3002. In at least one embodiment, pipeline manager 3002 manages configuration of one or more DPCs 3006 for processing tasks allocated to GPC 3000. In at least one embodiment, pipeline manager 3002 configures at least one of one or more DPCs 3006 to implement at least a portion of a graphics rendering pipeline. In at least one embodiment, DPC 3006 is configured to execute a vertex shader program on a programmable streaming multi-processor ("SM") 3014. In at least one embodiment, pipeline manager 3002 is configured to route packets received from a work distribution unit to appropriate logical units within GPC 3000. In at least one embodiment, and some packets may be routed to fixed function hardware units in PROP 3004 and/or raster engine 3008 while other packets may be routed to DPCs 3006 for processing by a primitive engine 3012 or SM 3014. In at least one embodiment, pipeline manager 3002 configures at least one of DPCs 3006 to implement a neural network model and/or a computing pipeline.

In at least one embodiment, PROP unit 3004 is configured to route data generated by raster engine 3008 and DPCs 3006 to a Raster Operations ("ROP") unit in a partition unit 2922, described in more detail above in conjunction with FIG. 29. In at least one embodiment, PROP unit 3004 is configured to perform optimizations for color blending, organize pixel data, perform address translations, and more. In at least one embodiment, raster engine 3008 includes, without limitation, a number of fixed function hardware units configured to perform various raster operations, in at least one embodiment, and raster engine 3008 includes, without limitation, a setup engine, a coarse raster engine, a culling engine, a clipping engine, a fine raster engine, a tile coalescing engine, and any suitable combination thereof. In at least one embodiment, setup engine receives transformed vertices and generates plane equations associated with geometric primitive defined by vertices; plane equations are transmitted to coarse raster engine to generate coverage information (e.g., an x, y coverage mask for a tile) for primitive; output of coarse raster engine is transmitted to culling engine where all fragments associated with primitive that fail a z-test are culled, and transmitted to a clipping engine where all fragments lying outside a viewing frustum are clipped. In at least one embodiment, any fragments that survive clipping and culling are passed to a fine raster engine to generate attributes for pixel fragments, based on plane equations generated by setup engine. In at least one embodiment, output of raster engine 3008 comprises fragments to be processed by any suitable entity, such as by a fragment shader implemented within DPC 3006.

In at least one embodiment, each DPC 3006 included in GPC 3000 comprise, without limitation, an M-Pipe Controller ("MPC") 3010; a primitive engine 3012; one or more SMs 3014; and any suitable combination thereof. In at least one embodiment, MPC 3010 controls operation of DPC 3006, routing packets received from pipeline manager 3002 to appropriate units in DPC 3006. In at least one embodiment, packets associated with a vertex are routed to primitive engine 3012, which is configured to fetch vertex attributes associated with vertex from memory; in contrast, packets associated with a shader program may be transmitted to SM 3014.

In at least one embodiment, SM 3014 comprises, without limitation, a programmable streaming processor that is configured to process tasks represented by a number of threads. In at least one embodiment, SM 3014 is multi-threaded and configured to execute a plurality of threads (e.g., 32 threads) from a particular group of threads concurrently, and implements a Single-Instruction, Multiple-Data ("SIMD") architecture, where each thread in a group of threads (e.g., a warp) is configured to process a different set of data based on same set of instructions. In at least one embodiment, all threads in a group of threads execute same instructions. In at least one embodiment, SM 3014 implements a Single-Instruction, Multiple Thread ("SIMT") architecture wherein each thread in a group of threads is configured to process a different set of data based on same set of instructions, but where individual threads in group of threads are allowed to diverge during execution. In at least one embodiment, a program counter, call stack, and execution state is maintained for each warp, enabling concurrency between warps and serial execution within warps when threads within warp diverge. In at least one embodiment, a program counter, call stack, and execution state is maintained for each individual thread, enabling equal concurrency between all threads, within and between warps. In at least one embodiment, execution state is maintained for each individual thread and threads executing same instructions may be converged and executed in parallel for better efficiency. At least one embodiment of SM 3014 is described in more detail herein.

In at least one embodiment, MMU 3018 provides an interface between GPC 3000 and memory partition unit (e.g., partition unit 2922 of FIG. 29) and MMU 3018 provides translation of virtual addresses into physical addresses, memory protection, and arbitration of memory requests. In at least one embodiment, MMU 3018 provides one or more translation lookaside buffers ("TLBs") for performing translation of virtual addresses into physical addresses in memory.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, a deep learning application processor is used to train a machine learning model, such as a neural network, to predict or infer information provided to GPC 3000. In at least one embodiment, GPC 3000 is used to infer or predict information based on a trained machine learning model (e.g., neural network) that has been trained by another processor or system or by GPC 3000. In at least one embodiment, GPC 3000 may be used to perform one or more neural network use cases described herein.

In at least one embodiment, a GPU-based CRC processing unit might be used in a system of FIG. 30 to perform CRC generation and/or checking.

Figure 31:
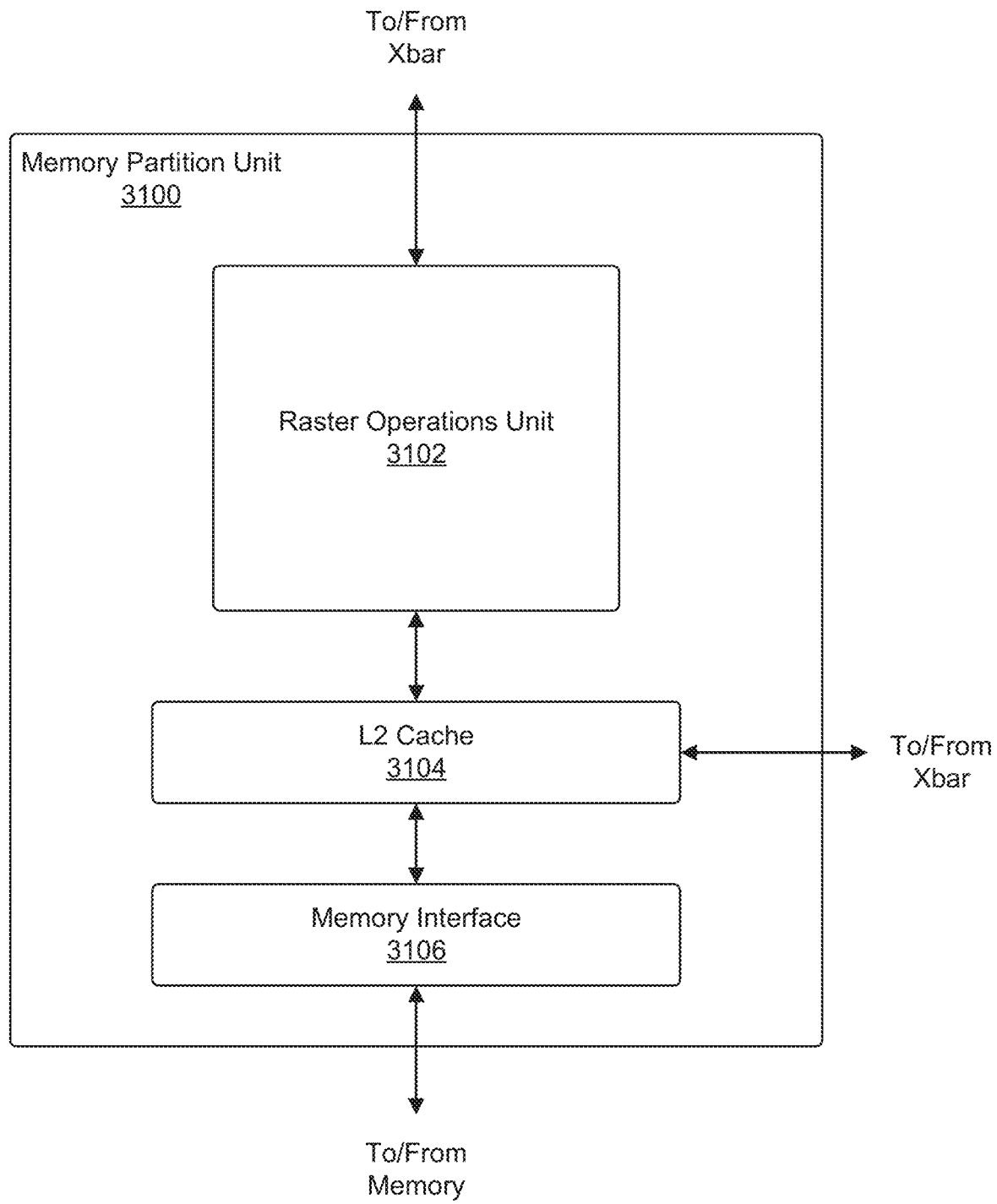
FIG. 31 illustrates a memory partition unit of a parallel processing unit ("PPU"), according to at least one embodiment.

FIG. 31 illustrates a memory partition unit 3100 of a parallel processing unit ("PPU"), in accordance with at least one embodiment. In at least one embodiment, a memory partition unit 3100 includes, without limitation, a Raster Operations ("ROP") unit 3102; a level two ("L2") cache 3104; a memory interface 3106; and any suitable combination thereof. In at least one embodiment, memory interface 3106 is coupled to memory. In at least one embodiment, memory interface 3106 may implement 32, 64, 128, 1024-bit data buses, or alike, for high-speed data transfer. In at least one embodiment, PPU incorporates U memory interfaces 3106, one memory interface 3106 per pair of partition units 3100, where each pair of partition units 3100 is connected to a corresponding memory device. For example, in at least one embodiment, a PPU may be connected to up to Y memory devices, such as high bandwidth memory stacks or graphics double-data-rate, version 5, synchronous dynamic random access memory ("GDDR5 SDRAM").

In at least one embodiment, memory interface 3106 implements a high bandwidth memory second generation ("HBM2") memory interface and Y equals half U. In at least one embodiment, HBM2 memory stacks are located on same physical package as PPU, providing substantial power and area savings compared with conventional GDDR5 SDRAM systems. In at least one embodiment, each HBM2 stack includes, without limitation, four memory dies and Y equals 4, with each HBM2 stack including two 128-bit channels per die for a total of 8 channels and a data bus width of 1024 bits. In at least one embodiment, memory supports Single-Error Correcting Double-Error Detecting ("SECDED") Error Correction Code ("ECC") to protect data. In at least one embodiment, ECC provides higher reliability for compute applications that are sensitive to data corruption.

In at least one embodiment, a PPU implements a multi-level memory hierarchy. In at least one embodiment, memory partition unit 3100 supports a unified memory to provide a single unified virtual address space for central processing unit ("CPU") and PPU memory, enabling data sharing between virtual memory systems. In at least one embodiment, frequency of accesses by a PPU to memory located on other processors is traced to ensure that memory pages are moved to physical memory of PPU that is accessing pages more frequently. In at least one embodiment, high-speed GPU interconnect 2908 supports address translation services allowing PPU to directly access a CPU's page tables and providing full access to CPU memory by PPU.

In at least one embodiment, copy engines transfer data between multiple PPUs or between PPUs and CPUs. In at least one embodiment, copy engines can generate page faults for addresses that are not mapped into page tables and memory partition unit 3100 then services page faults, mapping addresses into page table, after which copy engine performs transfer. In at least one embodiment, memory is pinned (e.g., non-pageable) for multiple copy engine operations between multiple processors, substantially reducing available memory. In at least one embodiment, with hardware page faulting, addresses can be passed to copy engines without regard as to whether memory pages are resident, and copy process is transparent.

Data from memory 2904 of FIG. 29 or other system memory is fetched by memory partition unit 3100 and stored in L2 cache 3104, which is located on-chip and is shared between various GPCs, in accordance with at least one embodiment. Each memory partition unit 3100, in at least one embodiment, includes, without limitation, at least a portion of L2 cache associated with a corresponding memory device. In at least one embodiment, lower level caches are implemented in various units within GPCs. In at least one embodiment, each of SMs 3014 may implement a level one ("L1") cache wherein L1 cache is private memory that is dedicated to a particular SM 3014 and data from L2 cache 3104 is fetched and stored in each of L1 caches for processing in functional units of SMs 3014. In at least one embodiment, L2 cache 3104 is coupled to memory interface 3106 and XBar 2920.

ROP unit 3102 performs graphics raster operations related to pixel color, such as color compression, pixel blending, and more, in at least one embodiment. ROP unit 3102, in at least one embodiment, implements depth testing in conjunction with raster engine 3008, receiving a depth for a sample location associated with a pixel fragment from culling engine of raster engine 3008. In at least one embodiment, depth is tested against a corresponding depth in a depth buffer for a sample location associated with fragment. In at least one embodiment, if fragment passes depth test for sample location, then ROP unit 3102 updates depth buffer and transmits a result of depth test to raster engine 3008. It will be appreciated that number of partition units 3100 may be different than number of GPCs and, therefore, each ROP unit 3102 can, in at least one embodiment, be coupled to each of GPCs. In at least one embodiment, ROP unit 3102 tracks packets received from different GPCs and determines which that a result generated by ROP unit 3102 is routed to through XBar 2920.

Figure 32:
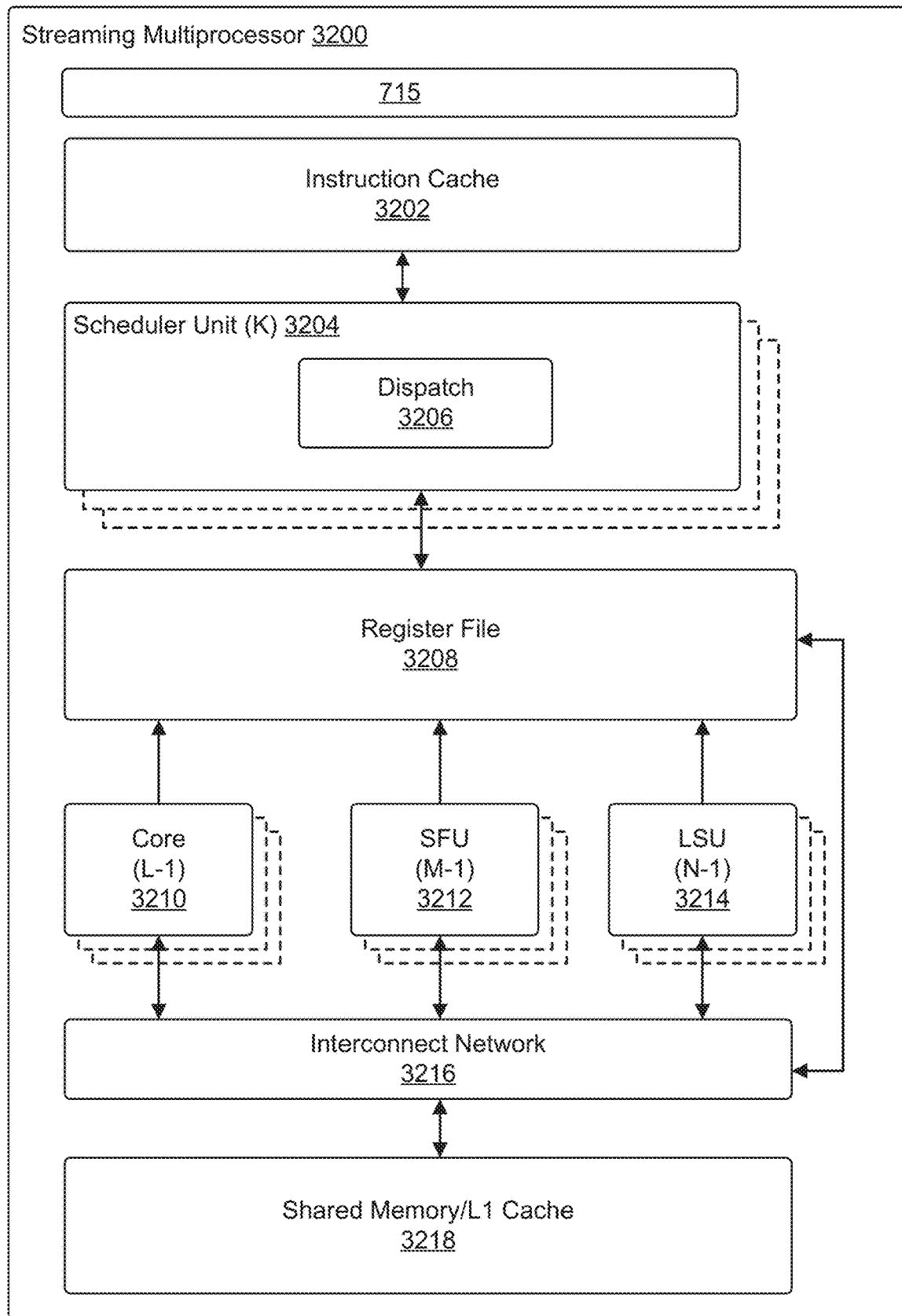
FIG. 32 illustrates a streaming multi-processor, according to at least one embodiment.

FIG. 32 illustrates a streaming multi-processor ("SM") 3200, according to at least one embodiment. In at least one embodiment, SM 3200 is SM of FIG. 30. In at least one embodiment, SM 3200 includes, without limitation, an instruction cache 3202; one or more scheduler units 3204; a register file 3208; one or more processing cores ("cores") 3210; one or more special function units ("SFUs") 3212; one or more load/store units ("LSUs") 3214; an interconnect network 3216; a shared memory/level one ("L1") cache 3218; and any suitable combination thereof. In at least one embodiment, a work distribution unit dispatches tasks for execution on general processing clusters ("GPCs") of parallel processing units ("PPUs") and each task is allocated to a particular Data Processing Cluster ("DPC") within a GPC and, if task is associated with a shader program, task is allocated to one of SMs 3200. In at least one embodiment, scheduler unit 3204 receives tasks from work distribution unit and manages instruction scheduling for one or more thread blocks assigned to SM 3200. In at least one embodiment, scheduler unit 3204 schedules thread blocks for execution as warps of parallel threads, wherein each thread block is allocated at least one warp. In at least one embodiment, each warp executes threads. In at least one embodiment, scheduler unit 3204 manages a plurality of different thread blocks, allocating warps to different thread blocks and then dispatching instructions from plurality of different cooperative groups to various functional units (e.g., processing cores 3210, SFUs 3212, and LSUs 3214) during each clock cycle.

In at least one embodiment, the Cooperative Groups may refer to a programming model for organizing groups of communicating threads that allows developers to express granularity at which threads are communicating, enabling expression of richer, more efficient parallel decompositions. In at least one embodiment, cooperative launch APIs support synchronization amongst thread blocks for execution of parallel algorithms. In at least one embodiment, applications of conventional programming models provide a single, simple construct for synchronizing cooperating threads: a barrier across all threads of a thread block (e.g., syncthreads ( ) function). However, in at least one embodiment, programmers may define groups of threads at smaller than thread block granularities and synchronize within defined groups to enable greater performance, design flexibility, and software reuse in form of collective group-wide function interfaces. In at least one embodiment, the Cooperative Groups enables programmers to define groups of threads explicitly at sub-block (e.g., as small as a single thread) and multi-block granularities, and to perform collective operations such as synchronization on threads in a cooperative group. In at least one embodiment, a programming model supports clean composition across software boundaries, so that libraries and utility functions can synchronize safely within their local context without having to make assumptions about convergence. In at least one embodiment, the Cooperative Groups primitives enable new patterns of cooperative parallelism, including, without limitation, producer-consumer parallelism, opportunistic parallelism, and global synchronization across an entire grid of thread blocks.

In at least one embodiment, a dispatch unit 3206 is configured to transmit instructions to one or more of functional units and scheduler units 3204 includes, without limitation, two dispatch units 3206 that enable two different instructions from same warp to be dispatched during each clock cycle. In at least one embodiment, each scheduler unit 3204 includes a single dispatch unit 3206 or additional dispatch units 3206.

In at least one embodiment, each SM 3200, includes, without limitation, a register file 3208 that provides a set of registers for functional units of SM 3200. In at least one embodiment, register file 3208 is divided between each of functional units such that each functional unit is allocated a dedicated portion of register file 3208. In at least one embodiment, register file 3208 is divided between different warps being executed by SM 3200 and register file 3208 provides a temporary storage for operands connected to data paths of functional units. In at least one embodiment, each SM 3200 comprises, without limitation, a plurality of L processing cores 3210. In at least one embodiment, SM 3200 includes, without limitation, a large number (e.g., 128 or more) of distinct processing cores 3210. In at least one embodiment, each processing core 3210, in at least one embodiment, includes, without limitation, a fully pipelined, single-precision, double-precision, and/or mixed precision processing unit that includes, without limitation, a floating point arithmetic logic unit and an integer arithmetic logic unit. In at least one embodiment, floating point arithmetic logic units implement IEEE 754-2008 standard for floating point arithmetic. In at least one embodiment, processing cores 3210 include, without limitation, 64 single-precision (32-bit) floating point cores, 64 integer cores, 32 double-precision (64-bit) floating point cores, and 8 tensor cores.

Tensor cores are configured to perform matrix operations in accordance with at least one embodiment. In at least one embodiment, one or more tensor cores are included in processing cores 3210. In at least one embodiment, tensor cores are configured to perform deep learning matrix arithmetic, such as convolution operations for neural network training and inferencing. In at least one embodiment, each tensor core operates on a 4×4 matrix and performs a matrix multiply and accumulate operation $D=A \times B+C$, where A, B, C, and D are 4×4 matrices.

In at least one embodiment, matrix multiply inputs A and B are 16-bit floating point matrices and accumulation matrices C and D are 16-bit floating point or 32-bit floating point matrices. In at least one embodiment, tensor cores operate on a 16-bit floating point input data with a 32-bit floating point accumulation. In at least one embodiment, 16-bit floating point multiply uses 64 operations and results in a full precision product that is then accumulated using a 32-bit floating point addition with other intermediate products for a 4×4×4 matrix multiply. Tensor cores are used to perform much larger two-dimensional or higher dimensional matrix operations, built up from these smaller elements, in at least one embodiment. In at least one embodiment, an API, such as CUDA 9 C++ API, exposes specialized matrix load, matrix multiply and accumulate, and matrix store operations to efficiently use tensor cores from a CUDA-C++ program. In at least one embodiment, at CUDA level, warp-level interface assumes 16×16 size matrices spanning all 32 threads of warp.

In at least one embodiment, each SM 3200 comprises, without limitation, M SFUs 3212 that perform special functions (e.g., attribute evaluation, reciprocal square root, and like). In at least one embodiment, SFUs 3212 include, without limitation, a tree traversal unit configured to traverse a hierarchical tree data structure. In at least one embodiment, SFUs 3212 include, without limitation, a texture unit configured to perform texture map filtering operations. In at least one embodiment, texture units are configured to load texture maps (e.g., a 2D array of texels) from memory and sample texture maps to produce sampled texture values for use in shader programs executed by SM 3200. In at least one embodiment, texture maps are stored in shared memory/L1 cache 3218. In at least one embodiment, texture units implement texture operations such as filtering operations using mip-maps (e.g., texture maps of varying levels of detail), in accordance with at least one embodiment. In at least one embodiment, each SM 3200 includes, without limitation, two texture units.

Each SM 3200 comprises, without limitation, N LSUs 3214 that implement load and store operations between shared memory/L1 cache 3218 and register file 3208, in at least one embodiment. In at least one embodiment, each SM 3200 includes, without limitation, an interconnect network 3216 that connects each of functional units to register file 3208 and LSU 3214 to register file 3208 and shared memory/L1 cache 3218 in at least one embodiment. In at least one embodiment, interconnect network 3216 is a crossbar that can be configured to connect any of functional units to any of registers in register file 3208 and connect LSUs 3214 to register file 3208 and memory locations in shared memory/L1 cache 3218.

In at least one embodiment, shared memory/L1 cache 3218 is an array of on-chip memory that allows for data storage and communication between SM 3200 and primitive engine and between threads in SM 3200, in at least one embodiment. In at least one embodiment, shared memory/L1 cache 3218 comprises, without limitation, 128 KB of storage capacity and is in path from SM 3200 to partition unit. In at least one embodiment, shared memory/L1 cache 3218, in at least one embodiment, is used to cache reads and writes. In at least one embodiment, one or more of shared memory/L1 cache 3218, L2 cache, and memory are backing stores.

Combining data cache and shared memory functionality into a single memory block provides improved performance for both types of memory accesses, in at least one embodiment. In at least one embodiment, capacity is used or is usable as a cache by programs that do not use shared memory, such as if shared memory is configured to use half of capacity, texture and load/store operations can use remaining capacity. Integration within shared memory/L1 cache 3218 enables shared memory/L1 cache 3218 to function as a high-throughput conduit for streaming data while simultaneously providing high-bandwidth and low-latency access to frequently reused data, in accordance with at least one embodiment. In at least one embodiment, when configured for general purpose parallel computation, a simpler configuration can be used compared with graphics processing. In at least one embodiment, fixed function graphics processing units are bypassed, creating a much simpler programming model. In at least one embodiment, in a general purpose parallel computation configuration, work distribution unit assigns and distributes blocks of threads directly to DPCs, in at least one embodiment. In at least one embodiment, threads in a block execute a same program, using a unique thread ID in calculation to ensure each thread generates unique results, using SM 3200 to execute said program and perform calculations, shared memory/L1 cache 3218 to communicate between threads, and LSU 3214 to read and write global memory through shared memory/L1 cache 3218 and memory partition unit. In at least one embodiment, when configured for general purpose parallel computation, SM 3200 writes commands that scheduler unit 3204 can use to launch new work on DPCs.

In at least one embodiment, PPU is included in or coupled to a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, and more. In at least one embodiment, PPU is embodied on a single semiconductor substrate. In at least one embodiment, PPU is included in a system-on-a-chip ("SoC") along with one or more other devices such as additional PPUs, memory, a reduced instruction set computer ("RISC") CPU, a memory management unit ("MMU"), a digital-to-analog converter ("DAC"), and alike.

In at least one embodiment, PPU may be included on a graphics card that includes one or more memory devices. In at least one embodiment, a graphics card may be configured to interface with a PCIe slot on a motherboard of a desktop computer. In at least one embodiment, PPU may be an integrated graphics processing unit ("iGPU") included in a chipset of a motherboard.

Inference and/or training logic 715 are used to perform inferencing and/or training operations associated with one or more embodiments. Details regarding inference and/or training logic 715 are provided herein in conjunction with FIGS. 7A and/or 7B. In at least one embodiment, a deep learning application processor is used to train a machine learning model, such as a neural network, to predict or infer information provided to SM 3200. In at least one embodiment, SM 3200 is used to infer or predict information based on a trained machine learning model (e.g., neural network) that has been trained by another processor or system or by SM 3200. In at least one embodiment, SM 3200 may be used to perform one or more neural network use cases described herein.

In at least one embodiment, a GPU-based CRC processing unit might be used in a system of FIG. 32 to perform CRC generation and/or checking.

In at least one embodiment, a single semiconductor platform may refer to a sole unitary semiconductor-based integrated circuit or chip. In at least one embodiment, multi-chip modules may be used with increased connectivity which simulate on-chip operation, and make substantial improvements over utilizing a conventional central processing unit ("CPU") and bus implementation. In at least one embodiment, various modules may also be situated separately or in various combinations of semiconductor platforms per desires of user.

In at least one embodiment, computer programs in form of machine-readable executable code or computer control logic algorithms are stored in main memory 1204 and/or a secondary storage. Computer programs, if executed by one or more processors, enable system 1200 to perform various functions in accordance with at least one embodiment. In at least one embodiment, memory 1204, storage, and/or any other storage are possible examples of computer-readable media. In at least one embodiment, secondary storage may refer to any suitable storage device or system such as a hard disk drive and/or a removable storage drive, representing a floppy disk drive, a magnetic tape drive, a compact disk drive, a digital versatile disk ("DVD") drive, a recording device, a universal serial bus ("USB") flash memory, etc. In at least one embodiment, architecture and/or functionality of various previous figures are implemented in context of CPU 1202; parallel processing system 1212; an integrated circuit capable of at least a portion of capabilities of both CPU 1202; parallel processing system 1212; a chipset (e.g., a group of integrated circuits designed to work and sold as a unit for performing related functions, etc.); and any suitable combination of integrated circuit(s).

In at least one embodiment, architecture and/or functionality of various previous figures are implemented in context of a general computer system, a circuit board system, a game console system dedicated for entertainment purposes, an application-specific system, and more. In at least one embodiment, computer system 1200 may take form of a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, a mobile phone device, a television, a workstation, game consoles, an embedded system, and/or any other type of logic.

In at least one embodiment, parallel processing system 1212 includes, without limitation, a plurality of parallel processing units ("PPUs") 1214 and associated memories 1216. In at least one embodiment, PPUs 1214 are connected to a host processor or other peripheral devices via an interconnect 1218 and a switch 1220 or a multiplexer. In at least one embodiment, parallel processing system 1212 distributes computational tasks across PPUs 1214 which can be parallelizable for example, as part of distribution of computational tasks across multiple graphics processing unit ("GPU") thread blocks. In at least one embodiment, memory is shared and accessible (e.g., for read and/or write access) across some or all of PPUs 1214, although such shared memory may incur performance penalties relative to use of local memory and registers resident to a PPU 1214. In at least one embodiment, operation of PPUs 1214 is synchronized through use of a command such as _syncthreads( ), wherein all threads in a block (e.g., executed across multiple PPUs 1214) to reach a certain point of execution of code before proceeding.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to a specific form or forms disclosed, but on contrary, intention is to cover all modifications, alternative constructions, and equivalents falling within spirit and scope of disclosure, as defined in appended claims.

Use of the terms "a" and "an" and "the" and similar referents in context of describing disclosed embodiments (especially in context of following claims) are to be construed to cover both singular and plural, unless otherwise indicated herein or clearly contradicted by context. Terms "comprising," "having," "including," and "containing" are to be construed as open-ended terms (meaning "including, but not limited to,") unless otherwise noted. Term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. Term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but a subset and a corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). Number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (e.g., as a result of being executed) by one or more processors of a computer system, cause computer system to perform operations described herein. A set of non-transitory computer-readable storage media, in at least one embodiment, comprises multiple non-transitory computer-readable storage media and one or more of individual non-transitory storage media of multiple non-transitory computer-readable storage media lack all of said code while multiple non-transitory computer-readable storage media collectively store all of said code. In at least one embodiment, executable instructions are executed such that different instructions are executed by different processors for example, a non-transitory computer-readable storage medium store instructions and a main central processing unit ("CPU") executes some of said instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or alike, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. Process of obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to an acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or interprocess communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing claims.

What is claimed is:

1. A graphics processor comprising:
one or more circuits to perform error detection and correction of two or more portions of one or more fifth generation (5G) new radio signals in parallel.

2. The Previously Presented graphics processor of claim 1, wherein the one or more circuits are further to:
obtain the one or more 5G new radio signals indicating at least a data sequence and a first polynomial;
allocate the data sequence and the first polynomial to a set of threads of the graphics processor; and
perform the error detection and correction by at least using the set of threads to process the data sequence and the first polynomial.

3. The graphics processor of claim 2, wherein the one or more circuits are further to:
allocate the data sequence by at least processing the data sequence into a plurality of data segments; and
allocate the first polynomial by at least processing the first polynomial into a plurality of polynomial segments.

4. The graphics processor of claim 1, wherein the one or more circuits are further to perform the error detection and correction by at least calculating a remainder of a division operation based at least in part on one or more polynomials indicated by the one or more 5G new radio signals.

5. The graphics processor of claim 1, wherein the one or more circuits are further to use a plurality of threads of the graphics processor in parallel to perform the error detection and correction.

6. The graphics processor of claim 1, wherein the one or more 5G new radio signals comprise one or more code blocks.

7. A machine-readable medium having stored thereon a set of instructions, which if performed by one or more graphics processors, cause the one or more graphics processors to perform error detection and correction of two or more portions of one or more fifth generation (5G) new radio signals in parallel.

8. The machine-readable medium of claim 7, wherein the set of instructions further comprise instructions, which if performed by the one or more graphics processors, cause the one or more graphics processors to:
allocate a first set of data associated with the one or more 5G new radio signals to a first set of threads of the one or more graphics processors;
allocate a second set of data associated with the one or more 5G new radio signals to a second set of threads of the one or more graphics processors; and
perform the error detection and correction by at least using the first set of threads and the second set of threads to calculate an output value based at least in part on the first set of data and the second set of data.

9. The machine-readable medium of claim 7, wherein the one or more 5G new radio signals comprise one or more data segments corresponding to one or more generator segments.

10. The machine-readable medium of claim 9, wherein the instructions further comprise instructions, which if performed by the one or more graphics processors, cause the one or more graphics processors to:
store the one or more data segments in local memory of the one or more graphics processors; and
store the one or more generator segments in global memory of the one or more graphics processors.

11. The machine-readable medium of claim 7, wherein the set of instructions further comprise instructions, which if performed by the one or more graphics processors, cause the one or more graphics processors to calculate whether an error has occurred by at least determining whether a first value stored in memory associated with the one or more graphics processors matches a second value calculated based at least in part on the one or more 5G new radio signals.

12. The machine-readable medium of claim 7, wherein the instructions further comprise instructions, which if performed by the one or more graphics processors, cause the one or more graphics processors to:
use one or more threads of the one or more graphics processors to perform one or more multiplication operations based at least in part on the one or more 5G new radio signals to calculate a plurality of outputs; and perform the error detection and correction by at least performing an exclusive OR operation on the plurality of outputs.

13. The machine-readable medium of claim 12, wherein the set of instructions further comprise instructions, which if performed by the one or more graphics processors, cause the one or more graphics processors to perform the error detection and correction by at least calculating a first output of the plurality of outputs and a second output of the plurality of outputs in parallel.

14. A system, comprising:
one or more computers having one or more graphics processors to perform error detection and correction of two or more portions of one or more fifth generation (5G) new radio signals in parallel.

15. The system of claim 14, wherein the one or more graphics processors are further to:
obtain the one or more 5G new radio signals indicating at least input data and a polynomial associated with a cyclic redundancy check (CRC) process; and
perform the error detection and correction by at least using a plurality of threads of the one or more graphics processors in parallel to process the input data and the polynomial.

16. The system of claim 14, wherein the one or more graphics processors are further to parse the one or more 5G new radio signals to calculate a plurality of input data segments sized to fit a thread local memory data width.

17. The system of claim 14, wherein the one or more graphics processors to perform the error detection and correction are further to:
calculate one or more cyclic redundancy check (CRC) values associated with one or more code blocks associated with the one or more 5G new radio signals; and
concatenate the one or more CRC values to calculate a CRC value associated with a transport block comprising the one or more code blocks, wherein the CRC value indicates a result of the error detection and correction.

18. The system of claim 14, wherein the one or more 5G new radio signals indicate at least an input data sequence representable as a binary polynomial.

19. The system of claim 14, wherein the one or more graphics processors are further to:
determine a first generator segment associated with a first thread position of a thread of the one or more graphics processors;
calculate one or more values of a thread output associated with the thread corresponding to the first thread position; and
provide access to the one or more values to the thread corresponding to the first thread position.

20. The system of claim 19, wherein the one or more graphics processors are further to:
provide the access to the one or more values through one or more lookup tables; and
perform the error detection and correction by at least using the one or more lookup tables.

21. A method, comprising: using one or more graphics processors to perform error detection and correction on one or more fifth generation (5G) new radio signals in parallel.

22. The method of claim 21, further comprising:
obtaining the one or more 5G new radio signals comprising one or more transport blocks;
obtaining a plurality of code blocks based at least in part on the one or more transport blocks; and
using a plurality of threads of the one or more graphics processors to process the plurality of code blocks.

23. The method of claim 21, further comprising:
obtaining a generator polynomial associated with the one or more 5G new radio signals; and
performing the error detection and correction by at least processing one or more generator segments corresponding to the generator polynomial and one or more data segments corresponding to the one or more 5G new radio signals in parallel.

24. The method of claim 21, wherein the one or more 5G new radio signals are generated by one or more mobile devices.

25. The method of claim 21, wherein the error detection and correction comprises one or more cyclic redundancy check (CRC) processes.

* * * * *